(12) United States Patent
Moriwaki

(10) Patent No.: US 11,744,091 B2
(45) Date of Patent: Aug. 29, 2023

(54) IMAGING ELEMENT, STACKED-TYPE IMAGING ELEMENT, AND SOLID-STATE IMAGING APPARATUS TO IMPROVE CHARGE TRANSFER

(71) Applicant: SONY CORPORATION, Tokyo (JP)

(72) Inventor: Toshiki Moriwaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 532 days.

(21) Appl. No.: 16/768,207

(22) PCT Filed: Oct. 31, 2018

(86) PCT No.: PCT/JP2018/040509
§ 371 (c)(1),
(2) Date: May 29, 2020

(87) PCT Pub. No.: WO2019/111603
PCT Pub. Date: Jun. 13, 2019

(65) Prior Publication Data
US 2020/0303446 A1  Sep. 24, 2020

(30) Foreign Application Priority Data
Dec. 5, 2017 (JP) .................. 2017-233157

(51) Int. Cl.
*H10K 39/32* (2023.01)
*H01L 27/146* (2006.01)
*H04N 25/79* (2023.01)

(52) U.S. Cl.
CPC ....... *H10K 39/32* (2023.02); *H01L 27/14647* (2013.01); *H04N 25/79* (2023.01)

(58) Field of Classification Search
CPC ................. H01L 27/307; H01L 27/14–14893
See application file for complete search history.

(56) References Cited

U.S. PATENT DOCUMENTS 7,345,328 B2 * 3/2008 Oda .................. H01L 27/14645
257/293
8,643,386 B2 * 2/2014 Imai .......................... G01J 1/44
324/629

(Continued)

FOREIGN PATENT DOCUMENTS

JP 2007-123698 5/2007
JP 2009-272528 11/2009

(Continued)

OTHER PUBLICATIONS

Amorphous indium-gallium-zinc-oxide as electron transport layer in organic photodetectors, H. Arora, P.E. Malinowski, and A. Chasin et al., Applied Physics Letters 106, 143301 (Year: 2015).*

(Continued)

*Primary Examiner* — Kevin Parendo
(74) *Attorney, Agent, or Firm* — Sheridan Ross P.C.

(57) ABSTRACT

An imaging element includes a photoelectric conversion section that includes a first electrode, a photoelectric conversion layer, and a second electrode stacked on one another. An inorganic oxide semiconductor material layer is formed between the first electrode and the photoelectric conversion layer. The inorganic oxide semiconductor material layer includes indium (In) atoms, gallium (Ga) atoms, tin (Sn) atoms, and zinc (Zn) atoms.

12 Claims, 84 Drawing Sheets

(56) References Cited

U.S. PATENT DOCUMENTS

| | | | |
|---|---|---|---|
| 10,714,532 | B2 | 7/2020 | Togashi et al. |
| 11,276,726 | B2 | 3/2022 | Moriwaki et al. |
| 11,348,965 | B2 | 5/2022 | Togashi et al. |
| 2006/0197172 | A1 | 9/2006 | Oda |
| 2006/0278869 | A1 | 12/2006 | Hioki et al. |
| 2007/0181177 | A9 | 8/2007 | Sager et al. |
| 2009/0223566 | A1 | 9/2009 | Mitsui et al. |
| 2009/0315136 | A1 | 12/2009 | Hayashi |
| 2010/0320457 | A1 | 12/2010 | Matsubara et al. |
| 2012/0012869 | A1 | 1/2012 | Song |
| 2012/0327032 | A1 | 12/2012 | Jeon et al. |
| 2013/0228222 | A1* | 9/2013 | Shiba ............... H01L 51/0035 136/263 |
| 2014/0096817 | A1 | 4/2014 | Xie et al. |
| 2014/0138673 | A1 | 5/2014 | Shieh et al. |
| 2014/0306180 | A1 | 10/2014 | Moriwaki et al. |
| 2015/0188065 | A1 | 7/2015 | Takimoto |
| 2015/0311245 | A1 | 10/2015 | Yamazaki et al. |
| 2015/0311362 | A1* | 10/2015 | Sogabe ............ H01L 31/02366 428/141 |
| 2015/0349008 | A1 | 12/2015 | Yamaguchi |
| 2016/0013424 | A1 | 1/2016 | Yamamoto et al. |
| 2016/0037098 | A1 | 2/2016 | Lee et al. |
| 2016/0064623 | A1 | 3/2016 | Clatterbuck |
| 2016/0104734 | A1* | 4/2016 | Hirose ............... H01L 27/1225 257/43 |
| 2016/0111669 | A1 | 4/2016 | Uetani |
| 2016/0284862 | A1 | 9/2016 | Yamazaki et al. |
| 2016/0336363 | A1 | 11/2016 | Dairiki et al. |
| 2017/0005126 | A1 | 1/2017 | Yamazaki et al. |
| 2017/0054097 | A1* | 2/2017 | O'Rourke ............ H01L 51/448 |
| 2017/0062620 | A1 | 3/2017 | Yamazaki et al. |
| 2017/0257587 | A1 | 9/2017 | Hatano et al. |
| 2017/0278784 | A1 | 9/2017 | Moriwaki et al. |
| 2017/0338431 | A1 | 11/2017 | Ro et al. |
| 2018/0076252 | A1 | 3/2018 | Togashi et al. |
| 2018/0226596 | A1 | 8/2018 | Moriwaki et al. |
| 2018/0294315 | A1 | 10/2018 | Shiomi et al. |
| 2019/0355875 | A1 | 11/2019 | Yum et al. |
| 2019/0364191 | A1 | 11/2019 | Takahashi et al. |
| 2020/0295219 | A1 | 9/2020 | Moriwaki et al. |
| 2021/0098649 | A1 | 4/2021 | Park et al. |
| 2021/0126040 | A1 | 4/2021 | Moriwaki et al. |
| 2021/0135059 | A1 | 5/2021 | Lee et al. |
| 2021/0167234 | A1 | 6/2021 | Nakano et al. |
| 2021/0257401 | A1 | 8/2021 | Moriwaki et al. |
| 2021/0288099 | A1 | 9/2021 | Moriwaki et al. |
| 2021/0327961 | A1 | 10/2021 | Moriwaki et al. |
| 2022/0037602 | A1 | 2/2022 | Iino et al. |
| 2022/0208857 | A1 | 6/2022 | Moriwaki et al. |
| 2022/0231245 | A1 | 7/2022 | Iino et al. |
| 2022/0255027 | A1 | 8/2022 | Moriwaki et al. |

FOREIGN PATENT DOCUMENTS

| | | |
|---|---|---|
| JP | 2011-138927 | 7/2011 |
| JP | 2012-049210 | 3/2012 |
| JP | 2016-063165 | 4/2016 |
| JP | 2016-082242 | 5/2016 |
| JP | 2016-219800 | 12/2016 |
| JP | 2017-017324 | 1/2017 |
| JP | 2017-157816 | 9/2017 |
| JP | 2018-046039 | 3/2018 |
| JP | 2018-060910 | 4/2018 |
| KR | 20150083869 A | 7/2015 |
| KR | 20170072889 A | 6/2017 |
| TW | 201719874 | 6/2017 |
| TW | 201813073 | 4/2018 |
| WO | WO 2009/066750 | 5/2009 |
| WO | WO 2013/027391 | 2/2013 |
| WO | WO 2014/112279 | 7/2014 |
| WO | WO 2017/029877 | 2/2017 |
| WO | WO 2017/061082 | 4/2017 |
| WO | WO 2017/061174 | 4/2017 |
| WO | WO 2018/025540 | 2/2018 |

OTHER PUBLICATIONS

Amorphous Indium-Gallium-Zinc-Tin-Oxide TFTs with High Mobility and Reliability, Tao Sun et al., SID Symposium Digest of Technical Papers 46(1) (Year: 2015).*

International Search Report prepared by the Japan Patent Office dated Jan. 15, 2019, for International Application No. PCT/JP2018/040509.

Extended European Search Report for European Patent Application No. 18885794.0, dated Jan. 27, 2021, 6 pages.

Edwards et al., "A new transparent conducting oxide in the Ga2O3—In2O3—SnO2 system," Applied Physics Letters, vol. 70, No. 13, Mar. 31, 1997, pp. 1706-1708.

International Search Report and Written Opinion for International (PCT) Patent Application No. PCT/JP2018/015838, dated Jul. 10, 2018, 7 pages.

International Search Report and Written Opinion for International (PCT) Patent Application No. PCT/JP2019/016292, dated Jul. 9, 2019, 7 pages.

International Search Report and Written Opinion for International (PCT) Patent Application No. PCT/JP2019/016462, dated Jul. 9, 2019, 5 pages.

International Search Report and Written Opinion for International (PCT) Patent Application No. PCT/JP2019/016262, dated Jul. 9, 2019, 7 pages.

International Search Report and Written Opinion for International (PCT) Patent Application No. PCT/JP2019/015591, dated Jul. 9, 2019, 4 pages.

Official Action for U.S. Appl. No. 16/499,917, dated Apr. 2, 2021, 12 pages.

Official Action for U.S. Appl. No. 16/499,917, dated Aug. 6, 2021, 12 pages.

Notice of Allowance for U.S. Appl. No. 16/499,917, dated Nov. 3, 2021, 7 pages.

Official Action for U.S. Appl. No. 17/047,182, dated Mar. 29, 2022, 14 pages.

Official Action for U.S. Appl. No. 17/047,182, dated Jul. 13, 2022, 19 pages.

Official Action for U.S. Appl. No. 17/047,182, dated Dec. 12, 2022, 22 pages.

Official Action for U.S. Appl. No. 17/047,208, dated Jun. 2, 2022, 12 pages. Restriction Requirement.

Official Action for U.S. Appl. No. 17/047,208, dated Sep. 16, 2022, 33 pages.

Official Action for U.S. Appl. No. 17/047,208, dated Jan. 3, 2023, 24 pages.

* cited by examiner

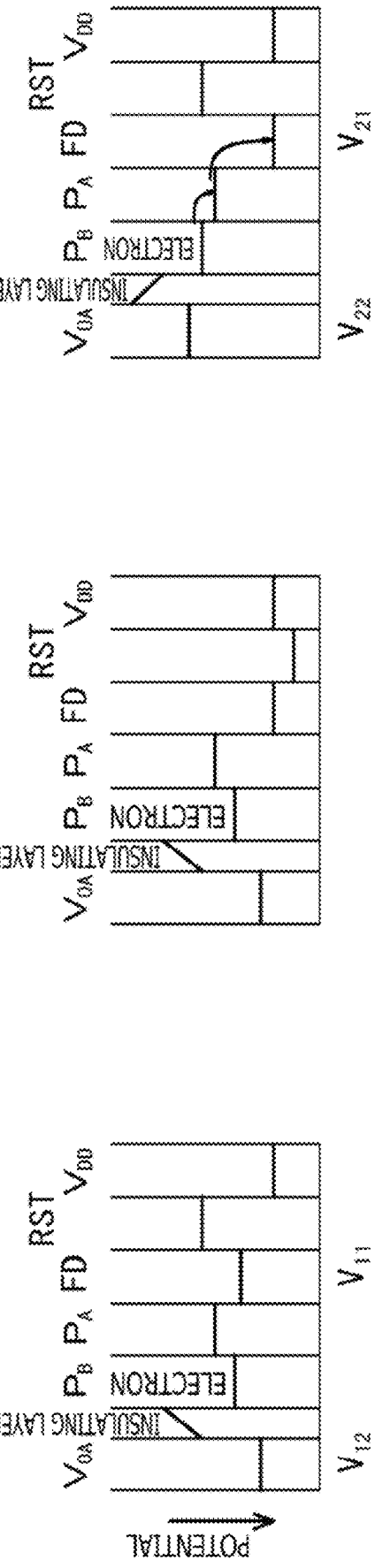
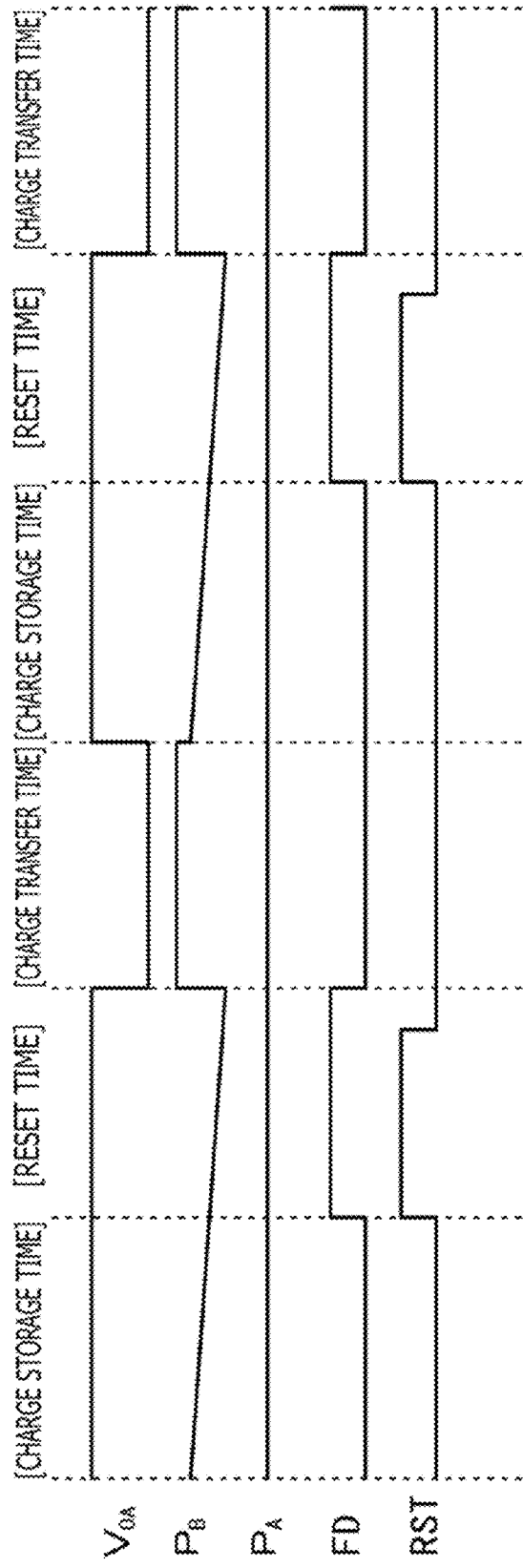
FIG. 5

CHARGE STORAGE ELECTRODE SIDE

IMAGING ELEMENT, STACKED-TYPE IMAGING ELEMENT, AND SOLID-STATE IMAGING APPARATUS TO IMPROVE CHARGE TRANSFER

CROSS REFERENCE TO RELATED APPLICATIONS

This application is a national stage application under 35 U.S.C. 371 and claims the benefit of PCT Application No. PCT/JP2018/040509 having an international filing date of 31 Oct. 2018, which designated the United States, which PCT application claimed the benefit of Japanese Patent Application No. 2017-233157 filed 5 Dec. 2017, the entire disclosures of each of which are incorporated herein by reference.

TECHNICAL FIELD

The present disclosure relates to an imaging element, a stacked-type imaging element, and a solid-state imaging apparatus.

BACKGROUND ART

As an imaging element for constituting an image sensor or the like, in recent years, a stacked-type imaging element has been drawing attention. The stacked-type imaging element has a structure in which a photoelectric conversion layer (light receiving layer) is sandwiched between two electrodes. In the stacked-type imaging element, a structure in which signal charges generated in the photoelectric conversion layer based on photoelectric conversion are stored and transferred should be provided. In a conventional structure, a structure in which the signal charges are stored in an FD (Floating Drain) electrode and transferred should be provided, and high-speed transfer should be performed such that the signal charges are not delayed.

An imaging element (photoelectric conversion element) for solving such a problem is disclosed, for example, in JP 2016-63165A. This imaging element includes:

a storage electrode formed on a first insulating layer;
a second insulating layer formed on the storage electrode;
a semiconductor layer formed such as to cover the storage electrode and the second insulating layer;
a collecting electrode formed to make contact with the semiconductor layer and formed to be spaced from the storage electrode;
a photoelectric conversion layer formed on the semiconductor layer; and
an upper electrode formed on the photoelectric conversion layer.

The imaging element in which an organic semiconductor material is used for a photoelectric conversion layer is able to perform photoelectric conversion of a specific color (wavelength band). Having such a characteristic, in the case where the imaging element is used as an imaging element in a solid-state imaging apparatus, it is possible to obtain a structure (stacked-type imaging element) in which sub-pixels are stacked, which is impossible in a conventional solid-state imaging apparatus, in which a combination of an on-chip color filter (OCCF) and an imaging element constitutes a sub-pixel, and the sub-pixels are arranged in a two-dimensional pattern (see, for example, JP 2011-138927A). In addition, since a demosaic treatment is unnecessary, the imaging element has an advantage of not generating false colors. In the following description, an imaging element including a photoelectric conversion section provided on or on an upper side of a semiconductor substrate may be referred to as "an imaging element of the first type" for convenience' sake, a photoelectric conversion section constituting an imaging element of the first type may be referred to as "a photoelectric conversion section of the first type" for convenience' sake, an imaging element provided in a semiconductor substrate may be referred to as "an imaging element of the second type" for convenience' sake, and a photoelectric conversion section constituting an imaging element of the second type may be referred to as "a photoelectric conversion section of the second type" for convenience' sake.

FIG. 84 depicts a configuration example of a conventional stacked-type imaging element (stacked-type solid-state imaging apparatus). In the example depicted in FIG. 84, a third photoelectric conversion section 343A and a second photoelectric conversion section 341A as photoelectric conversion sections of the second type for constituting a third imaging element 343 and a second imaging element 341 which are imaging elements of the second type are stacked and formed in the semiconductor substrate 370. In addition, a first photoelectric conversion section 310A which is a photoelectric conversion section of the first type is disposed on an upper side of the semiconductor substrate 370 (specifically, on an upper side of the second imaging element 341). Here, the first photoelectric conversion section 310A includes a first electrode 321, a photoelectric conversion layer 323 including an organic material, and a second electrode 322, and constitutes a first imaging element 310 which is an imaging element of the first type. In the second photoelectric conversion section 341A and the third photoelectric conversion section 343A, for example, photoelectric conversion of blue light and red light are respectively performed, based on the difference in absorption coefficient. In addition, in the first photoelectric conversion section 310A, for example, photoelectric conversion of green light is performed.

Charges generated by photoelectric conversion in the second photoelectric conversion section 341A and the third photoelectric conversion section 343A are once stored in the second photoelectric conversion section 341A and the third photoelectric conversion section 343A, are thereafter transferred to a second floating diffusion layer (Floating Diffusion) $FD_2$ and a third floating diffusion layer $FD_3$ respectively by a vertical transistor (a gate section 345 is illustrated) and a transfer transistor (a gate section 346 is illustrated), and are further outputted to an external reading-out circuit (not illustrated). These transistors and the floating diffusion layers $FD_2$ and $FD_3$ are also formed in the semiconductor substrate 370.

The charges generated by photoelectric conversion in the first photoelectric conversion section 310A are stored in the first floating diffusion layer $FD_1$ formed in the semiconductor substrate 370, via a contact hole section 361 and a wiring layer 362. In addition, the first photoelectric conversion section 310A is connected also to a gate section 352 of an amplification transistor for converting a charge amount into voltage, via the contact hole section 361 and the wiring layer 362. The first floating diffusion layer $FD_1$ constitutes a part of a reset transistor (a gate section 351 is illustrated). Reference sign 371 denotes an element isolation region, reference sign 372 denotes an oxide film formed on a surface of the semiconductor substrate 370, reference signs 376 and 381 denote interlayer insulating layers, reference sign 383 denotes an insulating layer, and reference sign 314 denotes an on-chip microlens.

CITATION LIST

Patent Literature

[PTL 1]
JP 2016-63165A
[PTL 2]
JP 2011-138927A

SUMMARY

Technical Problems

However, according to the technology disclosed in JP 2016-63165A, a restriction that a storage electrode and a second insulating layer formed thereon should be formed in the same length is present, gaps concerning a collecting electrode and the like are precisely prescribed, so that the production process is complicated, leading to a lowering in production yield. Further, although some descriptions are made concerning the materials constituting the semiconductor layer, no description is made in regard of the composition and configuration of more specific materials. In addition, a description is made concerning a correlation expression between mobility of the semiconductor layer and stored charges. However, no description is made as to items concerning improvement of charge transfer, such as items concerning the mobility of the semiconductor layer and items concerning the relation of energy level between the semiconductor layer and the part of the photoelectric conversion layer adjacent to the semiconductor layer, which are important for transfer of the charges generated.

Accordingly, it is an object of the present disclosure to provide an imaging element, a stacked-type imaging element, and a solid-state imaging apparatus which are excellent in transfer characteristics of charges stored in a photoelectric conversion layer, notwithstanding their simple configuration and structure.

Solution to Problems

In order to achieve the above object, an imaging element of the present disclosure includes a photoelectric conversion section that includes a first electrode, a photoelectric conversion layer, and a second electrode stacked on one another, in which an inorganic oxide semiconductor material layer is formed between the first electrode and the photoelectric conversion layer, and the inorganic oxide semiconductor material layer includes indium (In) atoms, gallium (Ga) atoms, tin (Sn) atoms, and zinc (Zn) atoms.

In order to achieve the above object, a stacked-type imaging element of the present disclosure has at least one imaging element of the present disclosure described above.

In order to achieve the above object, a solid-state imaging apparatus according to a first mode of the present disclosure includes a plurality of the imaging elements of the present disclosure described above. In addition, in order to achieve the above object, a solid-state imaging apparatus according to a second mode of the present disclosure includes a plurality of stacked-type imaging elements of the present disclosure described above.

BRIEF DESCRIPTION OF DRAWINGS

FIG. 5 is a diagram schematically depicting a state of potential at each part at the time of an operation of the imaging element of Embodiment 1.

FIG. 76 is a graph of the relation between $V_{gs}$ and $I_d$ in a TFT in which a channel forming region includes $In_aGa_bSn_cZn_dO_e$ or the like.

DESCRIPTION OF EMBODIMENTS

Figure 1:
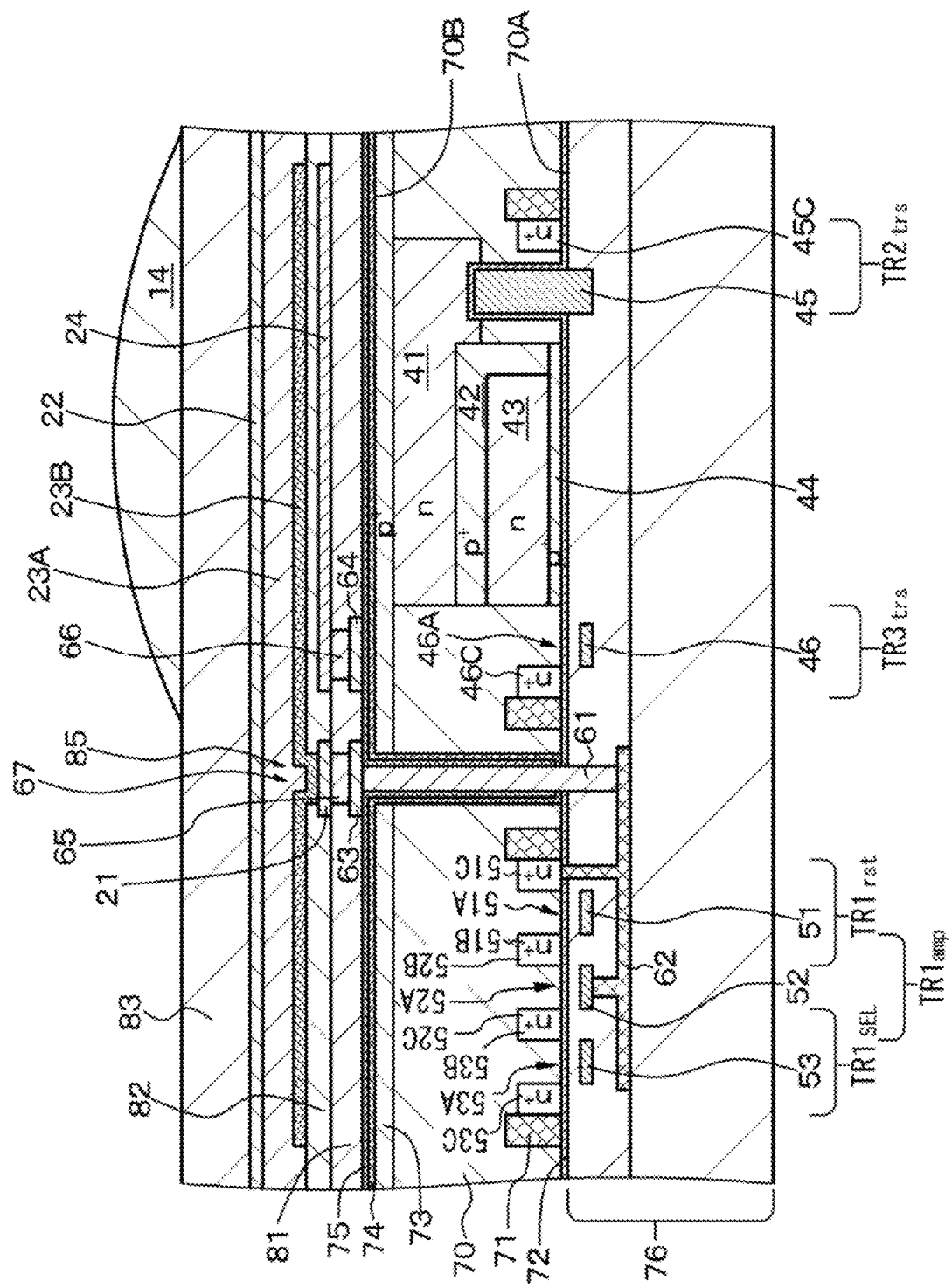
FIG. 1 is a schematic partial sectional view of an imaging element of Embodiment 1.

The present disclosure will be described below based on Embodiments and referring to the drawings, but the present disclosure is not limited to Embodiments, and various numerical values and materials in Embodiments are merely illustrative. Note that the description will be made in the following order.
1. General description of imaging element of present disclosure, stacked-type imaging element of present disclosure, and solid-state imaging apparatus according to first and second modes of present disclosure
2. Embodiment 1 (Imaging element of present disclosure, stacked-type imaging element of present disclosure, and solid-state imaging apparatus according to second mode of present disclosure)
3. Embodiment 2 (Modification of Embodiment 1)
4. Embodiment 3 (Modifications of Embodiments 1 and 2, solid-state imaging apparatus according to first mode of present disclosure)
5. Embodiment 4 (Modifications of Embodiments 1 to 3, imaging element including transfer control electrode)
6. Embodiment 5 (Modifications of Embodiments 1 to 4, imaging element including charge discharge electrode)
7. Embodiment 6 (Modifications of Embodiments 1 to 5, imaging element including plurality of charge storage electrode segments)
8. Embodiment 7 (Imaging elements of first and sixth configurations)
9. Embodiment 8 (Imaging elements of second and sixth configurations of present disclosure)
10. Embodiment 9 (Imaging element of third configuration)
11. Embodiment 10 (Imaging element of fourth configuration)
12. Embodiment 11 (Imaging element of fifth configuration)
13. Embodiment 12 (Imaging element of sixth configuration)
14. Embodiment 13 (Solid-state imaging apparatuses of first and second configurations)
15. Embodiment 14 (Modification of Embodiment 13)
16. Others <General Description of Imaging Element of Present Disclosure, Stacked-Type Imaging Element of Present Disclosure, and Solid-State Imaging Apparatuses of First and Second Modes of Present Disclosure>

In an imaging element of the present disclosure, an imaging element of the present disclosure that constitutes a stacked-type imaging element of the present disclosure, and an imaging element of the present disclosure that constitutes solid-state imaging apparatuses of first and second modes of the present disclosure (these imaging elements may hereinafter be referred to generically as "imaging element or the like of the present disclosure"), when an inorganic oxide semiconductor material layer is represented by $In_aGa_bSn_cZn_dO_e$, $$1.8 < (b+c)/a < 2.3$$

and $$2.3 < d/a < 2.6$$

can be satisfied. Further, b>0 can be satisfied. Note that while an example of the ratio of b/c can include 1/9 to 9/1, a ratio of 1/1 is most preferable. In addition, the inorganic oxide semiconductor material layer may include other metal atoms in addition to indium (In) atoms, gallium (Ga) atoms, tin (Sn) atoms, and zinc (Zn) atoms. Besides, it is preferable that $$3.3 < e/a < 8.5$$

is satisfied.

In the imaging apparatus or the like of the present disclosure including the above-mentioned preferred mode, a photoelectric conversion section can further include an insulating layer, and a charge storage electrode that is disposed spaced from a first electrode and is disposed to face an inorganic oxide semiconductor material layer, with the insulating layer interposed therebetween.

Further, in the imaging apparatus or the like of the present disclosure including the above-described various preferred modes, a LUMO value $E_1$ of the material constituting a part of the photoelectric conversion layer located in the vicinity of the inorganic oxide semiconductor material layer and a LUMO value $E_2$ of the material constituting the inorganic oxide semiconductor material layer can satisfy preferably $$E_2 - E_1 \geq 0.1 \text{ eV, and}$$

more preferably $$E_2 - E_1 > 0.1 \text{ eV.}$$

Here, "the part of the photoelectric conversion layer located in the vicinity of the inorganic oxide semiconductor material layer" refers to the part of the photoelectric conversion layer located in a region corresponding to within 10% of the thickness of the photoelectric conversion layer (or a region within 0% to 10% of the thickness of the photoelectric conversion layer) with an interface between the inorganic oxide semiconductor material layer and the photoelectric conversion layer as a reference. The LUMO value $E_1$ of the material constituting the part of the photoelectric conversion layer located in the vicinity of the inorganic oxide semiconductor material layer is an average value of the part of the photoelectric conversion layer located in the vicinity of the inorganic oxide semiconductor material layer, and the LUMO value $E_2$ of the material constituting the inorganic oxide semiconductor material layer is an average value of the inorganic oxide semiconductor material layer.

Further, in the imaging apparatus or the like of the present disclosure including the above-described various preferred modes, the mobility of the material constituting the inorganic oxide semiconductor material layer can be equal to or more than 10 $cm^2/V \cdot s$.

Furthermore, in the imaging apparatus or the like of the present disclosure including the above-described various preferred modes, the inorganic oxide semiconductor material layer can be amorphous (for example, be amorphous and not locally having a crystalline structure). Whether or not the inorganic oxide semiconductor material layer is amorphous can be determined based on X-ray diffraction analysis.

Further, in the imaging apparatus or the like of the present disclosure including the above-described various preferred modes, the thickness of the inorganic oxide semiconductor material layer can be $1 \times 10^{-8}$ to $1.5 \times 10^{-7}$ m, preferably $2 \times 10^{-8}$ to $1.0 \times 10^{-7}$ m, and more preferably $3 \times 10^{-8}$ to $1.0 \times 10^{-7}$ m.

Furthermore, in the imaging apparatus or the like of the present disclosure including the above-described various preferred modes, light may be incident from the second electrode, and the surface roughness Ra of the inorganic oxide semiconductor material layer at the interface between the photoelectric conversion layer and the inorganic oxide semiconductor material layer can be equal to or less than 1.5 nm, and the value of root mean square roughness Rq of the inorganic oxide semiconductor material layer can be equal to or less than 2.5 nm. The surface roughnesses Ra and Rq are based on the prescription of JIS B0601:2013. Such smoothness of the inorganic oxide semiconductor material layer at the interface of the photoelectric conversion layer and the inorganic oxide semiconductor material layer makes it possible to restrain surface scattering reflection at the inorganic oxide semiconductor material layer, and to enhance light current characteristic in photoelectric conversion. The surface roughness Ra of the charge storage electrode can be equal to or less than 1.5 nm, and the value of root mean square roughness Rq of the charge storage electrode can be equal to or less than 2.5 nm.

Further, in the imaging apparatus or the like of the present disclosure including the above-described various preferred modes, the carrier density of the inorganic oxide semiconductor material layer is preferably less than $1 \times 10^{16}/cm^3$.

Figure 84:
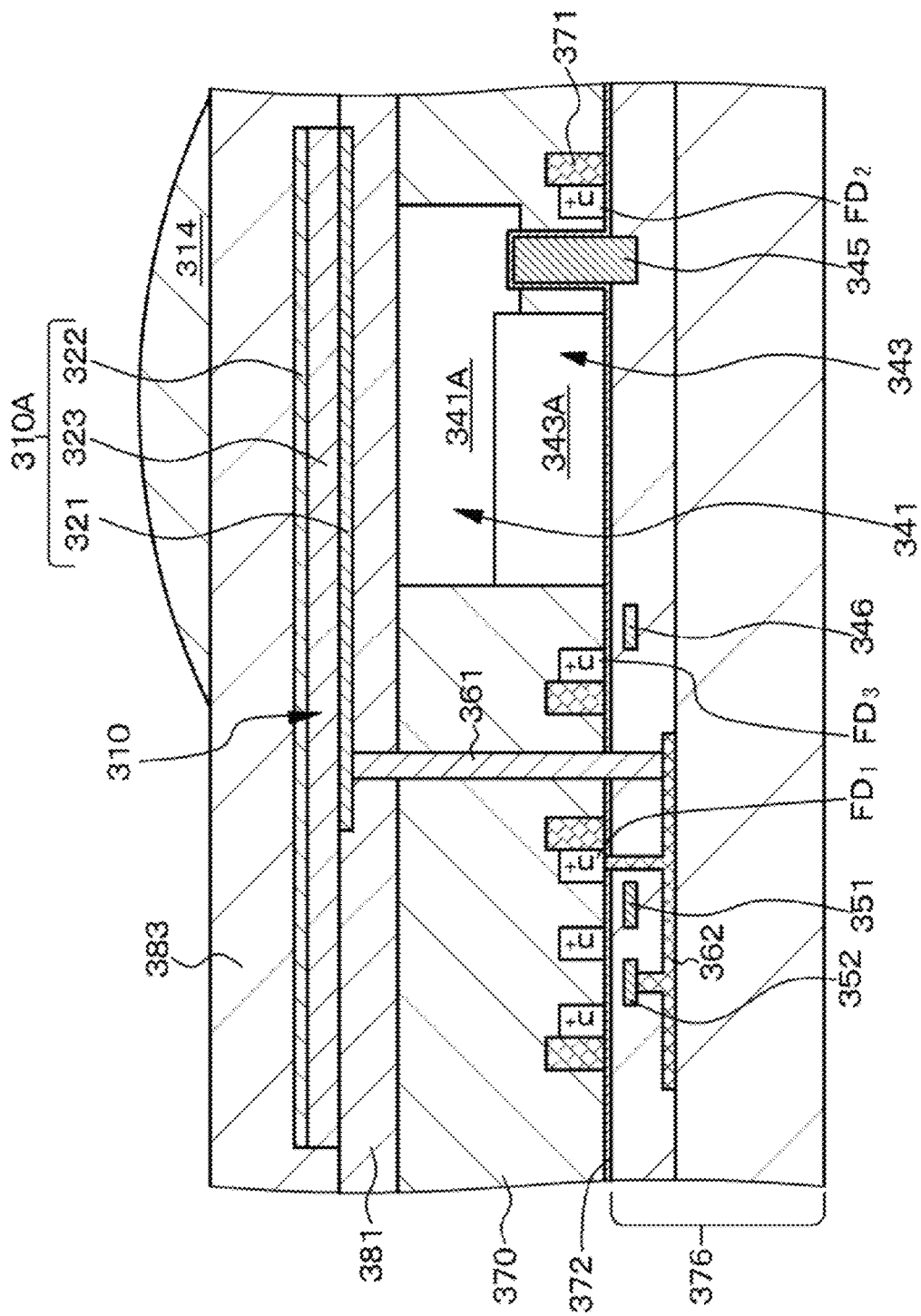
FIG. 84 is a conceptual diagram of a conventional stacked-type imaging element (stacked-type solid-state imaging apparatus).

In a conventional imaging element illustrated in FIG. 84, charges generated by photoelectric conversion in a second photoelectric conversion section 341A and a third photoelectric conversion section 343A are once stored in the second photoelectric conversion section 341A and the third photoelectric conversion section 343A, and are thereafter transferred to a second floating diffusion layer $FD_2$ and a third floating diffusion layer $FD_3$. Therefore, the second photoelectric conversion section 341A and the third photoelectric conversion section 343A can be completely depleted. However, charges generated by photoelectric conversion in a first photoelectric conversion section 310A are stored directly in a first floating diffusion layer $FD_1$. Therefore, it is difficult to completely deplete the first photoelectric conversion section 310A. As a result, kTC noise may be enlarged, and random noise may be worsened, leading to a lowering in picked-up image quality.

In the imaging apparatus or the like of the present disclosure, as aforementioned, the charge storage electrode is provided which is disposed spaced from the first electrode and is disposed to face the inorganic oxide semiconductor material layer, with the insulating layer interposed therebetween, so that it is ensured that when the photoelectric conversion section is irradiated with light and photoelectric conversion occurs in the photoelectric conversion section, charges can be stored in the inorganic oxide semiconductor material layer (in some cases, in the inorganic oxide semiconductor material layer and the photoelectric conversion layer). Therefore, when exposure is started, the charge storage section can be completely depleted, and the charges can be eliminated. As a result, a situation in which kTC noise is enlarged and random noise is worsened, leading to a lowering in picked-up image quality, can be restrained from being generated. Note that in the following description, the inorganic oxide semiconductor material layer, or the inorganic oxide semiconductor material layer and the photoelectric conversion layer, may be referred to generically as "the inorganic oxide semiconductor material layer and the like."

The inorganic oxide semiconductor material layer may have a monolayer configuration or a multilayer configuration. In addition, the material constituting the inorganic oxide semiconductor material layer located on an upper side of the charge storage electrode and the material constituting the inorganic oxide semiconductor material layer located on an upper side of the first electrode may be different from each other.

The inorganic oxide semiconductor material layer may be formed, for example, based on a sputtering method. Specifically, examples of the sputtering method include a sputtering method in which a parallel flat plate sputtering apparatus or a DC magnetron sputtering apparatus is used as a sputtering apparatus, an argon (Ar) gas is used as a process gas, and an $In_aGa_bSn_cZn_dO_e$ sintered body is used as a target.

Note that by controlling the quantity of an oxygen gas introduced (oxygen gas partial pressure) at the time of forming the inorganic oxide semiconductor material layer based on the sputtering method, the energy level of the inorganic oxide semiconductor material layer can be controlled. Specifically, it is preferable to set the oxygen gas partial pressure<=($O_2$ gas pressure)/
(total pressure of Ar gas and $O_2$ gas)> at the time of forming the inorganic oxide semiconductor material layer based on the sputtering method to a value of 0.005 to 0.10. Further, in the imaging element or the like of the present disclosure, the oxygen content of the inorganic oxide semiconductor material layer can be lower than the stoichiometric oxygen content. Here, the energy level of the inorganic oxide semiconductor material layer can be controlled based on the oxygen content, and the energy level can be made deeper as the oxygen content is lower than the stoichiometric oxygen content, namely, as oxygen deficiency is larger.

The imaging element or the like of the present disclosure which includes the above-described preferred modes and which includes the charge storage electrode may hereinafter be referred to as "the imaging element or the like including the charge storage electrode of the present disclosure," for convenience' sake.

In the imaging element or the like including the charge storage electrode of the present disclosure, the light transmittance of the inorganic oxide semiconductor material layer with respect to light of a wavelength of 400 to 660 nm is preferably equal to or more than 65%. In addition, the light transmittance of the charge storage electrode with respect to light of a wavelength of 400 to 660 nm is also preferably equal to or more than 65%. The sheet resistance of the charge storage electrode is preferably $3 \times 10$ to $1 \times 10^3 \Omega/\square$.

In the imaging element or the like including the charge storage electrode of the present disclosure, the imaging element or the like can further include a semiconductor substrate, and the photoelectric conversion section can be disposed on an upper side of the semiconductor substrate. Note that the first electrode, the charge storage electrode, and the second electrode are connected to a driving circuit which will be described later.

The second electrode located on the light incidence side may be common to a plurality of imaging elements. In other words, the second electrode may be a so-called solid electrode. The photoelectric conversion layer may be common to a plurality of imaging elements. In other words, one photoelectric conversion layer may be formed for the plurality of imaging elements, or may be provided on the basis of each imaging element. The inorganic oxide semiconductor material layer is preferably provided on the basis of each imaging element, but, in some cases, may be common to a plurality of imaging elements. In other words, for example, a charge movement control electrode which will be described later may be provided between an imaging element and another imaging element, so that one inorganic oxide semiconductor material layer may be formed for a plurality of imaging elements.

Further, in the imaging element or the like including the charge storage electrode of the present disclosure including the above-described various preferred modes, the first electrode can extend in an opening provided in the insulating layer, and can be connected to the inorganic oxide semiconductor material layer. Alternatively, the inorganic oxide semiconductor material layer can extend in the opening provided in the insulating layer, and can be connected to the first electrode. In this case, an edge portion of a top surface of the first electrode can be covered with the insulating layer, the first electrode can be exposed at a bottom surface of the opening, and let that surface of the insulating layer which makes contact with the top surface of the first electrode be a first surface, and let that surface of the insulating layer which makes contact with the part of the inorganic oxide semiconductor material layer facing the charge storage electrode be a second surface, a side surface of the opening can have such an inclination as to broaden from the first surface toward the second surface, and, further, the side surface of the opening having the inclination such as to broaden from the first surface toward the second surface can be located on the charge storage electrode side.

Furthermore, in the imaging element or the like including the charge storage electrode of the present disclosure including the above-described various preferred modes, the imaging element or the like can further include a control section which is provided on the semiconductor substrate and which has a driving circuit, the first electrode and the charge storage electrode can be connected to the driving circuit, in a charge storage period, from the driving circuit, a potential $V_{11}$ can be impressed on the first electrode, a potential $V_{12}$ can be impressed on the charge storage electrode, and charges can be stored in the inorganic oxide semiconductor material layer (or in the inorganic oxide semiconductor material layer and the photoelectric conversion layer), and in a charge transfer period, from the driving circuit, a potential $V_{21}$ can be impressed on the first electrode, a potential $V_{22}$ can be impressed on the charge storage electrode, and the charges stored in the inorganic oxide semiconductor material layer (or in the inorganic oxide semiconductor material layer and the photoelectric conversion layer) can be read out to the control section via the first electrode. It is to be noted, however, that the potential of the first electrode is higher than the potential of the second electrode, and $V_{12} \geq V_{11}$, and $V_{22} < V_{21}$ are satisfied.

Further, in the imaging element or the like including the charge storage electrode of the present disclosure including the above-described various preferred modes, the imaging element or the like can further include, between the first electrode and the charge storage electrode, a transfer control electrode (charge transfer electrode) which is disposed spaced from the first electrode and the charge storage electrode and which is disposed to face the inorganic oxide semiconductor material layer, with the insulating layer interposed therebetween. The imaging element or the like including the charge storage electrode of the present disclosure in such a mode will be referred to as "the imaging element or the like including the transfer control electrode of the present disclosure" for convenience' sake.

In the imaging element or the like including the transfer control electrode of the present disclosure, the imaging element or the like can further include a control section which is provided on the semiconductor substrate and which has the driving circuit, the first electrode, the charge storage electrode, and the transfer control electrode can be connected to the driving circuit, in a charge storage period, from the driving circuit, a potential $V_{11}$ can be impressed on the first electrode, a potential $V_{12}$ can be impressed on the charge storage electrode, a potential $V_{13}$ can be impressed on the transfer control electrode, and charges can be stored in the inorganic oxide semiconductor material layer (or in the inorganic oxide semiconductor material layer and the photoelectric conversion layer), and in a charge transfer period, from the driving circuit, a potential $V_{21}$ can be impressed on the first electrode, a potential $V_{12}$ can be impressed on the charge storage electrode, a potential $V_{13}$ can be impressed on the transfer control electrode, and the charges stored in the inorganic oxide semiconductor material layer (or in the inorganic oxide semiconductor material layer and the photoelectric conversion layer) can be read out to the control section via the first electrode. It is to be noted that the potential of the first electrode is higher than the potential of the second electrode, and $V_{11} > V_{13}$, and $V_{22} \leq V_{23} \leq V_{21}$ are satisfied.

Further, the imaging element or the like including the charge storage electrode of the present disclosure including the above-described various preferred modes may further include a charge discharge electrode which is connected to the inorganic oxide semiconductor material layer and which is disposed spaced from the first electrode and the charge storage electrode. The imaging element or the like including the charge discharge electrode of the present disclosure in such a mode will be referred to as "the imaging element or the like including the charge discharge electrode of the present disclosure" for convenience' sake. In the imaging element or the like including the charge discharge electrode of the present disclosure, the charge discharge electrode can be disposed such as to surround the first electrode and the charge storage electrode (in other words, in a picture frame form). The charge discharge electrode can be common to a plurality of imaging elements. In this case, the inorganic oxide semiconductor material layer can extend in a second opening provided in the insulating layer and can be connected to the charge discharge electrode, an edge portion of a top surface of the charge discharge electrode can be covered with the insulating layer, the charge discharge electrode can be exposed at a bottom surface of the second opening, and let that surface of the insulating layer which makes contact with the top surface of the charge discharge electrode be a third surface, and let that surface of the insulating layer which makes contact with the part of the inorganic oxide semiconductor material layer facing the charge storage electrode be a second surface, then a side surface of the second opening can have an inclination such as to broaden from the third surface toward the second surface.

Furthermore, in the imaging element or the like including the charge discharge electrode of the present disclosure, the imaging element or the like can further include the control section which is provided on the semiconductor substrate and which has the driving circuit, the first electrode, the charge storage electrode, and the charge discharge electrode can be connected to the driving circuit, in the charge storage period, from the driving circuit, the potential $V_{11}$ can be impressed on the first electrode, the potential $V_{12}$ can be impressed on the charge storage electrode, a potential $V_{14}$ can be impressed on the charge discharge electrode, and charges can be stored in the inorganic oxide semiconductor material layer (or in the inorganic oxide semiconductor material layer and the photoelectric conversion layer), and in the charge transfer period, from the driving circuit, the potential $V_{21}$ can be impressed on the first electrode, the potential $V_{21}$ can be impressed on the charge storage electrode, a potential $V_{24}$ can be impressed on the charge discharge electrode, and the charges stored in the inorganic oxide semiconductor material layer (or in the inorganic oxide semiconductor material layer and the photoelectric conversion layer) can be read out to the control section via the first electrode. It is to be noted that the potential of the first electrode is higher than the potential of the second electrode, and $V_{14} > V_{11}$, and $V_{24} < V_{21}$ are satisfied.

Furthermore, in the above-described various preferred modes of the imaging element or the like including the charge storage electrode of the present disclosure, the charge storage electrode can include a plurality of charge storage electrode segments. The imaging element or the like including the charge storage electrode of the present disclosure in such a mode will be referred to as "the imaging element or the like including the plurality of charge storage electrode segments of the present disclosure" for convenience' sake. The number of the charge storage electrode segments need only be equal to or more than two. In the imaging element or the like including the plurality of charge storage electrode segments of the present disclosure, in the case where different potentials are impressed respectively on N charge storage electrode segments, in the case where the potential of the first electrode is higher than the potential of the second electrode, the potential impressed on the charge storage electrode segment located at a nearest place to the first electrode (a first photoelectric conversion section segment) in the charge transfer period can be higher than the potential impressed on the charge storage electrode segment located at a farthest place from the first electrode (an N-th photoelectric conversion section segment), and in the case where the potential of the first electrode is lower than the potential of the second electrode, the potential impressed on the charge storage electrode segment located at the nearest place to the first electrode (the first photoelectric conversion section segment) in the charge transfer period can be lower than the potential impressed on the charge storage electrode segment located at the farthest place from the first electrode (the N-th photoelectric conversion section segment).

In the imaging element or the like including the charge storage electrode of the present disclosure including the above-described various preferred modes, the semiconductor substrate can be provided with at least a floating diffusion layer and an amplification transistor that constitute the control section, and the first electrode can be connected to the floating diffusion layer and a gate section of the amplification transistor. In this case, further, the semiconductor substrate can be provided further with a reset transistor and a select transistor that constitute the control section, the floating diffusion layer can be connected to a source/drain region on one side of the reset transistor, and a source/drain region on one side of the amplification transistor can be connected to a source/drain region on one side of the select transistor, and a source/drain region on the other side of the select transistor can be connected to a signal line.

Further, in the imaging element or the like including the charge storage electrode of the present disclosure including the above-described various preferred modes, the size of the charge storage electrode can be larger than the size of the first electrode. Let the area of the charge storage electrode be $S_1'$ and let the area of the first electrode be $S_1$, then it is preferable that $$4 \leq S_1'/S_1$$

is satisfied, though this is not limitative.

Alternatively, modifications of the imaging element or the like of the present disclosure including the above-described various preferred modes can include imaging elements of first to sixth configurations described below. In the imaging elements of the first to sixth configurations of the imaging element or the like of the present disclosure including the above-described various preferred modes, the photoelectric conversion section includes N (where N≥2) photoelectric conversion section segments, the inorganic oxide semiconductor material layer and the photoelectric conversion layer include N photoelectric conversion layer segments, the insulating layer includes N insulating layer segments, in the imaging elements of the first to third configurations, the charge storage electrode includes N charge storage electrode segments, in the imaging elements of the fourth and fifth configurations, the charge storage electrode includes N charge storage electrode segments disposed spaced from one another, an n-th (where n=1, 2, 3 . . . N) photoelectric conversion section segment includes an n-th charge storage electrode segment, an n-th insulating layer segment, and an n-th photoelectric conversion layer segment, and the photoelectric conversion section segment with a larger n value is located spaced more from the first electrode. Here, "the photoelectric conversion layer segment" refers to a segment in which the photoelectric conversion layer and the inorganic oxide semiconductor material layer are stacked.

In the imaging element of the first configuration, the thickness of the insulating layer segment varies gradually over a range from the first photoelectric conversion section segment to the N-th photoelectric conversion section segment. In the imaging element of the second configuration, the thickness of the photoelectric conversion layer segment varies gradually over a range from the first photoelectric conversion section segment to the N-th photoelectric conversion section segment. Note that in the photoelectric conversion layer segments, the thickness of the photoelectric conversion layer segment may be varied, with the thickness of the part of the photoelectric conversion layer being varied and with the thickness of the part of the inorganic oxide semiconductor material layer being constant, the thickness of the photoelectric conversion layer segment may be varied, with the thickness of the part of the photoelectric conversion layer being constant and with the thickness of the part of the inorganic oxide semiconductor material layer being varied, or the thickness of the photoelectric conversion layer segment may be varied, with the thickness of the part of the photoelectric conversion layer being varied and with the thickness of the part of the inorganic oxide semiconductor material layer being varied. Further, in the imaging element of the third configuration, the material constituting the insulating layer segment differs between adjacent photoelectric conversion section segments. In addition, in the imaging element of the fourth configuration, the material constituting the charge storage electrode segment differs between adjacent photoelectric conversion section segments. Further, in the imaging element of the fifth configuration, the area of the charge storage electrode segment is reduced gradually over a range from the first photoelectric conversion section segment to the N-th photoelectric conversion section segment. The area may be reduced continuously, or may be reduced stepwise.

Alternatively, in the imaging element of the sixth configuration of the imaging element or the like of the present disclosure including the above-described various preferred modes, let the stacking direction of the charge storage electrode, the insulating layer, the inorganic oxide semiconductor material layer, and the photoelectric conversion layer be a Z direction, and let the direction for spacing away from the first electrode be an X direction, then the sectional area of a stacked part of the charge storage electrode, the insulating layer, the inorganic oxide semiconductor material layer, and the photoelectric conversion layer when the stacked part is cut in a YZ virtual plane varies depending on the distance from the first electrode. The sectional area may vary continuously, or may vary stepwise.

In the imaging element of the first and second configurations, the N photoelectric conversion layer segments are provided continuously, the N insulating layer segments are also provided continuously, and the N charge storage electrode segments are also provided continuously. In the imaging element of the third to fifth configurations, the N photoelectric conversion layer segments are provided continuously. In addition, in the imaging element of the fourth and fifth configurations, the N insulating layer segments are provided continuously whereas, in the imaging element of the third configuration, the N insulating layer segments are provided correspondingly to the respective photoelectric conversion section segments. Further, in the imaging element of the fourth and fifth configurations, and in some cases in the imaging element of the third configuration, the N charge storage electrode segments are provided correspondingly to the respective photoelectric conversion section segments. In the imaging element of the first to sixth configurations, the same potential is impressed on all the charge storage electrode segments. Alternatively, in the imaging element of the fourth and fifth configurations, and in some cases in the imaging element of the third configuration, different potentials may be impressed on each of the N charge storage electrode segments.

In the imaging element or the like of the present disclosure including the imaging elements of the first to sixth configurations, the thickness of the insulating layer segment is prescribed, or the thickness of the photoelectric conversion layer segment is prescribed, or the materials constituting the insulating layer segments are different, or the materials constituting the charge storage electrode segments are different, or the area of the charge storage electrode segment is prescribed, or the sectional area of the stacked part is prescribed, and, therefore, a kind of charge transfer gradient is formed, and the charges generated by photoelectric conversion can be transferred to the first electrode more easily and securely. As a result, generation of after-images and generation of leaving untransferred charges can be prevented.

In the imaging element or the like of the first to fifth configurations, the photoelectric conversion section segment with a larger n value is located spaced more from the first electrode; in this case, whether or not a segment is located spaced from the first electrode is decided with the X direction as a reference. In addition, in the imaging element of the sixth configuration, the direction for spacing away from the first electrode is set as the X direction, and "the X direction" is defined as follows. A pixel region in which a plurality of imaging elements or stacked-type imaging elements is arranged includes a plurality of pixels arranged in a two-dimensional array, or arranged regularly in the X direction and the Y direction. In the case where the pixel is rectangular in plan-view shape, the direction in which a rectangle's side the nearest to the first electrode extends is made to be the Y direction, and the direction orthogonal to the Y direction is made to be the X direction. Alternatively, in the case where the pixel has an arbitrary shape as a plan-view shape, the general direction in which a line segment or a curve the nearest to the first electrode is included is made to be the Y direction, and the direction orthogonal to the Y direction is made to be the X direction.

In regard of the imaging elements of the first to sixth configurations, a case where the potential of the first electrode is higher than the potential of the second electrode will be described below.

In the imaging element of the first configuration, the thickness of the insulating layer segment varies gradually over a range from the first photoelectric conversion section segment to the N-th photoelectric conversion section segment; in this case, the thickness of the insulating layer segment preferably increases gradually, and, as a result of this, a kind of charge transfer gradient is formed. When a state of $|V_{12}| \geq |V_{11}|$ is established in the charge storage period, the n-th photoelectric conversion section segment can store more charges than the (n+1)th photoelectric conversion section segment, and a strong electric field is applied, so that a flow of charges from the first photoelectric conversion section segment to the first electrode can be prevented assuredly. In addition, when a state of $|V_{22}| < |V_{21}|$ is established in the charge transfer period, a flow of charges from the first photoelectric conversion section segment to the first electrode, and a flow of charges from the (n+1)th photoelectric conversion section segment to the n-th photoelectric conversion section segment can be secured assuredly.

In the imaging element of the second configuration, the thickness of the photoelectric conversion layer segment varies gradually over a range from the first photoelectric conversion section segment to the N-th photoelectric conversion section segment; in this case, the thickness of the photoelectric conversion layer segment preferably increases gradually, and, as a result of this, a kind of charge transfer gradient is formed. When a state of $V_{12} \geq V_{11}$ is established in the charge storage period, a stronger electric field is impressed on the n-th photoelectric conversion section segment than on the (n+1)th photoelectric conversion section segment, so that a flow of charges from the first photoelectric conversion section segment to the first electrode can be prevented securely. When a state of $V_{22} < V_{21}$ is established in the charge transfer period, a flow of charges from the first photoelectric conversion section segment to the first electrode, and a flow of charges from the (n+1)th photoelectric conversion section segment to the n-th photoelectric conversion section segment can be secured assuredly.

In the imaging element of the third configuration, the material constituting the insulating layer segment differs between adjacent photoelectric conversion section segments, so that a kind of charge transfer gradient is formed. In this case, it is preferable that the value of relative dielectric constant of the material constituting the insulating layer segment is reduced gradually over a range from the first photoelectric conversion section segment to the N-th photoelectric conversion section segment. With such a configuration adopted, when a state of $V_{12} \geq V_{11}$ is established in the charge storage period, more charges can be stored in the n-th photoelectric conversion section segment than in the (n+1)th photoelectric conversion section segment. In addition, when a state of $V_{22} < V_{21}$ is established in the charge transfer period, a flow of charges from the first photoelectric conversion section segment to the first electrode, and a flow of charges from the (n+1)th photoelectric conversion section segment to the n-th photoelectric conversion section segment can be secured assuredly.

In the imaging element of the fourth configuration, the material constituting the charge storage electrode segment differs between adjacent photoelectric conversion section segments, and, as a result of this, a kind of charge transfer gradient is formed. In this case, it is preferable that the value of work function of the material constituting the insulating layer segment is enlarged gradually over a range from the first photoelectric conversion section segment to the N-th photoelectric conversion section segment. With such a configuration adopted, a potential gradient advantageous for signal charge transfer can be formed, without depending on whether the voltage is positive or negative.

In the imaging element of the fifth configuration, the area of the charge storage electrode segment is reduced gradually over a range from the first photoelectric conversion section segment to the N-th photoelectric conversion section segment, and, as a result of this, a kind of charge transfer gradient is formed. When a state of $V_{12} \geq V_{11}$ is established in the charge storage period, therefore, more charge can be stored in the n-th photoelectric conversion section segment than in the (n+1)th photoelectric conversion section segment. In addition, when a state of $V_{22} < V_{21}$ is established in the charge transfer period, a flow of charges from the first photoelectric conversion section segment to the first electrode, and a flow of charges from the (n+1)th photoelectric conversion section segment to the n-th photoelectric conversion section segment can be secured assuredly.

In the imaging element of the sixth configuration, the sectional area of the stacked part varies depending on the distance from the first electrode, and, as a result of this, a kind of charge transfer gradient is formed. Specifically, when a configuration is adopted in which the thickness of the section of the stacked part is constant and the width of the section of the stacked part is narrower in going away from the first electrode, it is ensured, like described in the imaging element of the fifth configuration, that when a state of $V_{12} \geq V_{11}$ is established in the charge storage period, more charges can be stored in a region near to the first electrode than in a region far from the first electrode. When a state of $V_{22} < V_{21}$ is established in the charge transfer period, therefore, a flow of charges from the region near the first electrode to the first electrode, and a flow of charges from the region far from the first electrode to the region near the first electrode can be secured assuredly. On the other hand, when a configuration is adopted in which the width of the section of the stacked part is constant and the thickness of the section of the stacked part, specifically, the thickness of the insulating layer segment is gradually enlarged, it is ensured, like described in the imaging element of the first configuration, that when a state of $V_{12} \geq V_{11}$ is established in the charge storage period, more charges can be stored in a region near the first electrode than in a region far from the first region, and a strong electric field is applied, so that a flow of charges from the region near the first electrode to the first electrode can be prevented securely. When a state of $V_{22} < V_{21}$ is established in the charge transfer period, a flow of charges from the region near the first electrode to the first electrode, and a flow of charges from the region far from the first electrode to the region near the first electrode can be secured assuredly. In addition, when a configuration in which the thickness of the photoelectric conversion layer segment is gradually enlarged is adopted, it is ensured, like described in the imaging element of the second configuration, that when a state of $V_{12} \geq V_{11}$ is established in the charge storage period, a stronger electric field is applied to a region near the first electrode than to a region far from the first electrode, so that a flow of charges from the region near the first electrode to the first electrode can be prevented securely. When a state of $V_{22} < V_{21}$ is established in the charge transfer period, a flow of charges from the region near the first electrode to the first electrode, and a flow of charges from the region far from the first electrode to the region near the first electrode can be secured assuredly.

A modification of the solid-state imaging apparatuses of the first and second modes of the present disclosure is a solid-state imaging apparatus including a plurality of the imaging elements of the first to sixth configurations, in which the plurality of imaging elements constitutes an imaging element block, and a first electrode is shared by the plurality of imaging elements constituting the imaging element block. The solid-state imaging apparatus of such a configuration will be referred to as "the solid-state imaging apparatus of the first configuration" for convenience' sake. Alternatively, a modification of the solid-state imaging apparatuses of the first and second modes of the present disclosure may be a solid-state imaging apparatus including a plurality of the imaging elements of the first to sixth configuration or a plurality of stacked-type imaging elements having at least one of the imaging elements of the first to sixth configurations, in which the plurality of imaging elements or stacked-type imaging elements constitutes an imaging element block, and a first electrode is shared by the plurality of imaging elements or stacked-type imaging elements constituting the imaging element block. The solid-state imaging apparatus of such a configuration will be referred to as "the solid-state imaging apparatus of the second configuration" for convenience' sake. When the first electrode is thus shared by the plurality of imaging elements constituting the imaging element block, the configuration and structure of a pixel region in which a plurality of the imaging elements is arranged can be simplified and made finer.

In the solid-state imaging apparatuses of the first and second configurations, one floating diffusion layer is provided for a plurality of imaging elements (one imaging element block). Here, the plurality of imaging elements provided for one floating diffusion layer may include a plurality of the imaging elements of a first type described later, or may include at least one imaging element of the first type and one or more imaging elements of a second type described later. By suitably controlling the timing of the charge transfer period, the plurality of imaging elements can share one floating diffusion layer. The plurality of imaging elements is operated in conjunction with one another, and they are connected as an imaging element block to the driving circuit which will be described later. In other words, the plurality of imaging elements constituting the imaging element block is connected to one driving circuit. It is to be noted, however, that the control of the charge storage electrode is conducted on the basis of each imaging element. In addition, the plurality of imaging elements can share one contact hole section. The layout relation between the first electrode shared by the plurality of imaging elements and the charge storage electrode for each imaging element may be one in which the first electrode is disposed adjacently to the charge storage electrode of each imaging element. Alternatively, the first electrode may be disposed adjacently to the charge storage electrodes of some of the plurality of imaging elements but may not be disposed adjacently to the charge storage electrodes of the remaining ones of the plurality of imaging elements; in this case, the movement of charges from the remaining ones of the plurality of imaging elements to the first electrode is a movement via some of the plurality of imaging elements. It is preferable that the distance between a charge storage electrode constituting the imaging element and another charge storage electrode constituting the imaging element (this distance will be referred to as "distance A" for convenience' sake) is longer than the distance between the first electrode and the charge storage electrode in the imaging element adjacent to the first electrode (this distance will be referred to as "distance B" for convenience' sake), for ensuring the movement of charges from each imaging element to the first electrode. In addition, it is preferable to set the value of the distance A larger as the imaging element is located more spaced from the first electrode.

Further, in the imaging element or the like of the present disclosure including the above-described various preferred modes, light can be incident from the second electrode side, and a light shielding layer may be formed on the light incidence side near the second electrode. Alternatively, light can be incident from the second electrode side, but light may not be incident on the first electrode (in some cases, on the first electrode and the transfer control electrode). In this case, the light shielding layer can be formed on the light incidence side near the second electrode and on an upper side of the first electrode (in some cases, on an upper side of the first electrode and the transfer control electrode), or an on-chip microlens can be provided on an upper side of the charge storage electrode and the second electrode, and the light incident on the on-chip microlens can be concentrated onto the charge storage electrode. Here, the light shielding layer may be disposed above a light incidence side surface of the second electrode, or may be disposed on the light incidence side surface of the second electrode. In some cases, the second electrode may be formed with the light shielding layer. Examples of the material constituting the light shielding layer include chromium (Cr), copper (Cu), aluminum (Al), tungsten (W), and non-light-transmitting resins (for example, polyimide resin).

Specific examples of the imaging elements of the present disclosure include an imaging element having sensitivity to blue light (referred to as "the blue light imaging element of the first type" for convenience' sake) including a photoelectric conversion layer or a photoelectric conversion section that absorbs blue light (light of 425 to 495 nm) (referred to as "the blue light photoelectric conversion layer of the first type" or "the blue light photoelectric conversion section of the first type" for convenience' sake), an imaging element having sensitivity to green light (referred to as "the green light imaging element of the first type" for convenience' sake) including a photoelectric conversion layer or a photoelectric conversion section that absorbs green light (light of 495 to 570 nm) (referred to as "the green light photoelectric conversion layer of the first type" or "the green light photoelectric conversion section of the first type"), and an imaging element having sensitivity to red light (referred to as "the red light imaging element of the first type" for convenience' sake) including a photoelectric conversion layer or a photoelectric conversion section that absorbs red light (light of 620 to 750 nm) (referred to as "the red light photoelectric conversion layer of the first type" or "the red light photoelectric conversion section of the first type" for convenience' sake). In addition, of conventional imaging elements not including a charge storage electrode, the imaging element having sensitivity to blue light is referred to as "the blue light imaging element of the second type" for convenience' sake, the imaging element having sensitivity to green light is referred to as "the green light imaging element of the second type" for convenience' sake, and the imaging element having sensitivity to red light is referred to as "the red light imaging element of the second type" for convenience' sake. The photoelectric conversion layer or the photoelectric conversion section that constitutes the blue light imaging element of the second type is referred to as "the blue light photoelectric conversion layer of the second type" or "the blue light photoelectric conversion section of the second type" for convenience' sake, the photoelectric conversion layer or the photoelectric conversion section that constitutes the green light imaging element of the second type is referred to as "the green light photoelectric conversion layer of the second type" or "the green light photoelectric conversion section of the second type" for convenience' sake, and the photoelectric conversion layer or the photoelectric conversion section that constitutes the red light imaging element of the second type is referred to as "the red light photoelectric conversion layer of the second type" or "the red light photoelectric conversion section of the second type" for convenience' sake.

Specific examples of the stacked-type imaging element including the charge storage electrode include:

[A] a configuration or structure in which the blue light photoelectric conversion section of the first type, the green light photoelectric conversion section of the first type, and the red light photoelectric conversion section of the first type are stacked in the vertical direction, and respective control sections of the blue light imaging element of the first type, the green light imaging element of the first type, and the red light imaging element of the first type are provided on the semiconductor substrate;

[B] a configuration or structure in which the blue light photoelectric conversion section of the first type and the green light photoelectric conversion section of the first type are stacked in the vertical direction, the red light photoelectric conversion section of the second type is disposed on a lower side of these two photoelectric conversion sections of the first type, and respective control sections of the blue light imaging element of the first type, the green light imaging element of the first type, and the red light imaging element of the second type are provided on the semiconductor substrate;

[C] a configuration or structure in which the blue light photoelectric conversion section of the second type and the red light photoelectric conversion section of the second type are disposed on a lower side of the green light photoelectric conversion section of the first type, and respective control sections of the green light imaging element of the first type, the blue light imaging element of the second type, and the red light imaging element of the second type are provided on the semiconductor substrate; and

[D] a configuration or structure in which the green light photoelectric conversion section of the second type and the red light photoelectric conversion section of the second type are disposed on a lower side of the blue light photoelectric conversion section of the first type, and respective control sections of the blue light imaging element of the first type, the green light imaging element of the second type, and the red light imaging element of the second type are provided on the semiconductor substrate.

The disposing order of the photoelectric conversion sections of these imaging elements in the vertical direction is preferably the blue light photoelectric conversion section, the green light photoelectric conversion section, and the red light photoelectric conversion section from the light incidence direction, or the green light photoelectric conversion section, the blue light photoelectric conversion section, and the red light photoelectric conversion section from the light incidence direction. This is because light of a shorter wavelength is absorbed more efficiently on the incidence surface side. Since the red light is the longest in wavelength of the three color lights, it is preferable to locate the red light photoelectric conversion section at the lowermost layer as viewed from the light incidence surface. By a stacked layer structure of these imaging elements, one pixel is configured. In addition, a near infrared light photoelectric conversion section (or an infrared light photoelectric conversion section) of the first type may be provided. Here, it is preferable that a photoelectric conversion layer of the infrared light photoelectric conversion section of the first type includes, for example, an organic material, is a lowermost layer in the stacked layer structure of the imaging element of the first type, and is disposed above the imaging element of the second type. Alternatively, a near infrared light photoelectric conversion section (or an infrared light photoelectric conversion section) of the second type may be provided on a lower side of the photoelectric conversion sections of the first type.

In the imaging element of the first type, for example, the first electrode is formed on an interlayer insulating layer provided on the semiconductor substrate. The imaging element formed on the semiconductor substrate may be of a back side illumination type or a front side illumination type.

In the case where the photoelectric conversion layer includes an organic material, the photoelectric conversion layer may be in any of the following four modes:

(1) Includes a p-type organic semiconductor;
(2) Includes an n-type organic semiconductor;
(3) Includes a stacked layer structure of p-type organic semiconductor layer/n-type organic semiconductor layer. Includes a stacked layer structure of p-type organic semiconductor layer/mixed layer (bulk hetero structure) of p-type organic semiconductor and n-type organic semiconductor/n-type organic semiconductor layer. Includes a stacked layer structure of p-type organic semiconductor layer/mixed layer (bulk hetero structure) of p-type organic semiconductor and n-type organic semiconductor. Includes a stacked layer structure of n-type organic semiconductor layer/mixed layer (bulk hetero structure) of p-type organic semiconductor and n-type organic semiconductor; and
(4) Includes a mixture (bulk hetero structure) of p-type organic semiconductor and n-type organic semiconductor.

It is to be noted, however, that the stacking order may be rearranged (modified) arbitrarily.

Examples of the p-type organic semiconductor include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having a heterocyclic compound as a ligand, polythiophene derivatives, polybenzothiazole derivatives, polyfluorene derivatives, etc. Examples of the n-type organic semiconductor include fullerenes and fullerene derivatives <e.g., fullerenes (higher fullerenes) such as C60, C70, and C74 fullerenes or the like, endohedral fullerene or the like) or fullerene derivatives (e.g., fullerene fluoride, PCBM fullerene compound, fullerene polymer, etc.)>, organic semiconductors with larger (deeper) HOMO and LUMO than those of p-type organic semiconductors, and transparent inorganic metal oxides. Specific examples of the n-type organic semiconductor include heterocyclic compounds containing a nitrogen atom, an oxygen atom, and a sulfur atom, for example, organic molecules and organometallic complexes having pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives or the like at a part of the molecular skeleton, and subphthalocyanine derivatives. Examples of a group or the like included in fullerene derivatives include a halogen atom; a linear, branched, or cyclic alkyl group or phenyl group; a group having a linear or condensed aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having chalcogenide; a phosphine group; a phosphonic group; and derivatives thereof. The thickness of the photoelectric conversion layer (may be referred to as "the organic photoelectric conversion layer") including an organic material may be, without being limited to, $1 \times 10^{-8}$ to $5 \times 10^{-7}$ m, preferably $2.5 \times 10^{-8}$ to $3 \times 10^{-7}$ m, more preferably $2.5 \times 10^{-8}$ to $2 \times 10^{-7}$ m, and still more preferably $1 \times 10^{-7}$ to $1.8 \times 10^{-7}$ m. Note that while organic semiconductors are often classified as p-type or n-type, p-type means that holes can be easily transported, and n-type means that electrons can be easily transported, and an organic semiconductor is not limited to the interpretation that it has holes or electrons as majority carriers of thermal excitation as in inorganic semiconductors.

Alternatively, examples of the material constituting an organic photoelectric conversion layer that photoelectrically converts green light include rhodamine-based coloring matter, melacyanine-based coloring matter, quinacridone derivative, subphthalocyanine-based coloring matter (subphthalocyanine derivative), etc. Examples of the material constituting an organic photoelectric conversion layer that photoelectrically converts blue light include coumarinic acid coloring matter, tris-8-hydroxyquinolinato aluminum (Alq3), melacyanine-based coloring matter, etc. Examples of the material constituting an organic photoelectric conversion layer that photoelectrically converts red light include phthalocyanine-based coloring matter and subphthalocyanine-based coloring matter (subphthalocyanine derivative), etc.

Alternatively, examples of the inorganic material constituting the photoelectric conversion layer include crystalline silicon, amorphous silicon, microcrystalline silicon, crystalline selenium, amorphous selenium, chalcopyrite compounds such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, AgInSe$_2$, group III-V compounds such as GaAs, InP, AlGaAs, InGaP, AlGaInP, InGaAsP, and compound semiconductors such as CdSe, CdS, In$_2$Se$_3$, In$_2$S$_3$, Bi$_2$Se$_3$, Bi$_2$S$_3$, ZnSe, ZnS, PbSe, PbS, etc. In addition, quantum dots including these materials may be used in the photoelectric conversion layer.

By use of the solid-state imaging apparatuses of the first and second modes of the present disclosure or the solid-state imaging apparatuses of the first and second configurations, a single plate type color solid-state imaging apparatus can be configured.

In the solid-state imaging apparatus according to the second mode of the present disclosure including the stacked-type imaging element, unlike the solid-state imaging apparatus including the Bayer-array imaging element (namely, spectroscopy for blue, green, and red is not performed using a color filter), imaging elements having sensitivity to light of plural types of wavelengths are stacked in the light incidence direction in the same pixel to form one pixel, and, therefore, improvement of sensitivity and pixel density per unit volume can be achieved. In addition, since an organic material has a high absorption coefficient, the film thickness of a photoelectric conversion layer can be thin as compared to a conventional Si-based photoelectric conversion layer, and light leakage from adjacent pixels and restriction on the light incidence angle can be alleviated. Further, since the conventional Si-based imaging element produces color signals by performing interpolation processing among three-color pixels, false color is generated, but false color can be suppressed in the solid-state imaging apparatus according to the second mode of the present disclosure including the stacked-type imaging element. Since the organic photoelectric conversion layer itself functions also as a color filter layer, color separation can be performed without disposing a color filter layer.

On the other hand, in the solid-state imaging apparatus according to the first mode of the present disclosure, a color filter layer is used, so that the request for spectral characteristics of blue, green, and red can be alleviated, and mass productivity is high. Examples of the arrangement of the imaging elements in the solid-state imaging apparatus according to the first mode of the present disclosure include an interline arrangement, a G stripe-RB checkered array, a G stripe-RB full-checkered array, a checkered complementary color array, a stripe array, a diagonal stripe array, a primary color difference array, a field color difference sequential array, a frame color difference sequential array, an MOS-type array, a modified MOS-type array, a frame interleave array, and a field interleave array in addition to a Bayer array. Here, one pixel (or sub-pixel) includes one imaging element.

Examples of the color filter layer (wavelength selecting means) include filter layers that transmit specific wavelengths of not only red, green, and blue, but also, in some cases, cyan, magenta, yellow, or the like. The color filter layers may include not only organic material color filter layers using organic compounds such as pigments and dyes, but also thin films of inorganic materials such as a photonic crystal, a wavelength selecting element based on application of plasmon (a color filter layer having a conductor lattice structure in which a conductor thin film is provided with a lattice shaped hole structure; see, for example, JP 2008-177191A), amorphous silicon, etc.

The pixel region in which a plurality of imaging elements of the present disclosure is arranged includes a plurality of pixels arranged regularly in a two-dimensional array. Normally, the pixel region includes an effective pixel region that actually receives light, amplifies a signal charge generated by photoelectric conversion, and reads the amplified signal charge out to a driving circuit, and a black reference pixel region (also called optical black pixel region (OPB)) for outputting optical black to be a reference of black level. Normally, the black reference pixel region is disposed in the periphery of the effective pixel region.

In the imaging element or the like of the present disclosure including the above-described various preferred modes, irradiation with light is performed, photoelectric conversion is generated in the photoelectric conversion layer, and holes and electrons are subjected to carrier separation. An electrode where the holes are taken out is made to be an anode, and an electrode where the electrons are taken out is made to be a cathode. The first electrode constitutes the cathode, and the second electrode constitutes the anode.

The first electrode, the charge storage electrode, the transfer control electrode, the charge discharge electrode, and the second electrode may include a transparent conductive material. The first electrode, the charge storage electrode, the transfer control electrode, and the charge discharge electrode may be referred to generically as "the first electrode or the like." Alternatively, in the case where the imaging element or the like of the present disclosure is arranged on a plane, for example, as in a Bayer array, the second electrode may include a transparent conductive material and the first electrode or the like may include a metallic material. In this case, specifically, the second electrode located on the light incidence side can include a transparent conductive material, and the first electrode or the like can include Al—Nd (alloy of aluminum and neodymium) or ASC (alloy of aluminum, samarium, and copper). An electrode including a transparent conductive material may be referred to as a "transparent electrode." Here, the band gap energy of the transparent conductive material is equal to or more than 2.5 eV, preferably equal to or more than 3.1 eV. Examples of the transparent conductive material constituting the transparent electrode include conductive metallic oxides, and specific examples thereof include indium oxide, indium tin oxide (ITO including Sn-doped $In_2O_3$, crystalline ITO, and amorphous ITO), indium zinc oxide (IZO) in which indium is added to zinc oxide as a dopant, indium gallium oxide (IGO) in which indium is added to gallium oxide as a dopant, indium gallium zinc oxide (IGZO, In—$GaZnO_4$) in which indium and gallium are added to zinc oxide as a dopant, indium tin zinc oxide (ITZO) in which indium and tin are added to zinc oxide as a dopant, IFO (F-doped $In_2O_3$), tin oxide ($SnO_2$), ATO (Sb-doped $SnO_2$), FTO (F-doped $SnO_2$), zinc oxide (including ZnO doped with other elements), aluminum zinc oxide (AZO) in which aluminum is added to zinc oxide as a dopant, gallium zinc oxide (GZO) in which gallium is added to zinc oxide as a dopant, titanium oxide ($TiO_2$), niobium titanium oxide (TNO) in which niobium is added to titanium oxide as a dopant, antimony oxide, spinel type oxide, an oxide having a $YbFe_2O_4$ structure. Alternatively, a transparent electrode having a base layer of gallium oxide, titanium oxide, niobium oxide, nickel oxide, or the like may be mentioned as an example. The thickness of the transparent electrode may be $2\times10^{-8}$ to $2\times10^{-7}$ m, preferably $3\times10^{-8}$ to $1\times10^{-7}$ m. In the case where transparency is necessary for the first electrode, it is preferable that the charge discharge electrode also include a transparent conductive material from the viewpoint of simplifying the manufacturing process.

Alternatively, in the case where transparency is unnecessary, a conductive material for constituting the cathode having a function as an electrode where electrons are taken out preferably includes a conductive material having a low work function (for example, $\varphi=3.5$ to $4.5$ eV), and specific examples of the conductive material include alkali metals (e.g., Li, Na, K, etc.) and fluorides or oxides thereof, alkaline earth metals (e.g., Mg, Ca, etc.) and fluorides or oxides thereof, aluminum (Al), zinc (Zn), tin (Sn), thallium (Tl), sodium-potassium alloys, aluminum-lithium alloys, magnesium-silver alloys, indium, rare earth metals such as ytterbium, and alloys thereof. Alternatively, examples of the material for constituting the cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), alloys containing these metallic elements, conductive particles of these metals, conductive particles of alloys containing these metals, polysilicon containing impurities, carbonaceous materials, oxide semiconductor materials, and conductive materials such as carbon nanotube and graphene, and stacked structures of layers containing these elements. Further, examples of the material for constituting the cathode include organic materials (conductive polymers) such as poly(3,4-ethylenedioxythiophene)/polystyrenesulfonic acid [PEDOT/PSS]. In addition, a paste or ink prepared by mixing these conductive materials with a binder (polymer) may be cured, and the cured product may be used as an electrode.

A dry method or wet method may be used as a film-forming method for the first electrode or the like (anode) and the second electrode (cathode). Examples of the dry method include a physical vapor deposition method (PVD method) and a chemical vapor deposition method (CVD method). Examples of the film-forming method using the principle of PVD method include a vacuum evaporation method using resistance heating or high frequency heating, an EB (electron beam) evaporation method, various sputtering methods (magnetron sputtering method, RF-DC coupled bias sputtering method, ECR sputtering method, facing-target sputtering method, and high frequency sputtering method), an ion plating method, a laser ablation method, a molecular beam epitaxy method, and a laser transfer method. In addition, examples of the CVD method include a plasma CVD method, a thermal CVD method, an organic metal (MO) CVD method, and a photo CVD method. On the other hand, examples of the wet method include an electrolytic plating method and an electroless plating method, a spin coating method, an ink jet method, a spray coating method, a stamping method, a micro contact printing method, a flexographic printing method, an offset printing method, a gravure printing method, a dipping method, etc. Examples of a patterning method include chemical etching such as shadow mask, laser transfer, photolithography, and the like, physical etching by ultraviolet light, laser, and the like. Examples of a planarization technique for the first electrode or the like and the second electrode include a laser planarization method, a reflow method, a CMP (Chemical Mechanical Polishing) method, etc.

Examples of the material for constituting the insulating layer include inorganic insulating materials exemplified by silicon oxide-based materials; silicon nitride ($SiN_y$); metal oxide high dielectric constant insulating materials such as aluminum oxide ($Al_2O_3$), as well as organic insulating materials (organic polymers) exemplified by polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), octadecyltrichlorosilane (OTS) or the like; novolac-type phenolic resins; fluoro resins;

straight-chain hydrocarbons having a functional group capable of bonding to the control electrode at one end such as octadecanethiol, dodecyl isocyanate and the like, and combinations thereof. Examples of the silicon oxide-based materials include silicon oxide ($SiO_x$), BPSG, PSG, BSG, AsSG, PbSG, silicon oxynitride (SiON), SOG (spin-on-glass), and low dielectric constant insulating materials (e.g., polyaryl ether, cycloperfluorocarbon polymers and benzocyclobutene, cyclic fluoro resins, polytetrafluoroethylene, fluoroaryl ether, fluorinated polyimide, amorphous carbon, and organic SOG). The insulating layer may have a monolayer configuration, or a plurality of layers (e.g., two layers) may be stacked. In the latter case, it is sufficient if an insulating layer lower layer is formed at least on the charge storage electrode and in a region between the charge storage electrode and the first electrode and, by subjecting the insulating layer lower layer to a planarization treatment, the insulating layer lower layer is left at least in the region between the charge storage electrode and the first electrode, and an insulating layer upper layer is formed on the thus left insulating layer lower layer and the charge storage electrode. By this, planarization of the insulating layers can be achieved securely. It is sufficient if materials constituting various interlayer insulating layers and insulating material films are also suitably selected from these materials.

The configuration and structure of the floating diffusion layer, amplification transistor, reset transistor, and select transistor constituting the control section can be similar to the configuration and structure of the conventional floating diffusion layer, amplification transistor, reset transistor, and select transistor. Also, the driving circuit can have a known configuration and structure.

The first electrode is connected to the floating diffusion layer and the gate section of the amplification transistor, and it is sufficient if a contact hole section is formed to connect the first electrode to the floating diffusion layer and the gate section of the amplification transistor. Examples of the material for constituting the contact hole section include an impurity-doped polysilicon, a high melting point metal or metal silicide such as tungsten, Ti, Pt, Pd, Cu, TiW, TiN, TiNW, $WSi_2$, $MoSi_2$, or the like, and a stacked structure of layers of these materials (e.g., Ti/TiN/W).

A first carrier blocking layer may be provided between the inorganic oxide semiconductor material layer and the first electrode, or a second carrier blocking layer may be provided between the organic photoelectric conversion layer and the second electrode. In addition, a first charge injection layer may be provided between the first carrier blocking layer and the first electrode, or a second charge injection layer may be provided between the second carrier blocking layer and the second electrode. Examples of the material for constituting the electron injection layer include alkali metals such as lithium (Li), sodium (Na), and potassium (K), fluorides and oxides thereof, alkaline earth metals such as magnesium (Mg) and calcium (Ca), fluorides and oxides thereof.

Examples of a film-forming method for various organic layers include a dry film forming method and a wet film forming method. Examples of the dry film forming method include a vacuum deposition method using resistance heating, high frequency heating, or electron beam heating, a flash deposition method, a plasma deposition method, an EB deposition method, various sputtering methods (bipolar sputtering method, direct current sputtering method, direct current magnetron sputtering method, high frequency sputtering method, magnetron sputtering method, RF-DC coupled bias sputtering method, ECR sputtering method, facing-target sputtering method, high frequency sputtering method, and ion beam sputtering method), a DC (Direct Current) method, an RF method, a multi-cathode method, an activation reaction method, an electric field vapor deposition method, various ion plating methods such as a high-frequency ion plating method and a reactive ion plating method, a laser ablation method, a molecular beam epitaxy method, a laser transfer method, and a molecular beam epitaxy (MBE) method. In addition, examples of a CVD method include a plasma CVD method, a thermal CVD method, an MOCVD method, and a photo CVD method. On the other hand, examples of the wet method include a spin coating method; a dipping method; a casting method; a micro contact printing method; a drop casting method; various printing methods such as a screen printing method, an ink jet printing method, an offset printing method, a gravure printing method, and a flexographic printing method; a stamping method; a spray coating method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Examples of a solvent in the coating method include nonpolar or low polar organic solvents such as toluene, chloroform, hexane, and ethanol. Examples of a patterning method include chemical etching such as shadow mask, laser transfer, photolithography, and the like, and physical etching by ultraviolet light, laser, and the like. Examples of a planarization technique for various organic layers include a laser planarization method, a reflow method, etc.

Two or more kinds of the imaging elements of the first to sixth modes described above can be appropriately combined, as desired.

As aforementioned, the imaging element or the solid-state imaging apparatus may be provided with an on-chip microlens or a light shielding layer, as required, or may be provided with a driving circuit and wiring for driving the imaging element. A shutter for controlling the incidence of light on the imaging element may be provided as necessary, or an optical cut filter may be provided according to the purpose of the solid-state imaging apparatus.

In addition, in the solid-state imaging apparatus of the first and second configurations, a mode can be adopted in which one on-chip microlens is disposed on an upper side of one imaging element or the like of the present disclosure, or a mode can be adopted in which an imaging element block includes two imaging elements or the like of the present disclosure, and one on-chip microlens is disposed on an upper side of the imaging element block.

For example, in the case where the solid-state imaging apparatus is stacked with a readout integrated circuit (ROIC), the stacking may be performed by overlaying a driving substrate on which a readout integrated circuit and a connection section including copper (Cu) are formed and an imaging element on which a connection section is formed such that the connection sections are in contact with each other, and joining the connection sections, and it is also possible to join the connection sections using a solder bump or the like.

Besides, a driving method of the solid-state imaging apparatus according to the first and second modes of the present disclosure can be a driving method for a solid-state imaging apparatus in which the following steps are repeated:

a step in which, in all the imaging elements, the charges in the first electrode are simultaneously discharged out of the system while charges are stored in the inorganic oxide semiconductor material layer (or in the inorganic oxide semiconductor material layer and the photoelectric conversion layer); and thereafter a step in which, in all the imaging elements, charges stored in the inorganic oxide semiconductor material layer (or in the inorganic oxide semiconductor material layer and the photoelectric conversion layer) are simultaneously transferred to the first electrode, and, after the transfer is completed, the charges transferred to the first electrode are sequentially read out in each imaging element.

In such a driving method of a solid-state imaging apparatus, each imaging element has a structure in which light incident from the second electrode side does not enter the first electrode and, in all the imaging elements, charges in the first electrode are simultaneously discharged to the outside of the system while charges are stored in the inorganic oxide semiconductor material layer or the like, and, therefore, reset of the first electrode can be reliably performed simultaneously in all the imaging elements. Thereafter, in all the imaging elements, the charges stored in the inorganic oxide semiconductor material layer or the like are simultaneously transferred to the first electrode, and after completion of the transfer, the charges transferred to the first electrode in each imaging element are sequentially read out. Therefore, a so-called global shutter function can be easily realized.

Examples of the imaging element of the present disclosure include a CCD element, a CMOS image sensor, a CIS (Contact Image Sensor), and a CMD (Charge Modulation Device) type signal amplification image sensor. For example, a digital still camera, a video camera, a camcorder, a monitoring camera, an on-vehicle camera, a smartphone camera, a game user interface camera, and a biometric authentication camera can be configured using the solid-state imaging apparatus according to the first and second modes and the solid-state imaging apparatus of the first and second configurations of the present disclosure.

Embodiment 1

Figure 2:
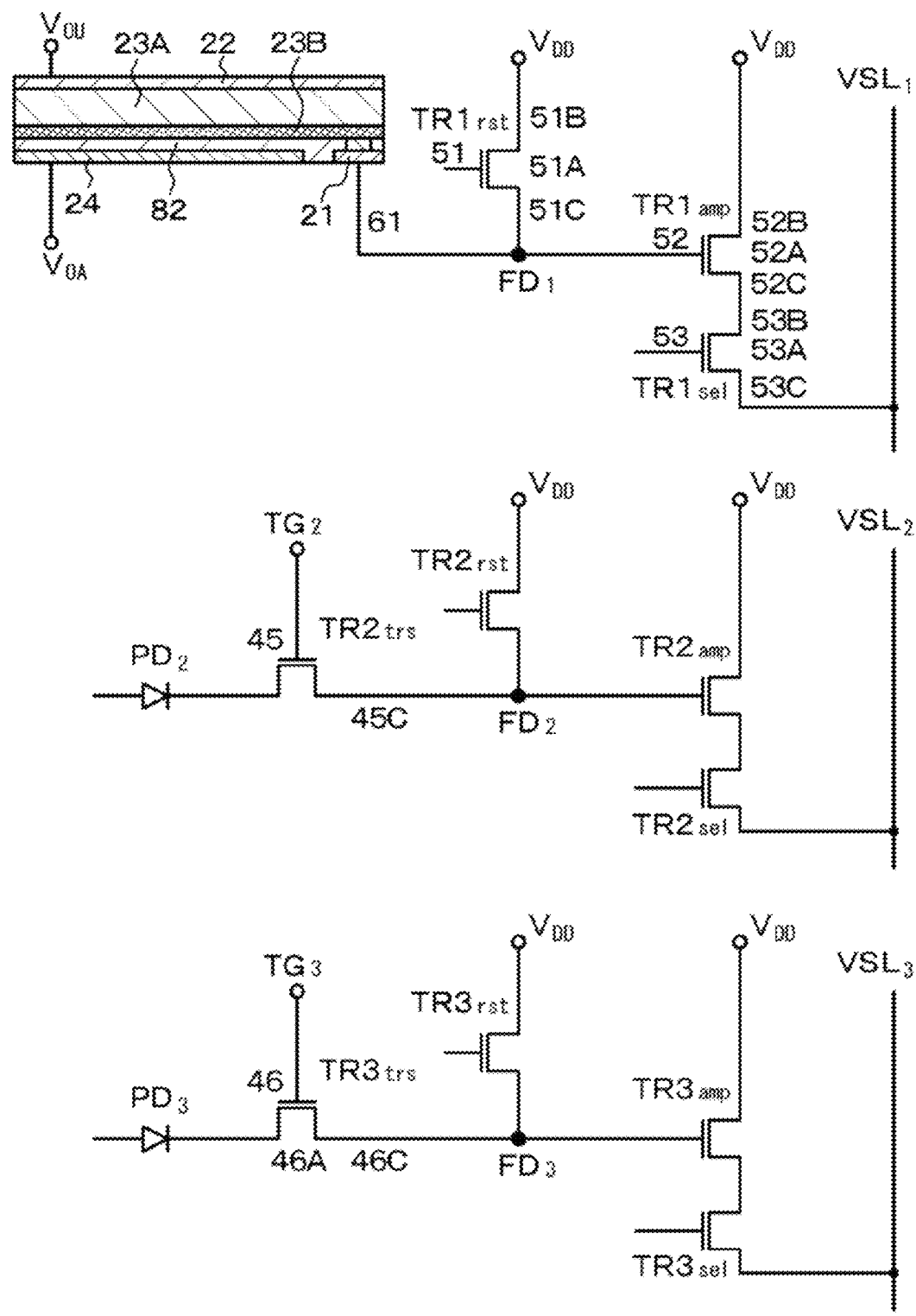
FIG. 2 is an equivalent circuit diagram of the imaging element of Embodiment 1.
Figure 3:
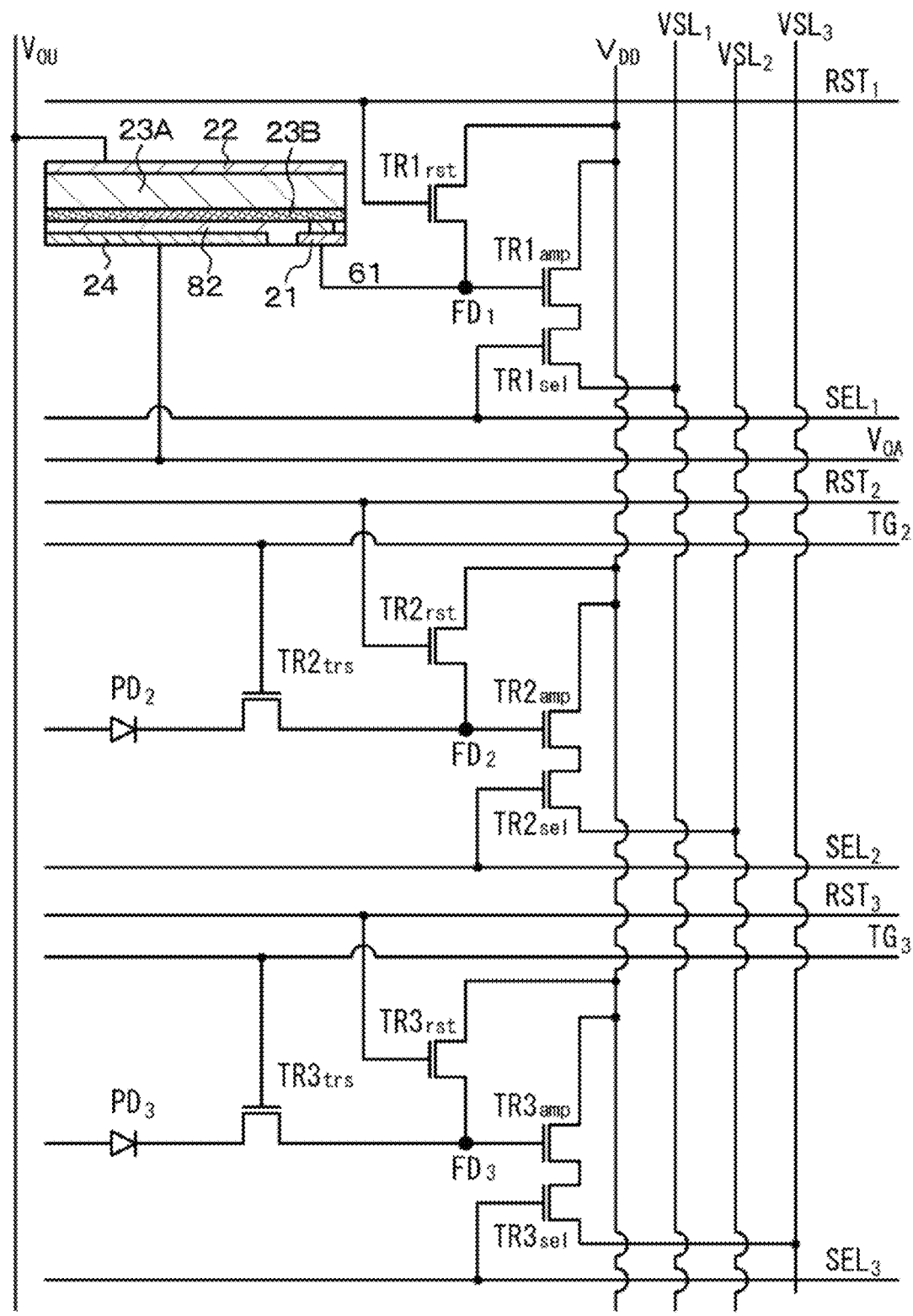
FIG. 3 is an equivalent circuit diagram of the imaging element of Embodiment 1.
Figure 4:
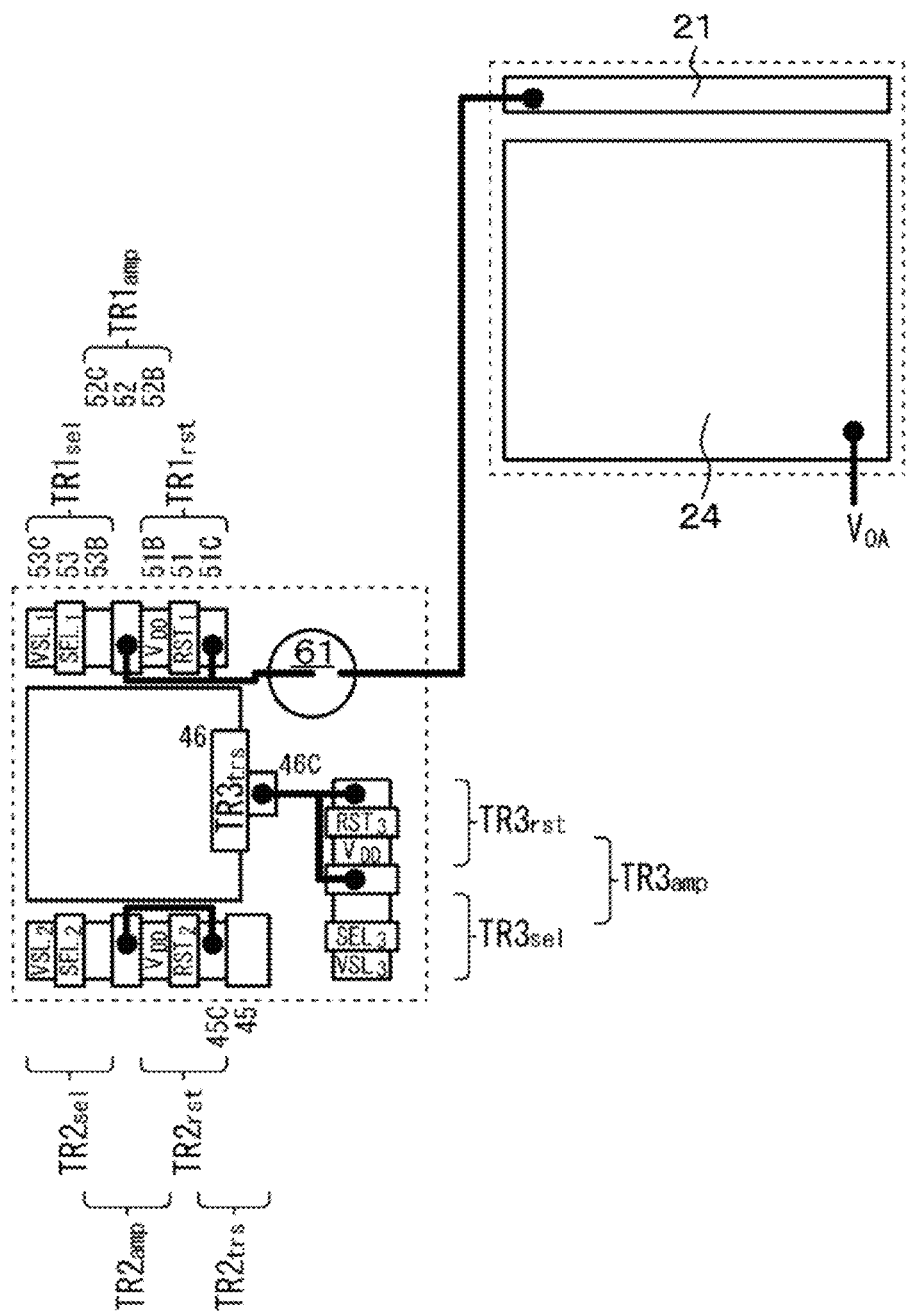
FIG. 4 is a schematic layout drawing of a first electrode and a charge storage electrode and transistors constituting a control section that constitute the imaging element of Embodiment 1.
Figure 6A:
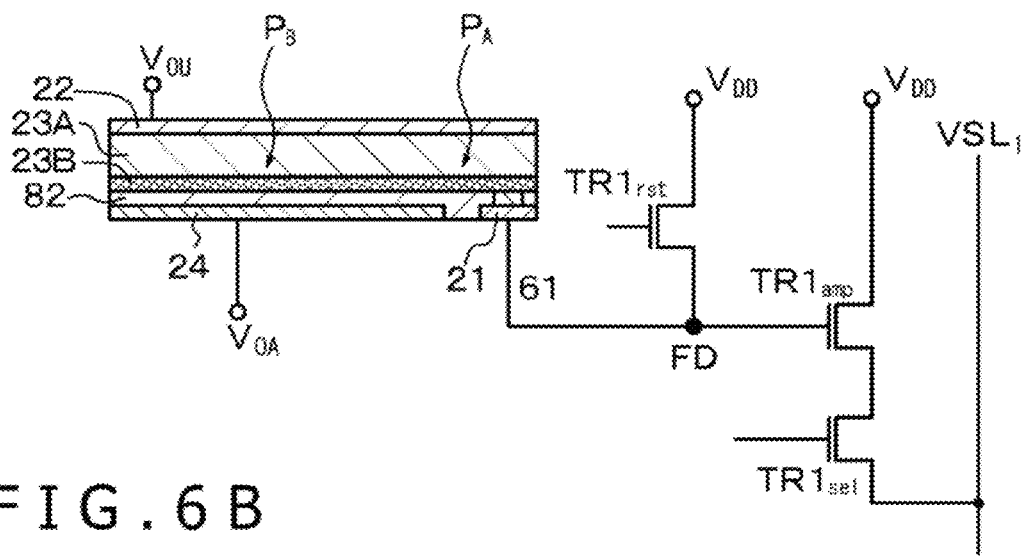
FIGS. 6A, 6B, and 6C are equivalent circuit diagrams of imaging elements of Embodiments 1, 4, and 6 for explaining each part of FIG. 5 (Embodiment 1), FIGS. 20 and 21 (Embodiment 4), and FIGS. 32 and 33 (Embodiment 6).
Figure 7:
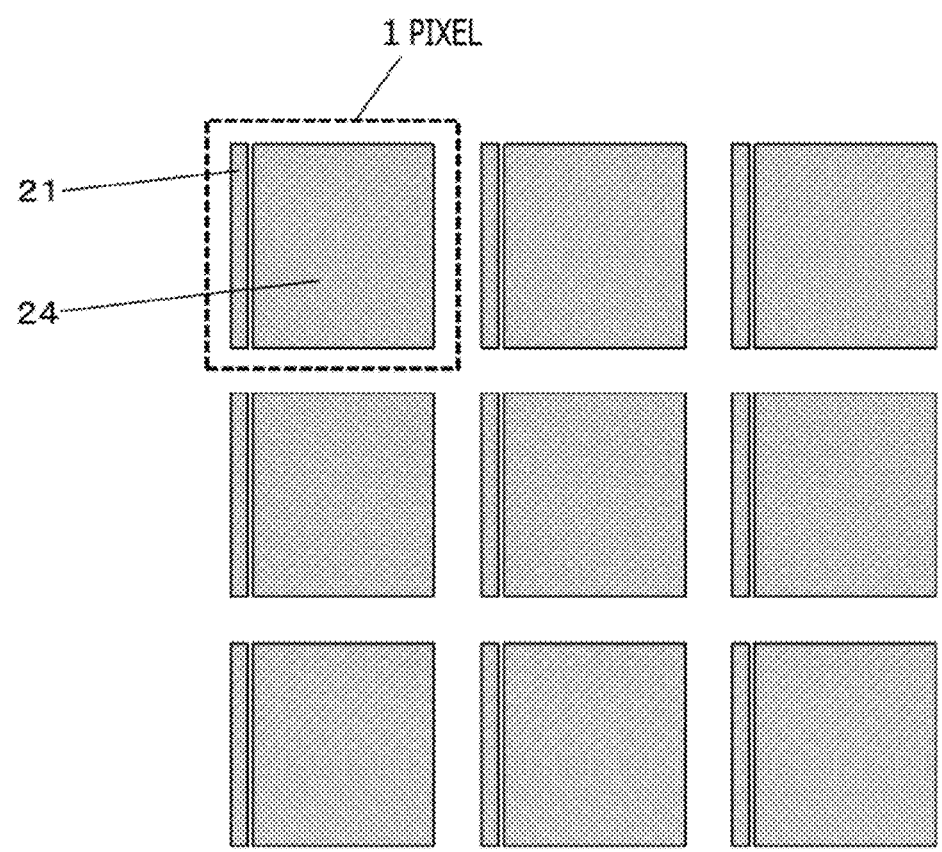
FIG. 7 is a schematic layout drawing of the first electrode and the charge storage electrode constituting the imaging element of Embodiment 1.
Figure 8:
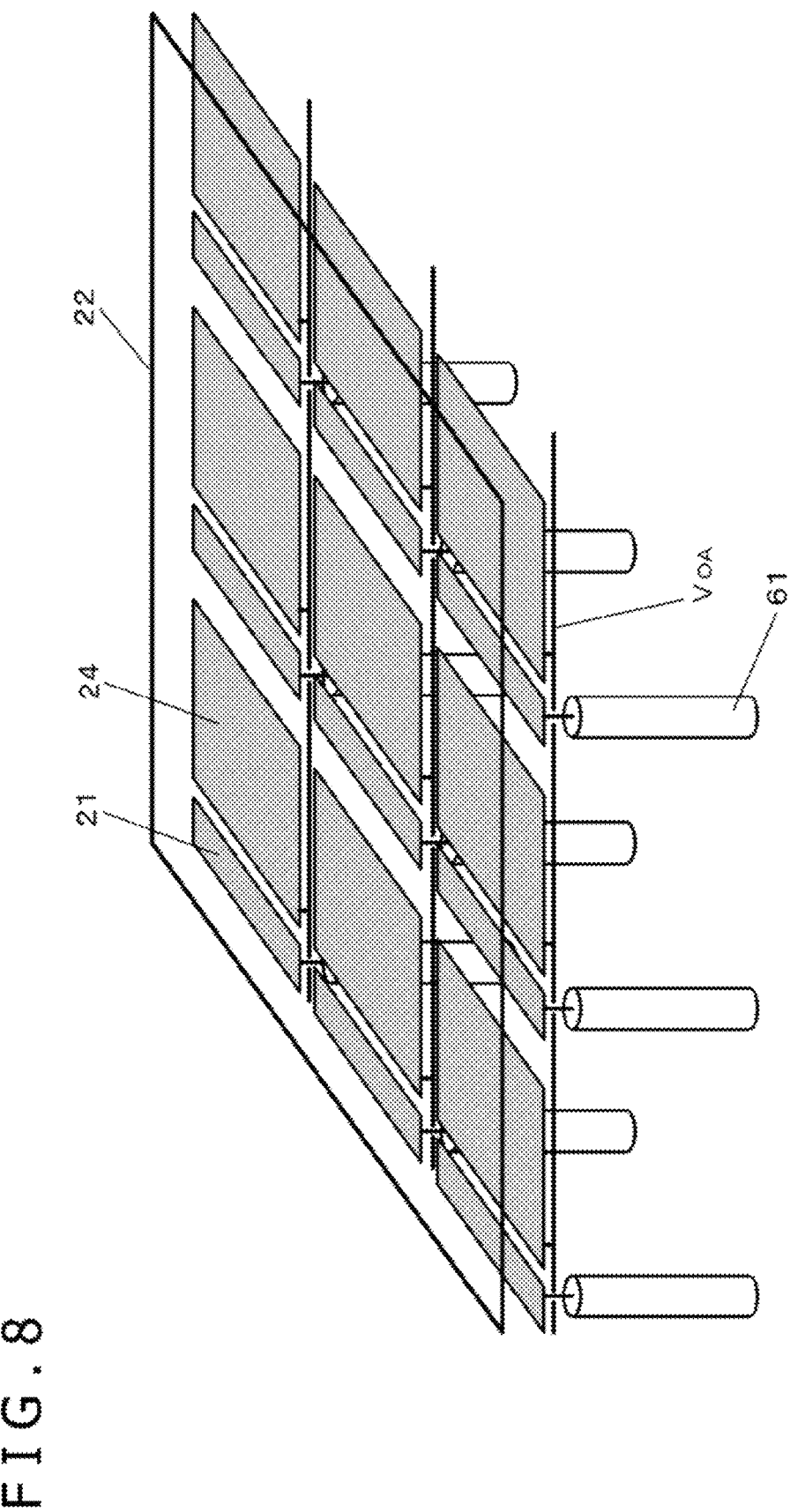
FIG. 8 is a schematic perspective view of the first electrode, the charge storage electrode, a second electrode, and a contact hole section constituting the imaging element of Embodiment 1.
Figure 78:
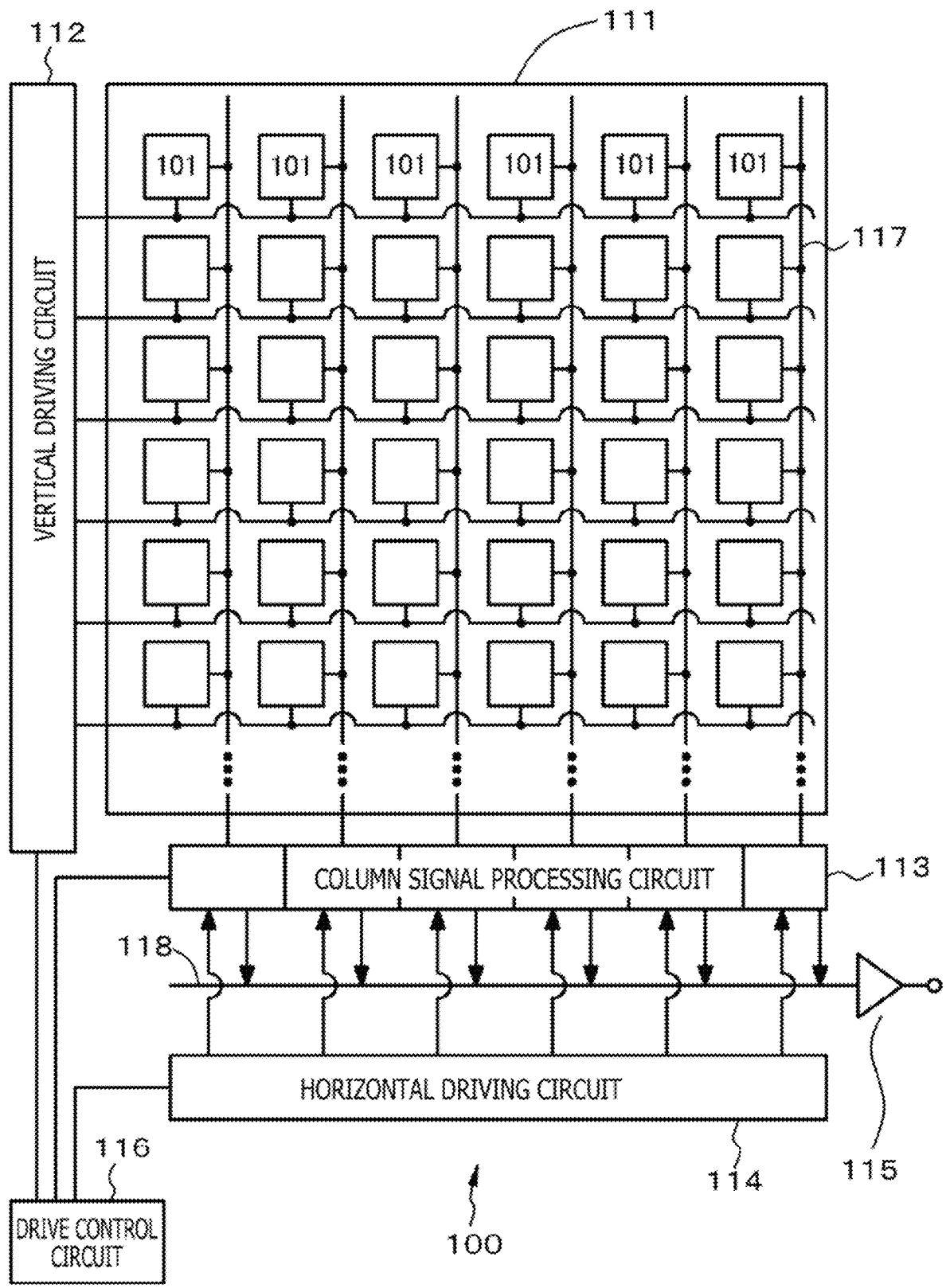
FIG. 78 is a conceptual diagram of a solid-state imaging apparatus of Embodiment 1.

Embodiment 1 relates to an imaging element of the present disclosure, a stacked-type imaging element of the present disclosure, and a solid-state imaging apparatus according to a second mode of the present disclosure. A schematic partial sectional view of the imaging element and the stacked-type imaging element (hereinafter referred to simply as the "imaging element") of Embodiment 1 is illustrated in FIG. 1; equivalent circuit diagrams of the imaging element of Embodiment 1 are depicted in FIGS. 2 and 3; a schematic layout drawing of the first electrode and the charge storage electrode constituting the photoelectric conversion section and the transistors constituting the control section of the imaging element of Embodiment 1 is illustrated in FIG. 4; a state of potential at each part at the time of operation of the imaging element of Embodiment 1 is schematically depicted in FIG. 5; and an equivalent circuit diagram for explaining each part of the imaging element of Embodiment 1 is illustrated in FIG. 6A. In addition, a schematic layout drawing of the first electrode and the charge storage electrode constituting the photoelectric conversion section of the imaging element of Embodiment 1 is depicted in FIG. 7; and a schematic perspective view of the first electrode, the charge storage electrode, the second electrode, and the contact hole section is illustrated in FIG. 8. A conceptual diagram of the solid-state imaging apparatus of Embodiment 1 is illustrated in FIG. 78.

The imaging element of Embodiment 1 includes a photoelectric conversion section in which a first electrode 21, a photoelectric conversion layer 23A, and a second electrode 22 are stacked, and an inorganic oxide semiconductor material layer 23B is formed between the first electrode 21 and the photoelectric conversion layer 23A. The inorganic oxide semiconductor material layer 23B include indium (In) atoms, gallium (Ga) atoms, tin (Sn) atoms, and zinc (Zn) atoms. In other words, the inorganic oxide semiconductor material layer 23B includes a compound oxide including indium (In) atoms, gallium (Ga) atoms, tin (Sn) atoms, and zinc (Zn) atoms, and specifically includes a compound oxide of an indium oxide, a gallium oxide, a tin oxide, and a zinc oxide.

The stacked-type imaging element of Embodiment 1 includes at least one imaging element of Embodiment 1. Besides, the solid-state imaging apparatus of Embodiment 1 includes a plurality of stacked-type imaging elements of Embodiment 1. For example, a digital still camera, a video camera, a camcorder, a monitoring camera, an on-vehicle camera, a smartphone camera, a game user interface camera, a biometric authentication camera, and the like are configured using the solid-state imaging apparatus of Embodiment 1.

In the imaging element of Embodiment 1, a LUMO value $E_1$ of the material constituting that part of the photoelectric conversion layer 23A which is located in the vicinity of the inorganic oxide semiconductor material layer 23B and a LUMO value $E_2$ of the material constituting the inorganic oxide semiconductor material layer 23B satisfy the following expression (A), and preferably satisfy the following expression (B).

$$E_2 = -E_1 \geq 0.1 \text{ eV} \tag{A}$$

$$E_2 - E_1 > 0.1 \text{ eV} \tag{B}$$

Alternatively, the mobility of the material constituting the inorganic oxide semiconductor material layer 23B is equal to or more than 10 cm$^2$/V·s. In addition, the carrier density of the inorganic oxide semiconductor material layer 23B is less than $1 \times 10^{16}$/cm$^3$.

In the imaging element of Embodiment 1, the photoelectric conversion section further includes an insulating layer 82, and a charge storage electrode 24 which is disposed spaced from the first electrode 21 and which is disposed to face the inorganic oxide semiconductor material layer 23B, with the insulating layer 82 interposed therebetween. Note that light is incident from the second electrode 22.

Hereinafter, a description of properties of the imaging element of Embodiment 1 will be made first, and then a detailed description of the imaging element and the solid-state imaging apparatus of Embodiment 1 will be made.

By controlling the oxygen gas introduction quantity (oxygen gas partial pressure) at the time of forming the inorganic oxide semiconductor material layer 23B based on a sputtering method, the energy level of the inorganic oxide semiconductor material layer 23B can be controlled. The oxygen gas partial pressure is preferably set to within the range of 0.005 (0.5%) to 0.10 (10%).

When the thickness of the inorganic oxide semiconductor material layer 23B is 50 nm and the inorganic oxide semiconductor material layer 23B includes In$_a$Ga$_b$Sn$_c$Zn$_d$O$_e$ (where (b+c)/a=2.0, d/a=2.4), the relation between the oxygen gas partial pressure and the energy level obtained from inverse photoemission spectroscopy was obtained, the resulting being set forth in Table 1 below. In the imaging element of Embodiment 1, by controlling the oxygen gas introduction quantity (oxygen gas partial pressure) at the time of forming the inorganic oxide semiconductor material layer 23B based on a sputtering method, the energy level of the inorganic oxide semiconductor material layer 23B can be controlled. Note that the oxygen content of the inorganic oxide semiconductor material layer 23B is lower than an oxygen content corresponding to stoichiometry. Note that e/a=5.1.

TABLE 1

| Oxygen gas partial pressure | Energy level |
|---|---|
| 0.5% | 4.6 eV |
| 10.0% | 4.7 eV |

Next, in regard of the photoelectric conversion layer 23A and the inorganic oxide semiconductor material layer 23B, the energy level of the inorganic oxide semiconductor material layer 23B, an energy level difference ($E_2-E_1$) between the photoelectric conversion layer 23A and the inorganic oxide semiconductor material layer 23B, and the mobility of the material constituting the inorganic oxide semiconductor material layer 23B were examined. As indicated in Table 2, the condition was divided into three conditions. In a first condition, IGZO was used as the material constituting the inorganic oxide semiconductor material layer 23B, while in a second condition and a third condition, $In_aGa_bSn_cZn_dO_e$ indicated below was used as the material constituting the inorganic oxide semiconductor material layer 23B. In addition, the film thickness of the inorganic oxide semiconductor material layer 23B was 50 nm. Further, the photoelectric conversion layer 23A included quinacridone, and its thickness was 0.1 μm. Here, the LUMO value $E_1$ of the material constituting that part of the photoelectric conversion layer 23A located in the vicinity of the inorganic oxide semiconductor material layer 23B was 4.5 eV. Note that imaging elements or the like based on the second condition and the third condition can be obtained by using targets with varied compositions, at the time of forming the inorganic oxide semiconductor material layer 23B based on a sputtering method.

$(b+c)/a=2.0$  $d/a=2.4$   Second condition $(b+c)/a=2.2$  $d/a=2.5$   Third condition Under the first condition, the energy level difference ($E_2-E_1$) is 0 eV. Under the second condition, the energy level difference ($E_2-E_1$) is improved as compared to that under the first condition. As indicated in Table 2, under the third condition, the mobility is further improved as compared to that under the second condition.

TABLE 2

| | First condition | Second condition | Third condition |
|---|---|---|---|
| Inorganic oxide semiconductor material layer | 4.5 eV | 4.6 eV | 4.7 eV |
| Energy level difference ($E_2 - E_1$) | 0.0 eV | 0.1 eV | 0.2 V |
| Mobility (unit: cm$^2$/V · s) | 9 | 13 | 18 |

Transfer characteristic under these three conditions was evaluated by device simulation, based on the imaging element of the structure illustrated in FIG. 1. Note that the LUMO value $E_1$ of the photoelectric conversion layer 23A was 4.5 eV. The relative amount of electrons in a state of electrons being drawn to an upper side of the charge storage electrode 24 was $1\times10^0$. In addition, the relative amount of electrons in a state in which all the electrons having been drawn to the upper side of the charge storage electrode 24 are transferred to the first electrode 21 was $1\times10^{-4}$. Besides, the time until the electrons having been drawn to the upper side of the charge storage electrode 24 are all transferred to the first electrode 21 (referred to as "transfer time") was used as an index for deciding the acceptability of transfer characteristic. The results of obtaining the transfer time are as set forth in Table 3 below. The transfer time is shortened under the second condition as compared to that under the first condition, and shortened under the third condition as compared to that under the second condition. In other words, better transfer characteristic result was exhibited as the value of ($E_2-E_1$) increased. This indicates that forming the layers in such a manner that the LUMO value $E_2$ of the inorganic oxide semiconductor material layer 23B is greater than the LUMO value $E_1$ of the photoelectric conversion layer 23A is a more preferable factor for further enhancement of transfer characteristic.

TABLE 3

| | Transfer time |
|---|---|
| First condition | $5 \times 10^{-6}$ sec |
| Second condition | $1 \times 10^{-7}$ sec |
| Third condition | $4 \times 10^{-8}$ sec |

In order to satisfy the characteristic free of leaving of untransferred charges which is required of the imaging element, it is suitable that the transfer time when the relative amount of electrons becomes $1\times10^{-4}$ is $1\times10^{-7}$ sec. For satisfying this transfer time, the second condition is excellent, and the third condition is more excellent. In other words, it is seen preferable that the inorganic oxide semiconductor material layer 23B includes $In_aGa_bSn_cZn_dO_e$, and $1.8<(b+c)/a<2.3$ and $2.3<d/a<2.6$ are satisfied; further, it is seen preferable that b>0 is satisfied. Note that in the case where the relevant expressions are out of these ranges, it is difficult to achieve depletion. For example, if In is increased excessively, carrier density would rise; if Ga is too lessened, it becomes difficult to control the carrier density. Therefore, the relevant expressions should be within these ranges. In addition, the LUMO value $E_1$ of the material constituting that part of the photoelectric conversion layer 23A which is located in the vicinity of the inorganic oxide semiconductor material layer 23B and the LUMO value $E_2$ of the material constituting the inorganic oxide semiconductor material layer 23B satisfy $E_2-E_1 \geq 0.1$ eV, more preferably, $E_2-E_1 > 0.1$ eV, and, further, the mobility of the material constituting the inorganic oxide semiconductor material layer 23B is equal to or more than 10 cm$^2$/V·s.

Figure 76:
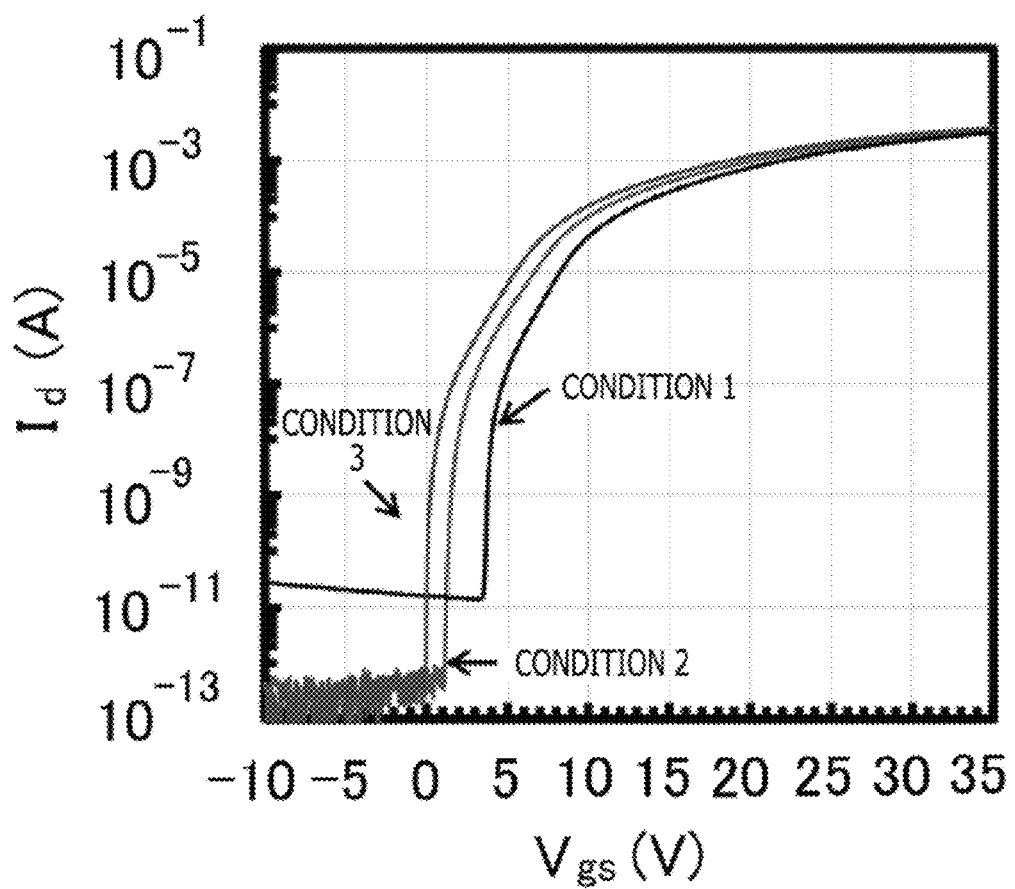

Besides, a channel forming region for a TFT was formed based on the first condition, the second condition, and the third condition, and FTF characteristic was evaluated, the results being indicated in FIG. 76. In other words, graphs obtained by determining the relation between $V_{gs}$ and $I_d$ of a TFT in which the channel forming region included IGZO or $In_aGa_bSn_cZn_dO_e$ are indicated in FIG. 76. It is seen that the TFT characteristic is better under the second condition than under the first condition, and better under the third condition than under the second condition.

Figure 77A:
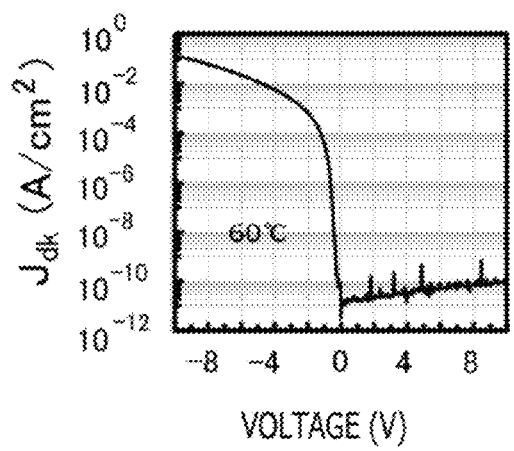
FIGS. 77A and 77B are graphs depicting evaluation results of dark current characteristic and external quantum efficiency for an evaluation sample and a comparative sample, respectively, in Embodiment 1.
Figure 77B:
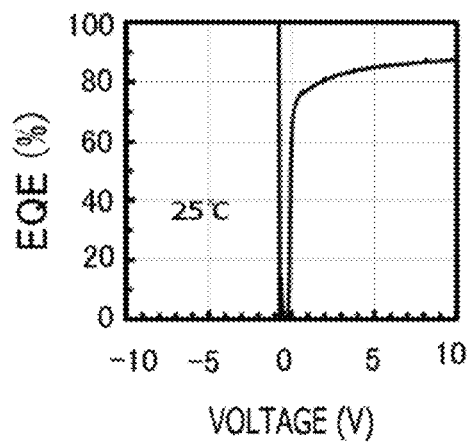

In addition, evaluation results of dark current characteristic ($J_{dk}$) at 60° C. and external quantum efficiency characteristic (EQE) at room temperature (25° C.) when the inorganic oxide semiconductor material layer 23B included $In_aGa_bSn_cZn_dO_e$ and photoelectric conversion was generated in the photoelectric conversion layer 23A are indicated in FIGS. 77A and 77B.

A sample for evaluation had a structure in which a first electrode including ITO is formed on a substrate, and an inorganic oxide semiconductor material layer, a photoelectric conversion layer, a buffer layer including $MoO_x$, and a second electrode are sequentially stacked over the first electrode. Here, the thickness of the inorganic oxide semiconductor material layer was 100 nm. When a positive bias of two volts was applied, a dark current characteristic ($J_{dk}$) of equal to or less than $1\times10^{-10}/cm^2$ was exhibited, which is favorable. Note that when a positive bias of two volts was applied to a comparative sample (not illustrated in the drawing) which did not include the inorganic oxide semiconductor material layer, also, a dark current characteristic ($Jd_k$) of equal to or less than $1\times10^{-10}/cm^2$ was obtained; thus, comparable characteristics were confirmed. In addition, when a positive bias of two volts was applied, the comparative sample (not illustrated in the drawing) exhibited an external quantum efficiency characteristic (EQE) of 80%, and the evaluation sample exhibited a good external quantum efficiency of equal to or more than 80% when the same voltage of two volts was applied.

Besides, from X-ray diffraction results of the inorganic oxide semiconductor material layer 23B, the inorganic oxide semiconductor material layer 23B was found to be amorphous (for example, be amorphous and not locally having a crystalline structure). Further, the surface roughness Ra of the inorganic oxide semiconductor material layer 23B at the interface between the photoelectric conversion layer 23A and the inorganic oxide semiconductor material layer 23B is equal to or less than 1.5 nm, and the value of the root mean square roughness Rq of the inorganic oxide semiconductor material layer is equal to or less than 2.5 nm. Specifically, $Ra=0.6$ nm and $Rq=2.5$ nm were obtained. In addition, the surface roughness Ra of the charge storage electrode 24 is equal to or less than 1.5 nm, and the value of root mean square roughness Rq of the charge storage electrode 24 is equal to or less than 2.5 nm. Specifically, $Ra=0.7$ nm and $Rq=2.3$ nm were obtained. Further, the light transmittance of the inorganic oxide semiconductor material layer 23B with respect to light of a wavelength of 400 to 660 nm is equal to or more than 65% (specifically, 83%), and the light transmittance of the charge storage electrode 24 with respect to light of a wavelength of 400 to 660 nm is equal to or more than 65% (specifically, 75%). The sheet resistance of the charge storage electrode 24 is $3\times10$ to $1\times10^3\Omega/\square$ (specifically, $84\Omega/\square$).

In the imaging element of Embodiment 1, the inorganic oxide semiconductor material layer includes indium (In) atoms, gallium (Ga) atoms, tin (Sn) atoms, and zinc (Zn) atoms. Therefore, controls of the carrier density of the inorganic oxide semiconductor material layer (the degree of depletion of the inorganic oxide semiconductor material layer), the mobility of the material constituting the inorganic oxide semiconductor material layer, and the LUMO value $E_2$ of the material constituting the inorganic oxide semiconductor material layer can be achieved in a well-balanced manner. As a result, it is possible to provide an imaging element, a stacked-type imaging element, and a solid-state imaging apparatus which are excellent in transfer characteristics of charges stored in a photoelectric conversion layer, notwithstanding their simple configuration and structure. It is assumed that the carrier density of the inorganic oxide semiconductor material layer (the degree of depletion of the inorganic oxide semiconductor material layer) can be controlled by controlling the proportion between gallium atoms and tin atoms, in the atoms constituting the inorganic oxide semiconductor material layer, the mobility of the inorganic oxide semiconductor material layer can be controlled by controlling the proportion of indium atoms, and the LUMO value $E_2$ can be controlled by controlling the proportion of zinc atoms. Moreover, the two-layer structure of the inorganic oxide semiconductor material layer and the photoelectric conversion layer makes it possible to prevent recombination at the time of charge storage, to increase the transfer efficiency of the charges stored in the photoelectric conversion layer to the first electrode, and to restrain generation of a dark current.

A detailed description of the imaging element and the solid-state imaging apparatus of Embodiment 1 will be made below.

The imaging element of Embodiment 1 further includes a semiconductor substrate (specifically, a silicon semiconductor layer) 70, and the photoelectric conversion section is disposed on an upper side of the semiconductor substrate 70. In addition, the imaging element further includes the control section which is provided on the semiconductor substrate 70 and which has the driving circuit connected with the first electrode 21 and the second electrode 22. Here, the light incidence surface of the semiconductor substrate 70 is made to be the upper side, and the opposite side of the semiconductor substrate 70 is made to be the lower side. A wiring layer 62 including a plurality of wirings is provided on a lower side of the semiconductor substrate 70.

The semiconductor substrate 70 is provided with at least a floating diffusion layer $FD_1$ and an amplification transistor $TR1_{amp}$ that constitute the control section, and the first electrode 21 is connected to the floating diffusion layer $FD_1$ and a gate section of the amplification transistor $TR1_{amp}$. The semiconductor substrate 70 is provided further with a reset transistor $TR1_{rst}$ and a select transistor $TR1_{sel}$ that constitute the control section. The floating diffusion layer $FD_1$ is connected to a source/drain region on one side of the reset transistor $TR1_{rst}$, a source/drain region on one side of the amplification transistor $TR1_{amp}$ is connected to a source/drain region on one side of the select transistor $TR1_{sel}$, and a source/drain region on the other side of the select transistor $TR1_{sel}$ is connected to a signal line $VSL_1$. The amplification transistor $TR1_{amp}$, the reset transistor $TR1_{rst}$, and the select transistor $TR1_{sel}$ constitute the driving circuit.

Specifically, the imaging element of Embodiment 1 is a back side illumination type imaging element and has a structure in which three imaging elements are stacked, the three imaging elements including a green light imaging element of Embodiment 1 of the first type which includes a green light photoelectric conversion layer of the first type absorbing green light and has sensitivity to green light (hereinafter referred to as "first imaging element"), a conventional blue light imaging element of the second type which includes a blue light photoelectric conversion layer of the second type absorbing blue light and has sensitivity to blue light (hereinafter referred to as "second imaging element"), and a conventional red light imaging element of the second type which includes a red light photoelectric conversion layer of the second type absorbing red light and has sensitivity to red light (hereinafter referred to as "third imaging element"). Here, the red light imaging element (third imaging element) and the blue light imaging element (second imaging element) are provided in the semiconductor substrate 70, and the second imaging element is located on the light incidence side as compared to the third imaging element. In addition, the green light imaging element (first imaging element) is provided on an upper side of the blue light imaging element (second imaging element). The stacked layer structure of the first imaging element, the second imaging element, and the third imaging element constitute one pixel. A color filter layer is not provided.

In the first imaging element, the first electrode 21 and the charge storage electrode 24 are formed on an interlayer insulating layer 81 in a mutually spaced apart state. The interlayer insulating layer 81 and the charge storage electrode 24 are covered with an insulating layer 82. An inorganic oxide semiconductor material layer 23B and a photoelectric conversion layer 23A are formed on the insulating layer 82, and a second electrode 22 is formed on the photoelectric conversion layer 23A. An insulating layer 83 is formed over the whole surface inclusive of the second electrode 22, and an on-chip microlens 14 is provided on the insulating layer 83. A color filter layer is not provided. The first electrode 21, the charge storage electrode 24, and the second electrode 22 include transparent electrodes formed using, for example, ITO (work function: approximately 4.4 eV). The inorganic oxide semiconductor material layer 23B includes $In_aGa_bSn_cZn_dO_e$. The photoelectric conversion layer 23A includes a layer containing a known organic photoelectric conversion material (for example, an organic material such as rhodamine-based coloring matter, melacyanine-based coloring matter, and quinacridone) having sensitivity to at least green light. The interlayer insulating layer 81 and the insulating layers 82 and 83 include a known insulating material (for example, $SiO_2$ or SiN). The inorganic oxide semiconductor material layer 23B and the first electrode 21 are connected by a connection section 67 provided at the insulating layer 82. The inorganic oxide semiconductor material layer 23B extends in the connection section 67. In other words, the inorganic oxide semiconductor material layer 23B extends in an opening 85 provided in the insulating layer 82, and is connected to the first electrode 21.

The charge storage electrode 24 is connected to the driving circuit. Specifically, the charge storage electrode 24 is connected to a vertical driving circuit 112 constituting the driving circuit, via a connection hole 66 provided in the interlayer insulating layer 81, a pad section 64, and a wiring $V_{OA}$.

The charge storage electrode 24 is larger in size than the first electrode 21. Let the area of the charge storage electrode 24 be $S_1'$, and let the area of the first electrode 21 be $S_1$, then it is preferable that $$4 \leq S_1'/S_1$$

is satisfied, which is not limitative; in Embodiment, for example, $$S_1'/S_1 = 8$$

was adopted, which is not limitative. Note that in Embodiments 7 to 10 to be described later, three photoelectric conversion section segments $10'_1$, $10'_2$, and $10'_3$ were the same in size, and were the same in plan-view shape.

Element isolation regions 71 are provided on the side of a first surface (front surface) 70A of the semiconductor substrate 70, and an oxide film 72 is formed over the first surface 70A of the semiconductor substrate 70. Further, on the first surface side of the semiconductor substrate 70, there are provided the reset transistor $TR1_{rst}$, the amplification transistor $TR1_{amp}$, and the select transistor $TR1_{sel}$ that constitute the control section of the first imaging element, and, further, the first floating diffusion layer $FD_1$ is provided.

The reset transistor $TR1_{rst}$ includes a gate section 51, a channel forming region 51A, and source/drain regions 51B and 51C. The gate section 51 of the reset transistor $TR1_{rst}$ is connected to a reset line $RST_1$, the source/drain region 51C on one side of the reset transistor $TR1_{rst}$ functions also as the first floating diffusion layer $FD_1$, and the source/drain region 51B on the other side is connected to a power source $V_{DD}$.

The first electrode 21 is connected to the source/drain region 51C (first floating diffusion layer $FD_1$) on one side of the reset transistor $TR1_{rst}$, via a connection hole 65 provided in the interlayer insulating layer 81, a pad section 63, the semiconductor substrate 70, a contact hole section 61 formed in an interlayer insulating layer 76, and the wiring layer 62 formed at the interlayer insulating layer 76.

The amplification transistor $TR1_{amp}$ includes a gate section 52, a channel forming region 52A, and source/drain regions 52B and 52C. The gate section 52 is connected to the first electrode 21 and the source/drain region 51C (first floating diffusion layer $FD_1$) on one side of the reset transistor $TR1_{rst}$, via the wiring layer 62. In addition, the source/drain region 52B on one side is connected to the power source $V_{DD}$.

The select transistor $TR1_{sel}$ includes a gate section 53, a channel forming region 53A, and source/drain regions 53B and 53C. The gate section 53 is connected to a select line $SEL_1$. In addition, the source/drain region 53B on one side shares a region with the source/drain region 52C on the other side constituting the amplification transistor $TR1_{amp}$, and the source/drain region 53C on the other side is connected to a signal line (data output line) $VSL_1$ (117).

The second imaging element includes an n-type semiconductor region 41 provided in the semiconductor substrate 70, as a photoelectric conversion layer. A gate section 45 of a transfer transistor $TR2_{trs}$ including a vertical transistor extends to the n-type semiconductor region 41, and is connected to a transfer gate line $TG_2$. In addition, a second floating diffusion layer $FD_2$ is provided in a region 45C of the semiconductor substrate 70 in the vicinity of the gate section 45 of the transfer transistor $TR2_{trs}$. Charges stored in the n-type semiconductor region 41 are read out to the second floating diffusion layer $FD_2$ via a transfer channel formed along the gate section 45.

In the second imaging element, further, on the first surface side of the semiconductor substrate 70, there are provided a reset transistor TR2$_{rst}$, an amplification transistor TR2$_{amp}$, and a select transistor TR2$_{sel}$ that constitute the control section of the second imaging element.

The reset transistor TR2$_{rst}$ includes a gate section, a channel forming region, and source/drain regions. The gate section of the reset transistor TR2$_{rst}$ is connected to a reset line RST$_2$, the source/drain region on one side of the reset transistor TR2$_{rst}$ is connected to the power source V$_{DD}$, and the source/drain region on the other side functions also as the second floating diffusion layer FD$_2$.

The amplification transistor TR2$_{amp}$ includes a gate section, a channel forming region, and source/drain regions. The gate section is connected to the source/drain region (second floating diffusion layer FD$_2$) on the other side of the reset transistor TR2$_{rst}$. Besides, the source/drain region on one side is connected to the power source V$_{DD}$.

The select transistor TR2$_{sel}$ includes a gate section, a channel forming region, and source/drain regions. The gate section is connected to the select line SEL$_2$. In addition, the source/drain region on one side shares a region with the source/drain region on the other side constituting the amplification transistor TR2$_{amp}$, and the source/drain region on the other side is connected to the signal line (data output line) VSL$_2$.

The third imaging element includes an n-type semiconductor region 43 provided in the semiconductor substrate 70, as a photoelectric conversion layer. A gate section 46 of a transfer transistor TR3$_{trs}$ is connected to a transfer gate line TG$_3$. Besides, a third floating diffusion layer FD$_3$ is provided in a region 46C of the semiconductor substrate 70 in the vicinity of the gate section 46 of the transfer transistor TR3$_{trs}$. Charges stored in the n-type semiconductor region 43 are read out to the third floating diffusion layer FD$_3$ via a transfer channel 46A formed along the gate section 46.

In the third imaging element, further, on the first surface side of the semiconductor substrate 70, there are provided a reset transistor TR3$_{rst}$, an amplification transistor TR3$_{amp}$, and a select transistor TR3$_{sel}$ that constitute the control section of the third imaging element.

The reset transistor TR3$_{rst}$ includes a gate section, a channel forming region, and source/drain regions. The gate section of the reset transistor TR3$_{rst}$ is connected to a reset line RST$_3$, the source/drain region on one side of the reset transistor TR3$_{rst}$ is connected to the power source V$_{DD}$, and the source/drain region on the other side functions also as the third floating diffusion layer FD$_3$.

The amplification transistor TR3$_{amp}$ includes a gate section, a channel forming region, and source/drain regions. The gate section is connected to the source/drain region (third floating diffusion layer FD$_3$) on the other side of the reset transistor TR3$_{rst}$. Besides, the source/drain region on one side is connected to the power source V$_{DD}$.

The select transistor TR3$_{sel}$ includes a gate section, a channel forming region, and source/drain regions. The gate section is connected to a select line SEL$_3$. In addition, the source/drain region on one side shares a region with the source/drain region on the other side constituting the amplification transistor TR3$_{amp}$, and the source/drain region on the other side is connected to a signal line (data output line) VSL$_3$.

The reset lines RST$_1$, RST$_2$, and RST$_3$, the select lines SEL$_1$, SEL$_2$, and SEL$_3$, and transfer gate lines TG$_2$ and TG$_3$ are connected to the vertical driving circuit 112 constituting the driving circuit, and the signal lines (data output lines) VSL$_1$, VSL$_2$, and VSL$_3$ are connected to a column signal processing circuit 113 constituting the driving circuit.

A p$^+$ layer 44 is provided between the n-type semiconductor region 43 and the front surface 70A of the semiconductor substrate 70, to restrain generation of a dark current. A p$^+$ layer 42 is formed between the n-type semiconductor region 41 and the n-type semiconductor region 43, and, further, part of a side surface of the n-type semiconductor region 43 is surrounded by the pi layer 42. A p$^+$ layer 73 is formed on the side of the back surface 70B of the semiconductor substrate 70, and an HfO$_2$ film 74 and an insulating material film 75 are formed in an area ranging from the p$^+$ layer 73 to that part of the inside of the semiconductor substrate 70 where to form the contact hole section 61. While the interlayer insulating layer 76 is formed with wirings over a plurality of layers, the wirings are omitted in the drawing.

The HfO$_2$ film 74 is a film having a negative fixed charge, and, by providing such a film, generation of a dark current can be restrained. The HfO$_2$ film may be replaced by an aluminum oxide (Al$_2$O$_3$) film, a zirconium oxide (ZrO$_2$) film, a tantalum oxide (Ta$_2$O$_5$) film, a titanium oxide (TiO$_2$) film, a lanthanum oxide (La$_2$O$_3$) film, a praseodymium oxide (Pr$_2$O$_3$) film, a cerium oxide (CeO$_2$) film, a neodymium oxide (Nd$_2$O$_3$) film, a promethium oxide (Pm$_2$O$_3$) film, a samarium oxide (Sa$_2$O$_3$) film, an europium oxide (Eu$_2$O$_3$) film, a gadolinium oxide ((Gd$_2$O$_3$) film, a terbium oxide (Tb$_2$O$_3$) film, a dysprosium oxide (Dy$_2$O$_3$) film, a holmium oxide (Ho$_2$O$_3$) film, a thulium oxide (Tm$_2$O$_3$) film, a ytterbium oxide (Yb$_2$O$_3$) film, a lutetium oxide (Lu$_2$O$_3$) film, a yttrium oxide (Y$_2$O$_3$) film, a hafnium nitride film, an aluminum nitride film, a hafnium oxynitride film, or an aluminum oxynitride film. Examples of the film-forming method for these films include a CVD method, a PVD method, and an ALD method.

An operation of the stacked-type imaging element (first imaging element) including the charge storage electrode of Embodiment 1 will be described referring to FIGS. 5 and 6A. Here, the potential of the first electrode 21 was set higher than the potential of the second electrode 22. In other words, for example, the first electrode 21 is set to a positive potential, while the second electrode 22 is set to a negative potential, and electrons generated by photoelectric conversion in the photoelectric conversion layer 23A are read out to the floating diffusion layer. This similarly applies also to other embodiments.

Figure 20:
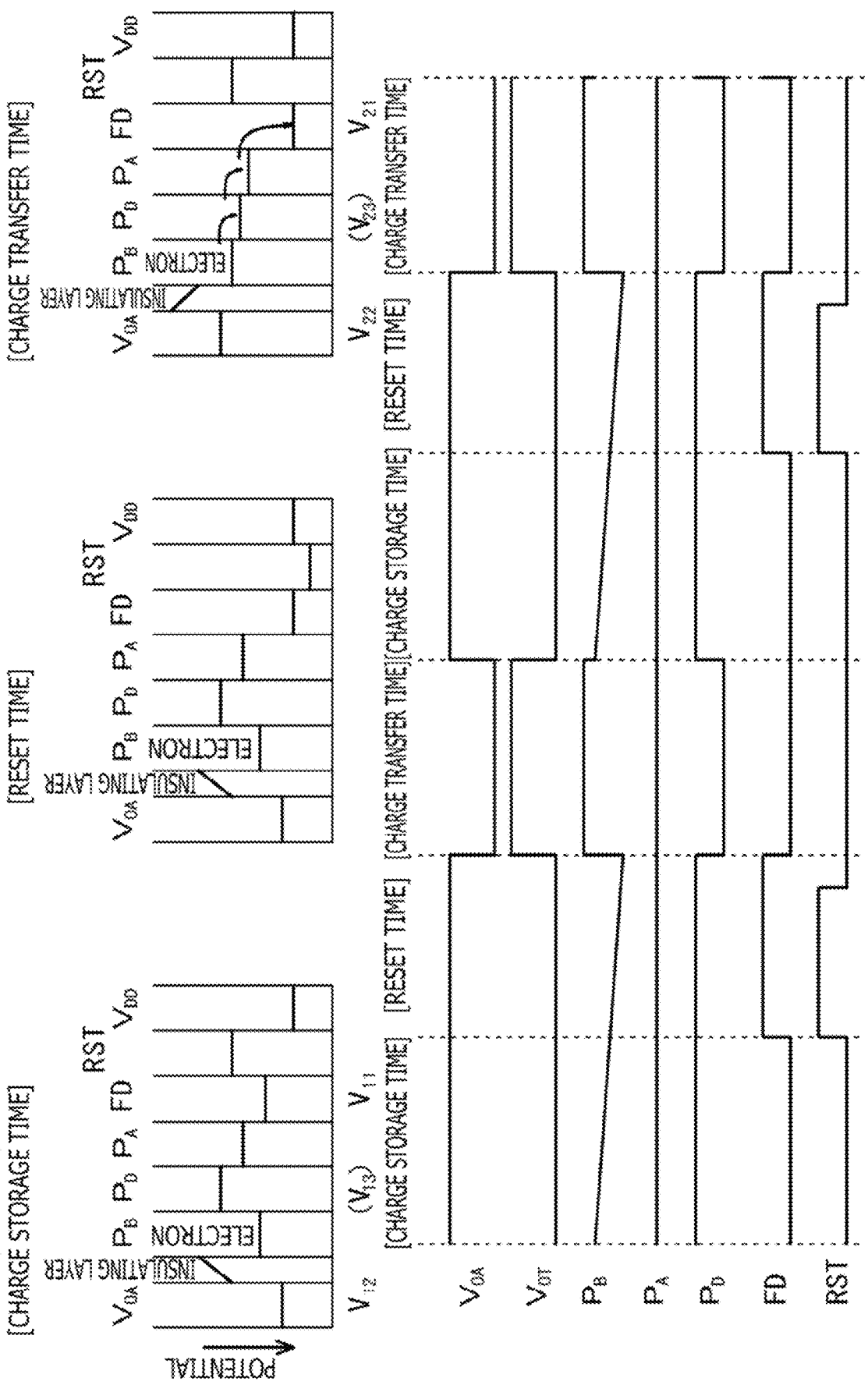
FIG. 20 is a diagram schematically depicting a state of potential at each part at the time of an operation of the imaging element of Embodiment 4.
Figure 21:
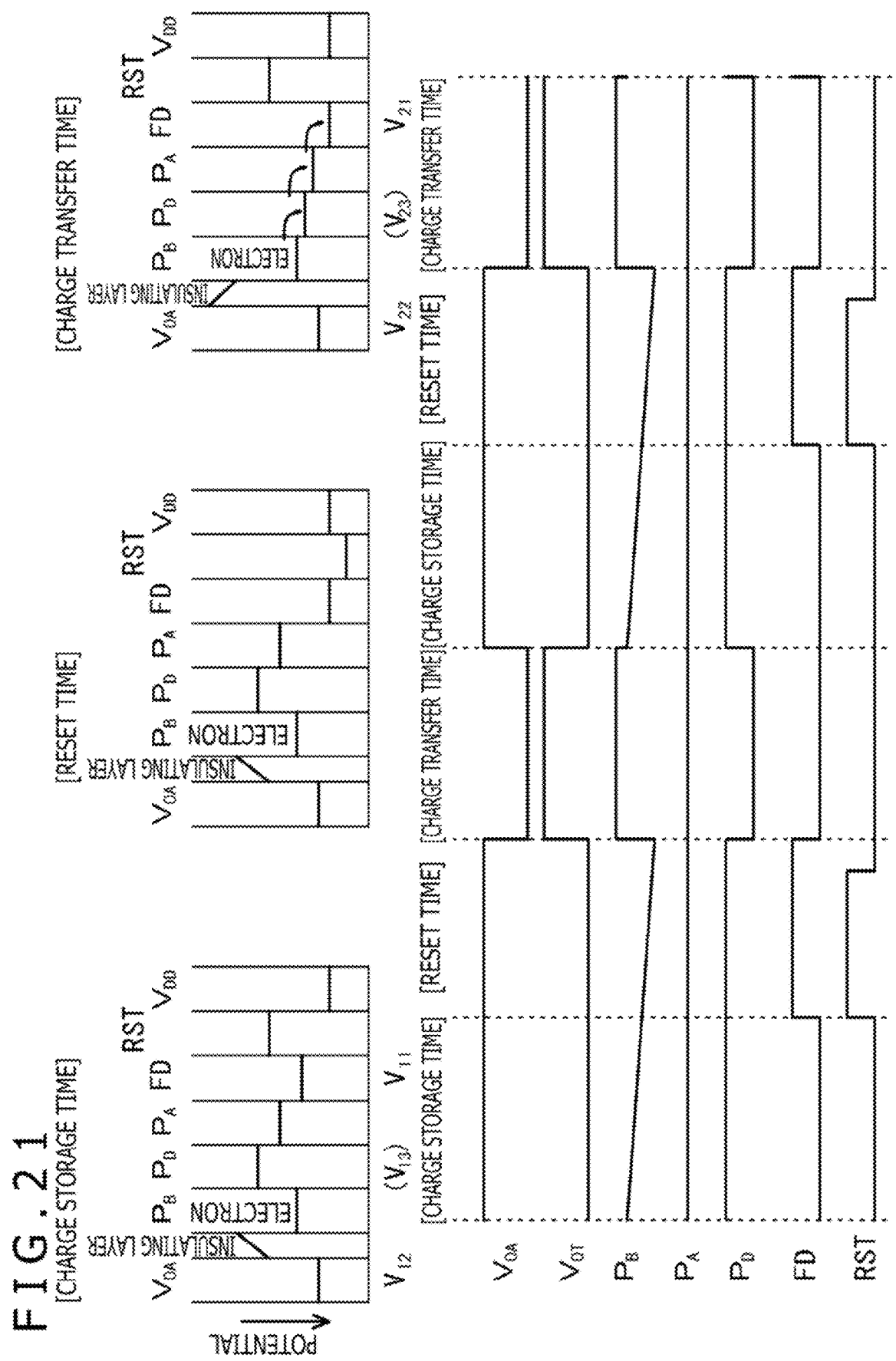
FIG. 21 is a diagram schematically depicting a state of potential at each part at the time of another operation of the imaging element of Embodiment 4.

Reference signs used in FIG. 5, FIGS. 20 and 21 in Embodiment 4 described later, and FIGS. 32 and 33 in Embodiment 6 are as follows.

P$_A$: Potential at point P$_A$ of inorganic oxide semiconductor material layer 23B facing a region located intermediate between charge storage electrode 24 or transfer control electrode (charge transfer electrode) 25 and first electrode 21

P$_B$: Potential at point P$_B$ in that region of inorganic oxide semiconductor material layer 23B which faces charge storage electrode 24

P$_{C1}$: Potential at point P$_{C1}$ in that region of inorganic oxide semiconductor material layer 23B which faces charge storage electrode segment 24A P$_{C2}$: Potential at point P$_{C1}$ in that region of inorganic oxide semiconductor material layer 23B which faces charge storage electrode segment 24B P$_{C3}$: Potential at point P$_{C3}$ in that region of inorganic oxide semiconductor material layer 23B which faces charge storage electrode segment 24C $P_D$: Potential at point $P_D$ in that region of inorganic oxide semiconductor material layer 23B which faces transfer control electrode (charge transfer electrode) 25

FD Potential at first floating diffusion layer $FD_1$ $V_{OA}$: Potential at charge storage electrode 24

$V_{OA-A}$: Potential at charge storage electrode segment 24A $V_{OA-B}$: Potential at charge storage electrode segment 24B $V_{OA-C}$: Potential at charge storage electrode segment 24C $V_{OT}$: Potential at transfer control electrode (charge transfer electrode) 25

RST: Potential at gate section 51 of reset transistor $TR1_{rst}$ $V_{DD}$: Potential of power source $VSL_1$: Signal line (data output line) $VSL_1$ $TR1_{rst}$: Reset transistor $TR1_{rst}$ $TR1_{amp}$: Amplification transistor $TR1_{amp}$ $TR1_{sel}$: Select transistor $TR1_{sel}$ In a charge storage period, a potential $V_{11}$ is impressed on the first electrode 21, and a potential $V_{12}$ is impressed on the charge storage electrode 24, from the driving circuit. By light incident on the photoelectric conversion layer 23A, photoelectric conversion is generated in the photoelectric conversion layer 23A. Holes generated by photoelectric conversion are sent out from the second electrode 22 to the driving circuit via a wiring $V_{OU}$. On the other hand, since the potential of the first electrode 21 is set higher than the potential of the second electrode 22, that is, for example, since a positive potential is impressed on the first electrode 21 and a negative potential is impressed on the second electrode 22, $V_{12} \geq V_{11}$, and preferably $V_{12} > V_{11}$ are satisfied. As a result, electrons generated by photoelectric conversion are attracted to the charge storage electrode 24, and stay in a region of the inorganic oxide semiconductor material layer 23B or in the inorganic oxide semiconductor material layer 23B and the photoelectric conversion layer 23A (hereinafter these will be referred to generically as "the inorganic oxide semiconductor material layer 23B or the like") facing the charge storage electrode 24. In other words, charges are stored in the inorganic oxide semiconductor material layer 23B or the like. Since $V_{12} > V_{11}$ is satisfied, the electrons generated inside the photoelectric conversion layer 23A would not move toward the first electrode 21. Attendant on the lapse of time of photoelectric conversion, the potential in that region of the inorganic oxide semiconductor material layer 23B or the like which faces the charge storage electrode 24 becomes a value on the more negative side.

At a later stage of the charge storage period, a resetting operation is performed. As a result, the potential of the first floating diffusion layer $FD_1$ is reset, and the potential of the first floating diffusion layer $FD_1$ becomes the potential $V_{DD}$ of the power source.

After completion of the resetting operation, reading of charges is performed. Specifically, in the charge transfer period, a potential $V_{21}$ is impressed on the first electrode 21, and a potential $V_{22}$ is impressed on the charge storage electrode 24, from the driving circuit. Here, $V_{22} < V_{21}$ is satisfied. As a result, electrons having stayed in that region of the inorganic oxide semiconductor material layer 23B or the like which faces the charge storage electrode 24 are read out to the first electrode 21, and, further, to the first floating diffusion layer $FD_1$. In other words, the charges stored in the inorganic oxide semiconductor material layer 23B or the like are read out to the control section.

In this way, a series of operations of charge storage, resetting operation, and charge transfer are completed.

The operations of the amplification transistor $TR1_{amp}$ and the select transistors $TR1_{sel}$ after the electrons are read out to the first floating diffusion layer $FD_1$ are the same as the operations of the corresponding conventional transistors. In addition, the series of operations of charge storage, resetting operation, and charge transfer of the second imaging element and the third imaging element are similar to the conventional series of operations of charge storage, resetting operation, and charge transfer. Besides, reset noise of the first floating diffusion layer $FD_1$ can be removed by a correlated double sampling (CDS) treatment, like in the related art.

As has been described above, in Embodiment 1, the charge storage electrode is provided which is disposed spaced from the first electrode and which is disposed to face the photoelectric conversion layer, with the insulating layer interposed therebetween. Therefore, when light is incident on the photoelectric conversion layer and photoelectric conversion occurs in the photoelectric conversion layer, a kind of capacitor includes the inorganic oxide semiconductor material layer or the like, the insulating layer, and the charge storage electrode, and charges can be stored in the inorganic oxide semiconductor material layer or the like. For this reason, at the time of start of exposure, the charge storage section can be completely depleted, and the charges can be eliminated. As a result, a phenomenon in which kTC noise is enlarged and random noise is worsened and picked-up image quality is lowered can be restrained from occurring. In addition, all the pixels can be simultaneously reset, and, therefore, a so-called global shutter function can be realized.

FIG. 78 illustrates a conceptual diagram of the solid-state imaging apparatus of Embodiment 1. The solid-state imaging apparatus 100 of Embodiment 1 has a configuration including an imaging region 111 in which stacked-type imaging elements 101 are arranged in a two-dimensional array, and its driving circuits (peripheral circuits) such as a vertical driving circuit 112, column signal processing circuits 113, a horizontal driving circuit 114, an output circuit 115, a drive control circuit 116, and the like. Naturally, these circuits may include known circuits, or may be configured using other circuit configurations (for example, various circuits used in conventional CCD imaging apparatus or CMOS imaging apparatus). In FIG. 78, the representation of reference sign "101" for the stacked-type imaging elements 101 is made in only one row.

The drive control circuit 116 generates a clock signal as a reference for operations of the vertical driving circuit 112, the column signal processing circuit 113, and the horizontal driving circuit 114 and control signals, based on a vertical synchronizing signal, a horizontal synchronizing signal, and a master clock. The clock signal and control signals thus generated are inputted to the vertical driving circuit 112, the column signal processing circuit 113, and the horizontal driving circuit 114.

The vertical driving circuit 112 includes, for example, a shift register, and selectively scans the stacked-type imaging elements 101 in the imaging region 111 sequentially in the vertical direction on a row basis. A pixel signal (image signal) based on the currents (signals) generated according to light reception amounts at the stacked-type imaging elements 101 is sent to the column signal processing circuit 113 via signal lines (data output lines) 117, VSL.

The column signal processing circuits 113 are arranged, for example, on the basis of each column of the stacked-type imaging elements 101, and subjects the image signal outputted from the stacked-type imaging elements 101 for one row to signal processing such as noise removal and signal amplification on an imaging element basis by a signal from a black reference pixel (not illustrated but formed in the periphery of the effective pixel region). At an output stage of the column signal processing circuits 113, a horizontal select switch (not illustrated) is provided in connection between the output stage and a horizontal signal line 118.

The horizontal driving circuit 114 includes, for example, a shift register, and sequentially outputs horizontal scan pulses, to sequentially select each one of the column signal processing circuits 113, thereby outputting the signal from each of the column signal processing circuits 113 to the horizontal signal line 118.

The output circuit 115 subjects the signals sequentially supplied from each of the column signal processing circuits 113 through the horizontal signal line 118 to signal processing, and outputs the processes signals.

Figure 9:
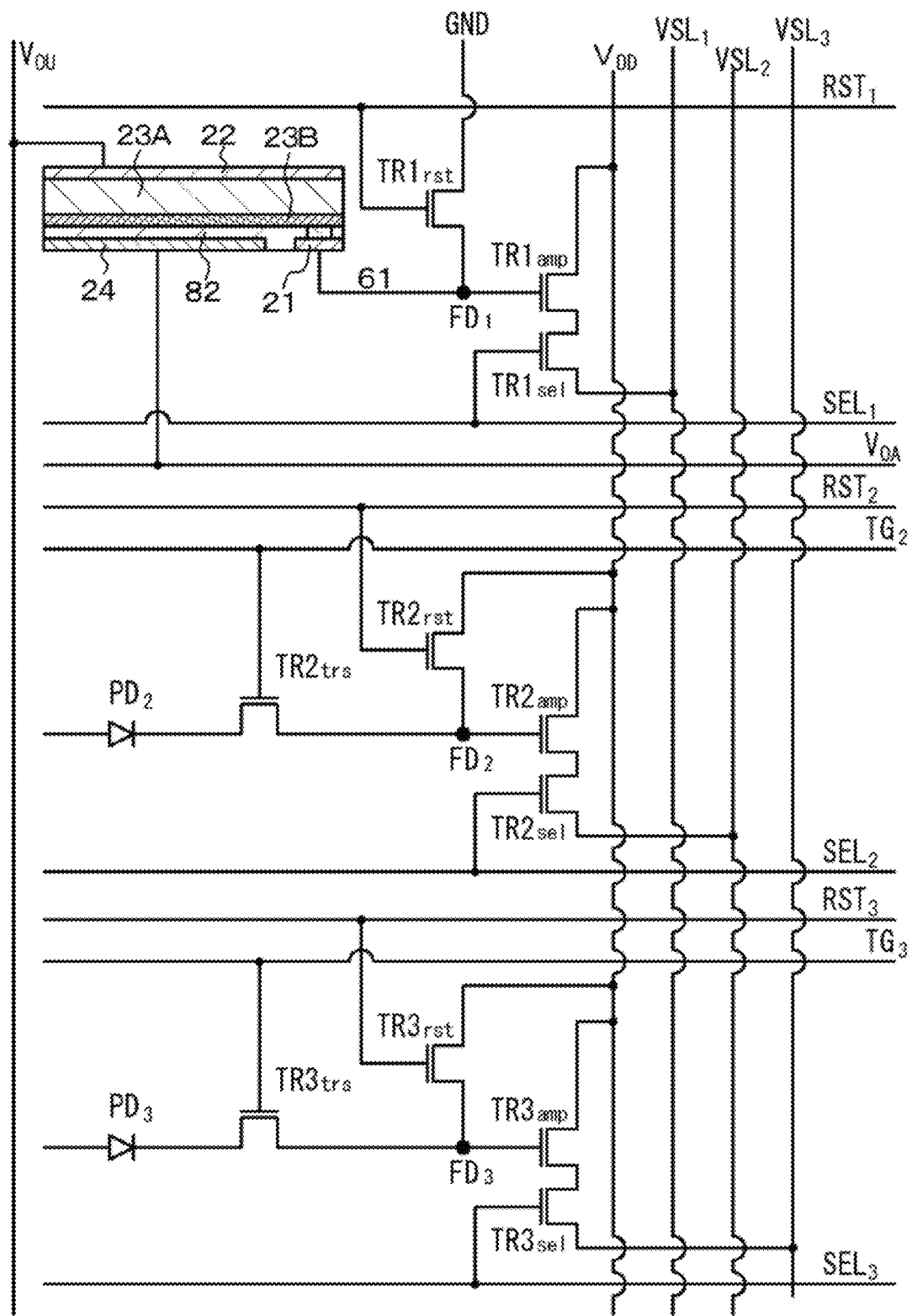
FIG. 9 is an equivalent circuit diagram of a modification of the imaging element of Embodiment 1.
Figure 10:
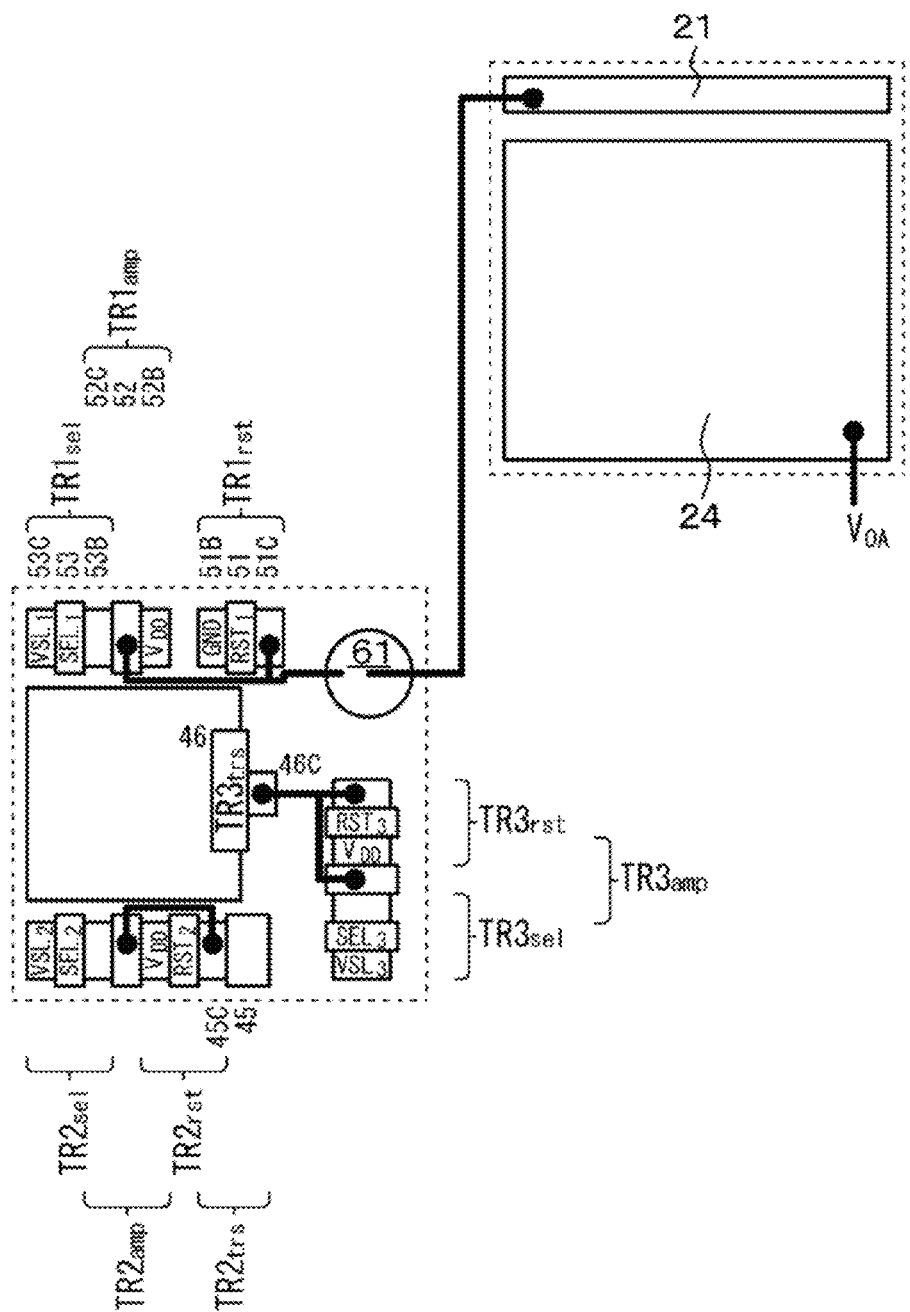
FIG. 10 is a schematic layout drawing of a first electrode and a charge storage electrode and transistors constituting a control section that constitute the modification of the imaging element of Embodiment 1 depicted in FIG. 9.

As an equivalent circuit diagram of a modification of the imaging element of Embodiment 1 is depicted in FIG. 9 and a schematic layout drawing of the first electrode and the charge storage electrode and transistors constituting the control section is depicted in FIG. 10, the source/drain region 51B on the other side of the reset transistor $TR1_{rst}$ may be grounded instead of being connected to the power source $V_{DD}$.

The imaging element of Embodiment 1 can be produced, for example, by the following method. First, an SOI substrate is prepared. A first silicon layer is formed on a front surface of the SOI substrate based on an epitaxial growth method, and the first silicon layer is formed with a $p^+$ layer 73 and an n-type semiconductor region 41. Next, a second silicon layer is formed on the first silicon layer based on an epitaxial growth method, and the second silicon layer is formed with an element isolation region 71, an oxide film 72, a $p^+$ layer 42, an n-type semiconductor region 43, and a $p^+$ layer 44. In addition, the second silicon layer is formed with various transistors and the like constituting a control section of the imaging element, and, further, a wiring layer 62 and an interlayer insulating layer 76 and various wirings are formed thereon, and the interlayer insulating layer 76 and a support substrate (not illustrated) are adhered to each other. Thereafter, the SOI substrate is removed to expose the first silicon layer. The surface of the second silicon layer corresponds to a front surface 70A of the semiconductor substrate 70, and the surface of the first silicon layer corresponds to a back surface 70B of the semiconductor substrate 70. Besides, the first silicon layer and the second silicon layer are collectively expressed as the semiconductor substrate 70. Next, an opening for forming a contact hole section 61 is formed on the side of the back surface 70B of the semiconductor substrate 70, then an $HfO_2$ film 74, an insulating material film 75, and the contact hole section 61 are formed, and, further, pad sections 63 and 64, an interlayer insulating layer 81, connection holes 65 and 66, a first electrode 21, a charge storage electrode 24, and an insulating layer 82 are formed. Subsequently, a connection section 67 is opened, an inorganic oxide semiconductor material layer 23B, a photoelectric conversion layer 23A, a second electrode 22, an insulating layer 83, and an on-chip microlens 14 are formed. By the above process, the imaging element of Embodiment 1 can be obtained.

In addition, though omitted in the drawings, the insulating layer 82 can have a two-layer configuration of an insulating layer lower layer and an insulating layer upper layer. In other words, it is sufficient if at least on the charge storage electrode 24 and in a region between the charge storage electrode 24 and the first electrode 21, the insulating layer lower layer is formed (more specifically, the insulating layer lower layer is formed on the interlayer insulating layer 81 inclusive of the charge storage electrode 24) and, after subjecting the insulating layer lower layer to a planarization treatment, the insulating layer upper layer is formed on the insulating layer lower layer and the charge storage electrode 24, so that planarization of the insulating layer 82 can be achieved securely. Then, it is sufficient if the connection section 67 is opened in the insulating layer 82 thus obtained.

Embodiment 2

Figure 11:
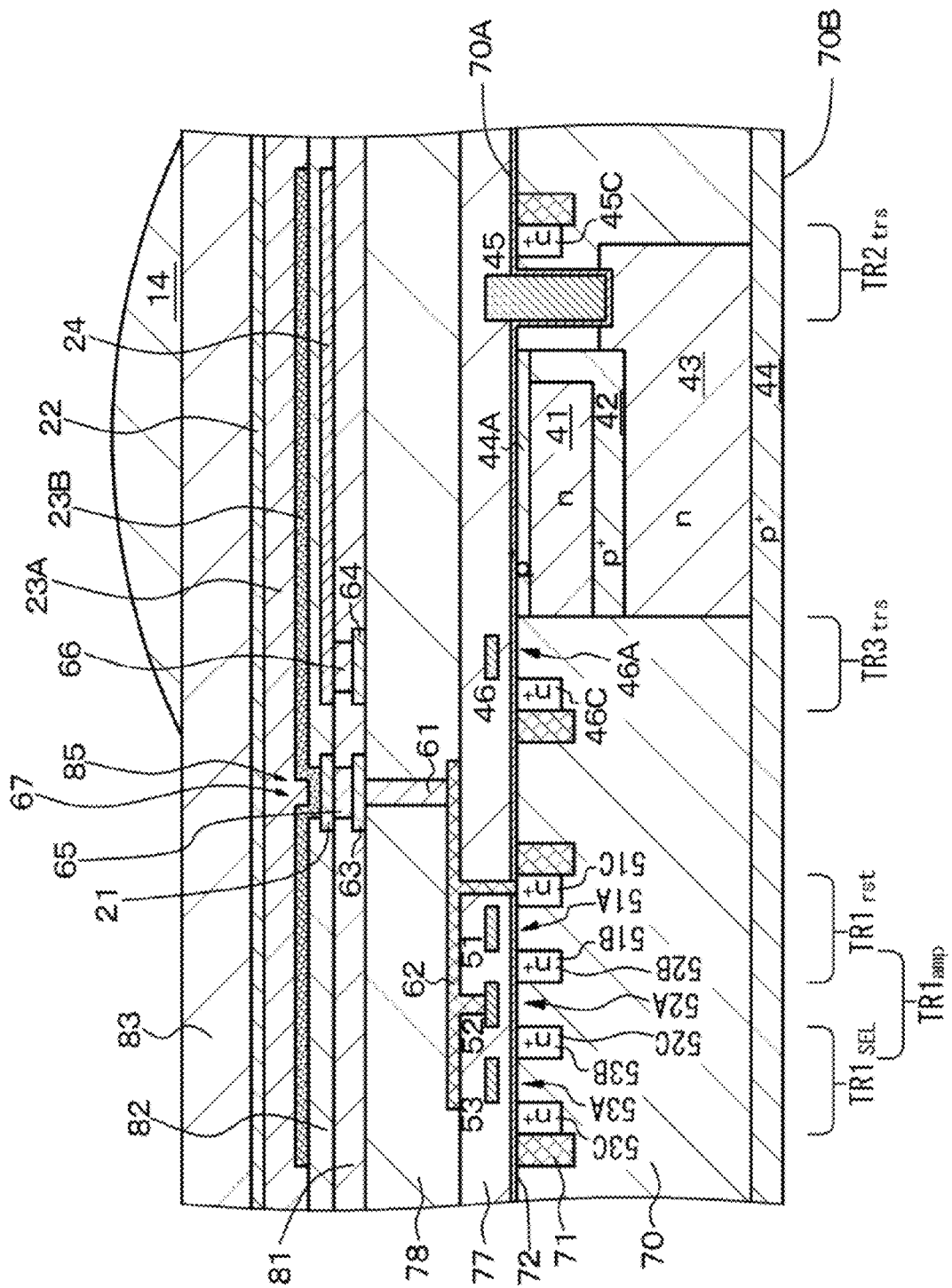
FIG. 11 is a schematic partial sectional view of an imaging element of Embodiment 2.

Embodiment 2 is a modification of Embodiment 1. An imaging element of Embodiment 2 of which a schematic partial sectional view is illustrated in FIG. 11 is a front side illumination type imaging element, and has a structure in which three imaging elements are stacked, the three imaging element being a green light imaging element of Embodiment 1 of the first type (first imaging element) which includes a green light photoelectric conversion layer of the first type absorbing green light and has sensitivity to green light, a conventional blue light imaging element of the second type (second imaging element) which includes a blue light photoelectric conversion layer of the second type absorbing blue light and has sensitivity to blue light, and a conventional red light imaging element of the second type (third imaging element) which includes a red light photoelectric conversion layer of the second type absorbing red light and has sensitivity to red light. Here, the red light imaging element (third imaging element) and the blue light imaging element (second imaging element) are provided in the semiconductor substrate 70, and the second imaging element is located on the light incidence side as compared to the third imaging element. In addition, the green light imaging element (first imaging element) is provided on an upper side of the blue light imaging element (second imaging element).

Various transistors constituting a control section are provided on the front surface 70A side of the semiconductor substrate 70, like in Embodiment 1. These transistors substantially have configurations and structures similar to those of the transistors described in Embodiment 1. While the semiconductor substrate 70 is provided with the second imaging element and the third imaging element, these imaging elements also may substantially have configurations and structures similar to those of the second imaging element and the third imaging element described in Embodiment 1.

An interlayer insulating layer 81 is formed on an upper side of the front surface 70A of the semiconductor substrate 70, and a photoelectric conversion section (a first electrode 21, an inorganic oxide semiconductor material layer 23B, a photoelectric conversion layer 23A, a second electrode 22, and a charge storage electrode 24, etc.) including a charge storage electrode for constituting the imaging element of Embodiment 1 is provided on an upper side of the interlayer insulating layer 81.

In this way, the configuration and structure of the imaging element of Embodiment 2 may be similar to the configuration and structure of the imaging element of Embodiment 1, except for the point of being of the front side illumination type, and, accordingly, detailed description thereof is omitted.

Embodiment 3

Embodiment 3 is a modification of Embodiment 1 and Embodiment 2.

Figure 12:
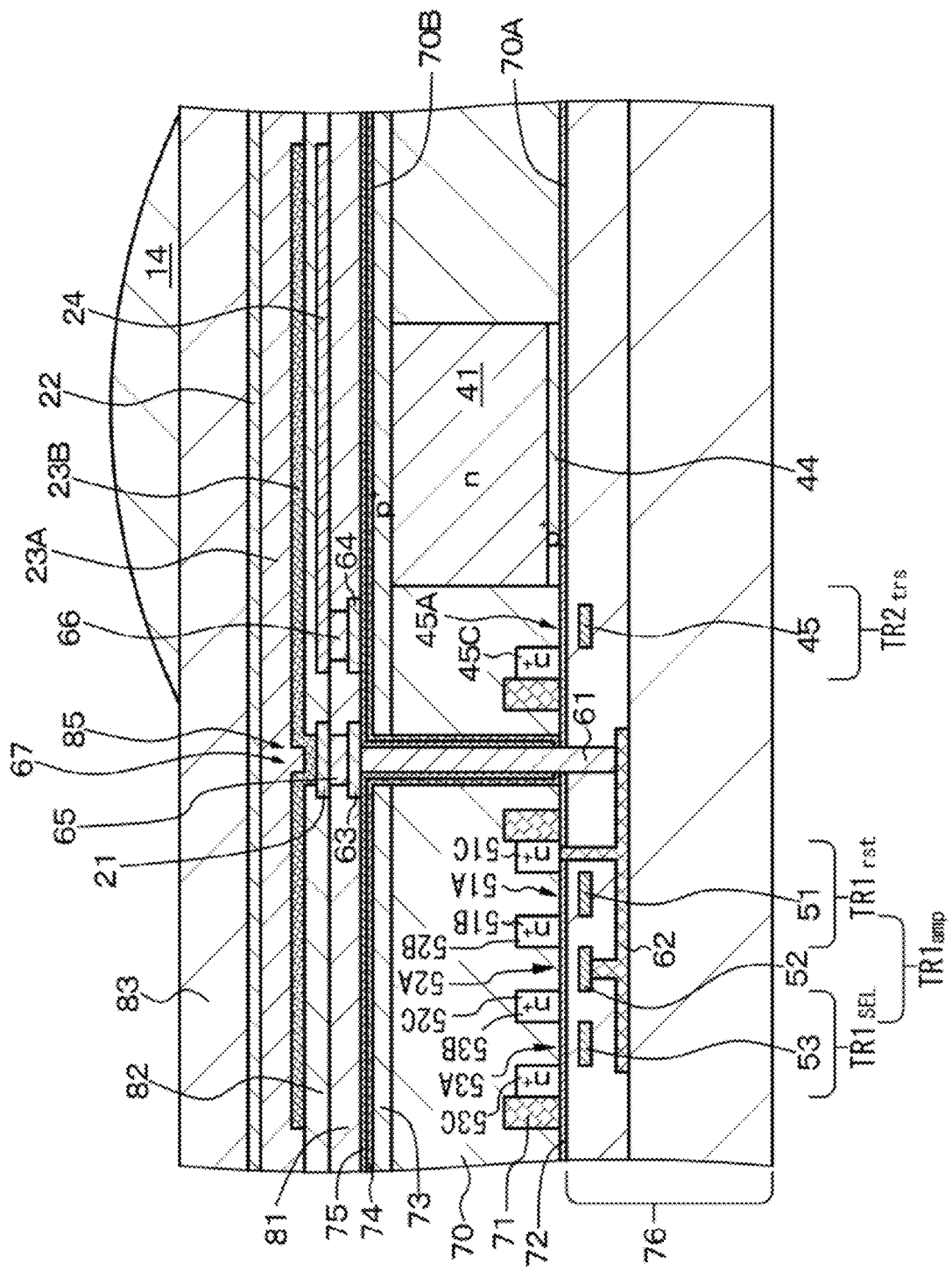
FIG. 12 is a schematic partial sectional view of an imaging element of Embodiment 3.
Figure 13:
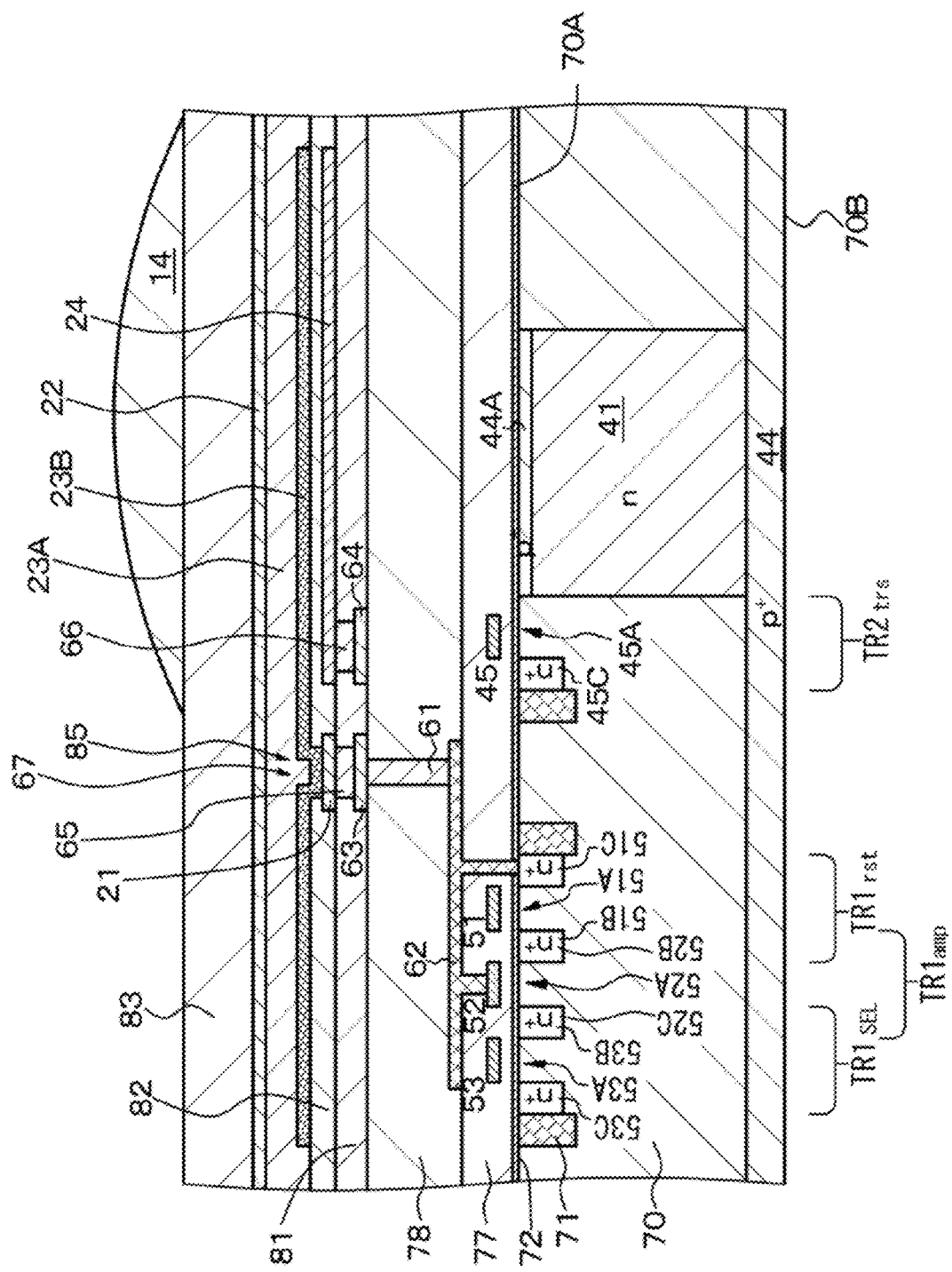
FIG. 13 is a schematic partial sectional view of a modification of the imaging element of Embodiment 3.

An imaging element of Embodiment 3 of which a schematic partial sectional view is depicted in FIG. 12 is a back side illumination type imaging element, and has a structure in which two imaging elements are stacked, the two imaging elements being a first imaging element of Embodiment 1 of the first type and a second imaging element of the second type. In addition, a modification of the imaging element of Embodiment 3 of which a schematic partial sectional view is depicted in FIG. 13 is an imaging element of a front side illumination type, and has a structure in which two imaging elements are stacked, the two imaging elements being a first imaging element of Embodiment 1 of the first type and a second imaging element of the second type. Here, the first imaging element absorbs light in primary colors, while the second imaging element absorbs light in complementary colors. Alternatively, the first imaging element absorbs white light, while the second imaging element absorbs infrared rays.

Figure 14:
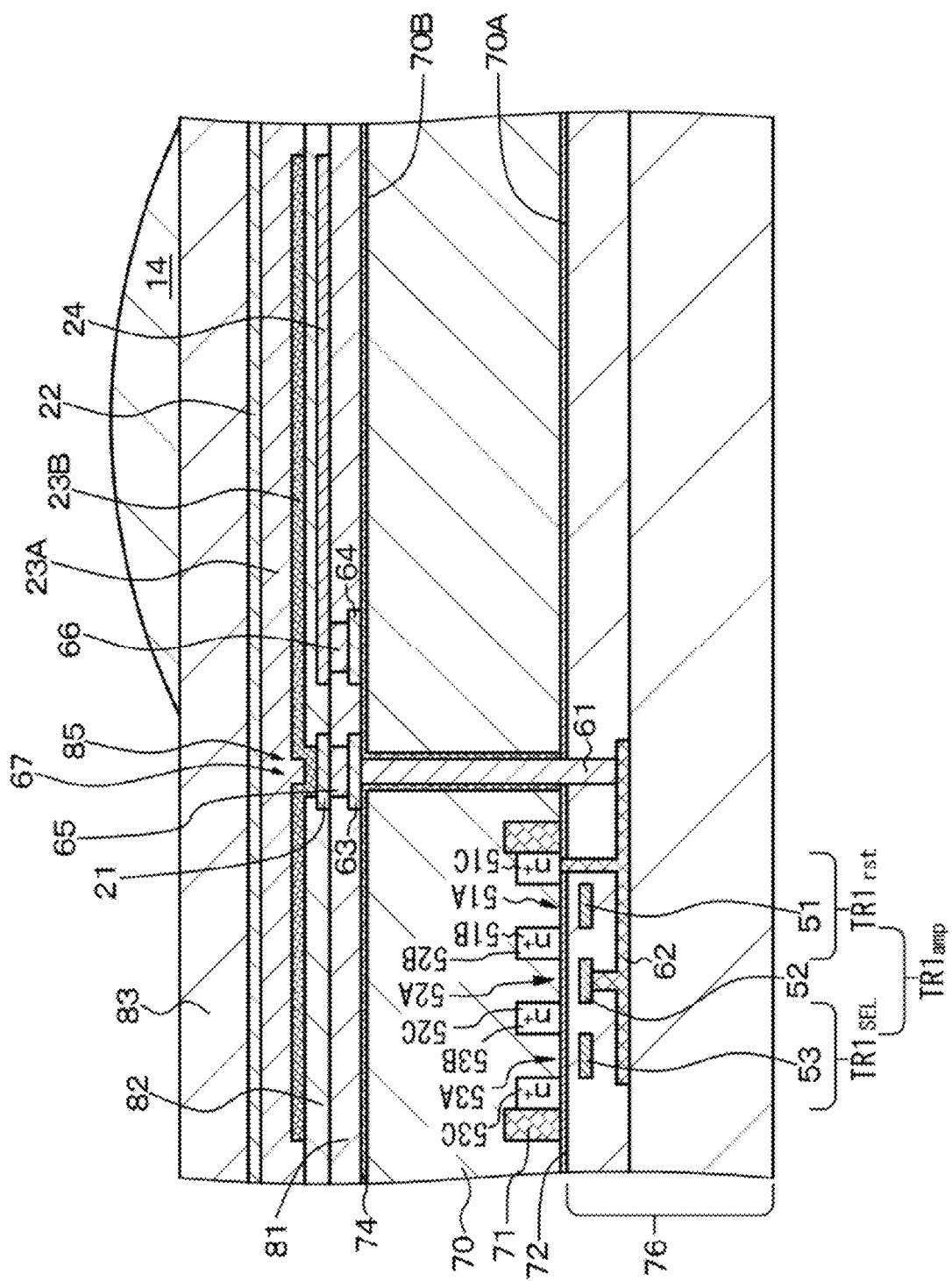
FIG. 14 is a schematic partial sectional view of another modification of the imaging element of Embodiment 3.
Figure 15:
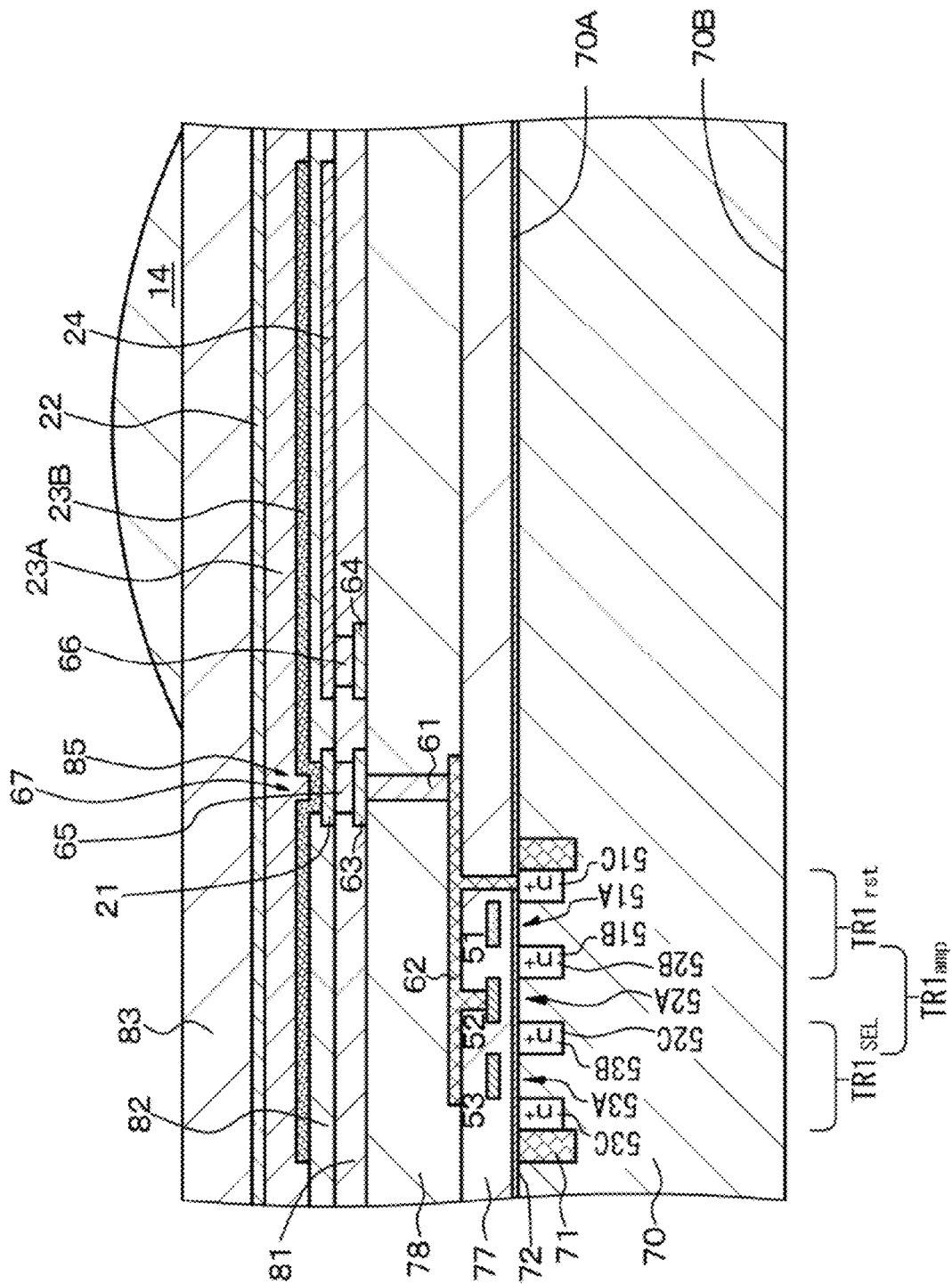
FIG. 15 is a schematic partial sectional view of a further modification of the imaging element of Embodiment 3.

A modification of the imaging element of Embodiment 3 of which a schematic partial sectional view is depicted in FIG. 14 is an imaging element of the back side illumination type, and includes the first imaging elements of Embodiment 1 of the first type. In addition, a modification of the imaging element of Embodiment 3 of which a schematic partial sectional view is depicted in FIG. 15 is an imaging element of the front side illumination type, and includes the first imaging elements of Embodiment 1 of the first type. Here, the first imaging elements include three kinds of imaging elements, that is, an imaging element that absorbs red light, an imaging element that absorbs green light, and an imaging element that absorbs blue light. Further, the solid-state imaging apparatus according to the first mode of the present disclosure includes a plurality of these imaging elements. Examples of arrangement of the plurality of these imaging elements include a Bayer array. Color filter layers for performing spectroscopy of blue, green, and red are disposed on the light incidence side of each imaging element, as required.

Instead of providing one photoelectric conversion section including the charge storage electrode of Embodiment 1 of the first type, a mode of stacking two photoelectric conversion sections (i.e., a mode in which two photoelectric conversion sections including the charge storage electrode are stacked and the semiconductor substrate is provided with a control section for the two photoelectric conversion sections) or a mode of stacking three photoelectric conversion sections (i.e., a mode in which three photoelectric conversion sections including the charge storage electrode are stacked and the semiconductor substrate is provided with a control section for the three photoelectric conversion sections) can be adopted. Examples of a stacked layer structure of the imaging element of the first type and the imaging element of the second type will be indicated in the following table.

| | First type | Second type |
|---|---|---|
| Back-side illumination type and front-side illumination type | 1 green | 2 blue + red |
| | 1 primary color | 1 complementary color |
| | 1 white | 1 infrared ray |
| | 1 blue, green, or red | 0 |
| | 2 green + infrared light | 2 blue + red |
| | 2 green + blue | 1 red |
| | 2 white + infrared light | 0 |

-continued

| First type | Second type |
|---|---|
| 3 green + blue + red | 2 blue green (emerald) + infrared light |
| 3 green + blue + red | 1 infrared light |
| 3 blue + green + red | 0 |

Embodiment 4

Figure 6B:
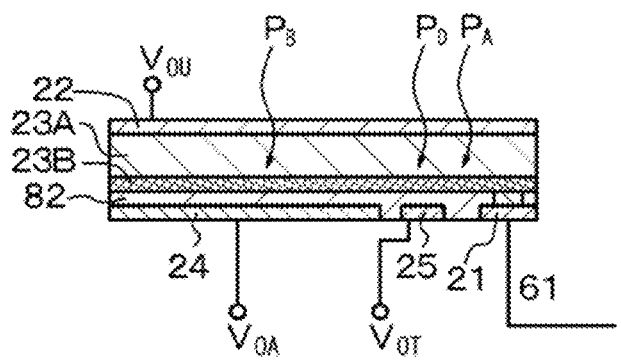
Figure 16:
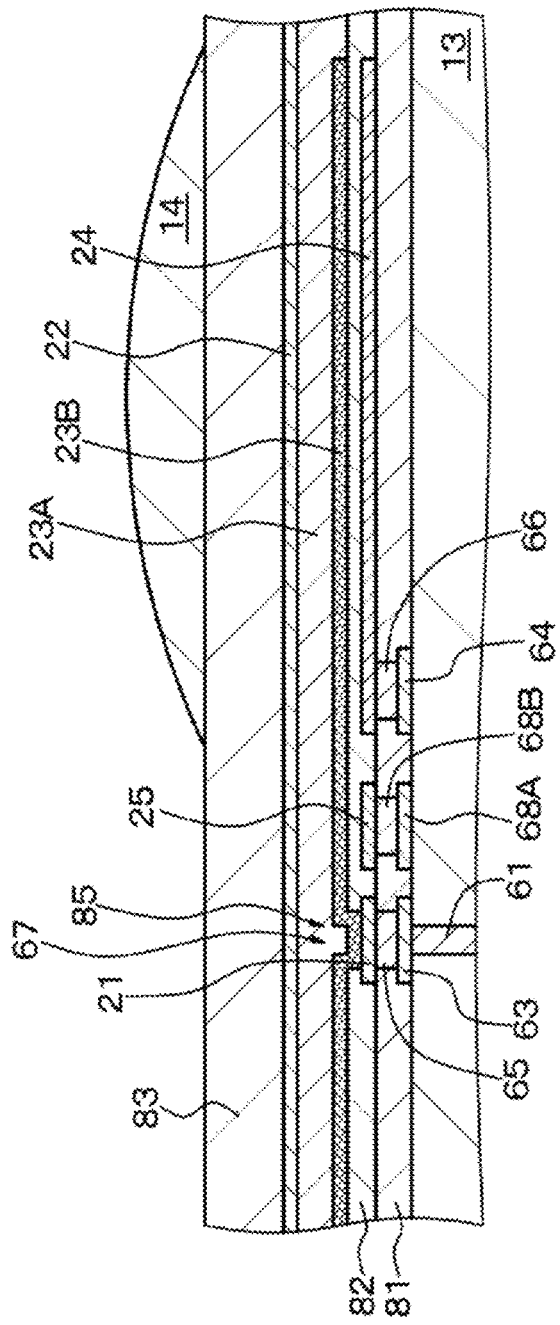
FIG. 16 is a schematic partial sectional view of a part of an imaging element of Embodiment 4.
Figure 17:
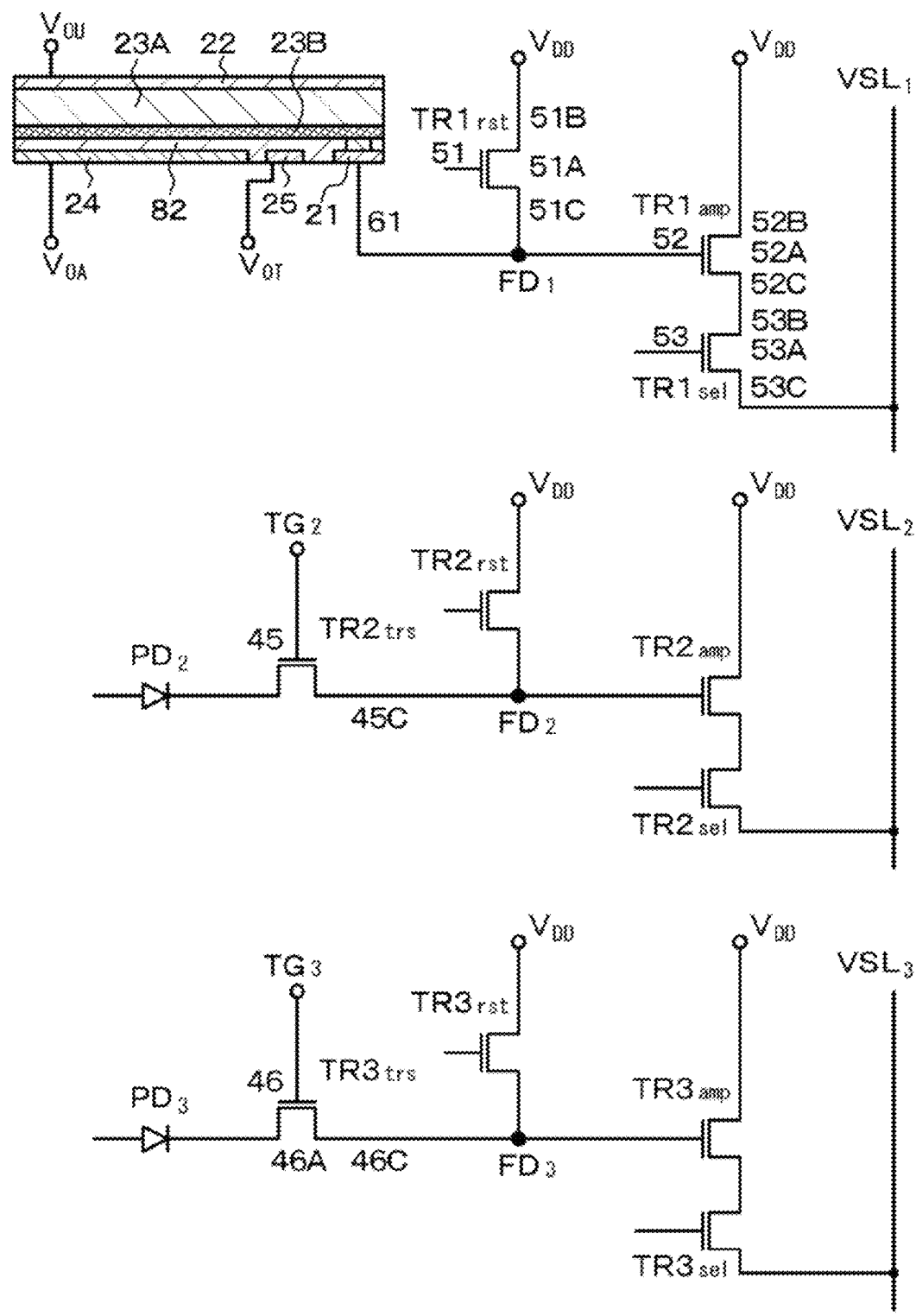
FIG. 17 is an equivalent circuit diagram of the imaging element of Embodiment 4.
Figure 18:
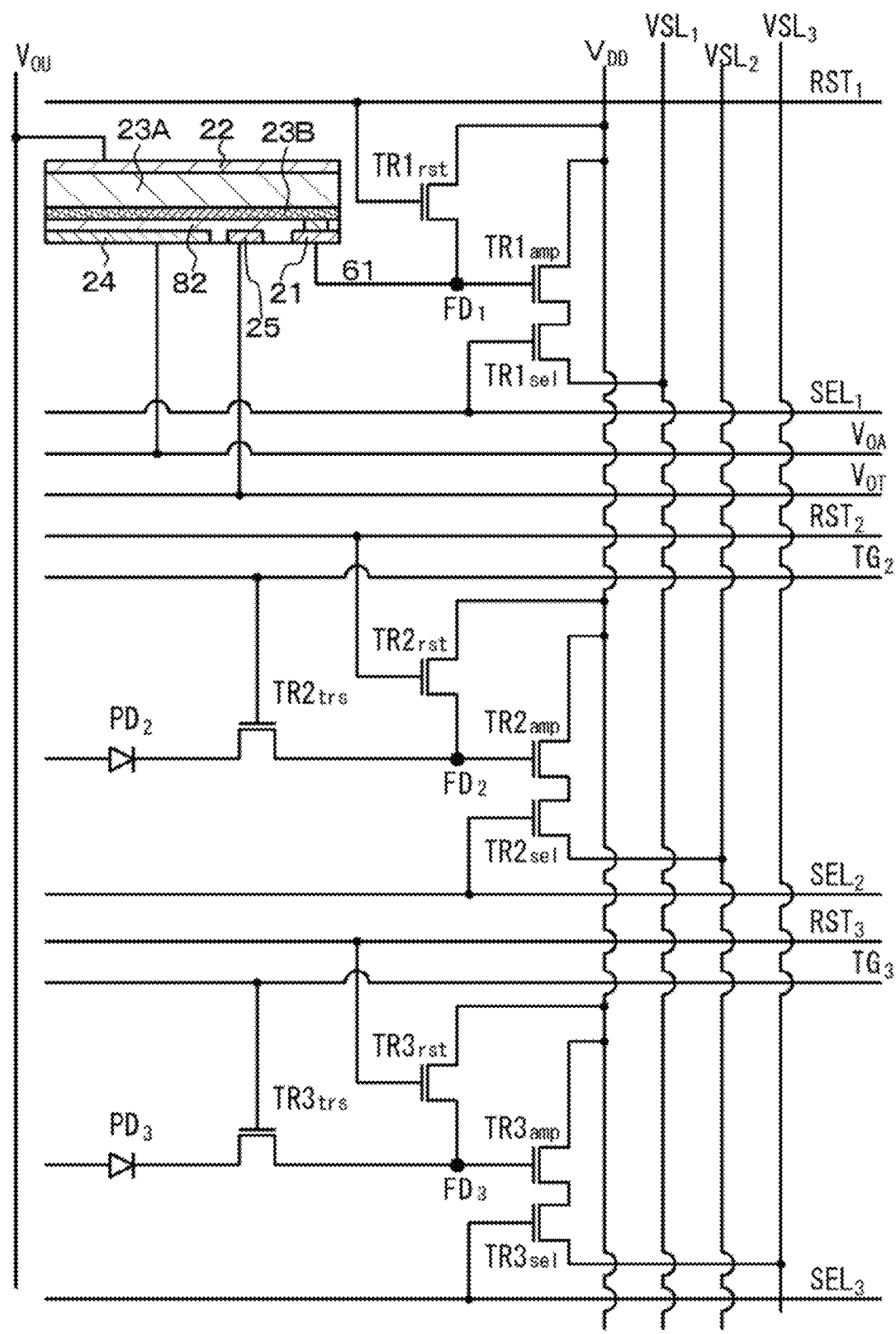
FIG. 18 is an equivalent circuit diagram of the imaging element of Embodiment 4.
Figure 19:
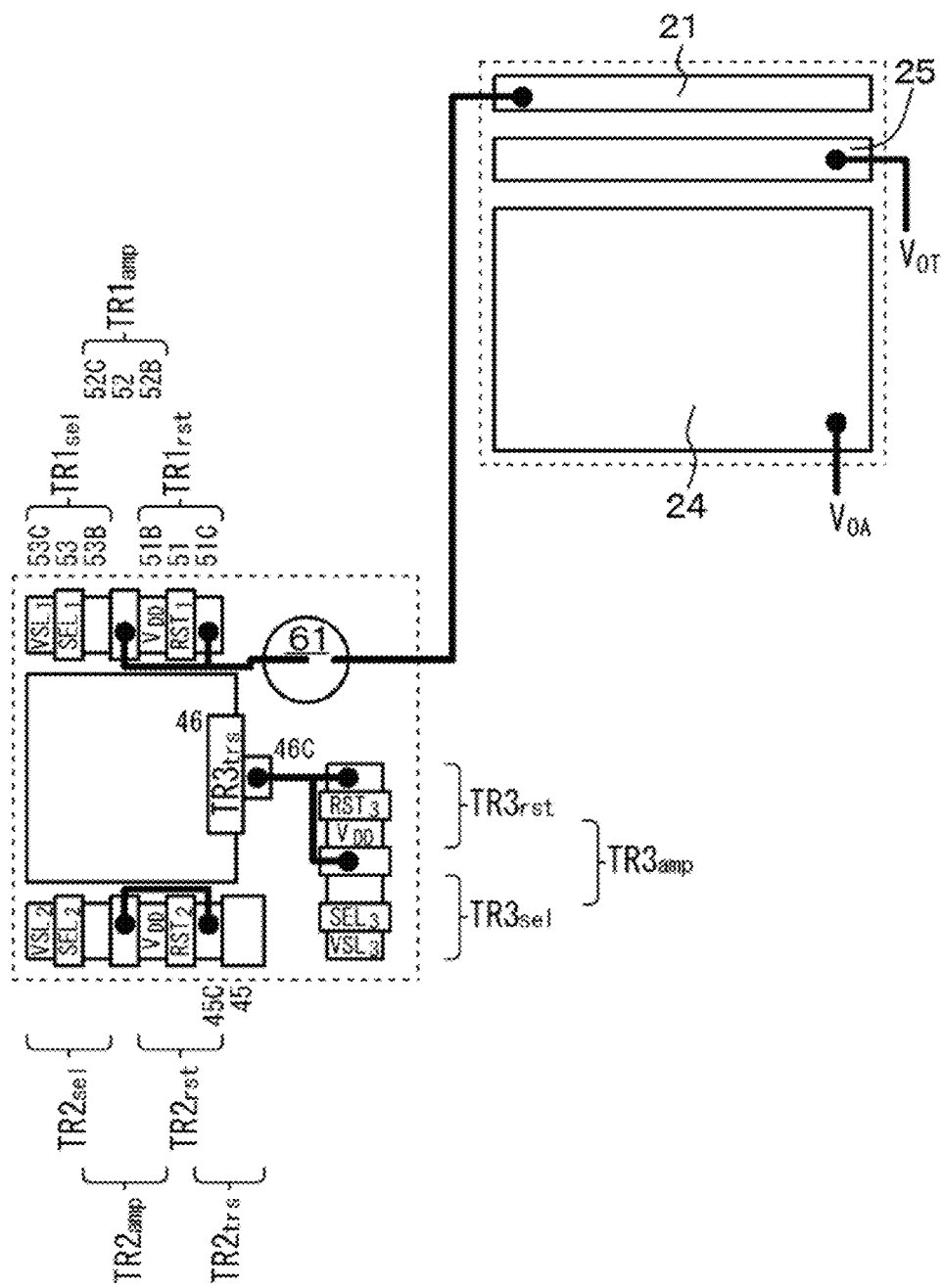
FIG. 19 is a schematic layout drawing of a first electrode, a transfer control electrode, and a charge storage electrode and transistors constituting a control section that constitute the imaging element of Embodiment 4.
Figure 22:
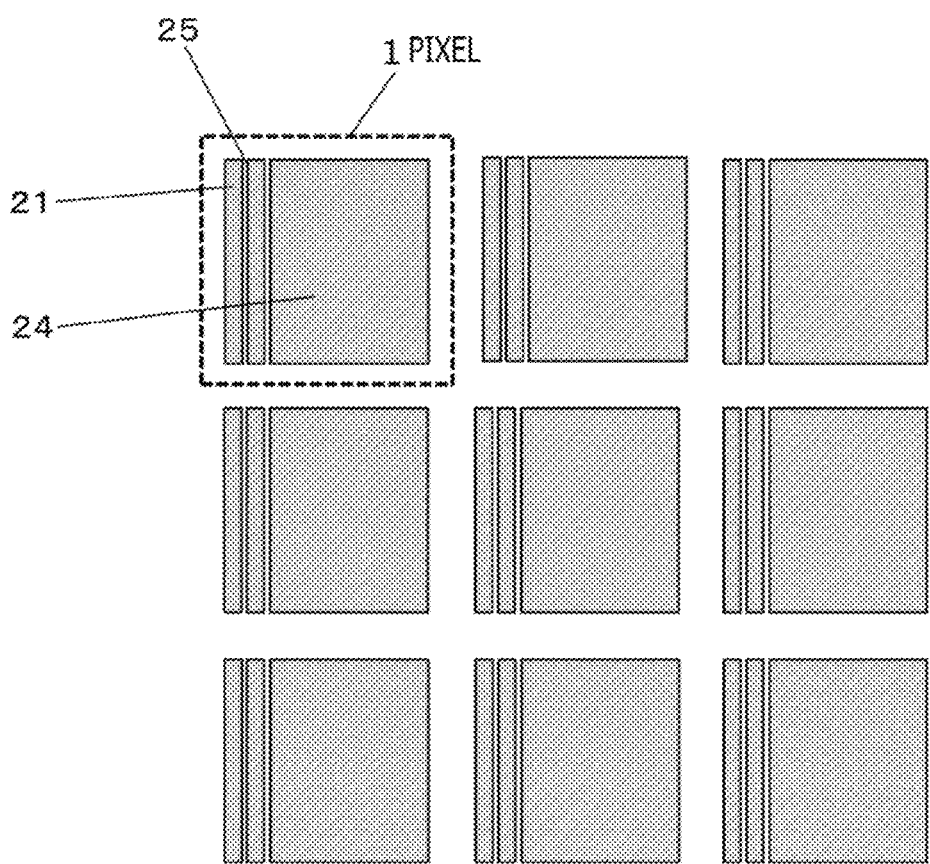
FIG. 22 is a schematic layout drawing of the first electrode, the transfer control electrode, and the charge storage electrode constituting the imaging element of Embodiment 4.
Figure 23:
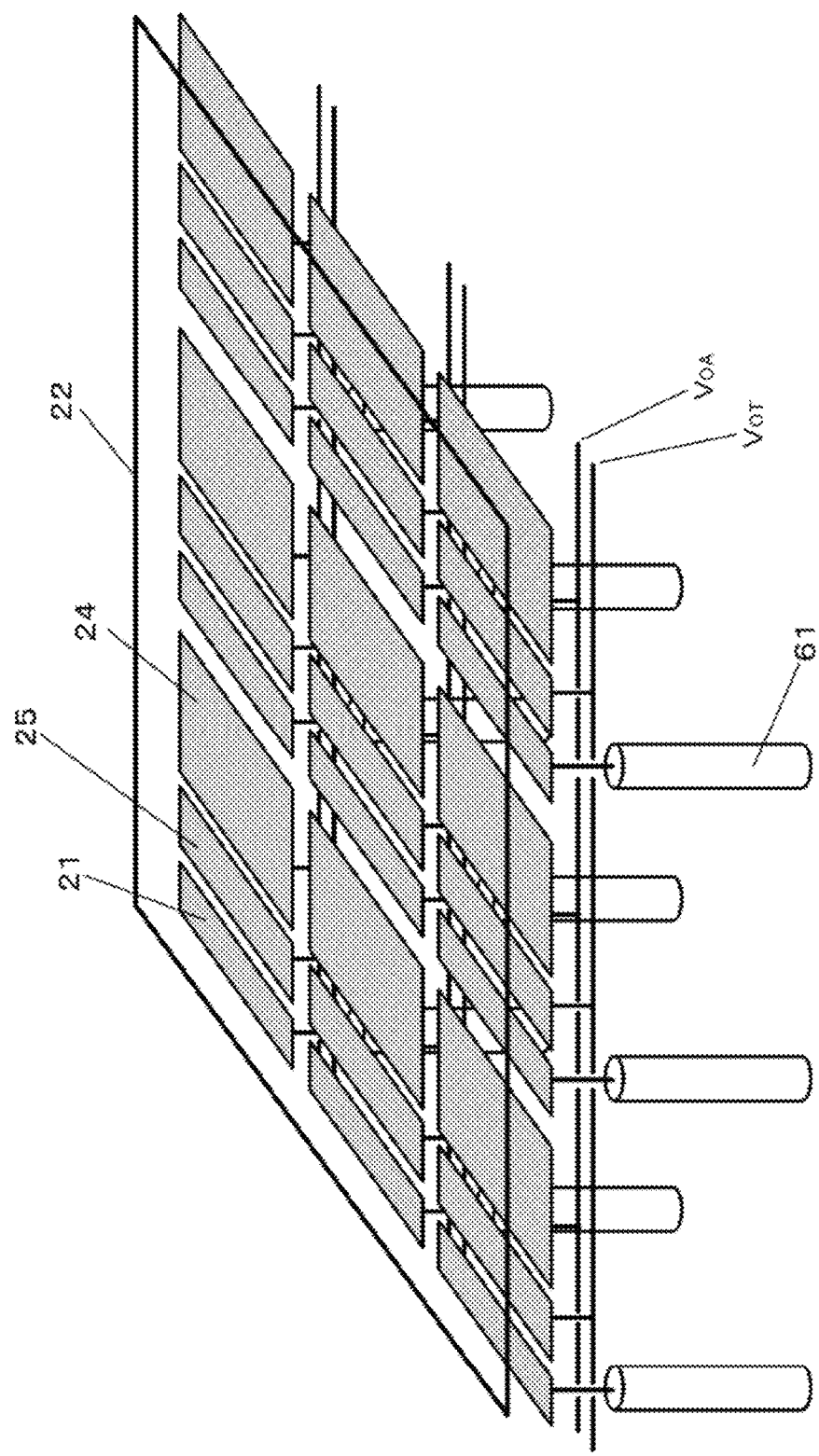
FIG. 23 is a schematic perspective view of the first electrode, the transfer control electrode, the charge storage electrode, a second electrode, and a contact hole section that constitute the imaging element of Embodiment 4.

Embodiment 4 is a modification of Embodiments 1 to 3, and relates to the imaging element or the like including the transfer control electrode (charge transfer electrode) of the present disclosure. A schematic partial sectional view of part of the imaging element of Embodiment 4 is depicted in FIG. 16, equivalent circuit diagrams of the imaging element of Embodiment 4 are depicted in FIGS. 17 and 18, a schematic layout drawing of a first electrode, a transfer control electrode, and a charge storage electrode constituting a photoelectric conversion section and transistors constituting a control section of the imaging element of Embodiment 4 is depicted in FIG. 19, a state of potentials at each part at the time of operation of the imaging element of Embodiment 4 is schematically depicted in FIGS. 20 and 21, and an equivalent circuit diagram for explaining each part of the imaging element of Embodiment 4 is depicted in FIG. 6B. In addition, a schematic layout drawing of the first electrode, the transfer control electrode, and the charge storage electrode constituting the photoelectric conversion section of the imaging element of Embodiment 4 is depicted in FIG. 22, and a schematic perspective view of the first electrode, the transfer control electrode, the charge storage electrode, a second electrode, and a contact hole section is depicted in FIG. 23.

The imaging element of Embodiment 4 further includes a transfer control electrode (charge transfer electrode) 25 which is disposed between a first electrode 21 and a charge storage electrode 24 in the state of being spaced from the first electrode 21 and the charge storage electrode 24 and which is disposed to face an inorganic oxide semiconductor material layer 23B, with an insulating layer 82 interposed therebetween. The transfer control electrode 25 is connected to a pixel driving circuit constituting a driving circuit, via a connection hole 68B provided in an interlayer insulating layer 81, a pad section 68A, and a wiring $V_{OT}$. Note that various kinds of imaging element constituent elements located below the interlayer insulating layer 81 are collectively denoted by reference sign 13 for convenience' sake for simplification of the drawing.

An operation of the imaging element (first imaging element) of Embodiment 4 will be described below, referring to FIGS. 20 and 21. Note that in FIGS. 20 and 21, the values of a potential impressed on the charge storage electrode 24 and a potential at point $P_D$ are different.

In a charge storage period, a potential $V_{11}$ is impressed on the first electrode 21, a potential $V_{12}$ is impressed on the charge storage electrode 24, and a potential $V_{13}$ is impressed on the transfer control electrode 25, from the driving circuit. By light incident on the photoelectric conversion layer 23A, photoelectric conversion is generated in the photoelectric conversion layer 23A. Holes generated by the photoelectric conversion are sent out to the driving circuit from the second electrode 22 via a wiring $V_{OU}$. On the other hand, since the potential of the first electrode 21 is set higher than the potential of the second electrode 22, i.e., since, for example, a positive potential is impressed on the first electrode 21 and a negative potential is impressed on the second electrode 22, $V_2 > V_{13}$ (for example, $V_{12} > V_{11} > V_{13}$, or $V_{11} > V_{12} > V_{13}$) is satisfied. As a result, electrons generated by the photoelectric conversion are attracted to the charge storage electrode 24, and stay in the region of the inorganic oxide semiconductor material layer 23B or the like facing the charge storage electrode 24. In other words, charges are stored in the inorganic oxide semiconductor material layer 23B or the like. Since $V_{12} > V_{13}$ is satisfied, the electrons generated in the inside of the photoelectric conversion layer 23A can be securely prevented from moving toward the first electrode 21. Attendant on the lapse of time of the photoelectric conversion, the potential in the region of the inorganic oxide semiconductor material layer 23B or the like facing the charge storage electrode 24 becomes a value on the more negative side.

At a later stage of the charge storage period, a resetting operation is performed. As a result, the potential of a first floating diffusion layer $FD_1$ is reset, and the potential of the first floating diffusion layer $FD_1$ becomes the potential $V_{DD}$ of the power source.

After the resetting operation is completed, reading of charges is conducted. In other words, in a charge transfer period, a potential $V_{21}$ is impressed on the first electrode 21, a potential $V_{22}$ is impressed on the charge storage electrode 24, and a potential $V_{23}$ is impressed on the transfer control electrode 25, from the driving circuit. Here, $V_{22} \leq V_{23} \leq V_{21}$ (preferably, $V_{22} < V_{23} < V_{21}$) is satisfied. In the case where a potential $V_{13}$ is impressed on the transfer control electrode 25, it is sufficient if $V_{22} \leq V_{13} \leq V_{21}$ (preferably, $V_{22} < V_{13} < V_{21}$) is satisfied. As a result, the electrons having stayed in the region of the inorganic oxide semiconductor material layer 23B or the like facing the charge storage electrode 24 are securely read out to the first electrode 21, and, further, to the first floating diffusion layer $FD_1$. In other words, the charges stored in the inorganic oxide semiconductor material layer 23B or the like are read out to the control section.

By the above process, a series of operations of charge storage, resetting operation, and charge transfer are completed.

Operations of an amplification transistor $TR1_{amp}$ and a select transistor $TR1_{sel}$ after the electrons are read out to the first floating diffusion layer $FD_1$ are the same as the operations of the corresponding conventional transistors. In addition, the series of operations of, for example, charge storage, resetting operation, and charge transfer in the second imaging element and the third imaging element are similar to the conventional series of operations of charge storage, resetting operation, and charge transfer.

Figure 24:
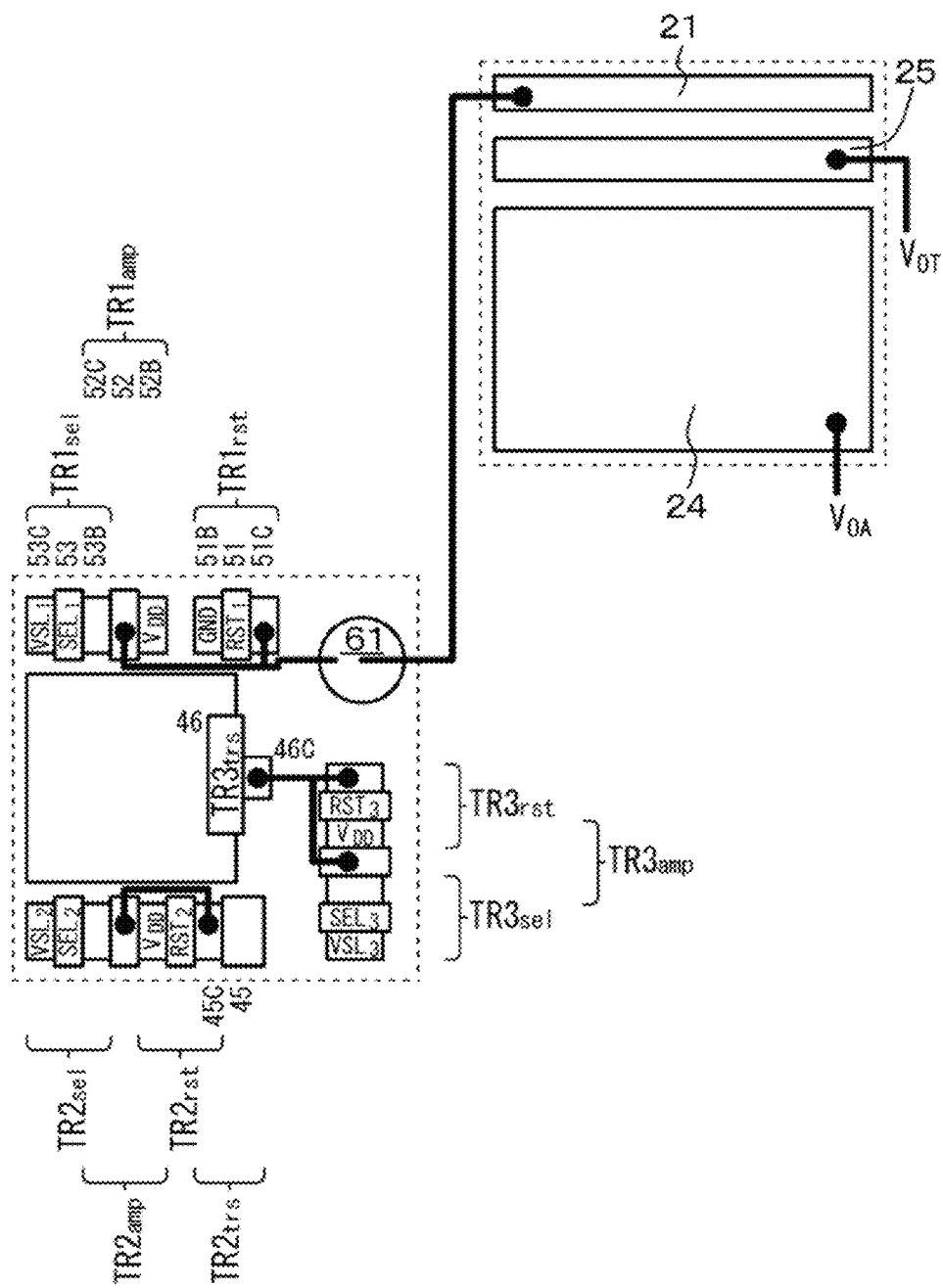
FIG. 24 is a schematic layout drawing of the first electrode, the transfer control electrode, and the charge storage electrode, and transistors constituting a control section that constitute a modification of the imaging element of Embodiment 4.

As a schematic layout drawing of the first electrode, the charge storage electrode, and the transistors constituting the control section that constitute the modification of the imaging element of Embodiment 4 is depicted in FIG. 24, a source/drain region 51B on the other side of the reset transistor $TR1_{rst}$ may be grounded, instead of being connected to the power source $V_{DD}$.

Embodiment 5

Figure 25:
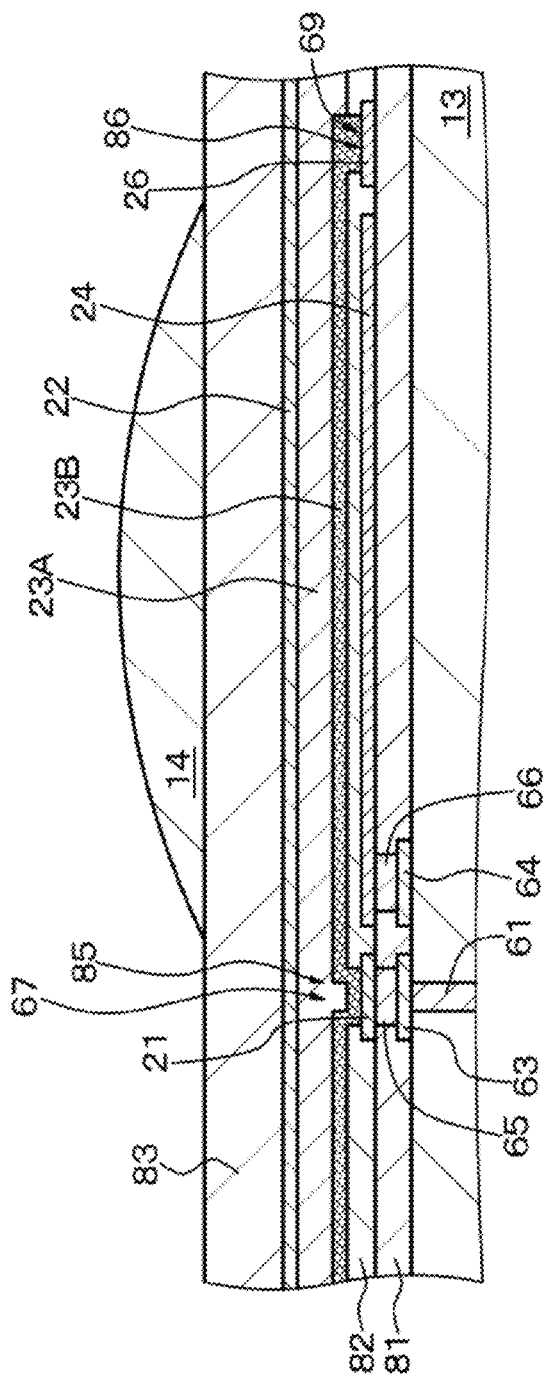
FIG. 25 is a schematic partial sectional view of a part of an imaging element of Embodiment 5.
Figure 26:
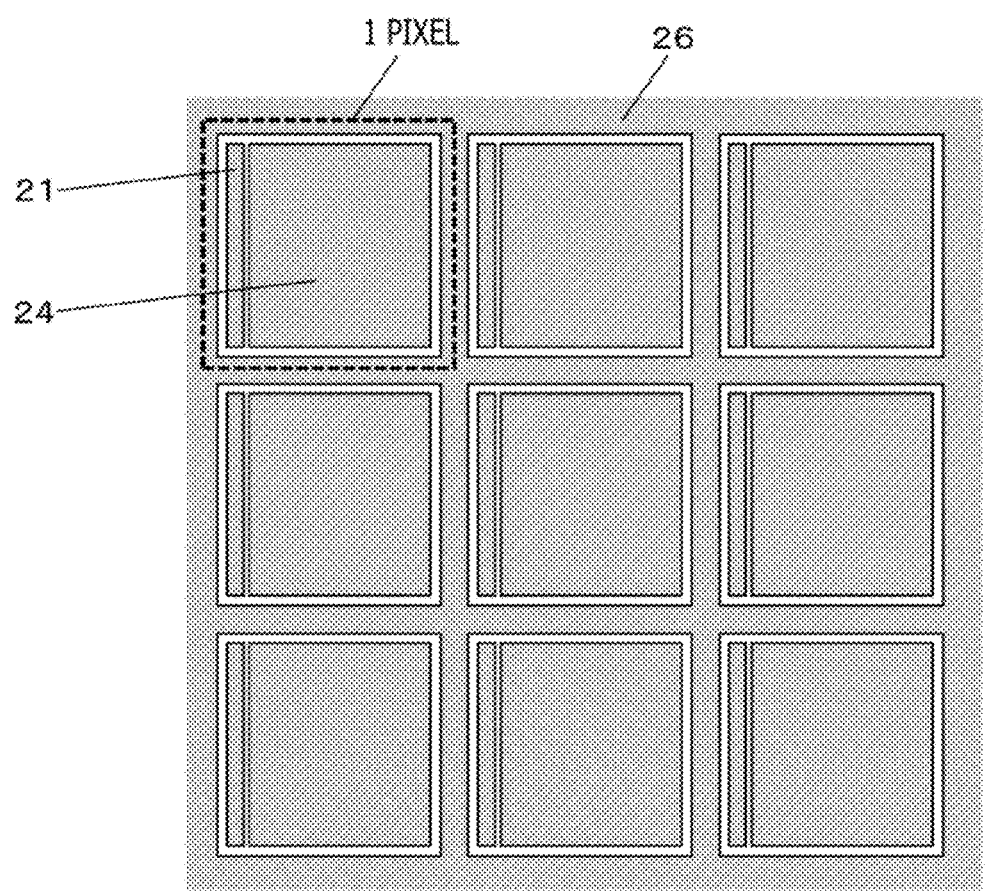
FIG. 26 is a schematic layout drawing of a first electrode, a charge storage electrode, and a charge discharge electrode constituting the imaging element of Embodiment 5.
Figure 27:
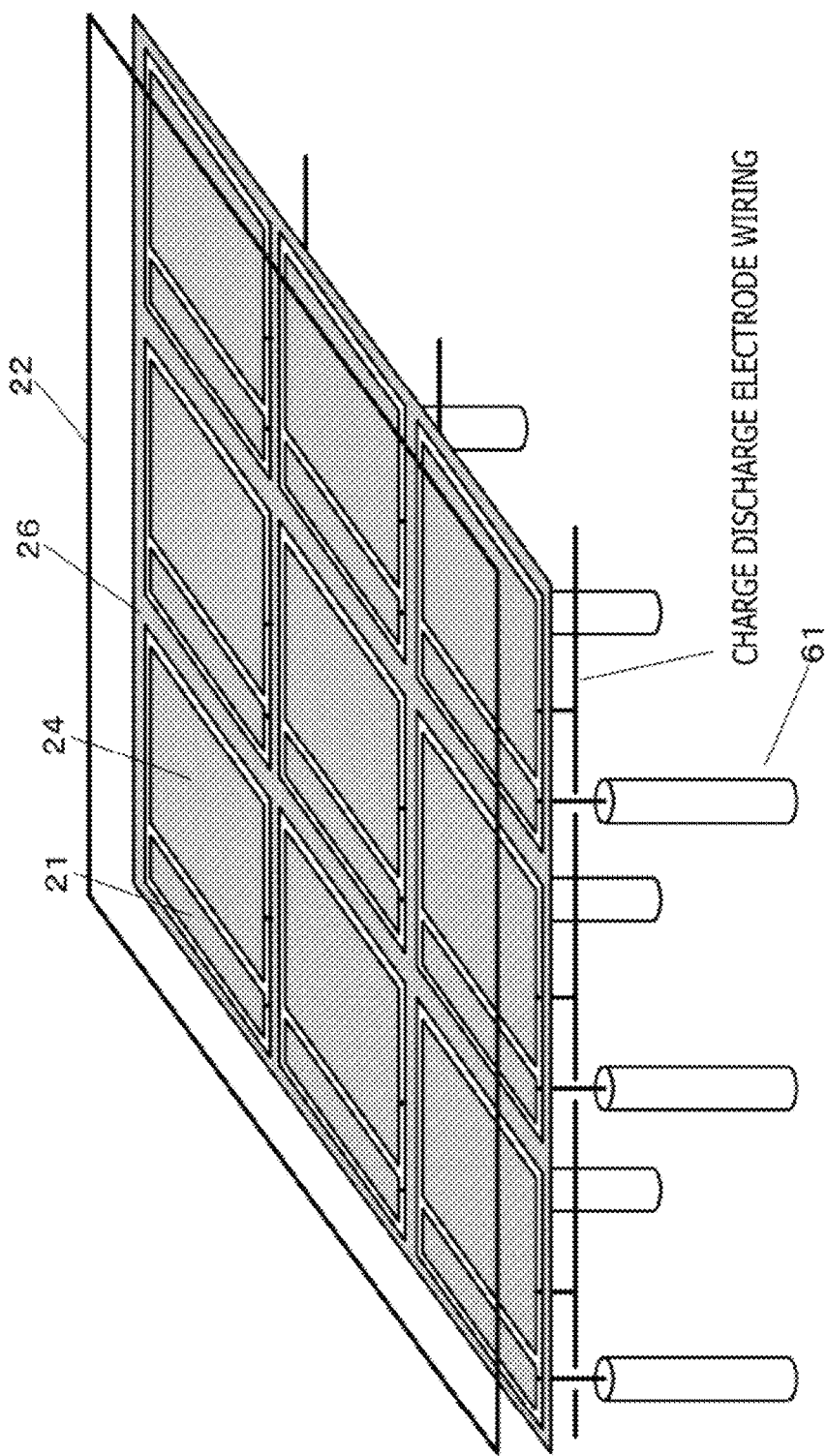
FIG. 27 is a schematic perspective view of the first electrode, the charge storage electrode, the charge discharge electrode, a second electrode, and a contact hole section constituting the imaging element of Embodiment 5.

Embodiment 5 is a modification of Embodiments 1 to 4, and relates to the imaging element or the like including the charge discharge electrode of the present disclosure. A schematic partial sectional view of part of the imaging element of Embodiment 5 is depicted in FIG. 25, a schematic layout drawing of a first electrode, a charge storage electrode, and a charge discharge electrode constituting a photoelectric conversion section including a charge storage electrode of the imaging element of Embodiment 5 is depicted in FIG. 26, and a schematic perspective view of the first electrode, the charge storage electrode, the charge discharge electrode, a second electrode, and a contact hole section is depicted in FIG. 27.

The imaging element of Embodiment 5 further includes a charge discharge electrode 26 which is connected to the inorganic oxide semiconductor material layer 23B via a connection section 69 and which is disposed spaced from the first electrode 21 and the charge storage electrode 24. Here, the charge discharge electrode 26 is disposed such as to surround the first electrode 21 and the charge storage electrode 24 (i.e., in a picture frame shape). The charge discharge electrode 26 is connected to a pixel driving circuit constituting the driving circuit. The inorganic oxide semiconductor material layer 23B extends inside the connection section 69. In other words, the inorganic oxide semiconductor material layer 23B extends in the inside of a second opening 86 provided in the insulating layer 82, and is connected to the charge discharge electrode 26. The charge discharge electrode 26 is shared by (is common to) a plurality of imaging elements.

In Embodiment 5, in a charge storage period, a potential $V_{11}$ is impressed on the first electrode 21, a potential $V_{12}$ is impressed on the charge storage electrode 24, and a potential $V_{14}$ is impressed on the charge discharge electrode 26, from the driving circuit, and charges are stored in the inorganic oxide semiconductor material layer 23B or the like. By light incident on the photoelectric conversion layer 23A, photoelectric conversion is generated in the photoelectric conversion layer 23A. Holes generated by the photoelectric conversion are sent out to the driving circuit from the second electrode 22 via a wiring $V_{OU}$. On the other hand, since the potential of the first electrode 21 is set higher than the potential of the second electrode 22, i.e., since, for example, a positive potential is impressed on the first electrode 21 and a negative potential is impressed on the second electrode 22, $V_{14} > V_{11}$ (for example, $V_{12} > V_{14} > V_{11}$) is satisfied. As a result, electrons generated by the photoelectric conversion are attracted to the charge storage electrode 24, and stay in the region of the inorganic oxide semiconductor material layer 23B or the like facing the charge storage electrode 24, so that the electrons can be securely prevented from moving toward the first electrode 21. It is to be noted, however, that electrons (so-called overflowed electrons) which are not sufficiently attracted by the charge storage electrode 24 or which are not properly stored in the inorganic oxide semiconductor material layer 23B or the like are set to the driving circuit via the charge discharge electrode 26.

At a later stage of the charge storage period, a resetting operation is performed. As a result, the potential of the first floating diffusion layer $FD_1$ is reset, and the potential of the first floating diffusion layer $FD_1$ becomes the potential $V_{DD}$ of the power source.

After the resetting operation is completed, reading of charges is conducted. In a charge transfer period, a potential $V_{11}$ is impressed on the first electrode 21, a potential $V_{22}$ is impressed on the charge storage electrode 24, and a potential $V_{24}$ is impressed on the charge discharge electrode 26, from the driving circuit. Here, $V_{14} < V_{21}$ (for example, $V_{14} < V_{22} < V_{21}$) is satisfied. As a result, the electrons having stayed in the region of the inorganic oxide semiconductor material layer 23B or the like facing the charge storage electrode 24 are securely read out to the first electrode 21, and, further, to the first floating diffusion layer $FD_1$. In other words, the charges stored in the inorganic oxide semiconductor material layer 23B or the like are read out to the control section.

By the above process, a series of operations of charge storage, resetting operation, and charge transfer are completed.

The operations of an amplification transistor $TR1_{amp}$ and a select transistor $TR1_{sel}$ after the electrons are read out to the first floating diffusion layer $FD_1$ are the same as the operations of the corresponding conventional transistors. Besides, for example, the series of operations of charge storage, resetting operation, and charge transfer of the second imaging element and the third imaging element are similar to the conventional series of operation of charge storage, resetting operation, and charge transfer.

In Embodiment 5, since the so-called overflowed electrons are set out to the driving circuit via the charge discharge electrode 26, leakage of the electrons to charge storage sections of the adjacent pixels can be restrained, and generation of blooming can be restrained. As a result, imaging performance of the imaging element can be enhanced.

Embodiment 6

Embodiment 6 is a modification of Embodiments 1 to 5, and relates to the imaging element or the like including a plurality of charge storage electrode segments of the present disclosure.

Figure 6C:
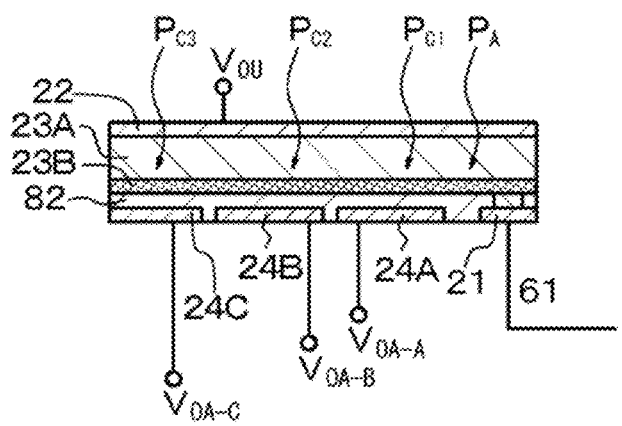
Figure 28:
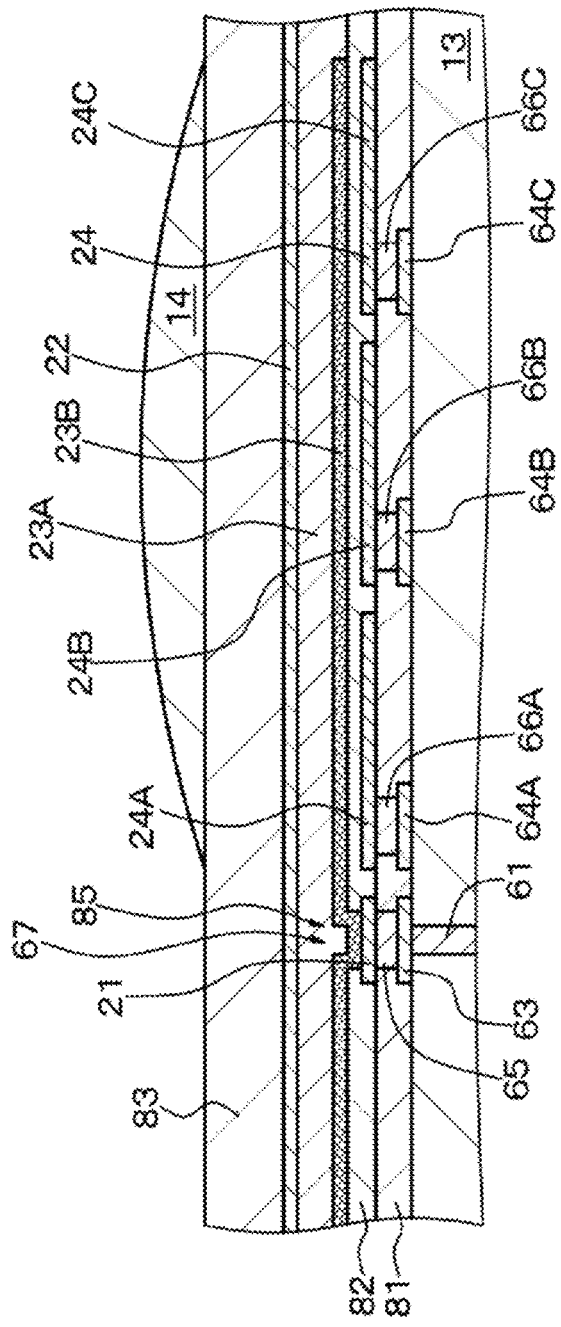
FIG. 28 is a schematic partial sectional view of an imaging element of Embodiment 6.
Figure 29:
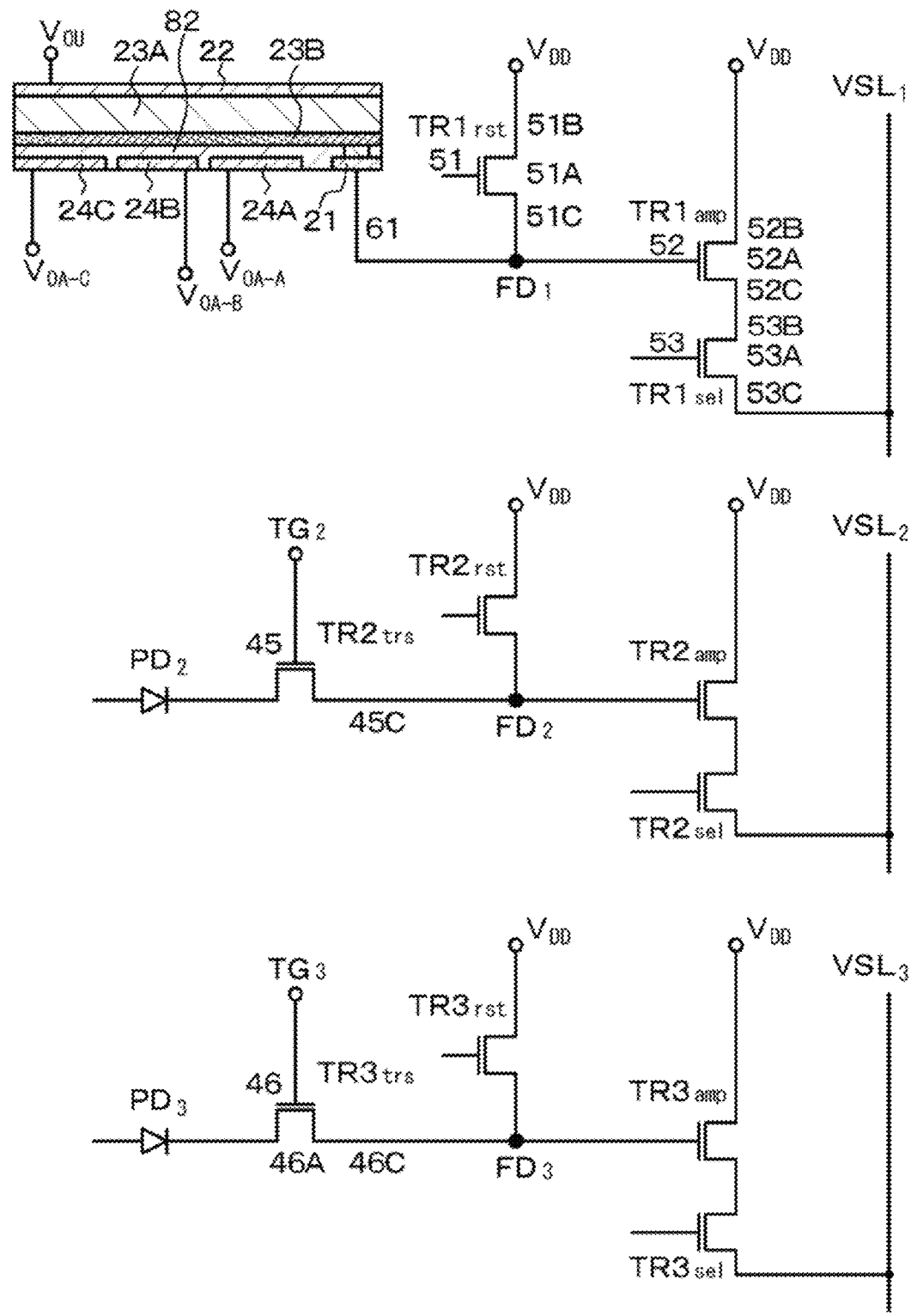
FIG. 29 is an equivalent circuit diagram of the imaging element of Embodiment 6.
Figure 30:
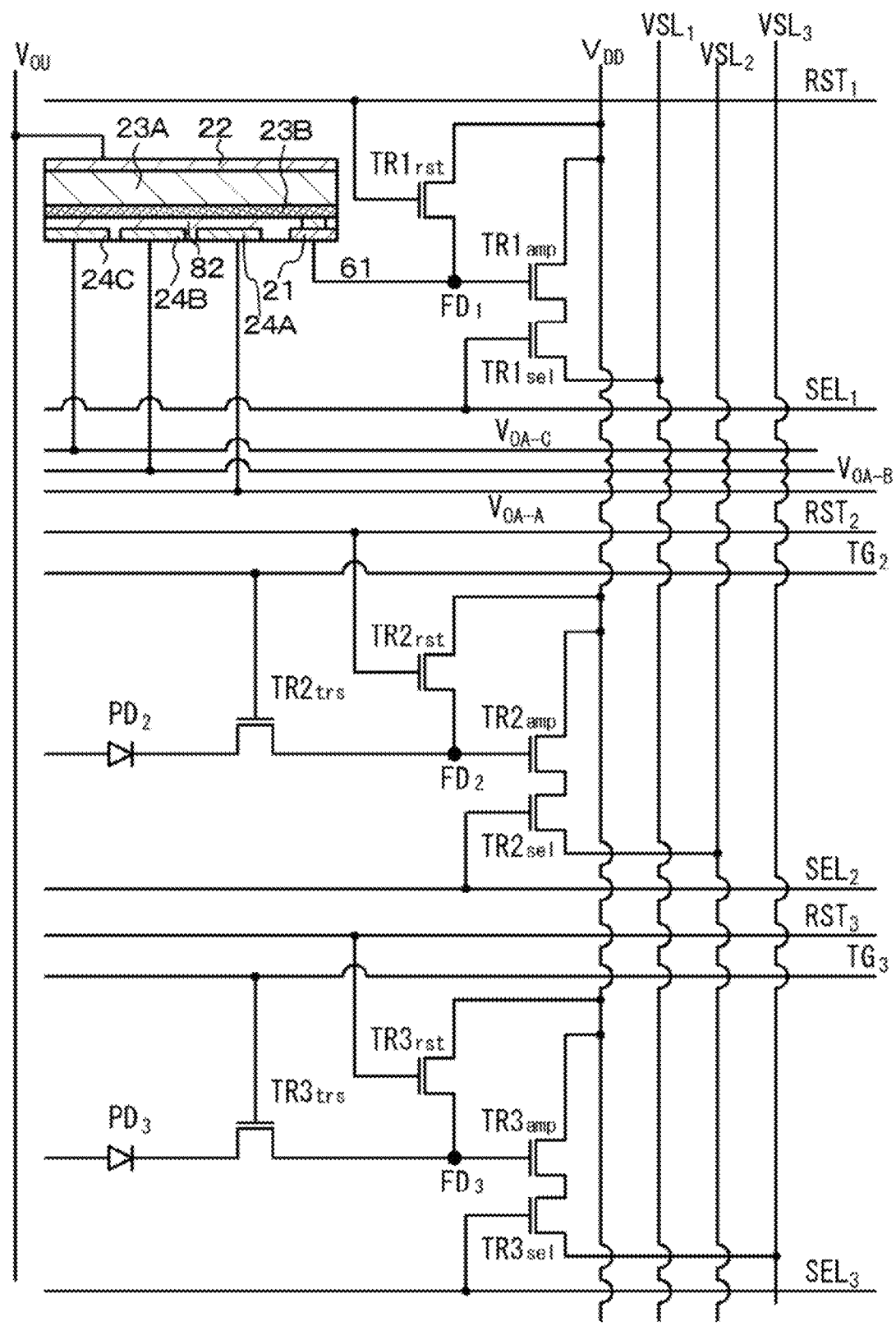
FIG. 30 is an equivalent circuit diagram of the imaging element of Embodiment 6.
Figure 31:
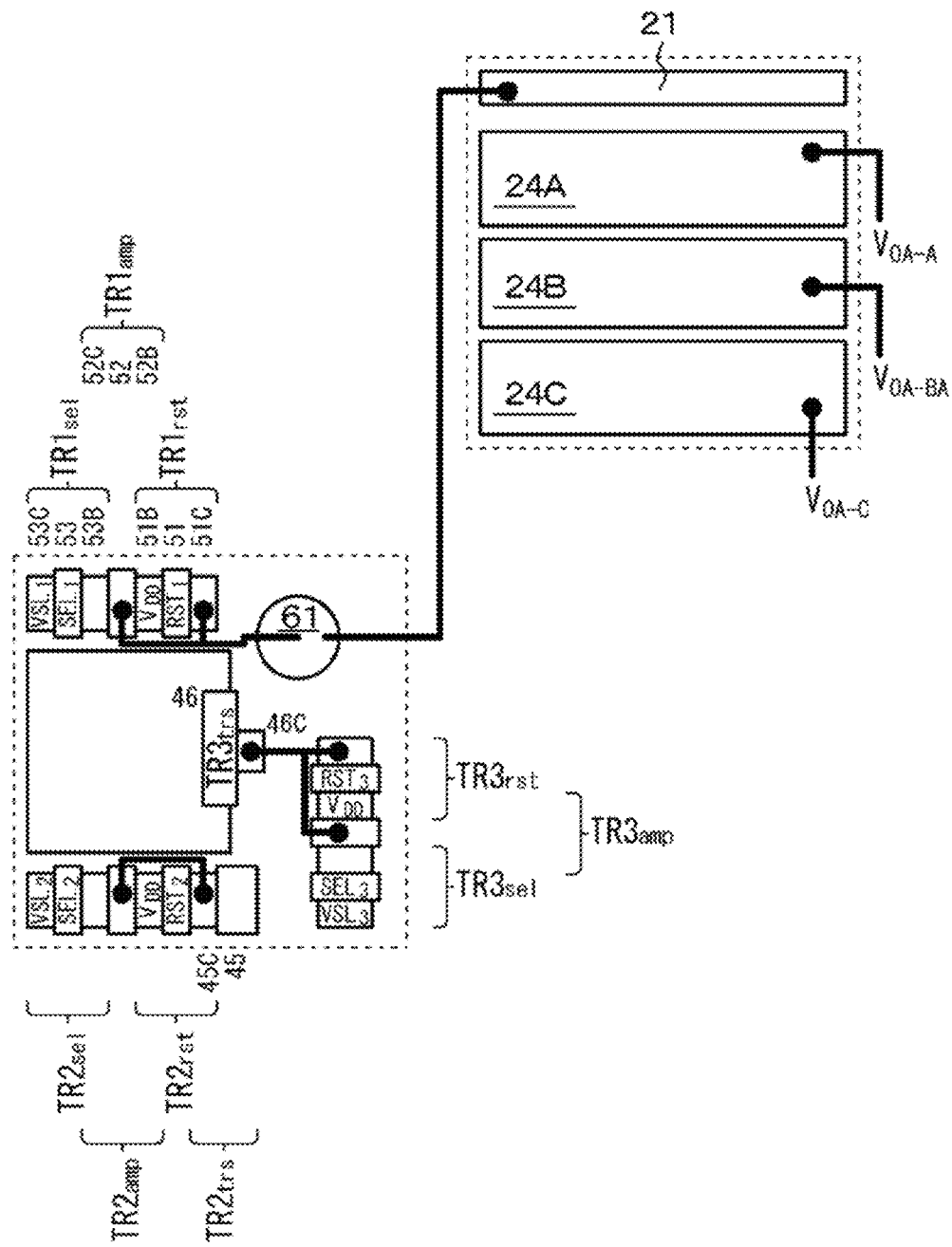
FIG. 31 is a schematic layout drawing of a first electrode and a charge storage electrode and transistors constituting a control section that constitute the imaging element of Embodiment 6.
Figure 32:
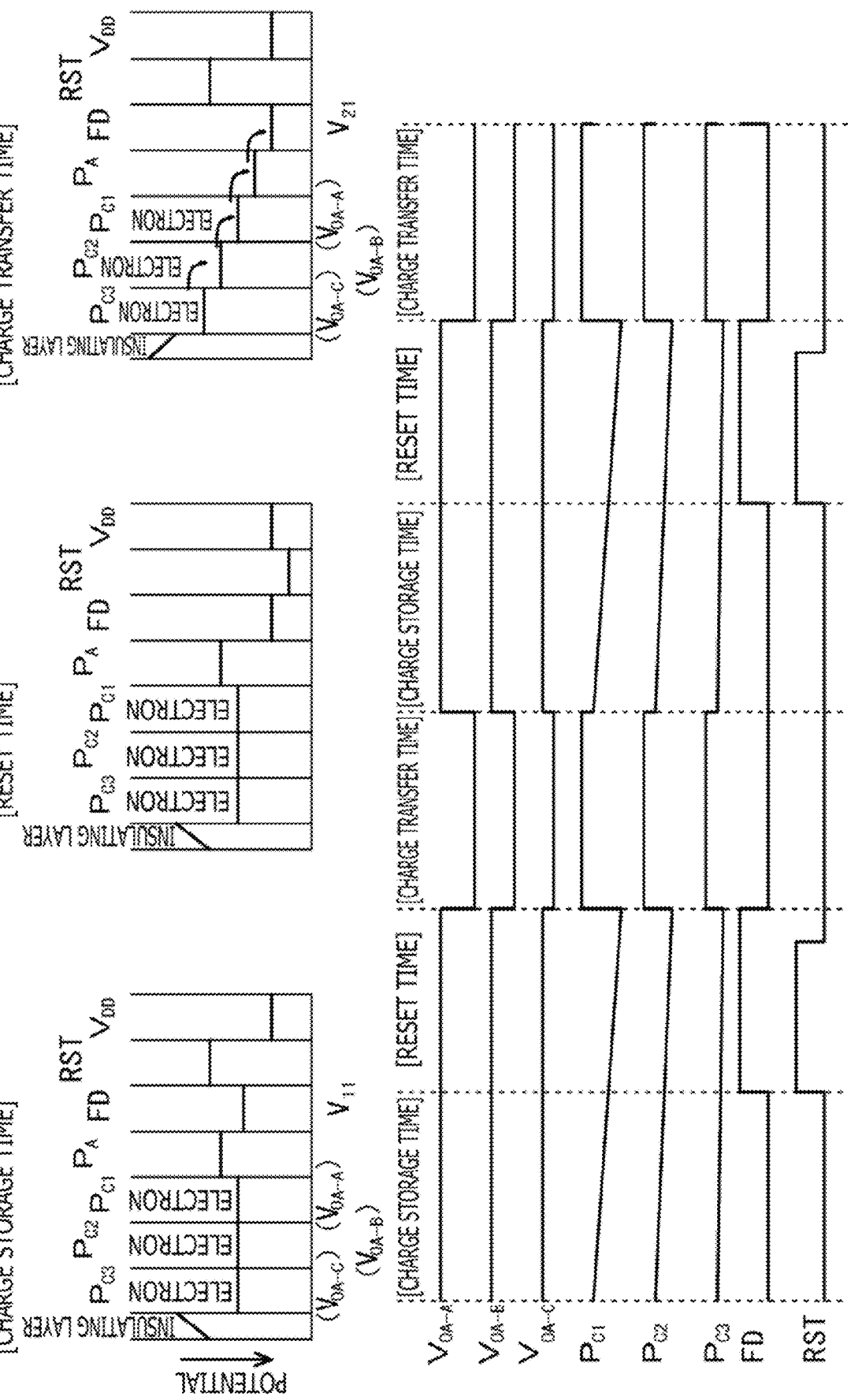
FIG. 32 is a diagram schematically depicting a state of potential at each part at the time of an operation of the imaging element of Embodiment 6.
Figure 33:
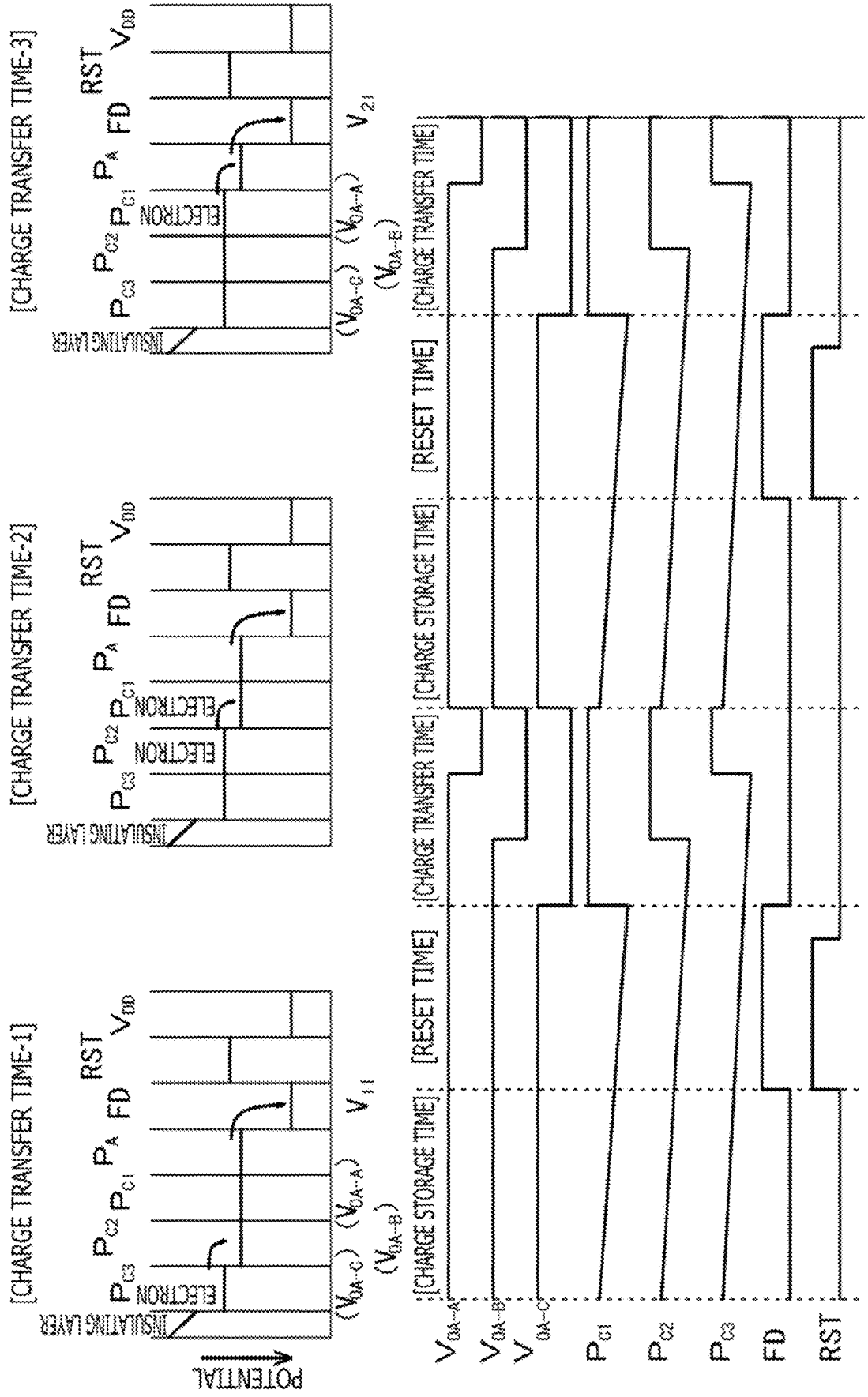
FIG. 33 is a diagram schematically depicting a state of potential at each part at the time of another operation (transfer) of the imaging element of Embodiment 6.
Figure 34:
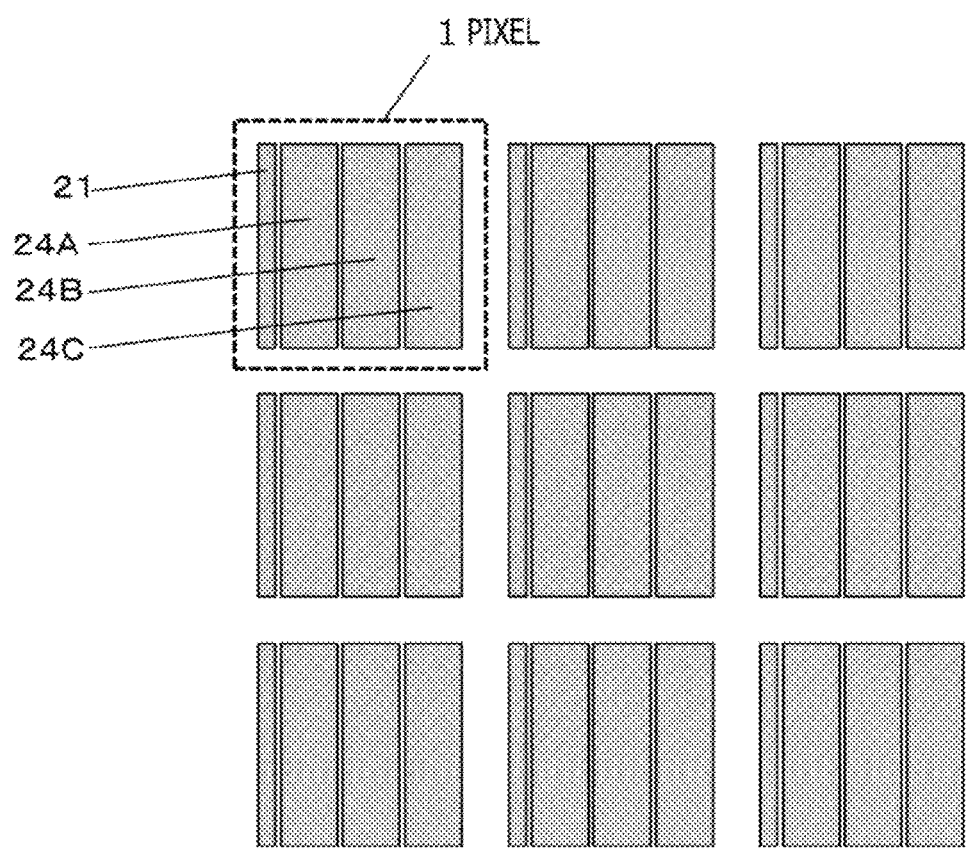
FIG. 34 is a schematic layout drawing of the first electrode and the charge storage electrode constituting the imaging element of Embodiment 6.
Figure 35:
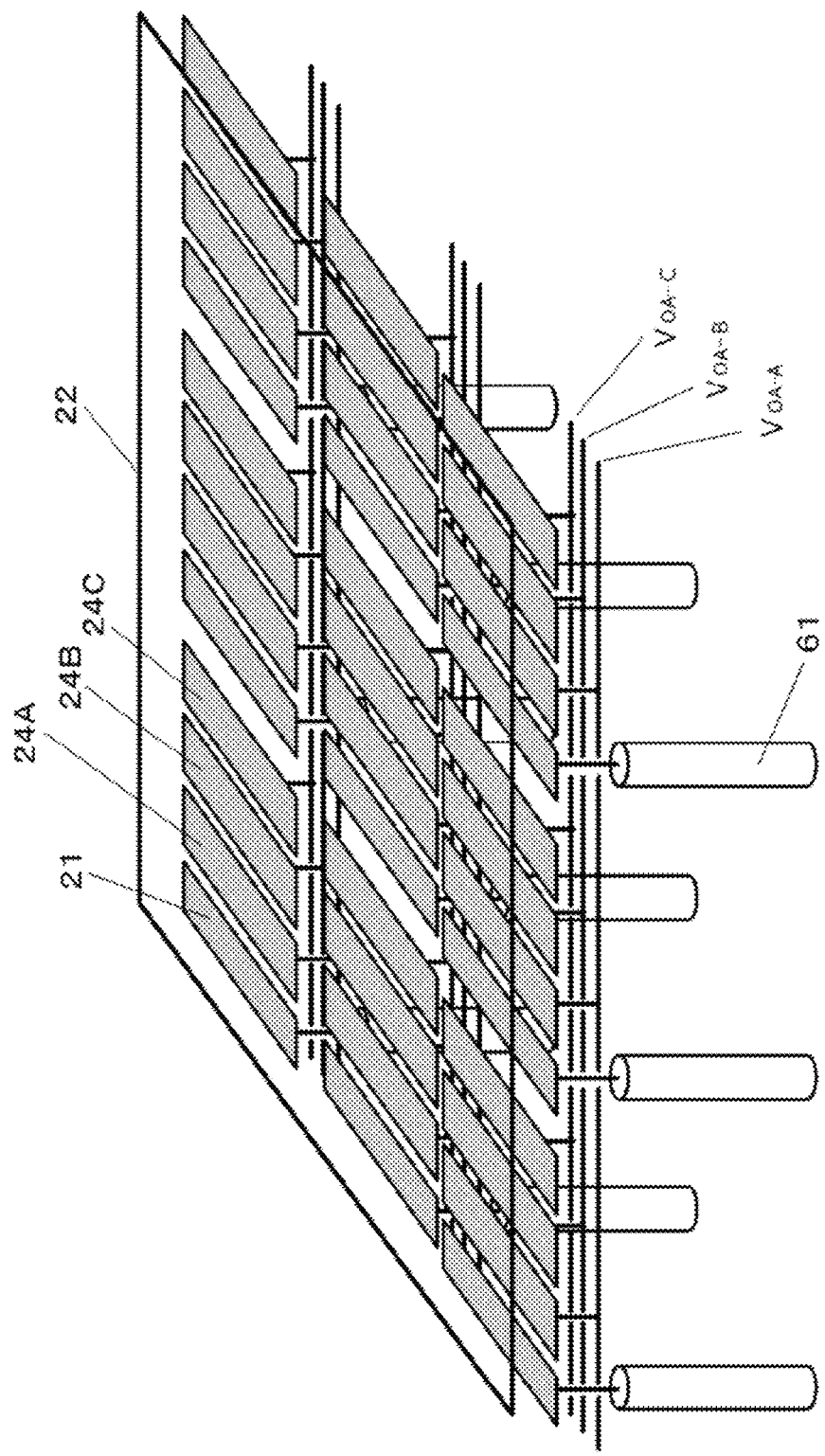
FIG. 35 is a schematic perspective view of the first electrode, the charge storage electrode, a second electrode, and a contact hole section constituting the imaging element of Embodiment 6.

A schematic partial sectional view of part of the imaging element of Embodiment 6 is depicted in FIG. 28, equivalent circuit diagrams of the imaging element of Embodiment 6 are depicted in FIGS. 29 and 30, a schematic layout drawing of a first electrode and a charge storage electrode constituting a photoelectric conversion section including a charge storage electrode and transistors constituting a control section of the imaging element of Embodiment 6 is depicted in FIG. 31, a state of potentials at each part at the time of operation of the imaging element of Embodiment 6 is depicted in FIGS. 32 and 33, and an equivalent circuit diagram for explaining each part of the imaging element of Embodiment 6 is depicted in FIG. 6C. In addition, a schematic layout drawing of the first electrode and the charge storage electrode of the photoelectric conversion section including the charge storage electrode of the imaging element of Embodiment 6 is depicted in FIG. 34, and a schematic perspective view of the first electrode, the charge storage electrode, a second electrode, and a contact hole section is depicted in FIG. 35.

In Embodiment 6, the charge storage electrode 24 includes a plurality of charge storage electrode segments 24A, 24B, and 24C. It is sufficient if the number of the charge storage electrode segments is any number of equal to or more than 2, and is "3" in Embodiment 6. In the imaging element of Embodiment 6, since the potential of the first electrode 21 is higher than the potential of the second electrode 22, for example, a positive potential is impressed on the first electrode 21 and a negative potential is impressed on the second electrode 22. In a charge transfer period, the potential impressed on the charge storage electrode segment 24A located at a place nearest to the first electrode 21 is higher than the potential impressed on the charge storage electrode segment 24C located at a place farthest from the first electrode 21. Thus, a potential gradient is imparted to the charge storage electrode 24, so that electrons having stayed in the region of the inorganic oxide semiconductor material layer 23B or the like facing the charge storage electrode 24 are more securely read out to the first electrode 21, and, further, to the first floating diffusion layer $FD_1$. In other words, charges stored in the inorganic oxide semiconductor material layer 23B or the like are read out to the control section.

In an example depicted in FIG. 32, in the charge transfer period, a setting is made such that (the potential of the charge storage electrode segment 24C)<(the potential of the charge storage electrode segment 24B)<(the potential of the charge storage electrode segment 24A), thereby electrons having stayed in the region of the inorganic oxide semiconductor material layer 23B or the like are simultaneously read out to the first floating diffusion layer $FD_1$. On the other hand, in an example depicted in FIG. 33, in the charge transfer period, the potential of the charge storage electrode segment 24C, the potential of the charge storage electrode segment 24B, and the potential of the charge storage electrode segment 24A are gradually varied (i.e., varied stepwise or in a sloped manner), so that the electrons having stayed in the region of the inorganic oxide semiconductor material layer 23B or the like facing the charge storage electrode segment 24C are moved into the region of the inorganic oxide semiconductor material layer 23B or the like facing the charge storage electrode segment 24B, next the electrons having stayed in the region of the inorganic oxide semiconductor material layer 23B or the like facing the charge storage electrode segment 24B are moved into the region of the inorganic oxide semiconductor material layer 23B or the like facing the charge storage electrode segment 24A, and then the electrons having stayed in the region of the inorganic oxide semiconductor material layer 23B or the like facing the charge storage electrode segment 24A are securely read out to the first floating diffusion layer $FD_1$.

Figure 36:
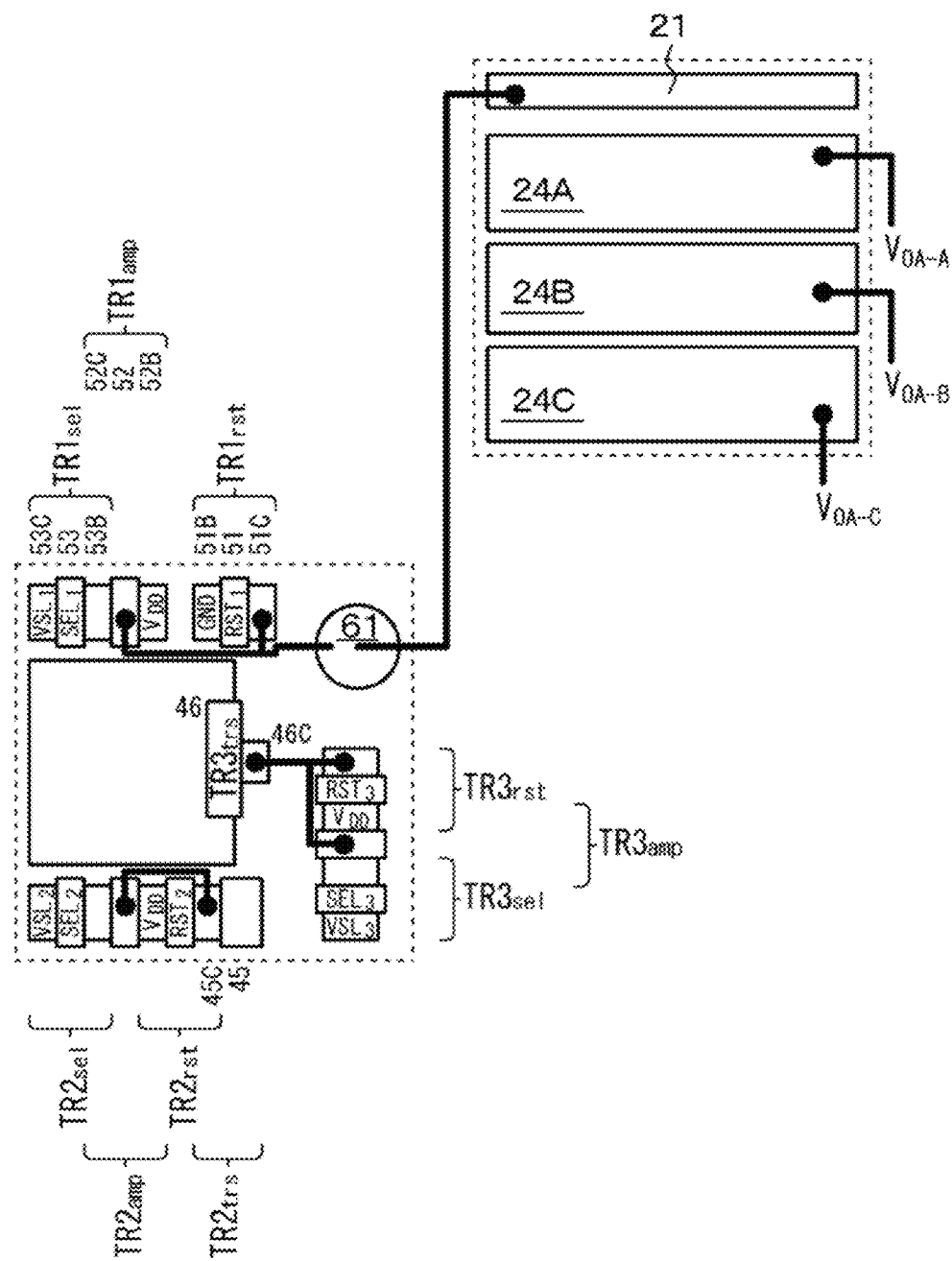
FIG. 36 is a schematic layout drawing of a first electrode and a charge storage electrode constituting a modification of the imaging element of Embodiment 6.

As a schematic layout drawing of the first electrode and the charge storage electrode, and transistors constituting the control section that constitute the modification of the imaging element of Embodiment 6 is depicted in FIG. 36, a source/drain region 51B on the other side of a reset transistor $TR1_{rst}$ may be grounded, instead of being connected to the power source $V_{DD}$.

Embodiment 7

Embodiment 7 is a modification of Embodiments 1 to 6, and relates to the imaging elements of the first to sixth configurations.

Figure 37:
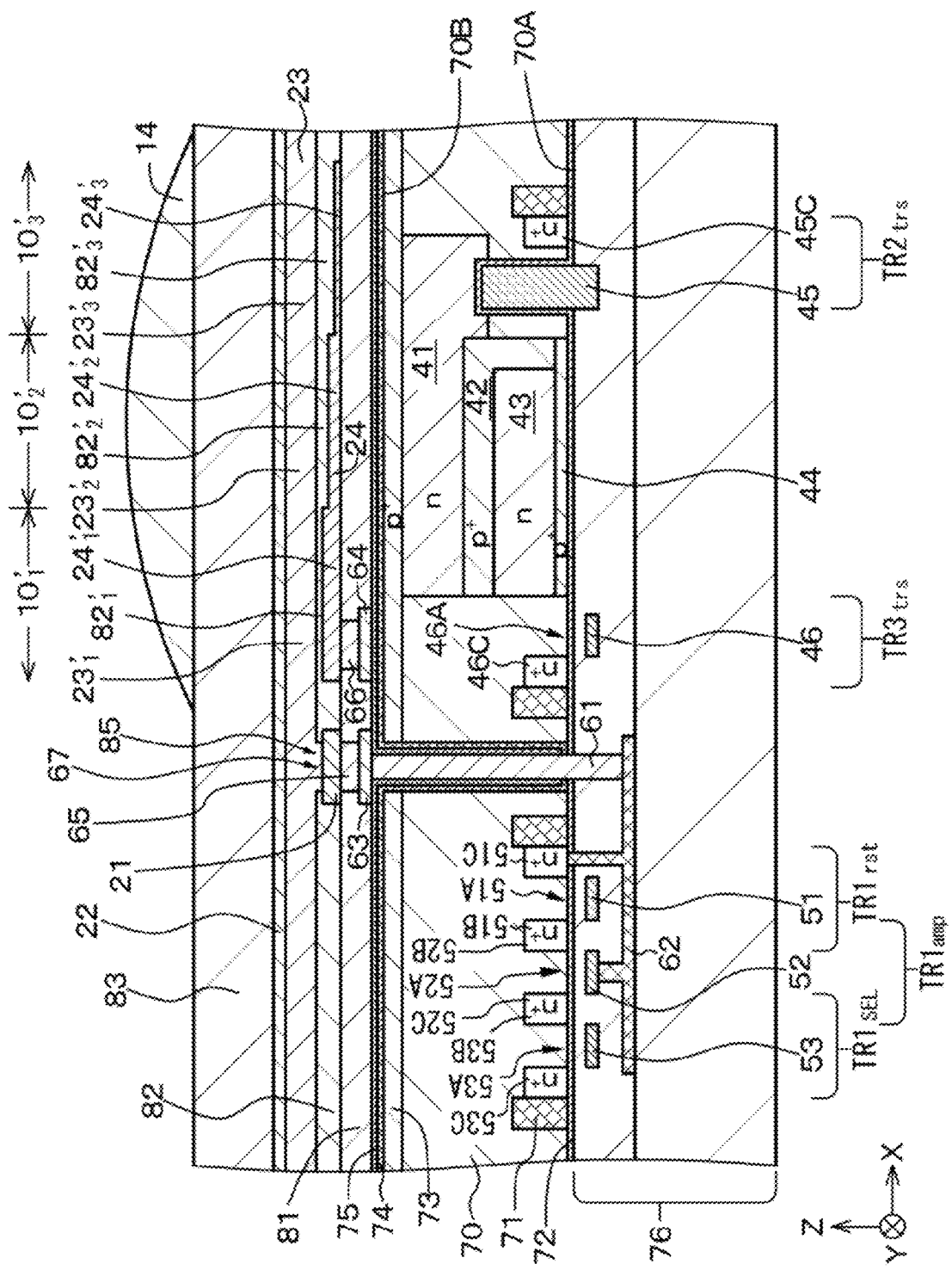
FIG. 37 is a schematic partial sectional view of an imaging element of Embodiment 7.
Figure 38:
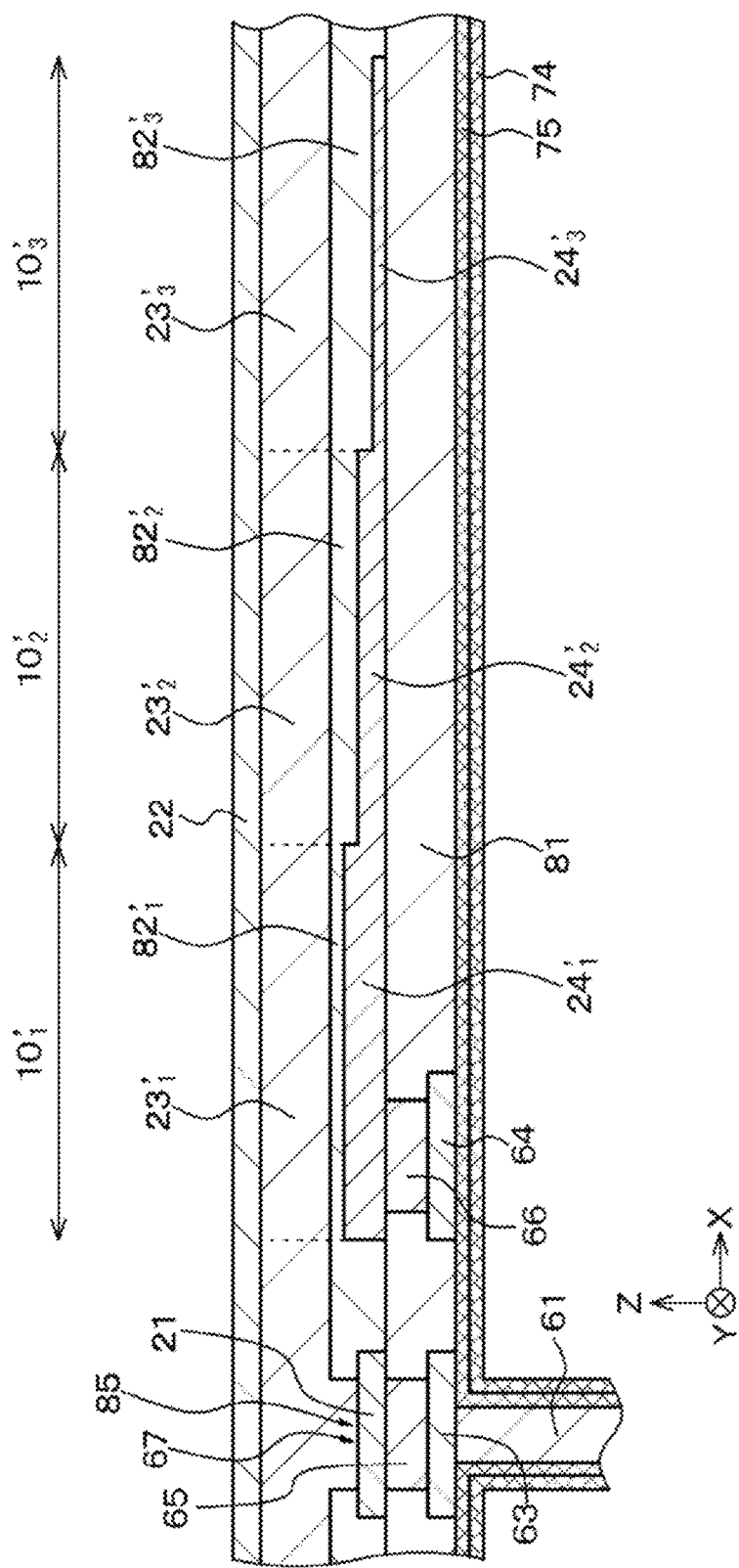
FIG. 38 is a schematic partial sectional view, in an enlarged form, of a part in which a charge storage electrode, a photoelectric conversion layer, and a second electrode are stacked in the imaging element of Embodiment 7.

A schematic partial sectional view of an imaging element of Embodiment 7 is depicted in FIG. 37, and a schematic partial sectional view, in an enlarged form, of a part where a charge storage electrode, an inorganic oxide semiconductor material layer, a photoelectric conversion layer, and a second electrode are stacked is depicted in FIG. 38. An equivalent circuit diagram of the imaging element of Embodiment 7 is similar to the equivalent circuit diagram of the imaging element of Embodiment 1 described in FIGS. 2 and 3, and a schematic layout drawing of the first electrode and the charge storage electrode constituting a photoelectric conversion section including a charge storage electrode and transistors constituting a control section of the imaging element of Embodiment 7 is similar to that of the imaging element of Embodiment 1 described in FIG. 4. Further, an operation of the imaging element (first imaging element) of Embodiment 7 is substantially similar to the operation of the imaging element of Embodiment 1.

Here, in the imaging element of Embodiment 7 or imaging elements of Embodiments 8 to 12 to be described later, a photoelectric conversion section includes N (where N≥2) photoelectric conversion section segments (specifically, three photoelectric conversion section segments $10'_1$, $10'_2$, and $10'_3$);

an inorganic oxide semiconductor material layer 23B and a photoelectric conversion layer 23A include N photoelectric conversion layer segments (specifically, three photoelectric conversion layer segments $23'_1$, $23'_2$, and $23'_3$);

an insulating layer 82 includes N insulating layer segments (specifically, three insulating layer segments $82'_1$, $82'_2$, and $82'_3$);

in Embodiments 7 to 9, a charge storage electrode 24 includes N charge storage electrode segments (specifically, in each Embodiment, three charge storage electrode segments $24'_1$, $24'_2$, and $24'_3$);

in Embodiments 10 and 11, and in Embodiment 9 depending on cases, the charge storage electrode 24 includes N charge storage electrode segments (specifically, three charge storage electrode segments $24'_1$, $24'_2$, and $24'_3$) disposed spaced from one another;

an n-th (where n=1, 2, 3 ... N) photoelectric conversion section segment $10'_n$ includes an n-th charge storage electrode segment $24'_n$, an n-th insulating layer segment $82'_n$, and an n-th photoelectric conversion layer segment $23'_n$; and the photoelectric conversion section segment with a larger n value is located spaced more from the first electrode 21. Here, the photoelectric conversion layer segments $23'_1$, $23'_2$, and $23'_3$ each refer to a segment in which a photoelectric conversion layer and an inorganic oxide semiconductor material layer are stacked, and are each represented as one layer in the drawings for simplification of the drawings. This similarly applies hereinbelow.

Note that in the photoelectric conversion layer segment, a configuration may be adopted in which the thickness of the part of the photoelectric conversion layer is varied and the thickness of the part of the inorganic oxide semiconductor material layer is constant and the thickness of the part of the photoelectric conversion layer segment is thereby varied, or a configuration may be adopted in which the thickness of the part of the photoelectric conversion layer is constant and the thickness of the part of the inorganic oxide semiconductor material layer is varied and the thickness of the photoelectric conversion layer segment is thereby varied, or a configuration may be adopted in which the thickness of the part of the photoelectric conversion layer is varied and the thickness of the part of the inorganic oxide semiconductor material layer is varied and the thickness of the photoelectric conversion layer segment is thereby varied.

Alternatively, the imaging element of Embodiment 7 or the imaging elements of Embodiments 8 and 11 to be described later include the photoelectric conversion section in which the first electrode 21, the inorganic oxide semiconductor material layer 23B, the photoelectric conversion layer 23A, and the second electrode 22 are stacked;

in which the photoelectric conversion section further includes the charge storage electrode 24 which is disposed spaced from the first electrode 21 and which is disposed to face the inorganic oxide semiconductor material layer 23B, with the insulating layer 82 interposed therebetween; and let the stacking direction of the charge storage electrode 24, the insulating layer 82, the inorganic oxide semiconductor material layer 23B, and the photoelectric conversion layer 23A be a Z direction, and let the direction of spacing away from the first electrode 21 be an X direction, then the sectional area of a stacked part where the charge storage electrode 24, the insulating layer 82, the inorganic oxide semiconductor material layer 23B, and the photoelectric conversion layer 23A are stacked when the stacked part is cut along a YZ virtual plane varies depending on the distance from the first electrode.

Further, in the imaging element of Embodiment 7, the thickness of the insulating layer segment gradually varies over a range from the first photoelectric conversion section segment $10'_1$ to the N-th photoelectric conversion section segment $10'_N$. Specifically, the thickness of the insulating layer segment gradually increases. Alternatively, in the imaging element of Embodiment 7, the width of the section of the stacked part is constant whereas the thickness of the section of the stacked part, specifically, the thickness of the insulating layer segment, gradually increases depending on the distance from the first electrode 21. Note that the thickness of the insulating layer segment increases stepwise. The thickness of the insulating layer segment $82'_n$ in the n-th photoelectric conversion section segment $10'_n$ is made constant. When the thickness of the insulating layer segment $82'_n$ in the n-th photoelectric conversion section segment $10'_n$ is "1," the thickness of the insulating layer segment $82'_{(n+1)}$ in the (n+1)th photoelectric conversion section segment $10'_{(n+1)}$ may be, for example, 2 to 10, but such a value is not limitative. In Embodiment 7, the thicknesses of the charge storage electrode segments $24'_1$, $24'_2$, and $24'_3$ are decreased gradually, so that the thicknesses of the insulating layer segments $82'_1$, $82'_2$, and $82'_3$ are increased gradually. The thicknesses of the photoelectric conversion layer segments $23'_1$, $23'_2$, and $23'_3$ are constant.

An operation of the imaging element of Embodiment 7 will be described below.

In a charge storage period, a potential $V_{11}$ is impressed on the first electrode 21, and a potential $V_{12}$ is impressed on the charge storage electrode 24, from the driving circuit. By the light incident on the photoelectric conversion layer 23A, photoelectric conversion is generated in the photoelectric conversion layer 23A. Holes generated by the photoelectric conversion are sent out to the driving circuit from the second electrode 22 via the wiring $V_{OU}$. On the other hand, since the potential of the first electrode 21 is set higher than the potential of the second electrode 22, i.e., since, for example, a positive potential is impressed on the first electrode 21 and a negative potential is impressed on the second electrode 22, $V_{12} \geq V_{11}$, and preferably $V_{12} > V_{11}$ are satisfied. As a result, electrons generated by the photoelectric conversion are attracted to the charge storage electrode 24, and stays in the region of the inorganic oxide semiconductor material layer 23B or the like facing the charge storage electrode 24. In other words, charges are stored in the inorganic oxide semiconductor material layer 23B or the like. Since $V_{12} > V_{11}$ is satisfied, the electrons generated in the inside of the photoelectric conversion layer 23A would not move toward the first electrode 21. Attendant on the lapse of time of photoelectric conversion, the potential in the region of the inorganic oxide semiconductor material layer 23B or the like facing the charge storage electrode 24 becomes a value on the more negative side.

In the imaging element of Embodiment 7, a configuration in which the thickness of the insulating layer segment is gradually increased is adopted. Therefore, when a state of $V_{12} \geq V_{11}$ is established in the charge storage period, the n-th photoelectric conversion section segment $10'_n$ can store more charges than the (n+1)th photoelectric conversion section segment $10'_{(n+1)}$, and a strong electric field is applied, so that charges can be securely prevented from flowing from the first photoelectric conversion section segment $10'_1$ to the first electrode 21.

At a later stage of the charge storage period, a resetting operation is performed. As a result, the potential of the first floating diffusion layer $FD_1$ is reset, and the potential of the first floating diffusion layer $FD_1$ becomes the potential $V_{DD}$ of the power source.

After the resetting operation is completed, reading of charges is performed. Specifically, in the charge transfer period, a potential $V_{21}$ is impressed on the first electrode 21, and a potential $V_{22}$ is impressed on the charge storage electrode 24, from the driving circuit. Here, $V_{21} > V_{22}$ is satisfied. As a result, electrons having stayed in the region of the inorganic oxide semiconductor material layer 23B or the like facing the charge storage electrode 24 are read out to the first electrode 21, and, further, to the first floating diffusion layer $FD_1$. In other words, charges stored in the inorganic oxide semiconductor material layer 23B or the like are read out to the control section.

More specifically, when a state of $V_{21} > V_{22}$ is attained in the charge transfer period, a flow of charges from the first photoelectric conversion section segment $10'_1$ to the first electrode 21, and a flow of charges from the (n+1)th photoelectric conversion section segment $10'_{(n+1)}$ to the n-th photoelectric conversion section segment $10'_n$, can be secured assuredly.

By the above process, a series of operations of charge storage, resetting operation, and charge transfer are completed.

In the imaging element of Embodiment 7, the thickness of the insulating layer segment gradually varies over a range from the first photoelectric conversion section segment to the N-th photoelectric conversion section segment; alternatively, the sectional area of the stacked part where the charge storage electrode, the insulating layer, the inorganic oxide semiconductor material layer, and the photoelectric conversion layer are stacked when the stacked part is cut along the YZ virtual plane varies depending on the distance from the first electrode. Therefore, a kind of charge transfer gradient is formed, so that the charges generated by the photoelectric conversion can be transferred more easily and securely.

The imaging element of Embodiment 7 can be produced by a method substantially similar to that for the imaging element of Embodiment 1, and, therefore, detailed description thereof is omitted.

Note that in the imaging element of Embodiment 7, in formation of the first electrode 21, the charge storage electrode 24, and the insulating layer 82, first, a conductive material layer for forming a charge storage electrode $24'_3$ is formed on the interlayer insulating layer 81, and the conductive material layer is patterned, to leave the conductive material layer in regions where to form the photoelectric conversion section segments $10'_1$, $10'_2$, and $10'_3$ and the first electrode 21, so that part of the first electrode 21 and the charge storage electrode $24'_3$ can be obtained. Next, an insulating layer for forming an insulating layer segment $82'_3$ is formed over the whole surface, the insulating layer is patterned, and a planarization treatment is conducted, so that the insulating layer segment $82'_3$ can be obtained. Subsequently, a conductive material layer for forming a charge storage electrode $24'_2$ is formed over the whole surface, and the conductive material layer is patterned, to leave the conductive material layer in regions where to form the photoelectric conversion section segments $10'_1$ and $10'_2$ and the first electrode 21, so that part of the first electrode 21 and the charge storage electrode $24'_2$ can be obtained. Next, an insulating layer for forming an insulating layer segment $82'_2$ is formed over the whole surface, the insulating layer is patterned, and a planarization treatment is performed, so that the insulating layer segment $82'_2$ can be obtained. Subsequently, a conductive material layer for forming a charge storage electrode $24'_1$ is formed over the whole surface, and the conductive material layer is patterned, to leave the conductive material layer in regions where to form the photoelectric conversion section segment $10'_1$ and the first electrode 21, so that the first electrode 21 and the charge storage electrode $24'_1$ can be obtained. Next, an insulating layer is formed over the whole surface, and a planarization treatment is conducted, so that the insulating layer segment $82'_1$ (insulating layer 82) can be obtained. Then, the inorganic oxide semiconductor material layer 23B and the photoelectric conversion layer 23A are formed on the insulating layer 82. In this way, the photoelectric conversion section segments $10'_1$, $10'_2$, and $10'_3$ can be obtained.

Figure 39:
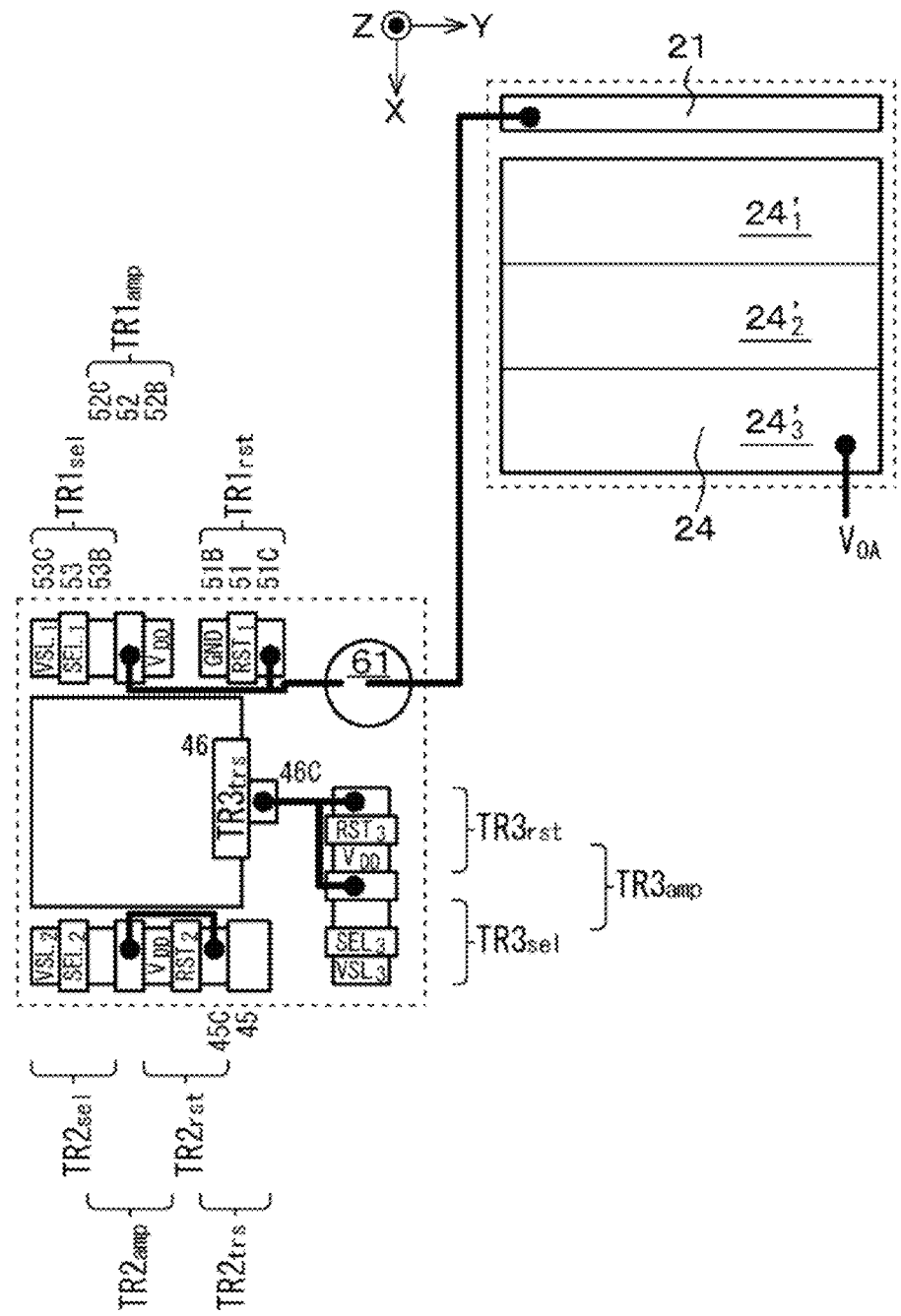
FIG. 39 is a schematic layout drawing of a first electrode and a charge storage electrode and transistors constituting a control section that constitute a modification of the imaging element of Embodiment 7.

As a schematic layout drawing of the first electrode and the charge storage electrode and transistors constituting the control section that constitute the modification of the imaging element of Embodiment 7 is depicted in FIG. 39, the source/drain region 51B on the other side of the reset transistor $TR1_{rst}$ may be grounded, instead of being connected to the power source $V_{DD}$.

Embodiment 8

Figure 40:
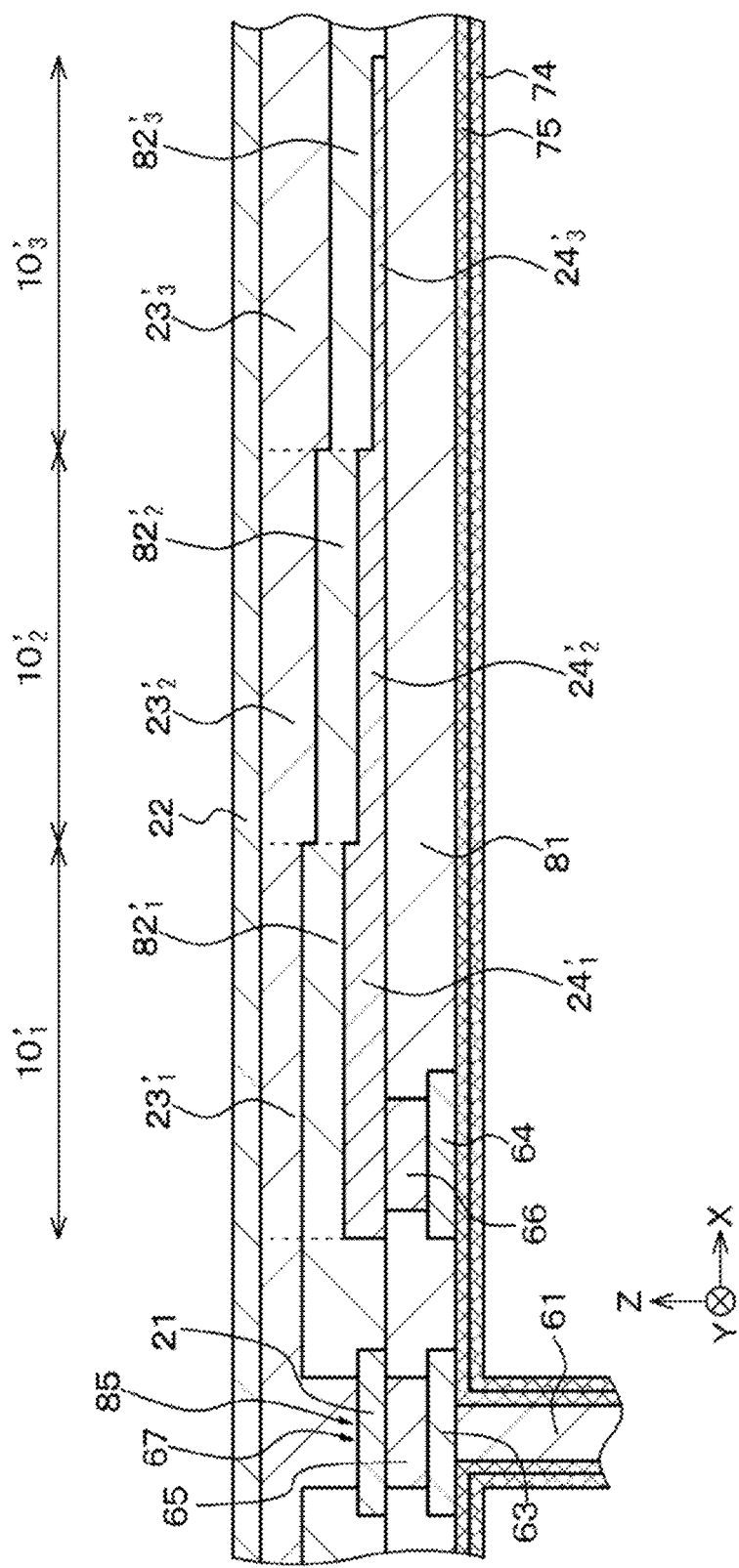
FIG. 40 is a schematic partial sectional view, in an enlarged form, of a part in which a charge storage electrode, a photoelectric conversion layer, and a second electrode are stacked in an imaging element of Embodiment 8.

An imaging element of Embodiment 8 relates to the imaging elements of the second configuration and the sixth configuration of the present disclosure. As a schematic partial sectional view, in an enlarged form, of a part where a charge storage electrode, an inorganic oxide semiconductor material layer, a photoelectric conversion layer, and a second electrode are stacked is depicted in FIG. 40, in the imaging element of Embodiment 8, the thickness of a photoelectric conversion layer segment gradually varies over a range from a first photoelectric conversion section segment $10'_1$ to an N-th photoelectric conversion section segment $10'_N$. Alternatively, in the imaging element of Embodiment 8, the width of the section of the stacked part is constant whereas the thickness of the section of the stacked part, specifically, the thickness of the photoelectric conversion layer segment is gradually increased depending on the distance from the first electrode 21. More specifically, the thickness of the photoelectric conversion layer segment gradually increases. Note that the thickness of the photoelectric conversion layer segment increases stepwise. The thickness of the photoelectric conversion layer segment $23'_n$ in the n-th photoelectric conversion section segment $10'_n$ is set constant. When the thickness of the photoelectric conversion layer segment $23'_n$ in the n-th photoelectric conversion section segment $10'_n$ is "1," the thickness of the photoelectric conversion layer segment $23_{(n+1)}$ in the (n+1)th photoelectric conversion section segment $10'_{(n+1)}$ may be, for example, 2 to 10, but such a value is not limitative. In Embodiment 8, the thicknesses of the charge storage electrode segments $24'_1$, $24'_2$, and $24'_3$ are gradually decreased, so that the thicknesses of the photoelectric conversion layer segments $23'_1$, $23'_2$, and $23'_3$ are gradually increased. The thicknesses of the insulating layer segments $82'_1$, $82'_2$, and $82'_3$ are constant. In addition, of the photoelectric conversion layer segment, for example, it is sufficient if the thickness of the part of the inorganic oxide semiconductor material layer is constant whereas the thickness of the part of the photoelectric conversion layer is varied, so that the thickness of the photoelectric conversion layer segment is varied.

In the imaging element of Embodiment 8, the thickness of the photoelectric conversion layer segment gradually increases. Therefore, when a state of $V_{12} \geq V_{11}$ is attained in the charge storage period, a stronger electric field is applied to the n-th photoelectric conversion section segment $10'_n$ than to the (n+1)th photoelectric conversion section segment $10'_{(n+1)}$, so that charges can be securely prevented from flowing from the first photoelectric conversion section segment $10'_1$ to the first electrode 21. When a state of $V_{22} < V_{21}$ is attained in the charge transfer period, a flow of charges from the first photoelectric conversion section segment $10'_1$ to the first electrode 21, and a flow of charges from the (n+1)th photoelectric conversion section segment $10'_{(n+1)}$ to the n-th photoelectric conversion section segment $10'_n$, can be secured assuredly.

In this way, in the imaging element of Embodiment 8, the thickness of the photoelectric conversion layer segment gradually varies in a range from the first photoelectric conversion section segment to the N-th photoelectric conversion section segment. Alternatively, the sectional area of the stacked part where the charge storage electrode, the insulating layer, the inorganic oxide semiconductor material layer, and the photoelectric conversion layer are stacked when the stacked part is cut along the YZ virtual plane varies depending on the distance from the first electrode. Therefore, a kind of charge transfer gradient is formed, and the charges generated by the photoelectric conversion can be transferred more easily and securely.

In the imaging element of Embodiment 8, in formation of the first electrode 21, the charge storage electrode 24, the insulating layer 82, the inorganic oxide semiconductor material layer 23B, and the photoelectric conversion layer 23A, first, a conductive material layer for forming a charge storage electrode $24'_3$ is formed on an interlayer insulating layer 81, and the conductive material layer is patterned, to leave the conductive material layer in a region where to form photoelectric conversion section segments $10'_1$, $10'_2$, and $10'_3$ and the first electrode 21, so that part of the first electrode 21 and the charge storage electrode $24'_3$ can be obtained. Next, a conductive material layer for forming a charge storage electrode $24'_2$ is formed over the whole surface, and the conductive material layer is patterned, to leave the conductive material layer in a region where to form the photoelectric conversion section segments $10'_1$ and $10'_2$ and the first electrode 21, so that part of the first electrode 21 and the charge storage electrode $24'_2$ can be obtained. Subsequently, a conductive material layer for forming a charge storage electrode $24'_1$ is formed over the whole surface, and the conductive material layer is patterned, to leave the conductive material layer in a region where to form the photoelectric conversion section segment $10'_1$ and the first electrode 21, so that the first electrode 21 and the charge storage electrode $24'_1$ can be obtained. Next, an insulating layer 82 is formed over the whole surface in a conformal manner. Then, the inorganic oxide semiconductor material layer 23B and the photoelectric conversion layer 23A are formed on the insulating layer 82, and a planarization treatment is applied to the photoelectric conversion layer 23A. In this way, the photoelectric conversion section segments $10'_1$, $10'_2$, and $10'_3$ can be obtained.

Embodiment 9

Figure 41:
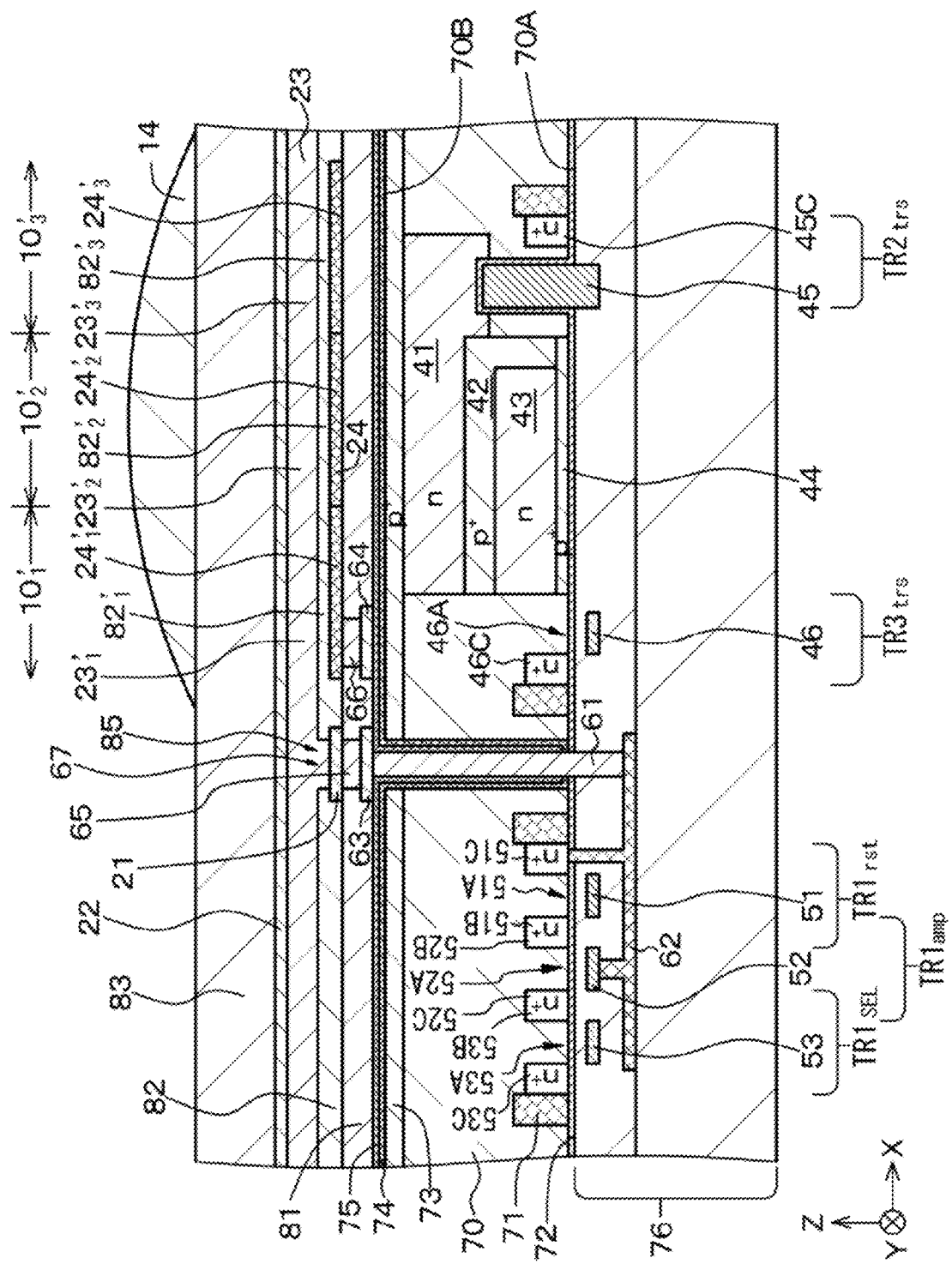
FIG. 41 is a schematic partial sectional view of an imaging element of Embodiment 9.

Embodiment 9 relates to the imaging element of the third configuration. A schematic partial sectional view of the imaging element of Embodiment 9 is depicted in FIG. 41. In the imaging element of Embodiment 9, the material constituting the insulating layer segment differs between adjacent photoelectric conversion section segments. Here, the value of relative dielectric constant of the material constituting the insulating layer segment is gradually decreased, over a range from the first photoelectric conversion section segment $10'_1$ to the N-th photoelectric conversion section segment $10'_N$. In the imaging element of Embodiment 9, the same potential may be impressed on all the N charge storage electrode segments, or different potentials may be impressed respectively on the N charge storage electrode segments. In the latter case, it is sufficient if charge storage electrode segments $24'_1$, $24'_2$, and $24'_3$ disposed spaced from one another are connected to a vertical driving circuit 112 constituting the driving circuit, via pad sections $64_1$, $64_2$, and $64_3$, similarly to the description in Embodiment 10.

With such a configuration adopted, a kind of charge transfer gradient is formed, so that when a state of $V_{12} \geq V_{11}$ is attained in the charge storage period, more charges can be stored in the n-th photoelectric conversion section segment than in the (n+1)th photoelectric conversion section segment. When a state of $V_{22} < V_{21}$ is attained in the charge transfer period, a flow of charges from the first photoelectric conversion section segment to the first electrode, and a flow of charges from the (n+1)th photoelectric conversion section segment to the n-th photoelectric conversion section segment, can be secured assuredly.

Embodiment 10

Figure 42:
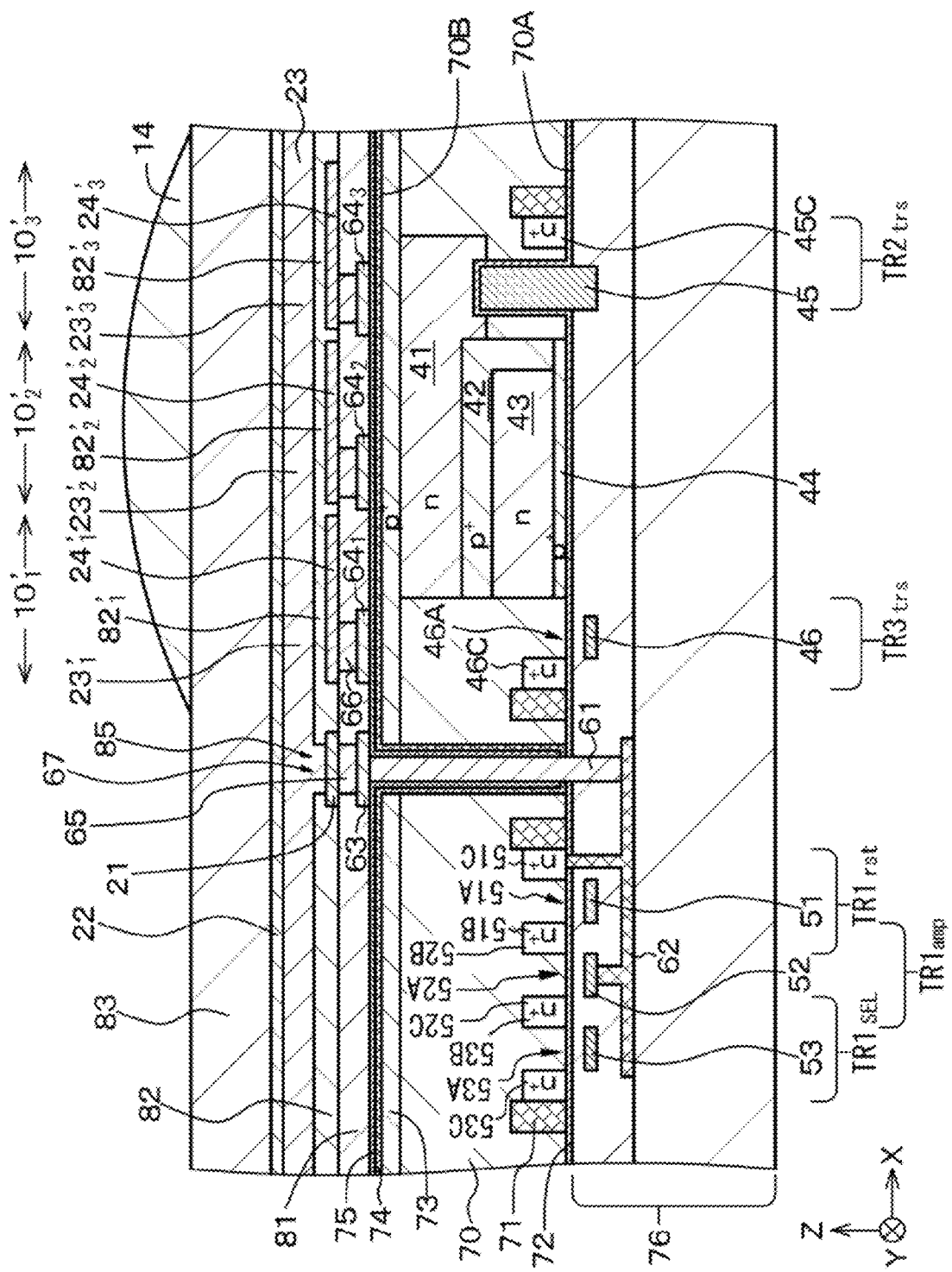
FIG. 42 is a schematic partial sectional view of an imaging element of Embodiment 10 and Embodiment 11.
Figure 43A:
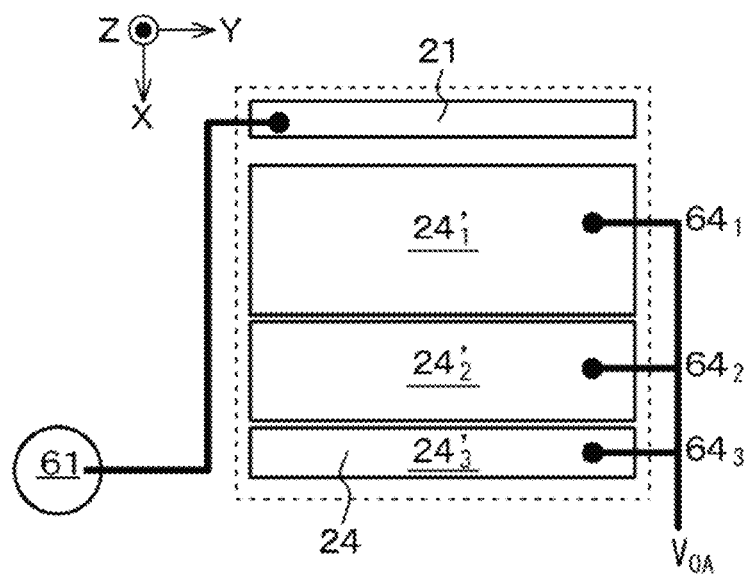
FIGS. 43A and 43B are schematic plan views of a charge storage electrode segment in Embodiment 11.
Figure 43B:
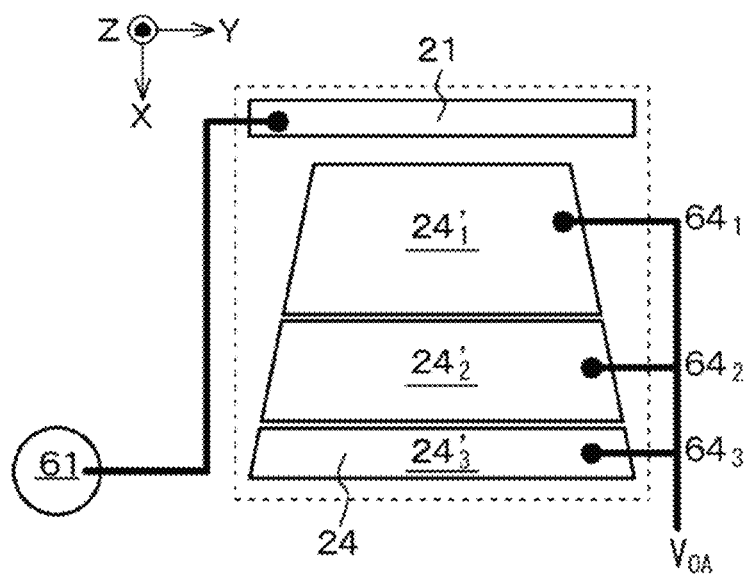
Figure 44A:
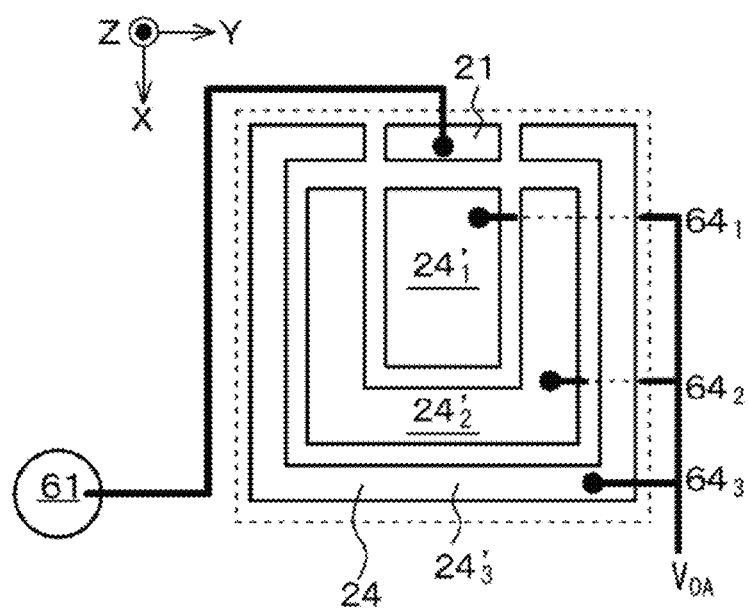
FIGS. 44A and 44B are schematic plan views of the charge storage electrode segment in Embodiment 11.
Figure 44B:
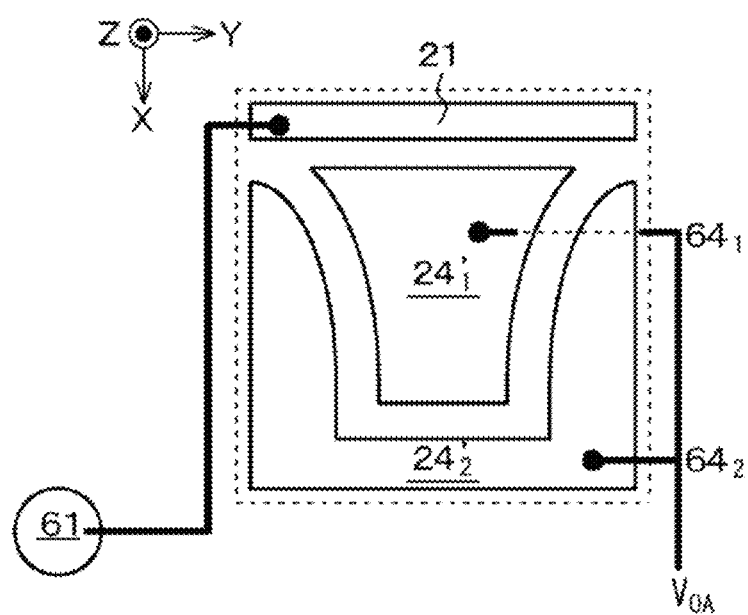

Embodiment 10 relates to the imaging element of the fourth configuration. A schematic partial sectional view of the imaging element of Embodiment 10 is depicted in FIG. 42. In the imaging element of Embodiment 10, the material constituting the charge storage electrode segment differs between adjacent photoelectric conversion section segments. Here, the value of work function of the material constituting the insulating layer segment is gradually increased over a range from the first photoelectric conversion section segment $10'_1$ to the N-th photoelectric conversion section segment $10'_N$. In the imaging element of Embodiment 10, the same potential may be impressed on all the N charge storage electrode segments, or different potentials may be impressed respectively on the N charge storage electrode segments. In the latter case, the charge storage electrode segments $24'_1$, $24'_2$, and $24'_3$ are connected to a vertical driving circuit 112 constituting the driving circuit, via pad sections $64_k$, $64_2$, and $64_3$.

Embodiment 11

Figure 45:
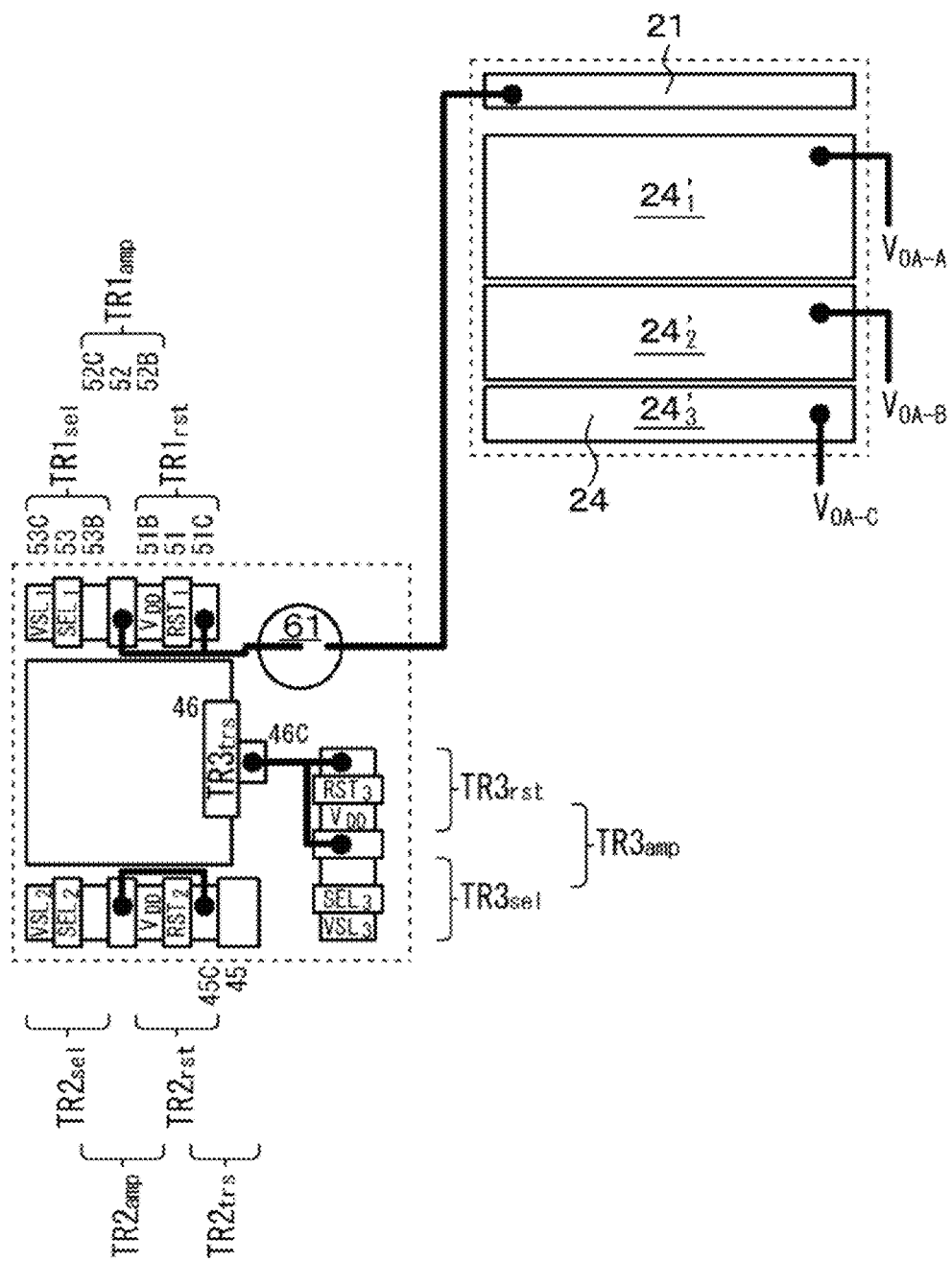
FIG. 45 is a schematic layout drawing of a first electrode and the charge storage electrode and transistors constituting a control section that constitute the imaging element of Embodiment 11.

The imaging element of Embodiment 11 relates to the imaging element of the fifth configuration. Schematic plan views of a charge storage electrode segment in Embodiment 11 are depicted in FIGS. 43A, 43B, 44A, and 44B, and a schematic layout drawing of a first electrode and a charge storage electrode constituting a photoelectric conversion section, including a charge storage electrode, and transistors constituting a control section of the imaging element of Embodiment 11 is depicted in FIG. 45. A schematic partial sectional view of the imaging element of Embodiment 11 is similar to the illustration in FIG. 42 or FIG. 47. In the imaging element of Embodiment 11, the area of the charge storage electrode segment is gradually decreased, over a range from the first photoelectric conversion section segment $10'_1$ to the N-th photoelectric conversion section segment $10'_N$. In the imaging element of Embodiment 11, the same potential may be impressed on all the N charge storage electrode segments, or different potentials may be impressed respectively on the N charge storage electrode segments. Specifically, it is sufficient if charge storage electrode segments $24'_1$, $24'_2$, and $24'_3$ disposed spaced from one another are connected to a vertical driving circuit 112 constituting the driving circuit, via pad sections $64_1$, $64_2$, and $64_3$, similarly to the description in Embodiment 10.

In Embodiment 11, the charge storage electrode 24 includes a plurality of charge storage electrode segments $24'_1$, $24'_2$, and $24'_3$. It is sufficient if the number of the charge storage electrode segments is any number of equal to or more than 2, and, in Embodiment 11, the number is "3." In the imaging element of Embodiment 11, the potential of the first electrode 21 is higher than the potential of the second electrode 22; for example, a positive potential is impressed on the first electrode 21, and a negative potential is impressed on the second electrode 22. In the charge transfer period, therefore, the potential impressed on the charge storage electrode segment $24'_1$ located at a place nearest to the first electrode 21 is higher than the potential impressed on the charge storage electrode segment $24'_3$ located at a place farthest from the first electrode 21. With a potential gradient thus imparted to the charge storage electrode 24, electrons having stayed in the region of the inorganic oxide semiconductor material layer 23B or the like facing the charge storage electrode 24 are more securely read out to the first electrode 21, and, further, to the first floating diffusion layer $FD_1$. In other words, the charges stored in the inorganic oxide semiconductor material layer 23B or the like are read out to the control section.

In the charge transfer period, a setting is made such that (the potential of the charge storage electrode segment $24'_3$)<(the potential of the charge storage electrode segment $24'_2$)<(the potential of the charge storage electrode segment $24'_1$). This setting ensures that the electrons having stayed in the region of the inorganic oxide semiconductor material layer 23B or the like can be simultaneously read out to the first floating diffusion layer $FD_1$. Alternatively, in the charge transfer period, the potential of the charge storage electrode segment $24'_3$, the potential of the charge storage electrode segment $24'_2$, and the potential of the charge storage electrode segment $24'_1$ are gradually varied (varied stepwise or varied in a sloped manner). As a result, the electrons having stayed in the region of the inorganic oxide semiconductor material layer 23B or the like facing the charge storage electrode segment $24'_3$ can be moved into the region of the inorganic oxide semiconductor material layer 23B or the like facing the charge storage electrode segment $24'_2$, next the electrons having stayed in the region of the inorganic oxide semiconductor material layer 23B or the like facing the charge storage electrode segment $24'_2$ can be moved into the region of the inorganic oxide semiconductor material layer 23B or the like facing the charge storage electrode segment $24'_1$, and then the electrons having stayed in the region of the inorganic oxide semiconductor material layer 23B or the like facing the charge storage electrode segment $24'_1$ can be securely read out to the first floating diffusion layer $FD_1$.

Figure 46:
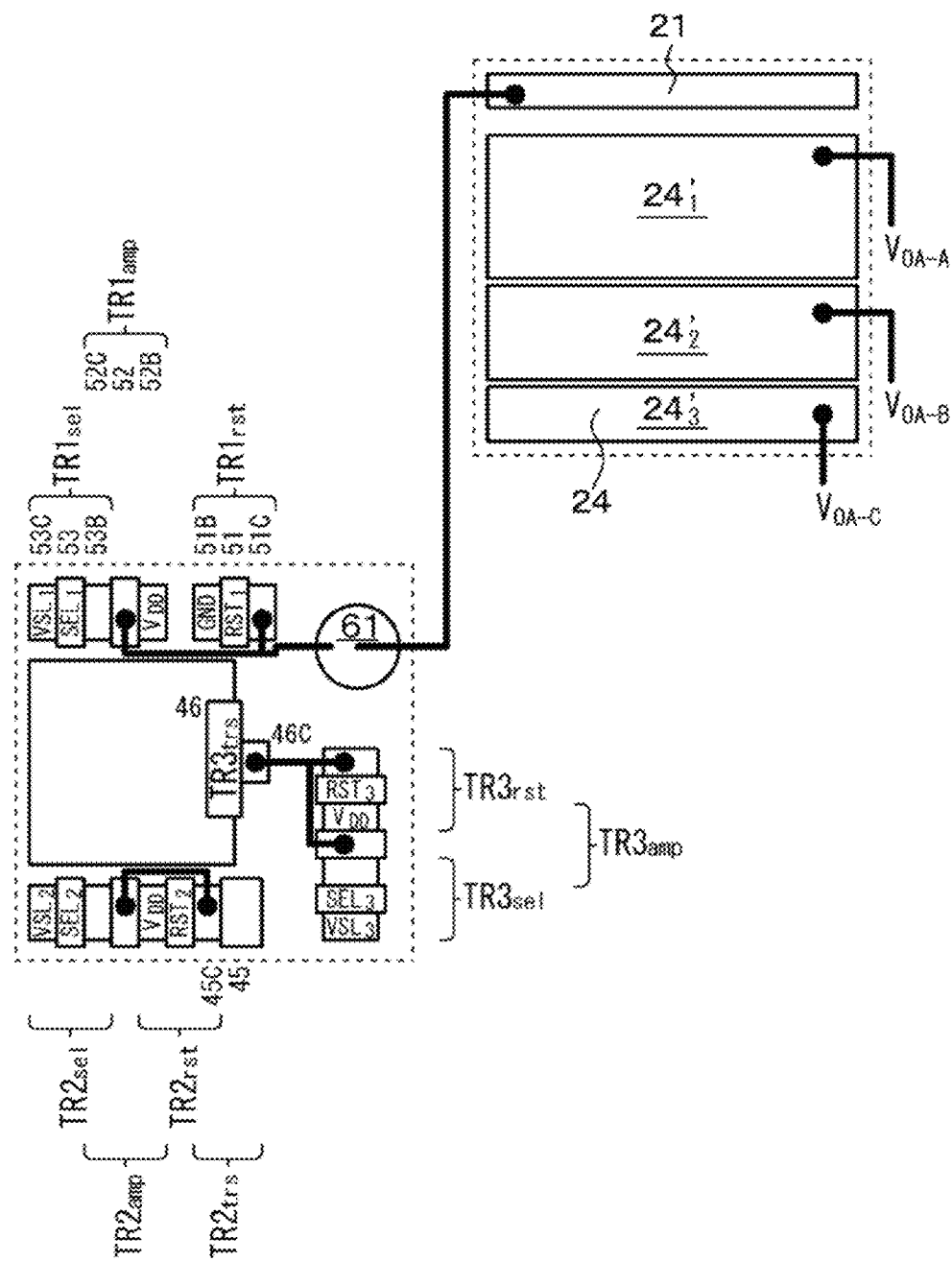
FIG. 46 is a schematic layout drawing of a first electrode and a charge storage electrode constituting a modification of the imaging element of Embodiment 11.

As a schematic layout drawing of the first electrode and the charge storage electrode and transistors constituting the control section that constitute the modification of the imaging element of Embodiment 11 is depicted in FIG. 46, the source/drain region 51B on the other side of the reset transistor $TR3_{rst}$ may be grounded, instead of being connected to the power source $V_{DD}$.

In the imaging element of Embodiment 11, also, with such a configuration adopted, a kind of charge transfer gradient is formed. In other words, the area of the charge storage electrode segment is gradually reduced, over a range from the first photoelectric conversion section segment $10'_1$ to the N-th photoelectric conversion section segment $10'_N$. Therefore, when a state of $V_{12} \geq V_{11}$ is attained in the charge storage period, more charges can be stored in the n-th photoelectric conversion section segment than in the (n+1)th photoelectric conversion section segment. When a state of $V_{22} < V_{21}$ is attained in the charge transfer period, a flow of charges from the first photoelectric conversion section segment to the first electrode, and a flow of charges from the (n+1)th photoelectric conversion section segment to the n-th photoelectric conversion section segment, can be secured assuredly.

Embodiment 12

Figure 47:
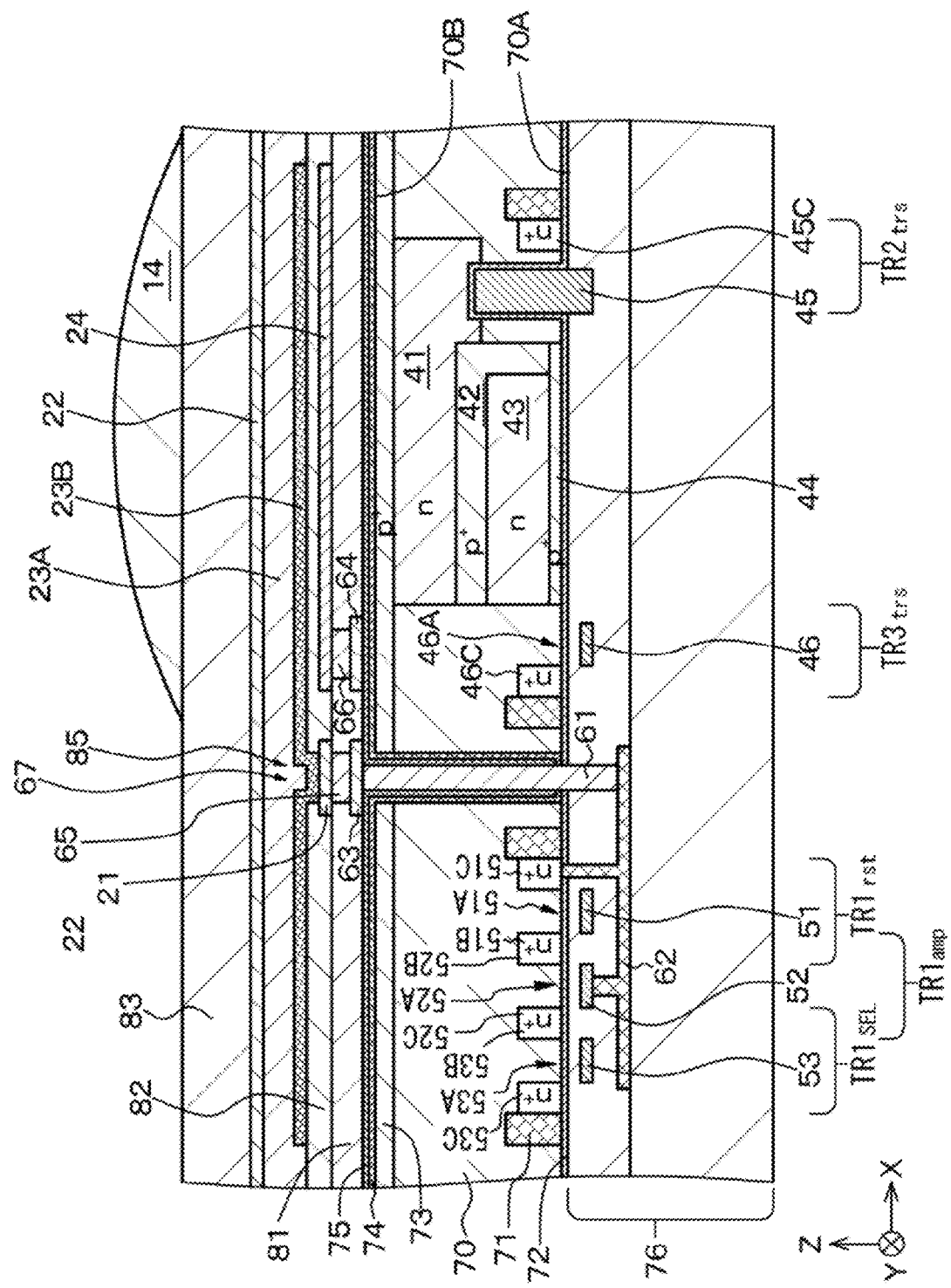
FIG. 47 is a schematic partial sectional view of an imaging element of Embodiment 12 and Embodiment 11.
Figure 48A:
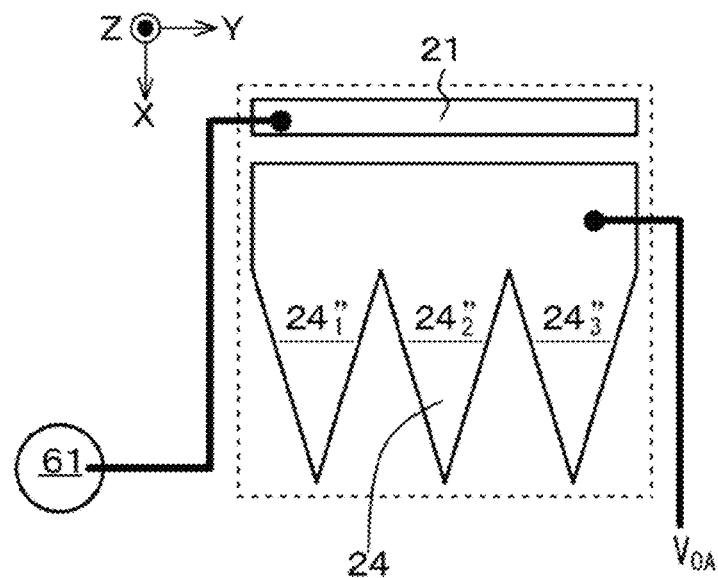
FIGS. 48A and 48B are schematic plan views of a charge storage electrode segment in Embodiment 12.
Figure 48B:
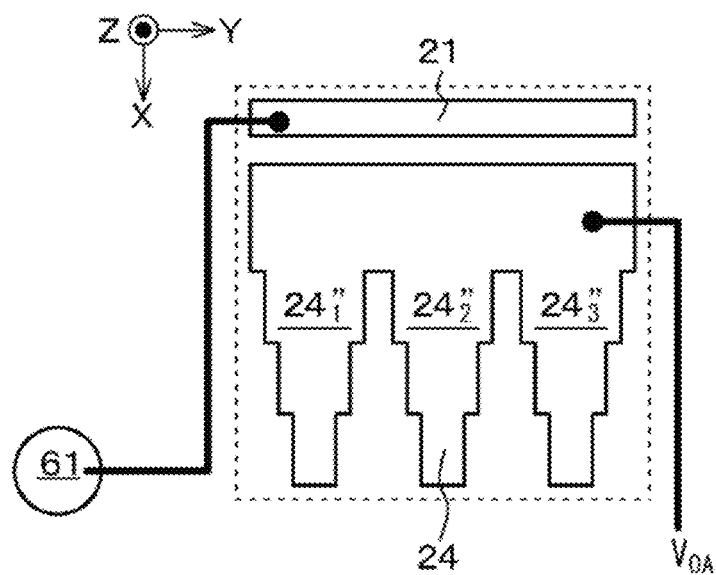

Embodiment 12 relates to the imaging element of the sixth configuration. A schematic partial sectional view of the imaging element of Embodiment 12 is depicted in FIG. 47. Schematic plan views of a charge storage electrode segment in Embodiment 12 are depicted in FIGS. 48A and 48B. The imaging element of Embodiment 12 includes a photoelectric conversion section in which a first electrode 21, an inorganic oxide semiconductor material layer 23B, a photoelectric conversion layer 23A, and a second electrode 22 are stacked. The photoelectric conversion section further includes charge storage electrodes 24 ($24''_1$, $24''_2$, and $24''_3$) which are disposed spaced from the first electrode 21 and which are disposed to face the inorganic oxide semiconductor material layer 23B, with an insulating layer 82 interposed therebetween. Let the stacking direction of the charge storage electrodes 24 ($24''_1$, $24''_2$, and $24''_3$), the insulating layer 82, the inorganic oxide semiconductor material layer 23B, and the photoelectric conversion layer 23A be a Z direction and let the direction of spacing away from the first electrode 21 be an X direction, then the sectional area of the stacked part where the charge storage electrodes 24 ($24''_1$, $24''_2$, and $24''_3$), the insulating layer 82, the inorganic oxide semiconductor material layer 23B, and the photoelectric conversion layer 23A are stacked when the stacked part is cut along a YZ virtual plane varies depending on the distance from the first electrode 21.

Specifically, in the imaging element of Embodiment 12, the thickness of the section of the stacked part is constant, whereas the width of the section of the stacked part at a position is narrower as the position is spaced away from the first electrode 21. Note that the width may be narrowed continuously (see FIG. 48A), or may be narrowed stepwise (see FIG. 48B).

In this way, in the imaging element of Embodiment 12, the sectional area of the stacked part where the charge storage electrodes 24 ($24''_1$, $24''_2$, and $24''_3$), the insulating layer 82, and the photoelectric conversion layer 23A are stacked when the stacked part is cut along the YZ virtual plane varies depending on the distance from the first electrode. Therefore, a kind of charge transfer gradient is formed. Accordingly, the charges generated by the photoelectric conversion can be transferred more easily and securely.

Embodiment 13

Embodiment 13 relates to solid-state imaging apparatuses of the first and second configurations.

The solid-state imaging apparatus of Embodiment 13 includes a plurality of imaging elements, the imaging elements each including a photoelectric conversion section in which a first electrode 21, an inorganic oxide semiconductor material layer 23B, a photoelectric conversion layer 23A, and a second electrode 22 are stacked, in which the photoelectric conversion section further includes a charge storage electrode 24 which is disposed spaced from the first electrode 21 and which is disposed to face the inorganic oxide semiconductor material layer 23B, with an insulating layer 82 interposed therebetween, the plurality of imaging elements constitutes an imaging element block, and the first electrode 21 is shared by the plurality of imaging elements constituting the imaging element block.

Alternatively, the solid-state imaging apparatus of Embodiment 13 includes a plurality of the imaging elements described in Embodiments 1 to 12.

In Embodiment 13, one floating diffusion layer is provided for a plurality of imaging elements. By appropriately controlling the timing of charge transfer period, the plurality of imaging elements is permitted to share the one floating diffusion layer. Besides, in this case, the plurality of imaging elements can share one contact hole section.

Note that the solid-state imaging apparatus of Embodiment 13 substantially has a configuration and structure similar to those of the solid-state imaging apparatuses described in Embodiments 1 to 12, except that the first electrode 21 is shared by the plurality of imaging elements constituting the imaging element block.

Figure 49:
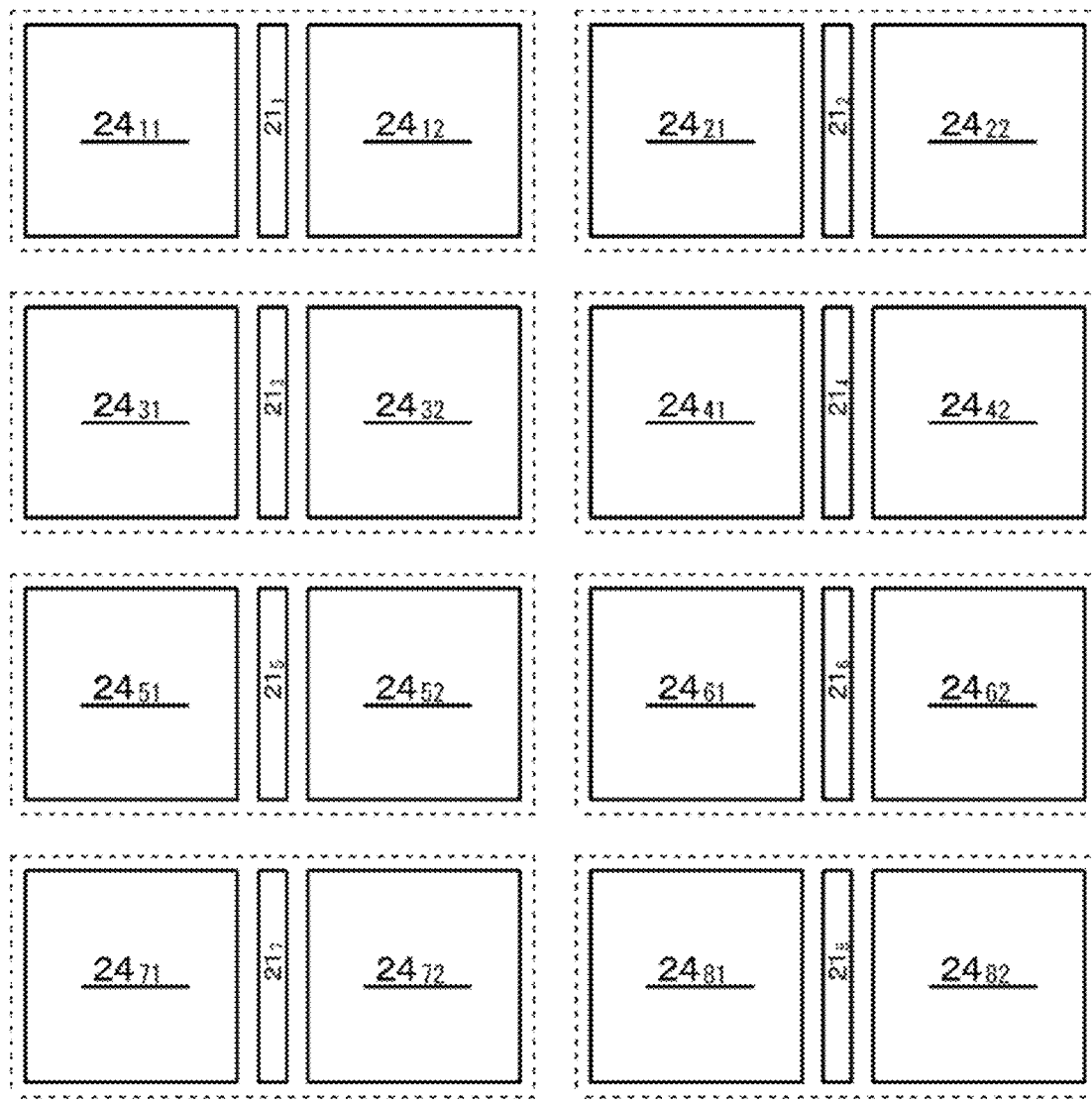
FIG. 49 is a schematic plan view of a first electrode and a charge storage electrode segment in a solid-state imaging apparatus of Embodiment 13.
Figure 50:
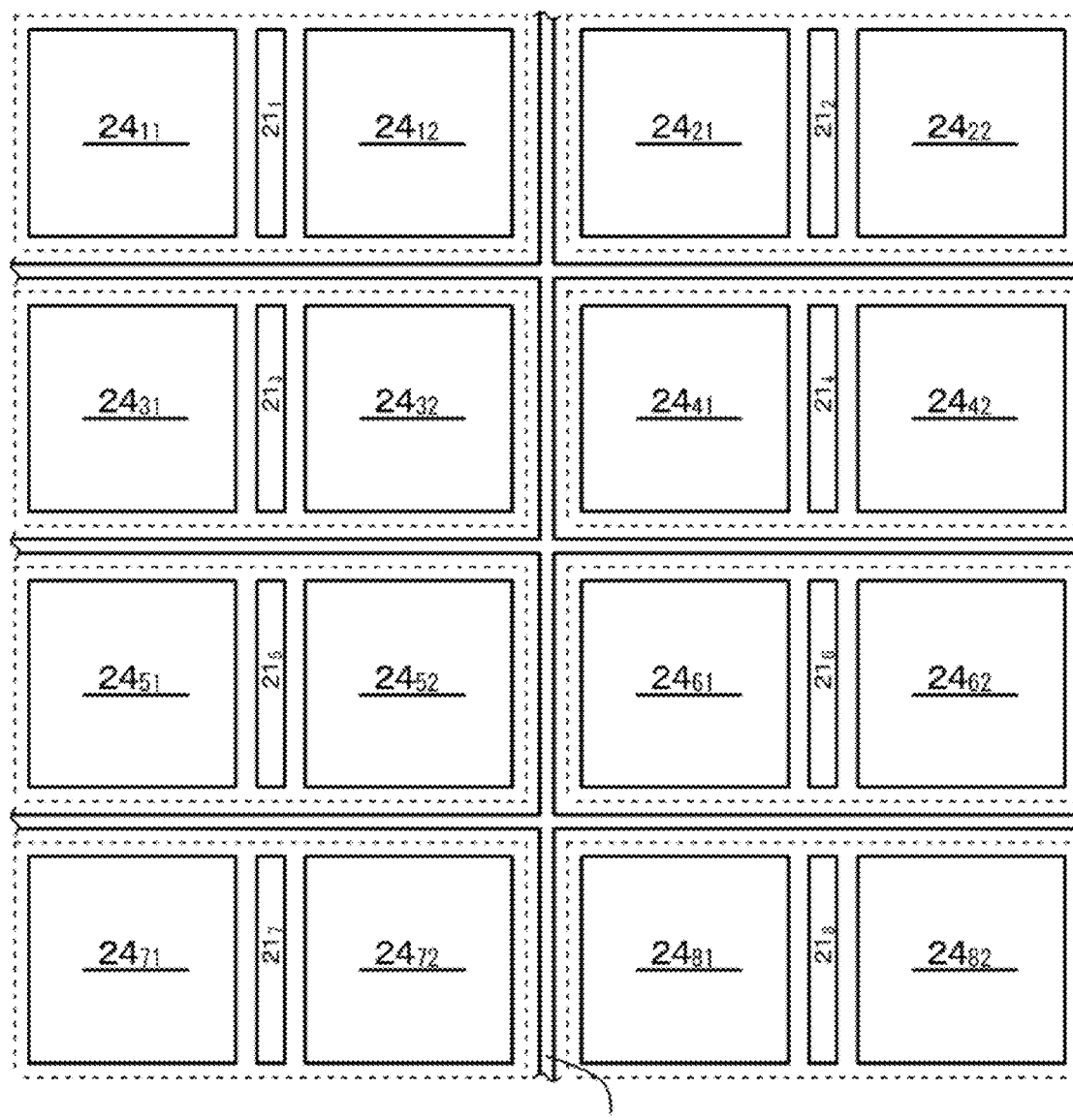
FIG. 50 is a schematic plan view of a first electrode and a charge storage electrode segment in a first modification of the solid-state imaging apparatus of Embodiment 13.
Figure 51:
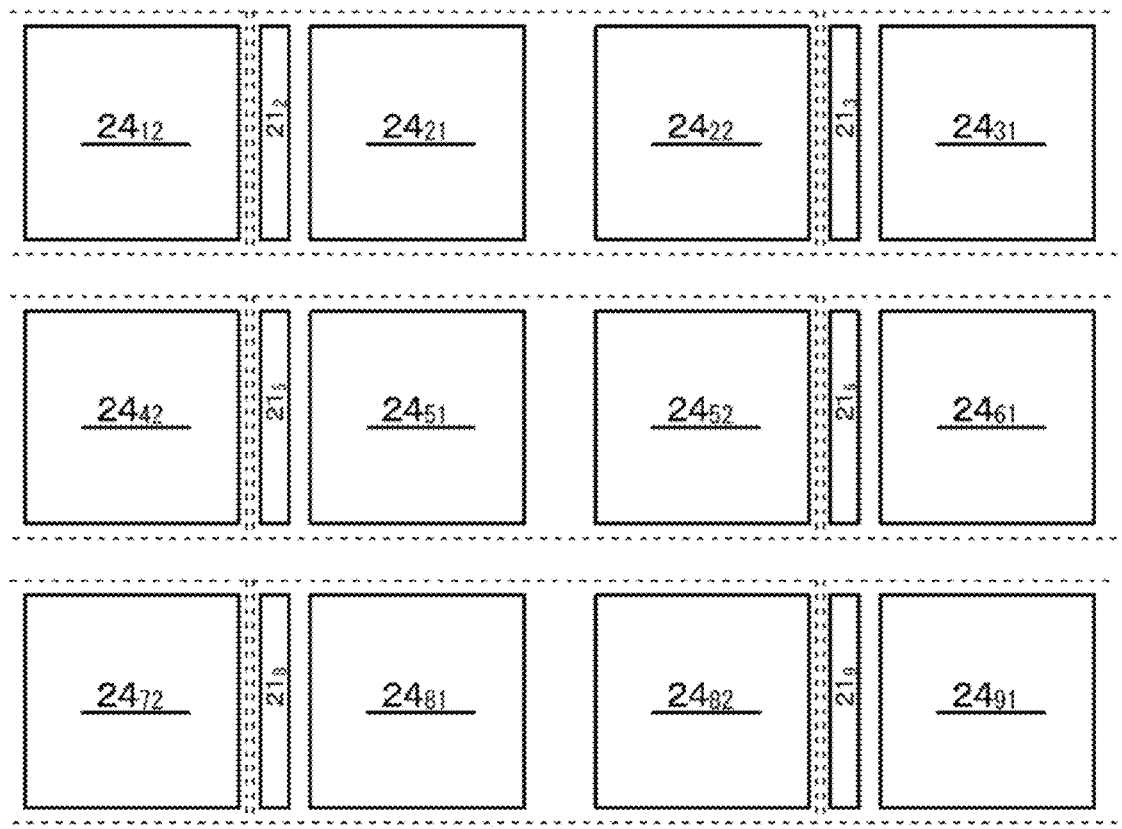
FIG. 51 is a schematic plan view of a first electrode and a charge storage electrode segment in a second modification of the solid-state imaging apparatus of Embodiment 13.
Figure 52:
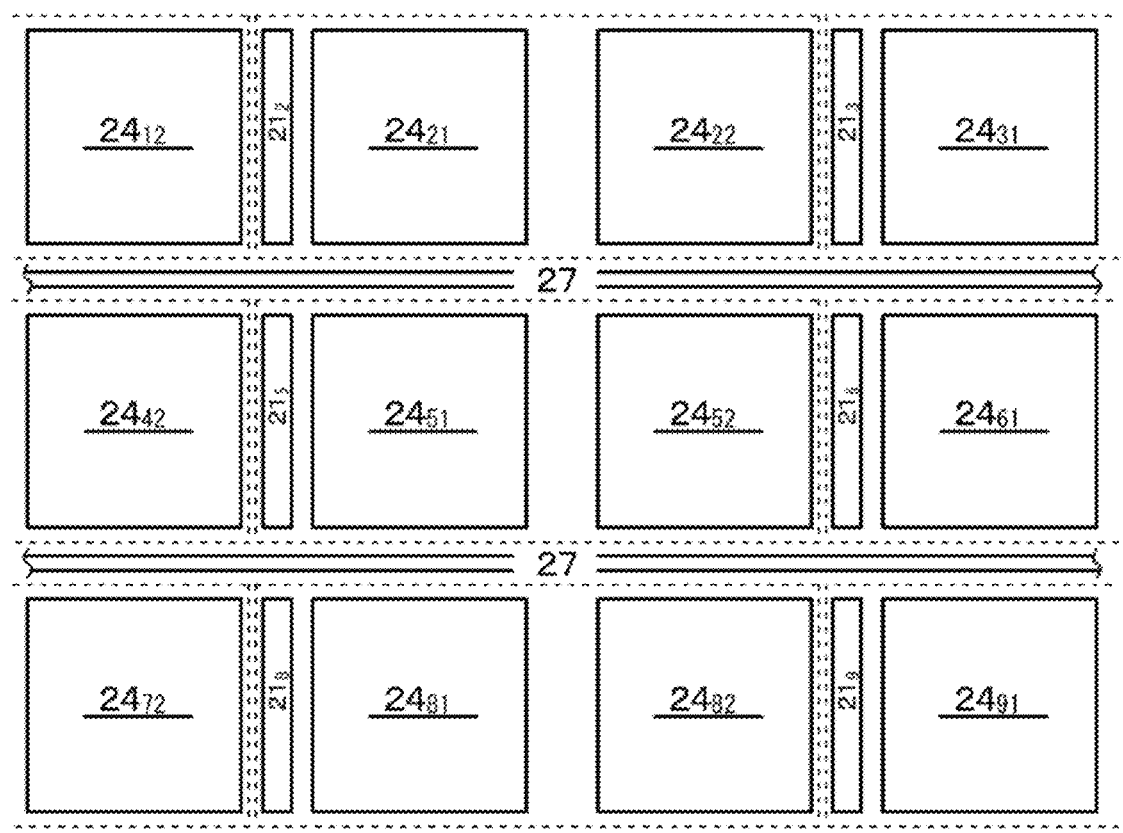
FIG. 52 is a schematic plan view of a first electrode and a charge storage electrode segment in a third modification of the solid-state imaging apparatus of Embodiment 13.
Figure 53:
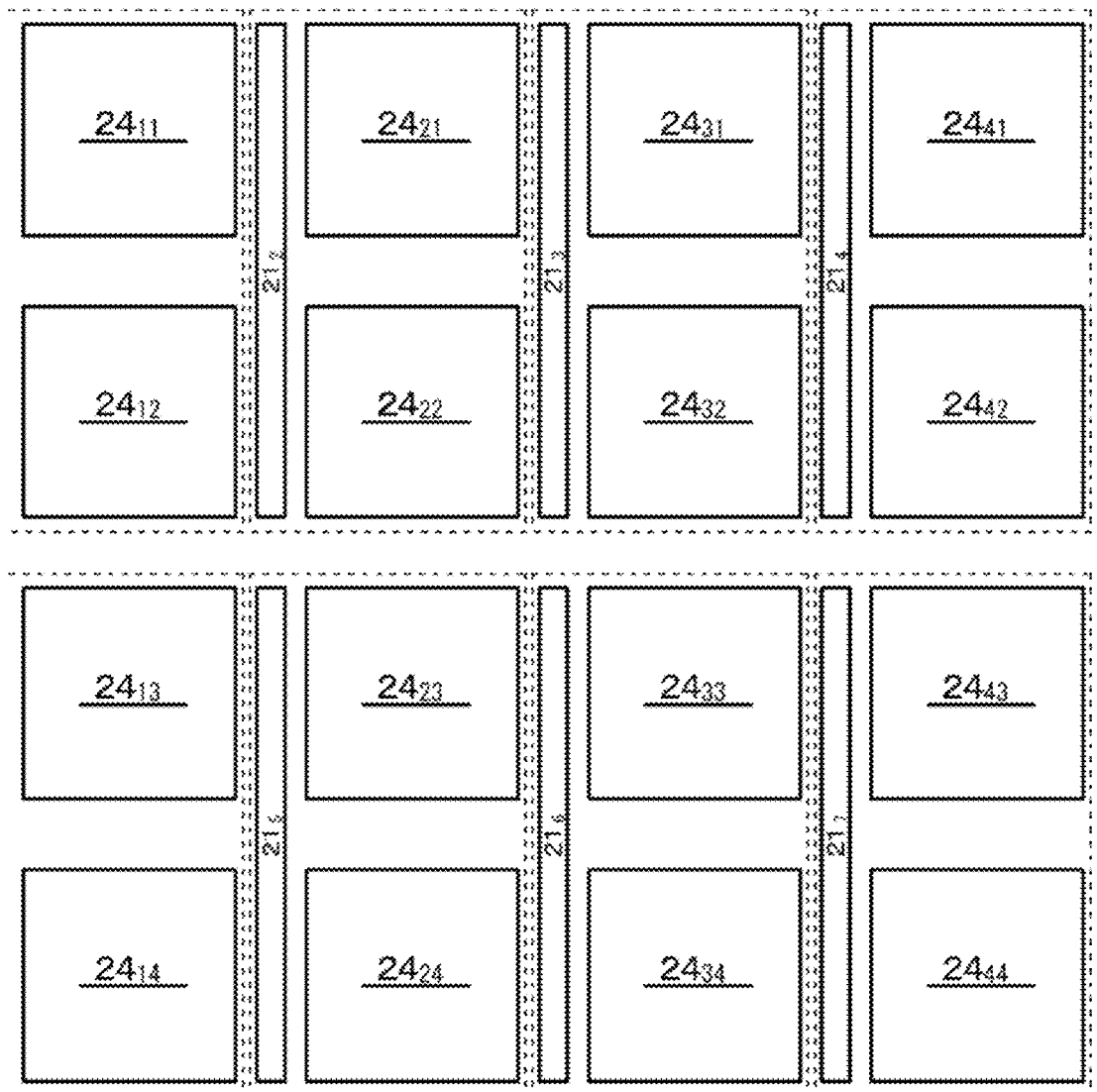
FIG. 53 is a schematic plan view of a first electrode and a charge storage electrode segment in a fourth modification of the solid-state imaging apparatus of Embodiment 13.
Figure 54:
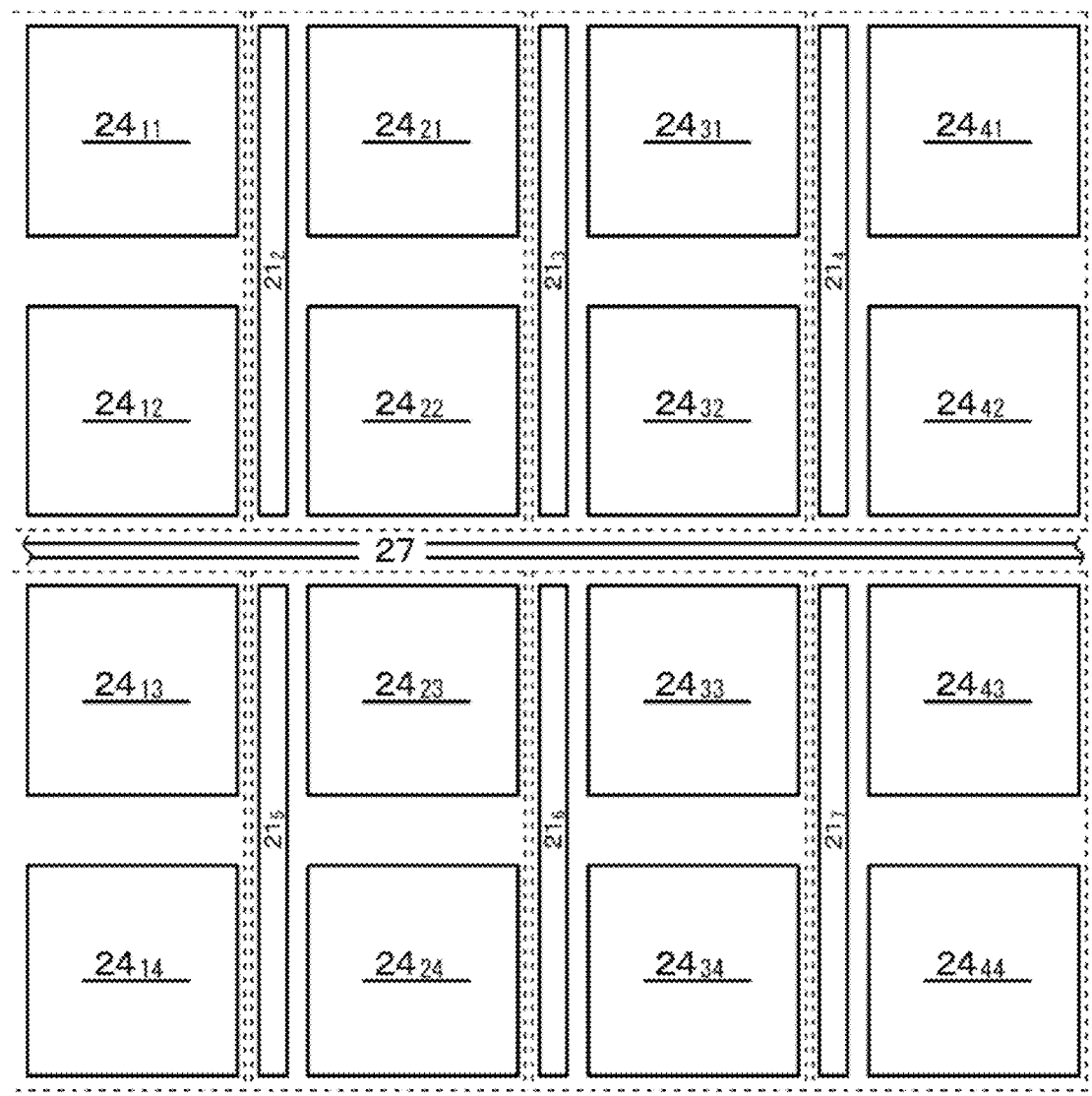
FIG. 54 is a schematic plan view of a first electrode and a charge storage electrode segment in a fifth modification of the solid-state imaging apparatus of Embodiment 13.

Layout states of the first electrodes 21 and the charge storage electrodes 24 in the solid-state imaging apparatus of Embodiment 13 are schematically depicted in FIG. 49 (Embodiment 13), FIG. 50 (first modification of Embodiment 13), FIG. 51 (second modification of Embodiment 13), FIG. 52 (third modification of Embodiment 13), and FIG. 53 (fourth modification of Embodiment 13). In FIGS. 49, 50, 53, and 54, 16 imaging elements are depicted, and in FIGS. 51 and 52, 12 imaging elements are depicted. Two imaging elements constitute an imaging element block. The imaging element block is depicted in the state of being surrounded by dotted line. The suffixes added to the first electrodes 21 and the charge storage electrodes 24 are for discriminating the first electrodes 21 and the charge storage electrodes 24. This similarly applies also to the descriptions given below. In addition, one on-chip microlens (not illustrated in FIGS. 49 to 58) is disposed on an upper side of one imaging element. In one imaging element block, two charge storage electrodes 24 are disposed, with the first electrode 21 therebetween (see FIGS. 49 and 50). Alternatively, one first electrode 21 is disposed facing two juxtaposed charge storage electrodes 24 (see FIGS. 53 and 54). In other words, the first electrode is disposed adjacently to the charge storage electrode of each imaging element. Alternatively, the first electrode is disposed adjacently to the charge storage electrodes of some of the plurality of imaging elements, but is not disposed adjacently to the charge storage electrodes of the rest of the plurality of imaging elements (see FIGS. 51 and 52); in this case, movement of charges from the rest of the plurality of imaging elements to the first electrode is movement via some of the plurality of imaging elements. It is preferable that the distance A between a charge storage electrode constituting an imaging element and another charge storage electrode constituting another imaging element is longer than the distance B between the first electrode and the charge storage electrode in the imaging element adjacent to the first electrode, in order to secure the movement of charges from each imaging element to the first electrode. In addition, it is preferable that the value of the distance A is larger for the imaging element located at a position spaced more from the first electrode. Besides, in examples depicted in FIGS. 50, 52, and 54, a charge movement control electrode 27 is disposed between the plurality of imaging elements constituting the imaging element block. With the charge movement control electrode 27 disposed, movement of charges between the imaging element blocks located with the charge movement control electrode 27 therebetween can be restrained securely. Note that let the potential impressed on the charge movement control electrode 27 be $V_{17}$, then it is sufficient if a setting that $V_{12} > V_{17}$ is adopted.

The charge movement control electrode 27 may be formed on the first electrode side, at the same level as the first electrode 21 or the charge storage electrode 24, or at a different level (specifically, at a level below the first electrode 21 or the charge storage electrode 24). In the former case, the distance between the charge movement control electrode 27 and the photoelectric conversion layer can be shortened, so that it is easy to control potential. On the other hand, in the latter case, the distance between the charge movement control electrode 27 and the charge storage electrode 24 can be shortened, which is advantageous for refinement.

An operation of the imaging element block including the first electrode $21_2$ and two charge storage electrodes $24_{21}$ and $24_{22}$ will be described below.

In the charge storage period, a potential $V_a$ is impressed on a first electrode $21_2$, and a potential $V_A$ is impressed on charge storage electrodes $24_{21}$ and $24_{22}$, from the driving circuit. By light incident on the photoelectric conversion layer 23A, photoelectric conversion is generated in the photoelectric conversion layer 23A. Holes generated by the photoelectric conversion are set out to the driving circuit from the second electrode 22 via a wiring $V_{OU}$. On the other hand, the potential of the first electrode $21_2$ is set higher than the potential of the second electrode 22; for example, a positive potential is impressed on the first electrode $21_2$, and a negative potential is impressed on the second electrode 22. Therefore, $V_A \geq V_a$, and preferably $V_A > V_a$ are satisfied. As a result, the electrons generated by the photoelectric conversion are attracted by the charge storage electrodes $24_{21}$ and $24_{22}$, and stay in the regions of the inorganic oxide semiconductor material layer 23B or the like facing the charge storage electrodes $24_{21}$ and $24_{22}$. In other words, charges are stored in the inorganic oxide semiconductor material layer 23B or the like. Since $V_A \geq V_a$ is satisfied, the electrons generated in the inside of the photoelectric conversion layer 23A would not move toward the first electrode $21_2$. Attendant on the lapse of time of the photoelectric conversion, the potential in the regions of the inorganic oxide semiconductor material layer 23B or the like facing the charge storage electrodes $24_{21}$ and $24_{22}$ become a value on the more negative side.

At a later stage of the charge storage period, a resetting operation is conducted. As a result, the potential of the first floating diffusion layer is reset, and the potential of the first floating diffusion layer becomes the potential $V_{DD}$ of the power source.

After the resetting operation is completed, reading of charges is conducted. In the charge transfer period, a potential $V_b$ is impressed on the first electrode $21_2$, a potential $V_{21-B}$ is impressed on the charge storage electrode $24_{21}$, and a potential $V_{22-B}$ is impressed on the charge storage electrode $24_{22}$, from the driving circuit. Here, $V_{21-B}<V_b<V_{22-B}$ is satisfied. As a result, the electrons having stayed in the region of the inorganic oxide semiconductor material layer 23B or the like facing the charge storage electrode $24_{21}$ are read out to the first electrode $21_2$, and, further, to the first floating diffusion layer. In other words, the charges stored in the region of the inorganic oxide semiconductor material layer 23B or the like facing the charge storage electrode $24_{21}$ are read out to the control section. After the reading is completed, a setting such that $V_{22-B} \leq V_{21-B}<V_b$ is made. Note that in examples depicted in FIGS. 53 and 54, a setting such that $V_{22-B}<V_b<V_{21-B}$ may be made. As a result, the electrons having stayed in the region of the inorganic oxide semiconductor material layer 23B or the like facing the charge storage electrode $24_{22}$ are read out to the first electrode $21_2$, and, further, to the first floating diffusion layer. In addition, in examples depicted in FIGS. 51 and 52, the electrons having stayed in the region of the inorganic oxide semiconductor material layer 23B or the like facing the charge storage electrode $24_{22}$ may be read out to the first floating diffusion layer via a first electrode $21_3$ to which the charge storage electrode $24_{22}$ is adjacent. Thus, the charges stored in the region of the inorganic oxide semiconductor material layer 23B or the like facing the charge storage electrode $24_{22}$ are read out to the control section. Note that when the reading of the charges stored in the region of the inorganic oxide semiconductor material layer 23B or the like facing the charge storage electrode $24_{21}$ to the control section is completed, the potential of the first floating diffusion layer may be reset.

Figure 59A:
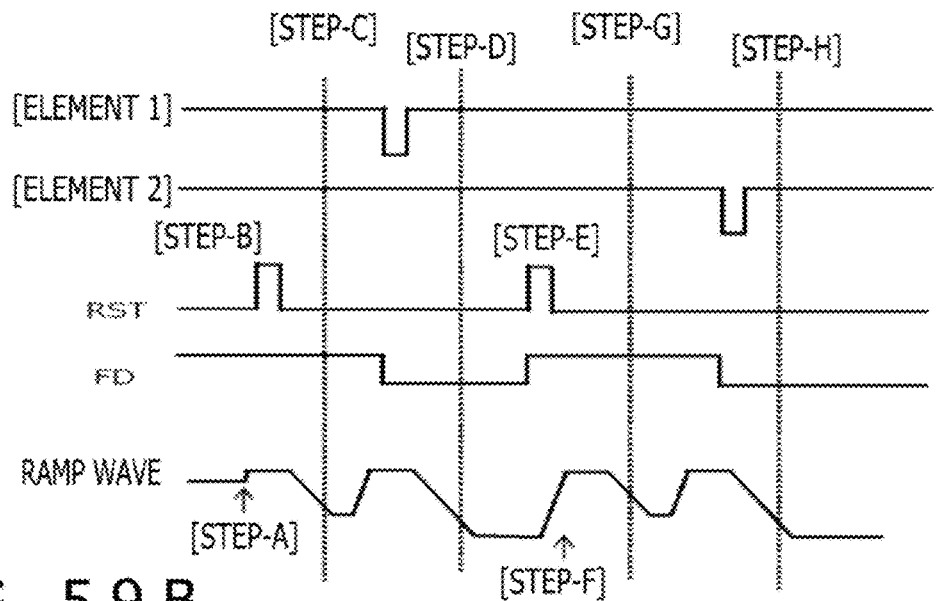
FIGS. 59A, 59B, and 59C are flowcharts depicting a reading driving example in an imaging element block of Embodiment 13.

FIG. 59A depicts a reading driving example in an imaging element block of Embodiment 13, in which signals from two imaging elements corresponding to the charge storage electrode $24_{21}$ and the charge storage electrode $24_{22}$ are read out according to the flow of:

[step-A]
   auto zero signal input to comparator,
[step-B]
   resetting operation of shared one floating diffusion layer,
[step-C]
   P-phase reading in imaging element corresponding to charge storage electrode $24_{21}$ and movement of charges to first electrode $21_2$,
[step-D]
   D-phase reading in imaging element corresponding to charge storage electrode $24_{21}$ and movement of charges to first electrode $21_2$,
[step-E]
   resetting operation of shared one floating diffusion layer,
[step-F]
   auto zero signal input to comparator,
[step-G]
   P-phase reading in imaging element corresponding to charge storage electrode $24_{22}$ and movement of charges to first electrode $21_2$, and
[step-H]
   D-phase reading in imaging element corresponding to charge storage electrode $24_{22}$ and movement of charges to first electrode $21_2$.

Based on a correlated double sampling (CDS) treatment, the difference between the P-phase reading in [step-C] and the D-phase reading in [step-D] is a signal from the imaging element corresponding to the charge storage electrode $24_{21}$, and the difference between the P-phase reading in [step-G] and the D-phase reading in [step-H] is a signal from the imaging element corresponding to the charge storage electrode $24_{22}$.

Figure 59B:
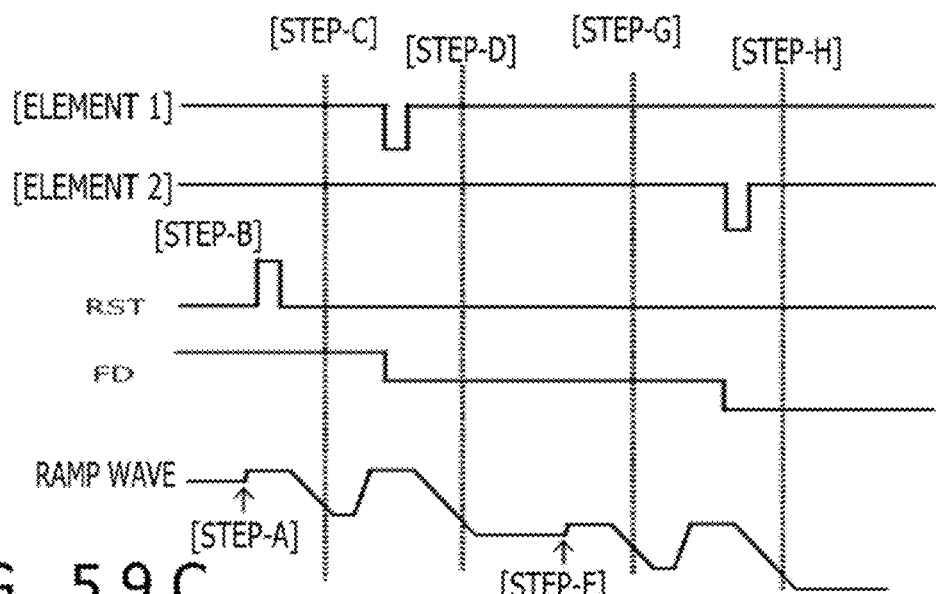
Figure 59C:
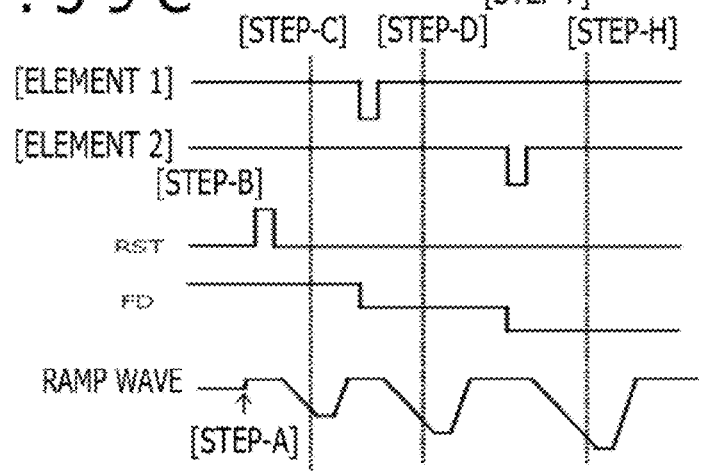
Figure 60:
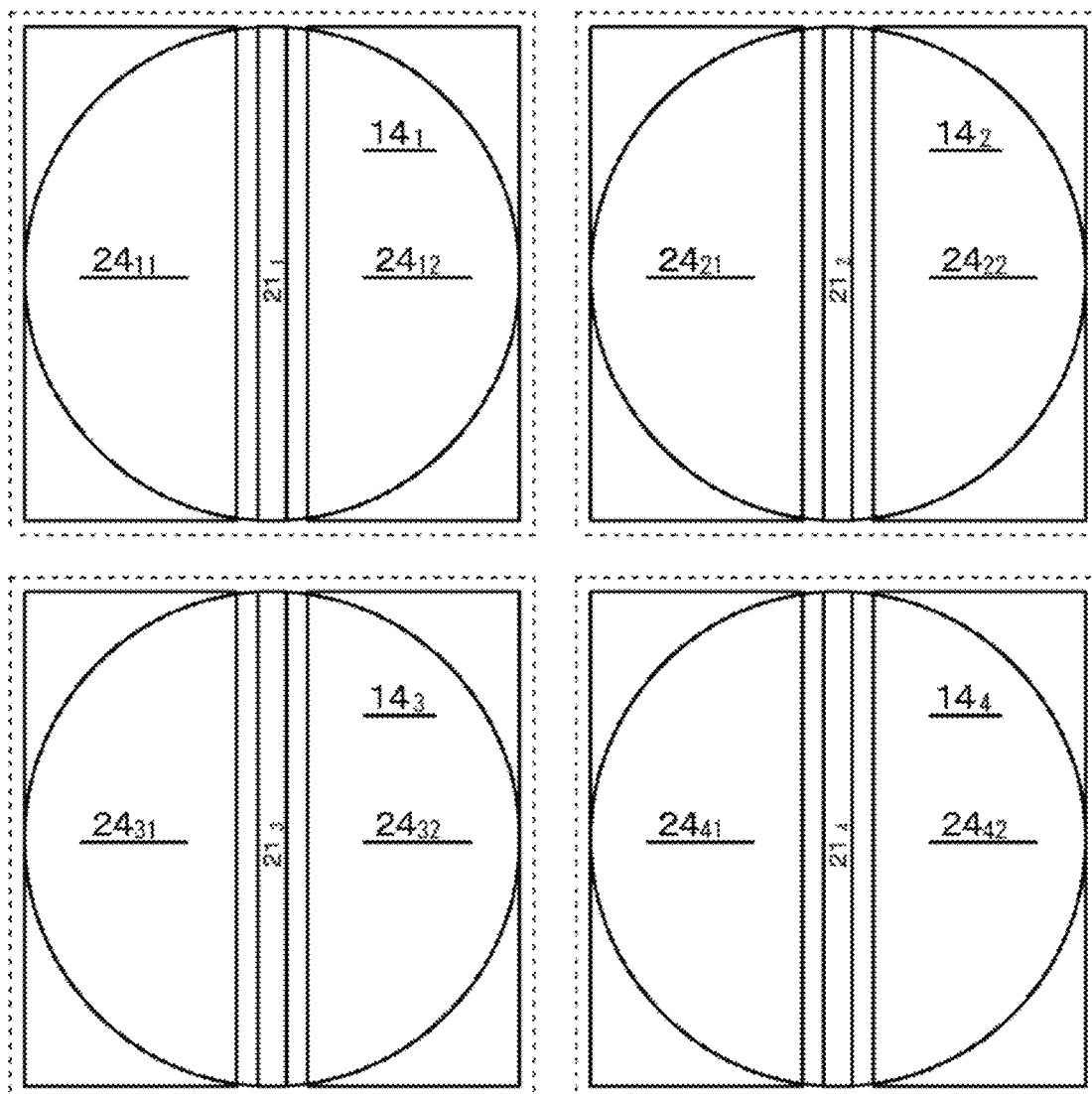
FIG. 60 is a schematic plan view of a first electrode and a charge storage electrode segment in a solid-state imaging apparatus of Embodiment 14.
Figure 61:
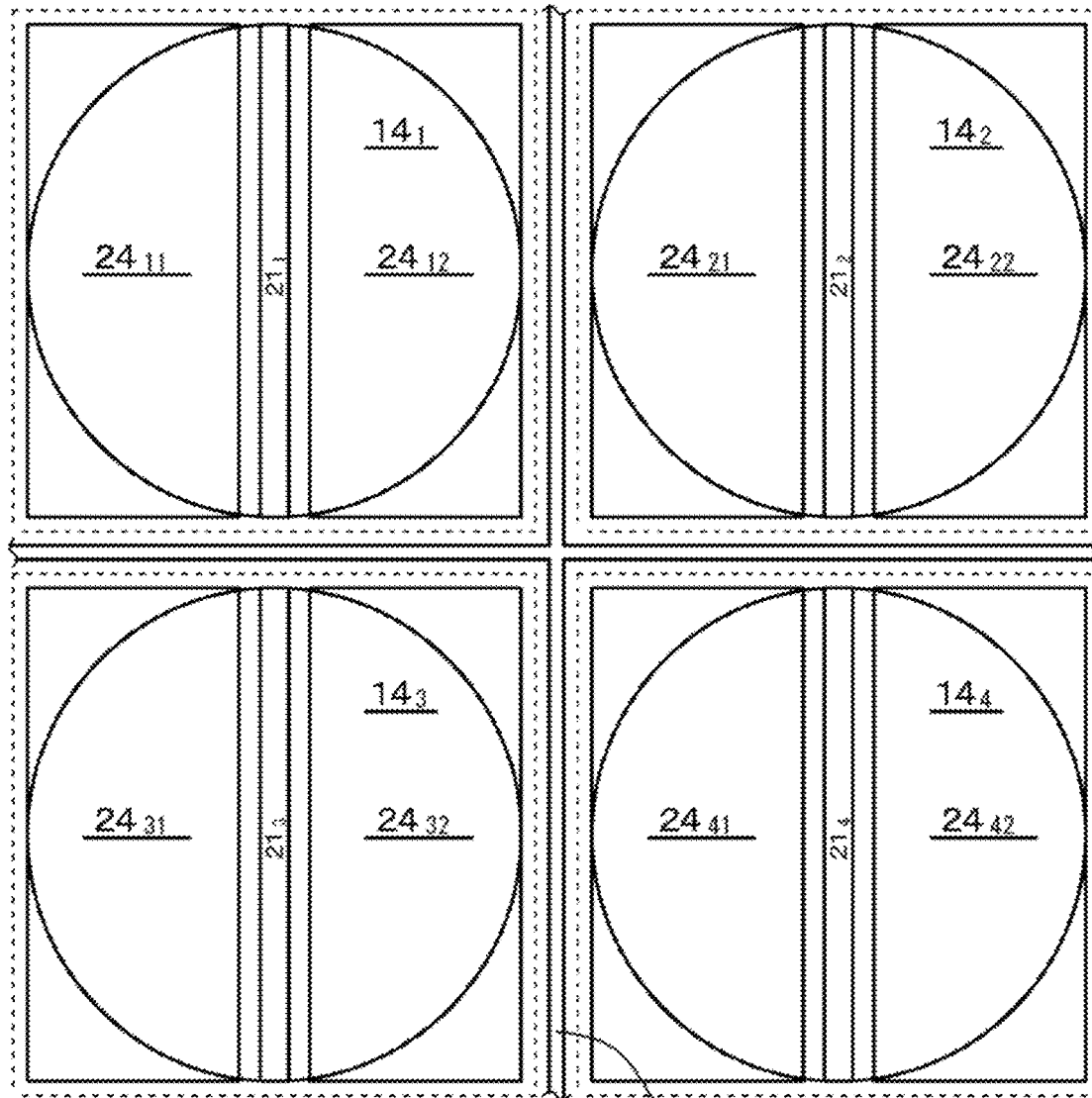
FIG. 61 is a schematic plan view of a first electrode and a charge storage electrode segment in a modification of the solid-state imaging apparatus of Embodiment 14.
Figure 62:
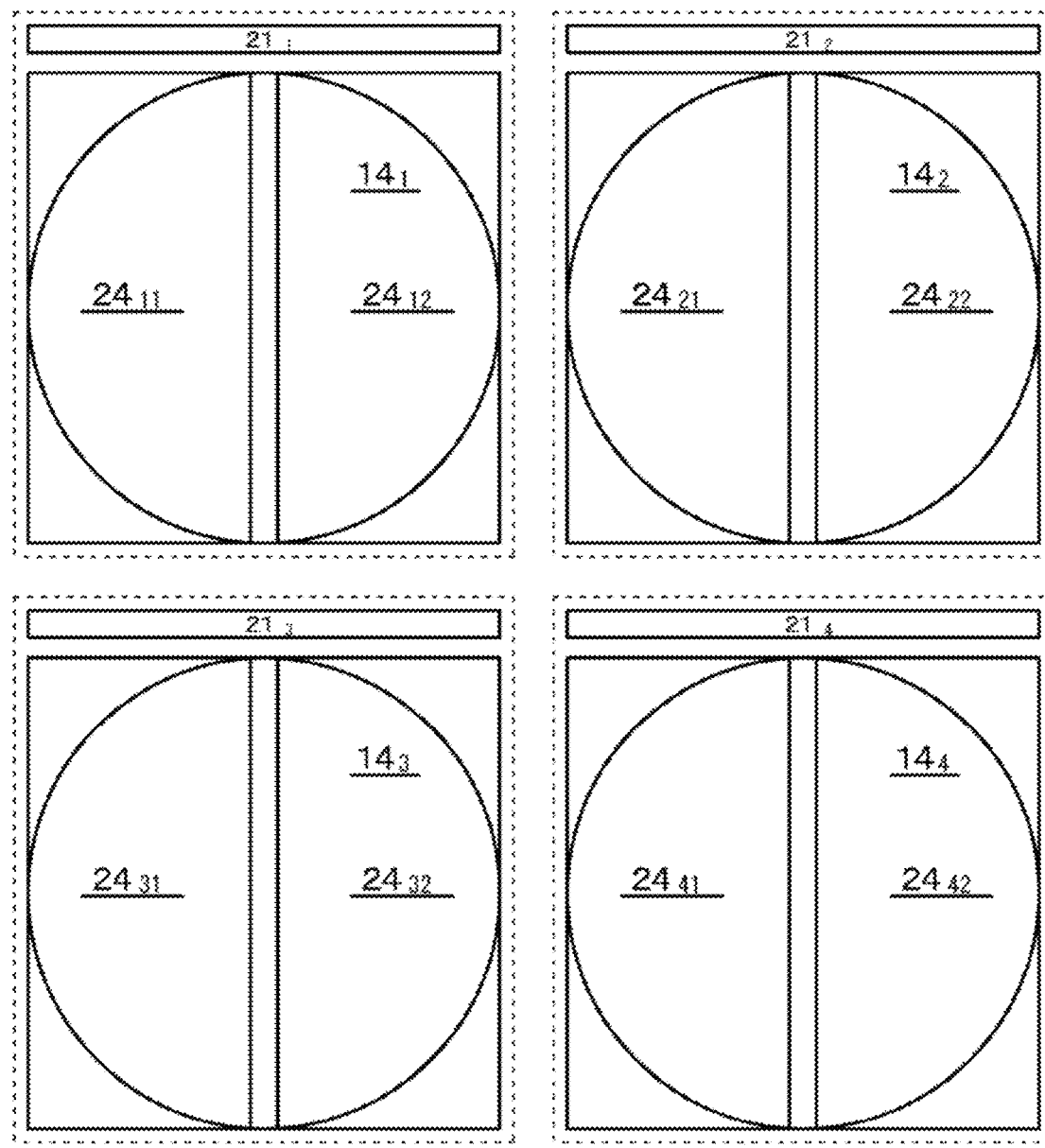
FIG. 62 is a schematic plan view of a first electrode and a charge storage electrode segment in a modification of the solid-state imaging apparatus of Embodiment 14.
Figure 63:
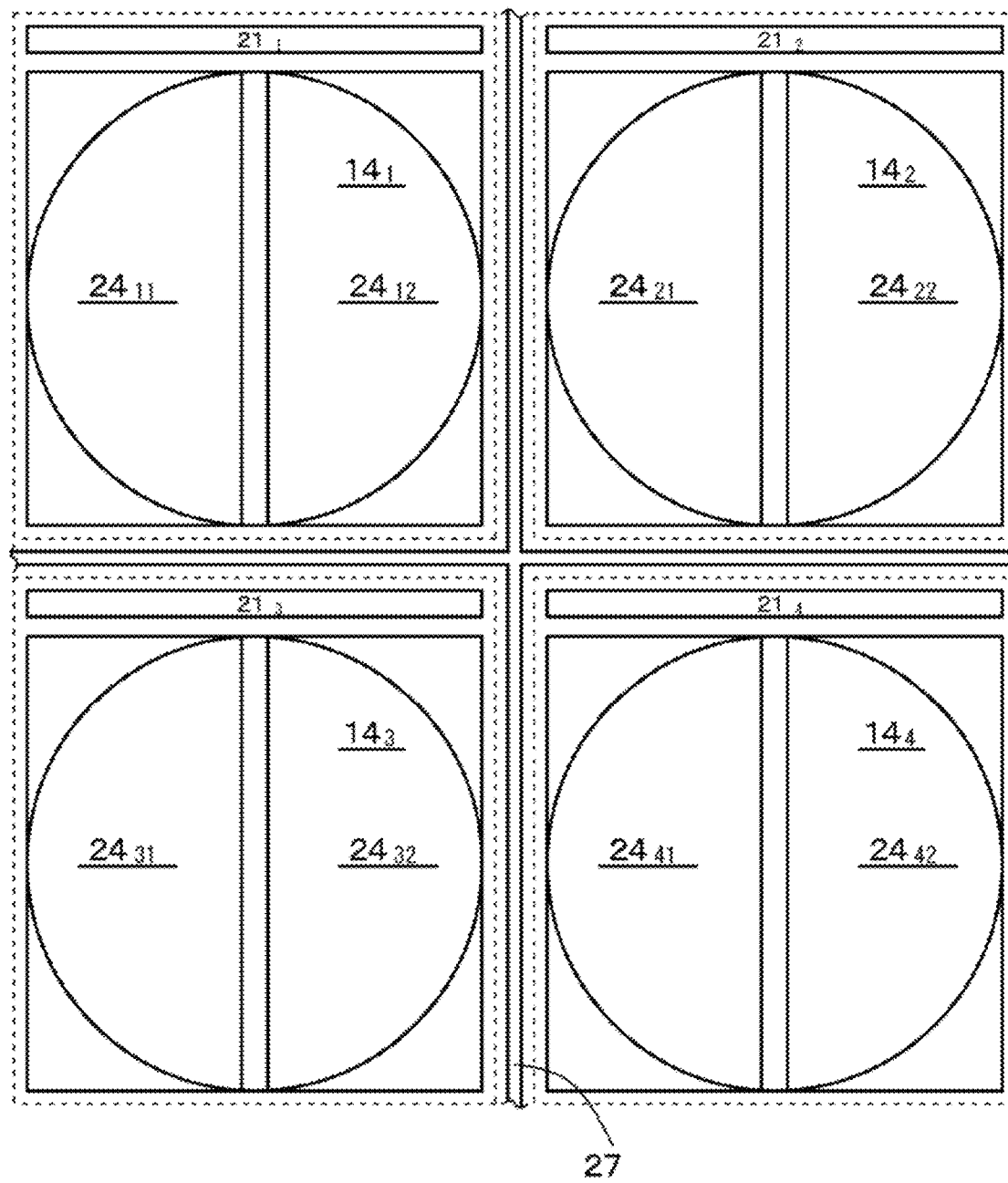
FIG. 63 is a schematic plan view of a first electrode and a charge storage electrode segment in a modification of the solid-state imaging apparatus of Embodiment 14.

Note that the operation of [step-E] may be omitted (see FIG. 59B). In addition, the operation of [step-F] may be omitted; in this case, further, [step-G] may be omitted (see FIG. 59C), whereon the difference between the P-phase reading in [step-C] and the D-phase reading in [step-D] is a signal from the imaging element corresponding to the charge storage electrode $24_{21}$, and the difference between the D-phase reading in [step-D] and the D-phase reading in [step-H] is a signal from the imaging element corresponding to the charge storage electrode $24_{22}$.

Figure 55:
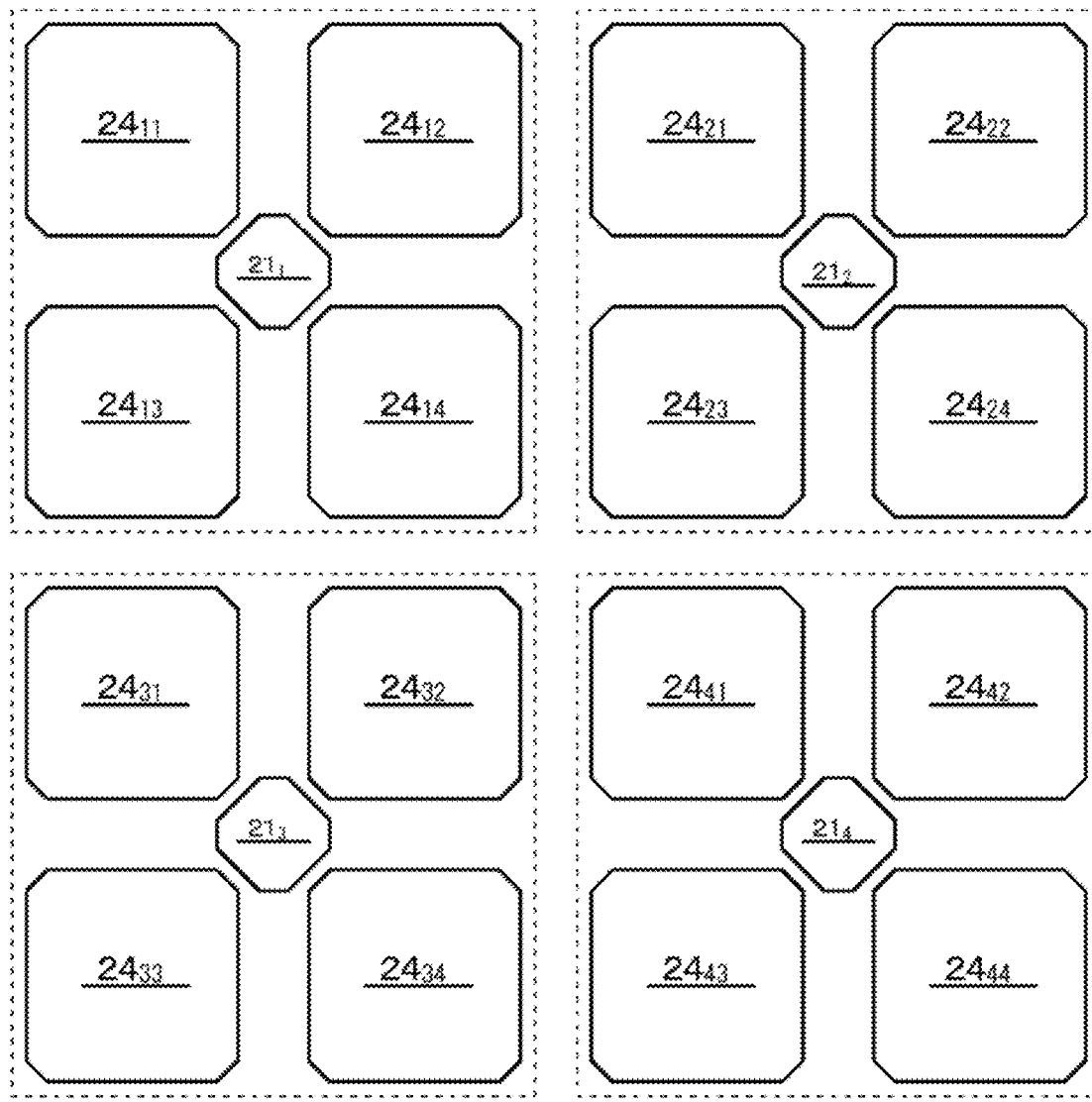
FIG. 55 is a schematic plan view of a first electrode and a charge storage electrode segment in a sixth modification of the solid-state imaging apparatus of Embodiment 13.
Figure 56:
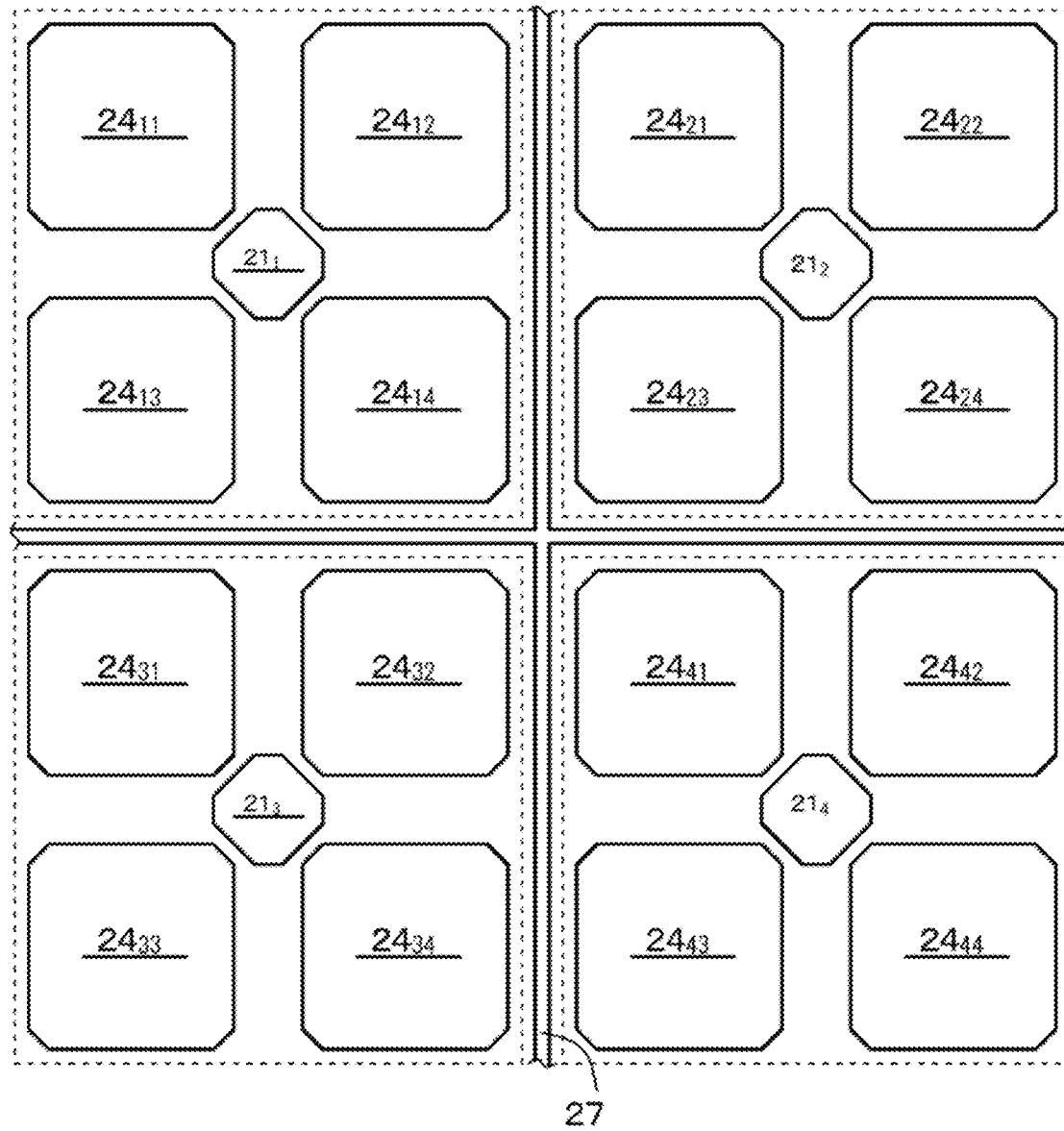
FIG. 56 is a schematic plan view of a first electrode and a charge storage electrode segment in a seventh modification of the solid-state imaging apparatus of Embodiment 13.

In the modifications in which a layout state of the first electrodes 21 and the charge storage electrodes 24 is schematically depicted in FIG. 55 (sixth modification of Embodiment 13) and FIG. 56 (seventh modification of Embodiment 13), four imaging elements constitute an imaging element block. The operations of these solid-state imaging apparatuses are substantially similar to the operations of the solid-state imaging apparatuses depicted in FIGS. 49 to 54.

Figure 57:
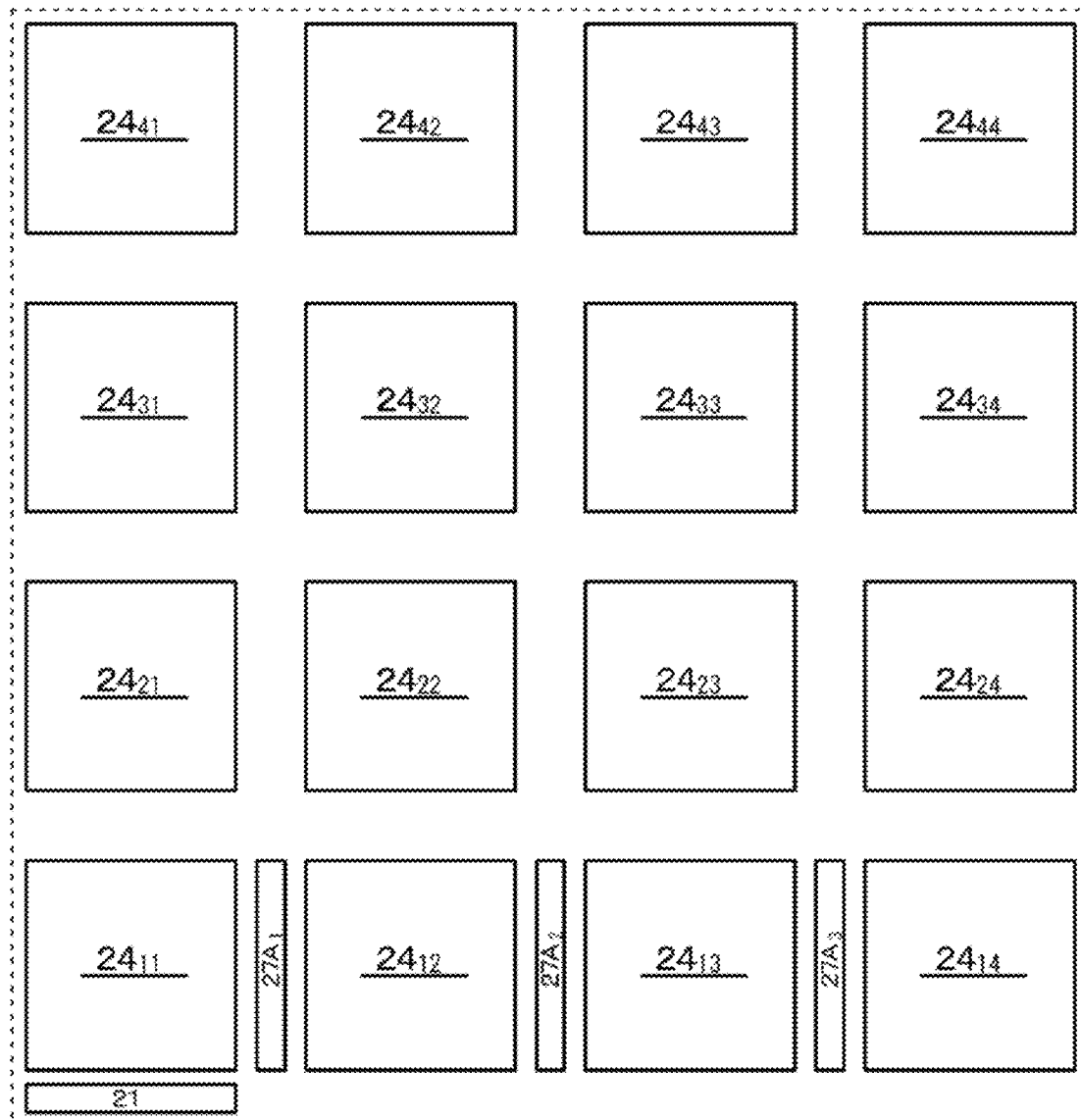
FIG. 57 is a schematic plan view of a first electrode and a charge storage electrode segment in an eighth modification of the solid-state imaging apparatus of Embodiment 13.
Figure 58:
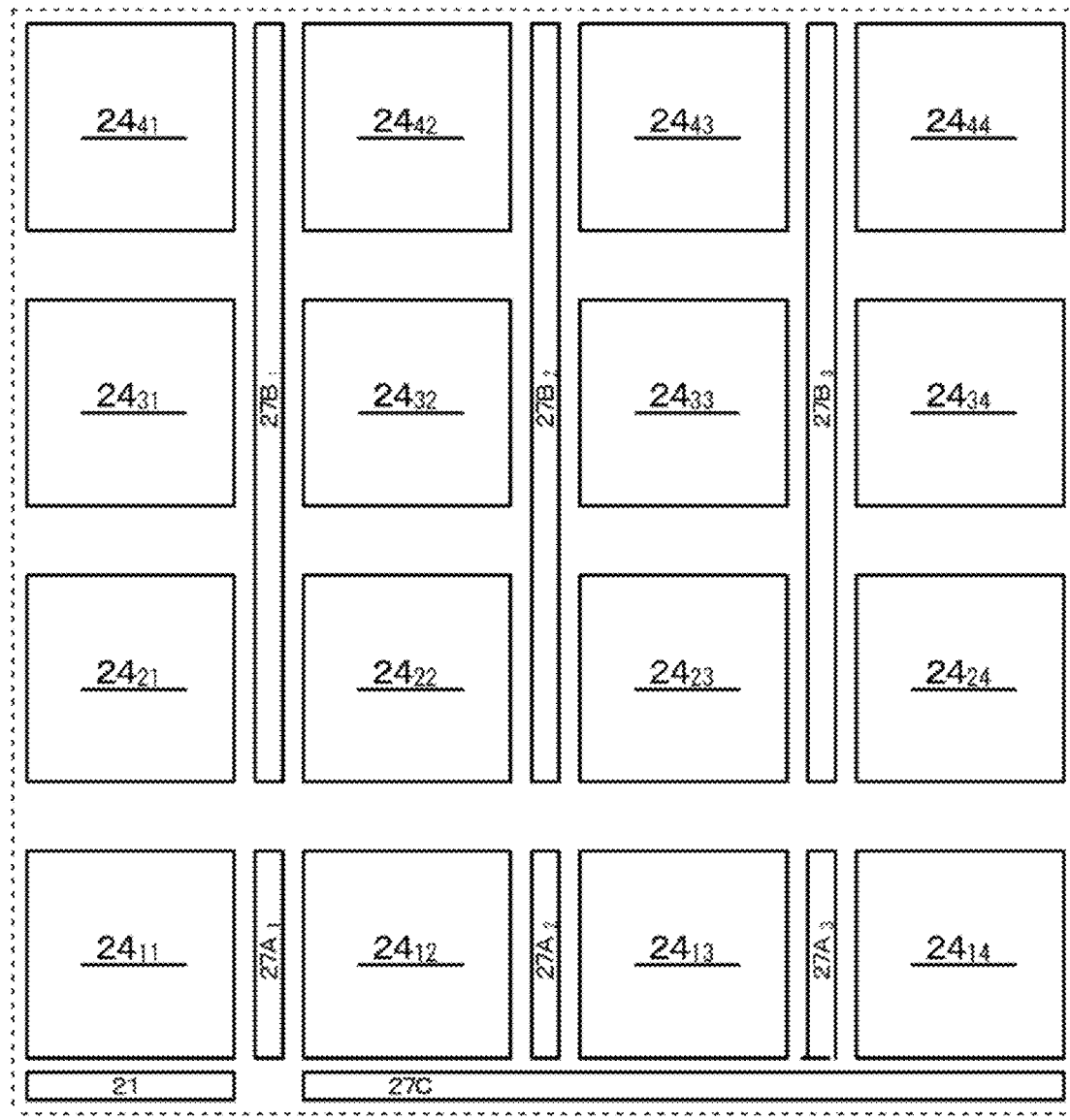
FIG. 58 is a schematic plan view of a first electrode and a charge storage electrode segment in a ninth modification of the solid-state imaging apparatus of Embodiment 13.

In Modification 8 and Modification 9 in which a layout state of the first electrodes 21 and the charge storage electrodes 24 is schematically depicted in FIG. 57 and FIG. 58, 16 imaging elements constitute an imaging element block. As illustrated in FIG. 57 and FIG. 58, charge movement control electrodes $27A_1$, $27A_2$, and $27A_3$ are disposed between a charge storage electrode $24_{11}$ and a charge storage electrode $24_{12}$, between the charge storage electrode $24_{12}$ and a charge storage electrode $24_{13}$, and between the charge storage electrode $24_{13}$ and a charge storage electrode $24_{14}$. In addition, as depicted in FIG. 58, charge movement control electrodes $27B_1$, $27B_2$, and $27B_3$ are disposed between charge storage electrodes $24_{21}$, $24_{31}$, and $24_{41}$ and charge storage electrodes $24_{22}$, $24_{32}$, and $24_{42}$, between the charge storage electrodes $24_{22}$, $24_{32}$, and $24_{42}$ and charge storage electrodes $24_{23}$, $24_{33}$, and $24_{43}$, and between the charge storage electrodes $24_{23}$, $24_{33}$, and $24_{43}$ and charge storage electrodes $24_{24}$, $24_{34}$, and $24_{44}$. Further, a charge movement control electrode 27C is disposed between an imaging element block and another imaging element block. In these solid-state imaging apparatuses, by controlling the 16 charge storage electrodes 24, charges stored in the inorganic oxide semiconductor material layer 23B can be read out from the first electrode 21.

[Step-10]
Specifically, first, charges stored in the region of the inorganic oxide semiconductor material layer 23B or the like facing the charge storage electrode $24_{11}$ are read out from the first electrode 21. Next, charges stored in the region of the inorganic oxide semiconductor material layer 23B or the like facing the charge storage electrode $24_{12}$ are read out from the first electrode 21, via the region of the inorganic oxide semiconductor material layer 23B or the like facing the charge storage electrode $24_{11}$. Subsequently, charges stored in the region of the inorganic oxide semiconductor material layer 23B or the like facing the charge storage electrode $24_{13}$ are read out from the first electrode 21, via the regions of the inorganic oxide semiconductor material layer 23B or the like facing the charge storage electrode $24_{12}$ and the charge storage electrode $24_{11}$.

[Step-20]
Thereafter, charges stored in the region of the inorganic oxide semiconductor material layer 23B or the like facing the charge storage electrode $24_{21}$ are moved into the region of the inorganic oxide semiconductor material layer 23B or the like facing the charge storage electrode $24_{11}$. Charges stored in the region of the inorganic oxide semiconductor material layer 23B or the like facing the charge storage electrode $24_{22}$ are moved into the region of the inorganic oxide semiconductor material layer 23B or the like facing the charge storage electrode $24_{12}$. Charges stored in the region of the inorganic oxide semiconductor material layer 23B or the like facing the charge storage electrode $24_{23}$ are moved into the region of the inorganic oxide semiconductor material layer 23B or the like facing the charge storage electrode $24_{13}$. Charges stored in the region of the inorganic oxide semiconductor material layer 23B or the like facing the charge storage electrode $24_{24}$ are moved into the region of the inorganic oxide semiconductor material layer 23B or the like facing the charge storage electrode 2414.

[Step-21]

Charges stored in the region of the inorganic oxide semiconductor material layer 23B or the like facing the charge storage electrode $24_{31}$ are moved into the region of the inorganic oxide semiconductor material layer 23B or the like facing the charge storage electrode $24_{21}$. Charges stored in the region of the inorganic oxide semiconductor material layer 23B or the like facing the charge storage electrode $24_{32}$ are moved into the region of the inorganic oxide semiconductor material layer 23B or the like facing the charge storage electrode $24_{22}$. Charges stored in the region of the inorganic oxide semiconductor material layer 23B or the like facing the charge storage electrode $24_{33}$ are moved into the region of the inorganic oxide semiconductor material layer 23B or the like facing the charge storage electrode $24_{23}$. Charges stored in the region of the inorganic oxide semiconductor material layer 23B or the like facing the charge storage electrode $24_{34}$ are moved into the region of the inorganic oxide semiconductor material layer 23B or the like facing the charge storage electrode $24_{24}$.

[Step-22]

Charges stored in the region of the inorganic oxide semiconductor material layer 23B or the like facing the charge storage electrode $24_{41}$ are moved into the region of the inorganic oxide semiconductor material layer 23B or the like facing the charge storage electrode $24_{31}$. Charges stored in the region of the inorganic oxide semiconductor material layer 23B or the like facing the charge storage electrode $24_{42}$ are moved into the region of the inorganic oxide semiconductor material layer 23B or the like facing the charge storage electrode $24_{32}$. Charges stored in the region of the inorganic oxide semiconductor material layer 23B or the like facing the charge storage electrode $24_{43}$ are moved into the region of the inorganic oxide semiconductor material layer 23B or the like facing the charge storage electrode $24_{33}$. Charges stored in the region of the inorganic oxide semiconductor material layer 23B or the like facing the charge storage electrode $24_{44}$ are moved into the region of the inorganic oxide semiconductor material layer 23B or the like facing the charge storage electrode $24_{34}$.

[Step-30]

Then, [step-10] is again carried out, so that the charges stored in the region of the inorganic oxide semiconductor material layer 23B or the like facing the charge storage electrode $24_{21}$, the charges stored in the region of the inorganic oxide semiconductor material layer 23B or the like facing the charge storage electrode $24_{22}$, the charges stored in the region of the inorganic oxide semiconductor material layer 23B or the like facing the charge storage electrode $24_{23}$, and the charges stored in the region of the inorganic oxide semiconductor material layer 23B or the like facing the charge storage electrode $24_{14}$, can be read out via the first electrode 21.

[Step-40]

Thereafter, charges stored in the region of the inorganic oxide semiconductor material layer 23B or the like facing the charge storage electrode $24_{21}$ are moved into the region of the inorganic oxide semiconductor material layer 23B or the like facing the charge storage electrode $24_{11}$. Charges stored in the region of the inorganic oxide semiconductor material layer 23B or the like facing the charge storage electrode $24_{22}$ are moved into the region of the inorganic oxide semiconductor material layer 23B or the like facing the charge storage electrode $24_{12}$. Charges stored in the region of the inorganic oxide semiconductor material layer 23B or the like facing the charge storage electrode $24_{23}$ are moved into the region of the inorganic oxide semiconductor material layer 23B or the like facing the charge storage electrode $24_{13}$. Charges stored in the region of the inorganic oxide semiconductor material layer 23B or the like facing the charge storage electrode $24_{24}$ are moved into the region of the inorganic oxide semiconductor material layer 23B or the like facing the charge storage electrode $24_{14}$.

[Step-41]

Charges in the region of the inorganic oxide semiconductor material layer 23B or the like facing the charge storage electrode $24_{31}$ are moved into the region of the inorganic oxide semiconductor material layer 23B or the like facing the charge storage electrode $24_{21}$. Charges stored in the region of the inorganic oxide semiconductor material layer 23B or the like facing the charge storage electrode $24_{32}$ are moved into the region of the inorganic oxide semiconductor material layer 23B or the like facing the charge storage electrode $24_{22}$. Charges stored in the region of the inorganic oxide semiconductor material layer 23B or the like facing the charge storage electrode $24_{33}$ are moved into the region of the inorganic oxide semiconductor material layer 23B or the like facing the charge storage electrode $24_{23}$. Charges stored in the region of the inorganic oxide semiconductor material layer 23B or the like facing the charge storage electrode $24_{34}$ are moved into the region of the inorganic oxide semiconductor material layer 23B or the like facing the charge storage electrode $24_{24}$.

[Step-50]

Then, [step-10] is again performed, so that the charges stored in the region of the inorganic oxide semiconductor material layer 23B or the like facing the charge storage electrode $24_{31}$, the charges stored in the region of the inorganic oxide semiconductor material layer 23B or the like facing the charge storage electrode $24_{32}$, the charges stored in the region of the inorganic oxide semiconductor material layer 23B or the like facing the charge storage electrode $24_{33}$, and the charges stored in the region of the inorganic oxide semiconductor material layer 23B or the like facing the charge storage electrode $24_{34}$, can be read out via the first electrode 21.

[Step-60]

Thereafter, charges stored in the region of the inorganic oxide semiconductor material layer 23B or the like facing the charge storage electrode $24_{21}$ are moved into the region of the inorganic oxide semiconductor material layer 23B or the like facing the charge storage electrode $24_{11}$. Charges stored in the region of the inorganic oxide semiconductor material layer 23B or the like facing the charge storage electrode $24_{12}$ are moved into the region of the inorganic oxide semiconductor material layer 23B or the like facing the charge storage electrode $24_{12}$. Charges stored in the region of the inorganic oxide semiconductor material layer 23B or the like facing the charge storage electrode $24_{23}$ are moved into the region of the inorganic oxide semiconductor material layer 23B or the like facing the charge storage electrode $24_{13}$. Charges stored in the region of the inorganic oxide semiconductor material layer 23B or the like facing the charge storage electrode $24_{24}$ are moved into the region of the inorganic oxide semiconductor material layer 23B or the like facing the charge storage electrode $24_{14}$.

[Step-70]

Then, [step-10] is again carried out, so that the charges stored in the region of the inorganic oxide semiconductor material layer 23B or the like facing the charge storage electrode $24_{41}$, the charges stored in the region of the inorganic oxide semiconductor material layer 23B or the like facing the charge storage electrode $24_{42}$, the charges stored in the region of the inorganic oxide semiconductor material layer 23B or the like facing the charge storage electrode $24_{43}$, and the charges stored in the region of the inorganic oxide semiconductor material layer 23B or the like facing the charge storage electrode $24_{44}$, can be read out via the first electrode 21.

In the solid-state imaging apparatus of Embodiment 13, the plurality of imaging elements constituting the imaging element block share the first electrode, and, therefore, the configuration and structure of the pixel region in which a plurality of the imaging elements is arranged can be simplified and refined. Note that the plurality of imaging elements provided for one floating diffusion layer may include a plurality of imaging elements of the first type, or may include at least one imaging element of the first type and one or more imaging elements of the second type.

Embodiment 14

Embodiment 14 is a modification of Embodiment 13. In a solid-state imaging apparatus of Embodiment 14 of which a layout state of first electrodes 21 and charge storage electrodes 24 is depicted in FIGS. 60, 61, 62, and 63, two imaging elements constitute an imaging element block. Besides, one on-chip microlens 14 is disposed on an upper side of the imaging element block. Note that in the examples illustrated in FIGS. 61 and 63, a charge movement control electrode 27 is disposed between the plurality of imaging elements constituting the imaging element block.

For example, a photoelectric conversion layer corresponding to charge storage electrodes $24_{11}$, $24_{21}$, $24_{31}$, and $24_{41}$ constituting an imaging element block has high sensitivity to incident light coming from an oblique right upper side in the drawing. In addition, a photoelectric conversion layer corresponding to charge storage electrodes $24_{12}$, $24_{22}$, $24_{32}$, and $24_{42}$ constituting an imaging element block has high sensitivity to incident light coming from an oblique left upper side in the drawing. Therefore, for example, when an imaging element having the charge storage electrode $24_{11}$ and an imaging element having the charge storage electrode $24_{12}$ are combined, it is thereby possible to acquire an image surface phase difference signal. Besides, when a signal from the imaging element having the charge storage electrode $24_{11}$ and a signal from the imaging element having the charge storage electrode $24_{12}$ are added to each other, one imaging element can be configured by a combination with these imaging elements. While a first electrode $21_1$ is disposed between the charge storage electrode $24_{11}$ and the charge storage electrode $24_{12}$ in the example depicted in FIG. 60, one first electrode $21_1$ may be disposed facing the juxtaposed two charge storage electrodes $24_{11}$ and $24_{12}$, as in the example illustrated in FIG. 62, so that more enhancement of sensitivity can be realized.

While the present disclosure has been described above based on preferred embodiments, the present disclosure is not limited to these embodiments. The structures and configurations, production conditions, producing methods, and materials used of the stacked-type imaging elements, imaging elements, and solid-state imaging apparatuses described in the embodiments are merely illustrative, and may be modified as required. The imaging elements of the embodiments may be combined with one another, as required. For example, the imaging element of Embodiment 7, the imaging element of Embodiment 8, the imaging element of Embodiment 9, the imaging element of Embodiment 10, and the imaging element of Embodiment 11 may be arbitrarily combined with one another, and the imaging element of Embodiment 7, the imaging element of Embodiment 8, the imaging element of Embodiment 9, the imaging element of Embodiment 10, and the imaging element of Embodiment 12 may be arbitrarily combined with one another.

Depending on the cases, the floating diffusion layers $FD_1$, $FD_2$, $FD_3$, 51C, 45C, and 46C may be shared.

Figure 64:
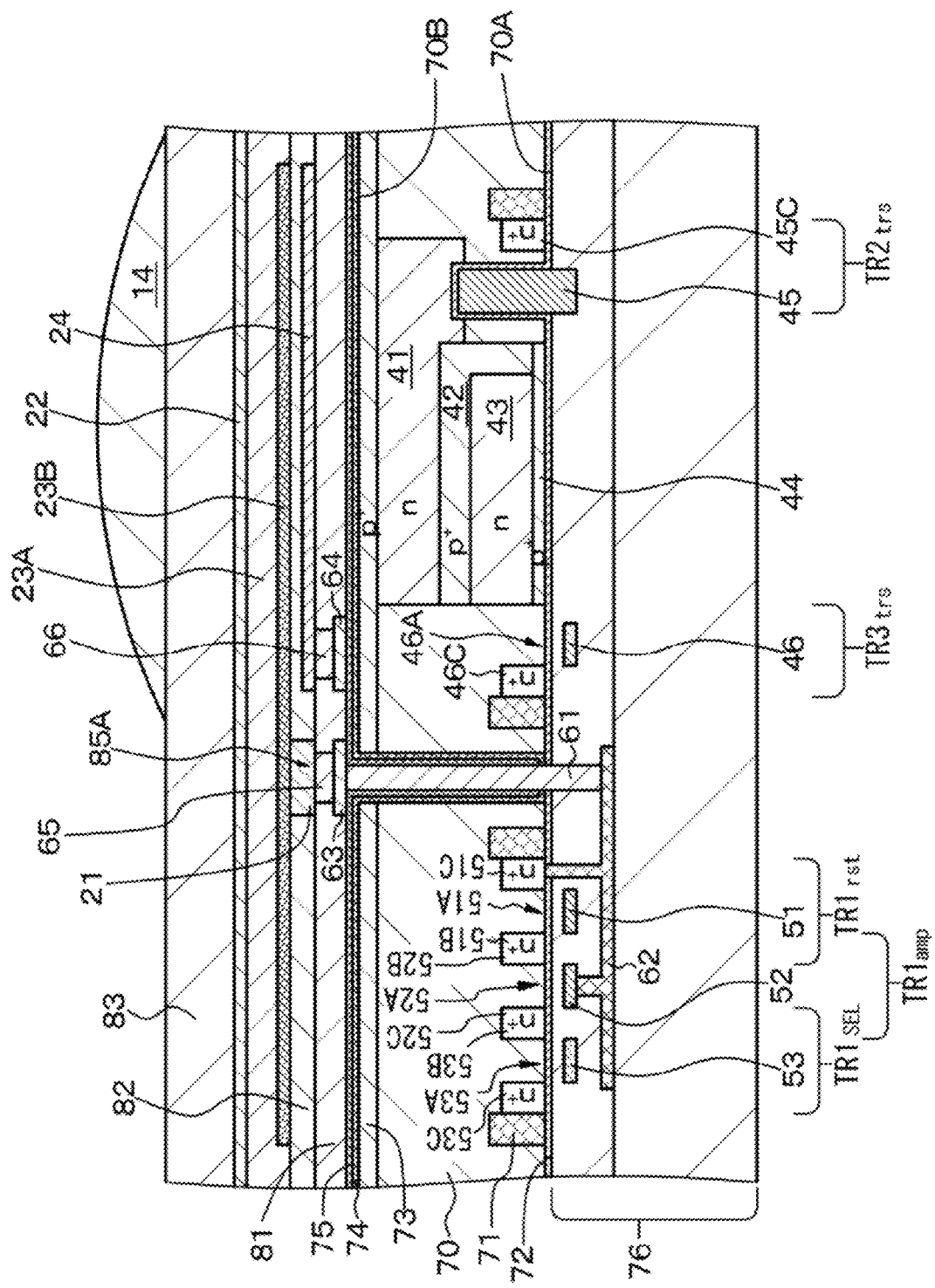
FIG. 64 is a schematic partial sectional view of another modification of the imaging element of Embodiment 1.

As a modification of the imaging element described in Embodiment 1, for example, is illustrated in FIG. 64, the first electrode 21 can extend in an opening 85A provided in the insulating layer 82 and can be connected to the inorganic oxide semiconductor material layer 23B.

Figure 65:
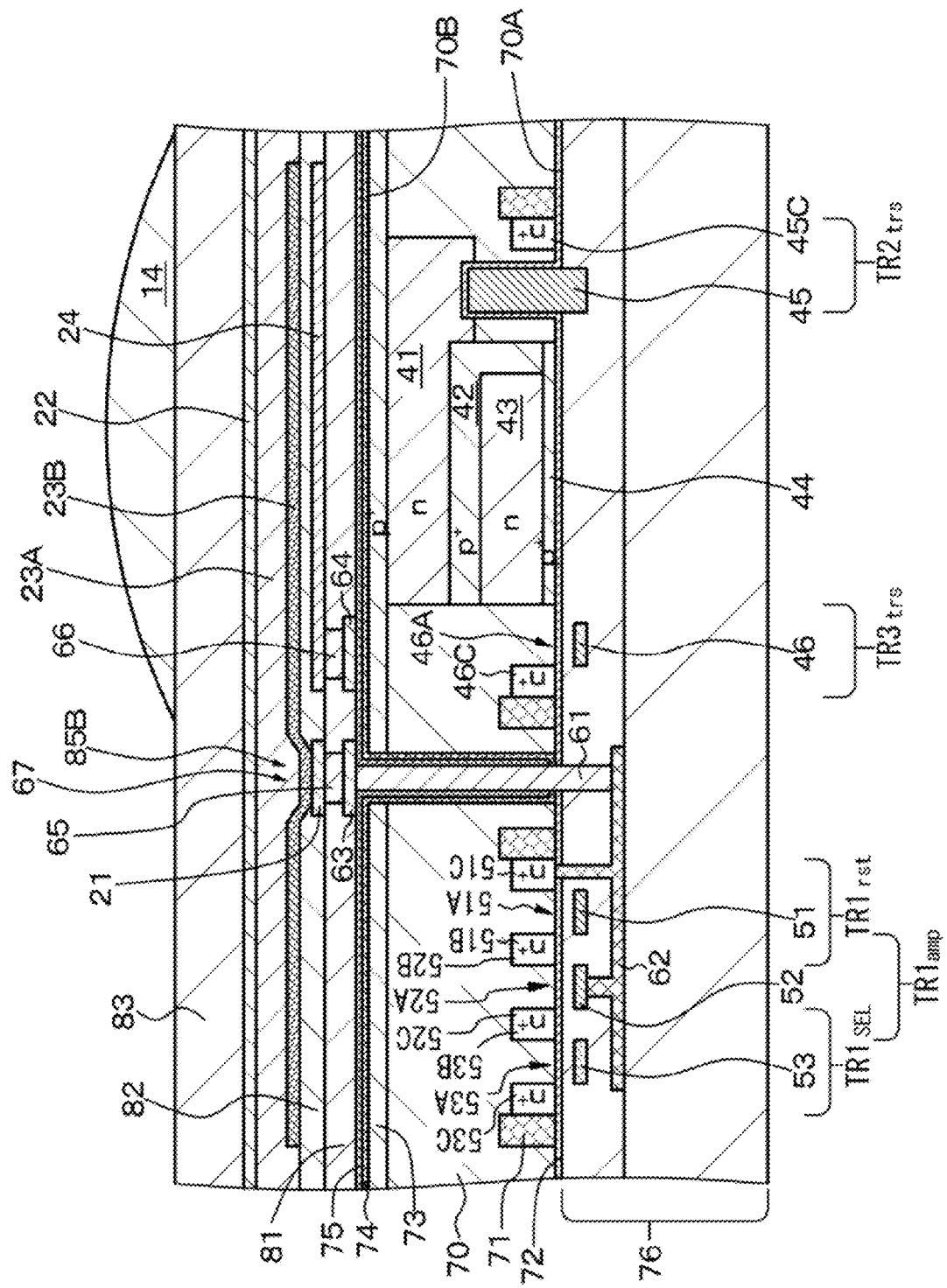
FIG. 65 is a schematic partial sectional view of a further modification of the imaging element of Embodiment 1.
Figure 66A:
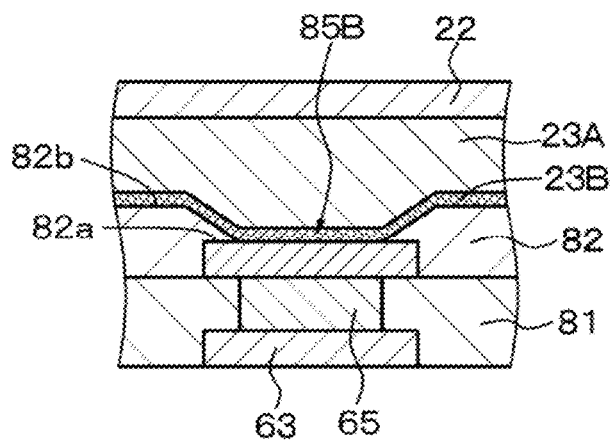
FIGS. 66A, 66B, and 66C are schematic partial sectional views, in an enlarged form, of a part of a first electrode and the like in a further modification of the imaging element of Embodiment 1.
Figure 66B:
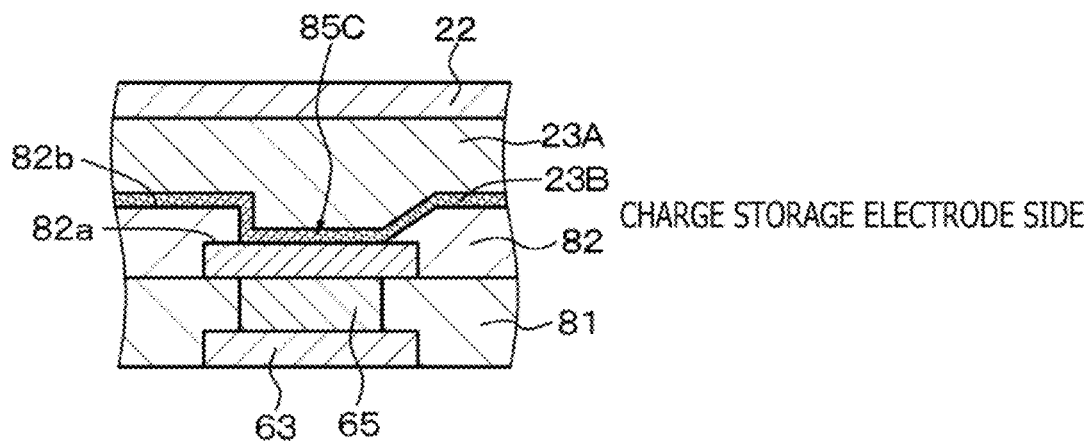
Figure 66C:
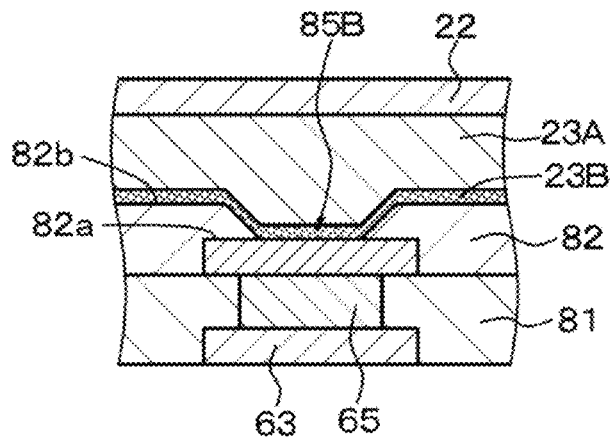

Alternatively, as a modification of the imaging element described in Embodiment 1, for example, is illustrated in FIG. 65 and a schematic partial sectional view in an enlarged form of the part of the first electrode and the like is depicted in FIG. 66A, an edge portion of a top surface of the first electrode 21 is covered with the insulating layer 82, the first electrode 21 is exposed at a bottom surface of the opening 85B, and, let the surface of the insulating layer 82 making contact with the top surface of the first electrode 21 be a first surface 82a and let the surface of the insulating layer 82 making contact with the part of the inorganic oxide semiconductor material layer 23B facing the charge storage electrode 24 be a second surface 82b, then a side surface of the opening 85B has an inclination such as to broaden from the first surface 82a toward the second surface 82b. With the side surface of the opening 85B thus inclined, movement of charges from the inorganic oxide semiconductor material layer 23B to the first electrode 21 is made smoother. Note that while the side surface of the opening 85B is in rotational symmetry with the axis of the opening 85B as a center of symmetry in the example illustrated in FIG. 66A, an opening 85C having an inclination such as to broaden from the first surface 82a toward the second surface 82b may be provided in such a manner that a side surface of the opening 85C is located on the charge storage electrode 24 side, as depicted in FIG. 66B. This makes it difficult for charges to move from that part of the inorganic oxide semiconductor material layer 23B which is on the opposite side of the opening 85C from the charge storage electrode 24. In addition, while the side surface of the opening 85B has the inclination such as to broaden from the first surface 82a toward the second surface 82b, an edge portion of the side surface of the opening 85B at the second surface 82b may be located on the outer side relative to an edge portion of the first electrode 21, as depicted in FIG. 66A, or may be located on the inner side relative to the edge portion of the first electrode 21, as depicted in FIG. 66C. With the former configuration adopted, transfer of charges is more facilitated, and, with the latter configuration adopted, variability in shape upon formation of the openings can be reduced.

These openings 85B and 85C can be formed by a process in which an etching mask including a resist material formed when the insulating layer is formed with the openings based on an etching method is subjected to reflow, so that a side surface of the opening of the etching mask is inclined, and the insulating layer 82 is etched using the etching mask.

Figure 67:
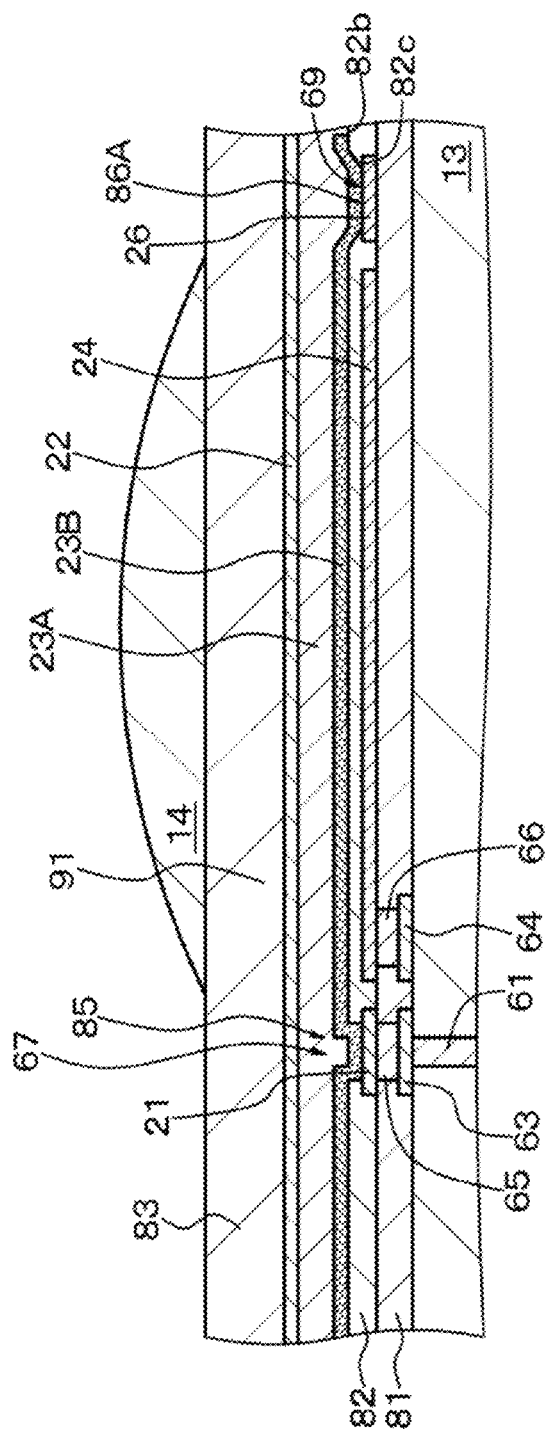
FIG. 67 is a schematic partial sectional view, in an enlarged form, of a part of a charge discharge electrode and the like in another modification of the imaging element of Embodiment 5.

Alternatively, in regard of the charge discharge electrode 26 described in Embodiment 5, a mode may be adopted in which as depicted in FIG. 67, the inorganic oxide semiconductor material layer 23B extends in a second opening 86A provided in the insulating layer 82 and is connected to the charge discharge electrode 26, an edge portion of a top surface of the charge discharge electrode 26 is covered with the insulating layer 82, the charge discharge electrode 26 is exposed at a bottom surface of the second opening 86A, and, let a surface of the insulating layer 82 making contact with the top surface of the charge discharge electrode 26 be a third surface 82c and let a surface of the insulating layer 82 making contact with the part of the inorganic oxide semiconductor material layer 23B facing the charge storage electrode 24 be a second surface 82b, then a side surface of the second opening 86A has an inclination such as to broaden from the third surface 82c toward the second surface 82b.

Figure 68:
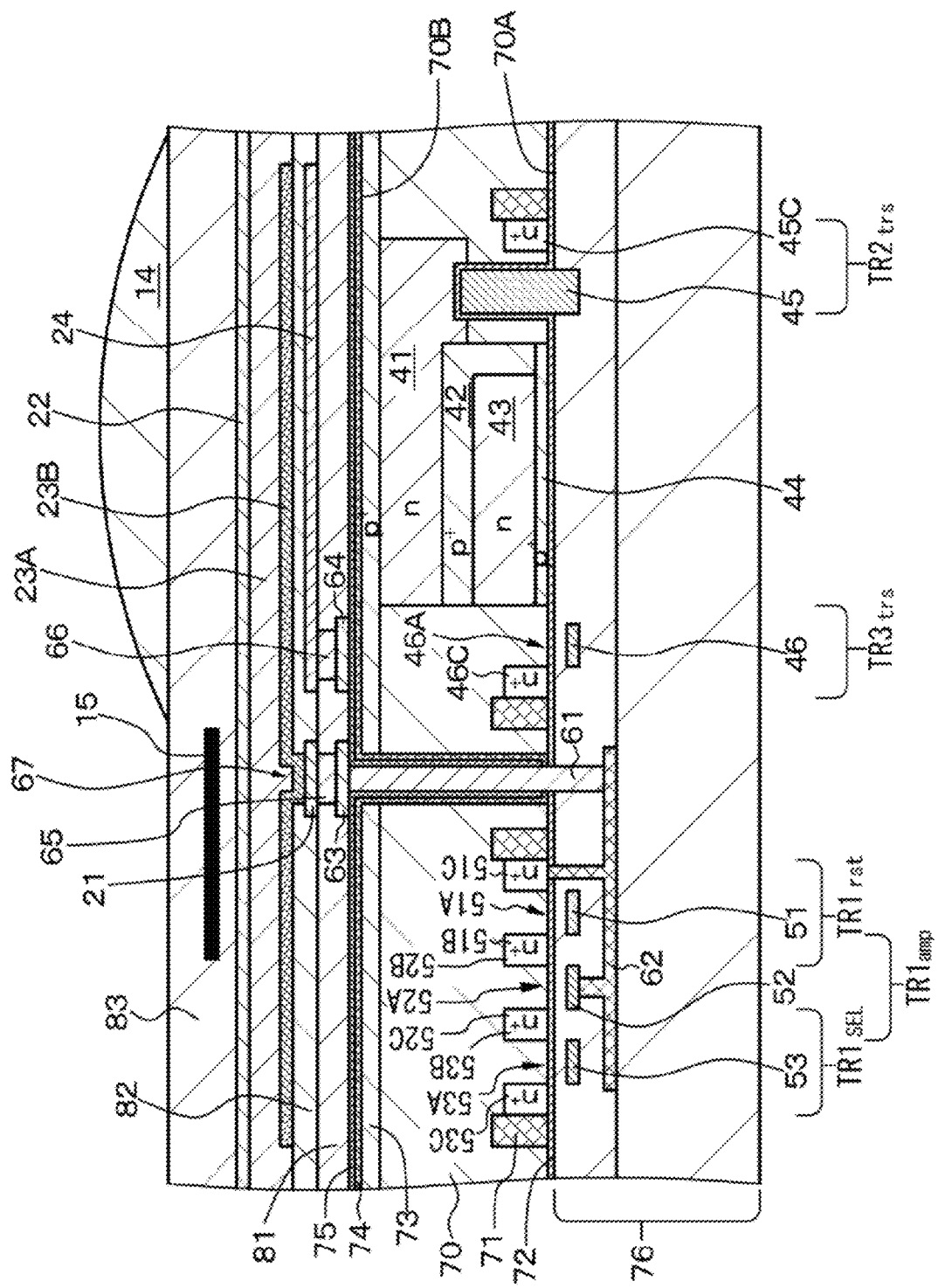
FIG. 68 is a schematic partial sectional view of a further modification of the imaging element of Embodiment 1.

In addition, as a modification of the imaging element described in Embodiment 1, for example, is depicted in FIG. 68, a mode may be adopted in which light is incident from the side of the second electrode 22, and a light shielding layer 15 is formed on the light incidence side near the second electrode 22. Note that various wirings provided on the light incidence side relative to the photoelectric conversion layer may be made to function as the light shielding layer.

Figure 69:
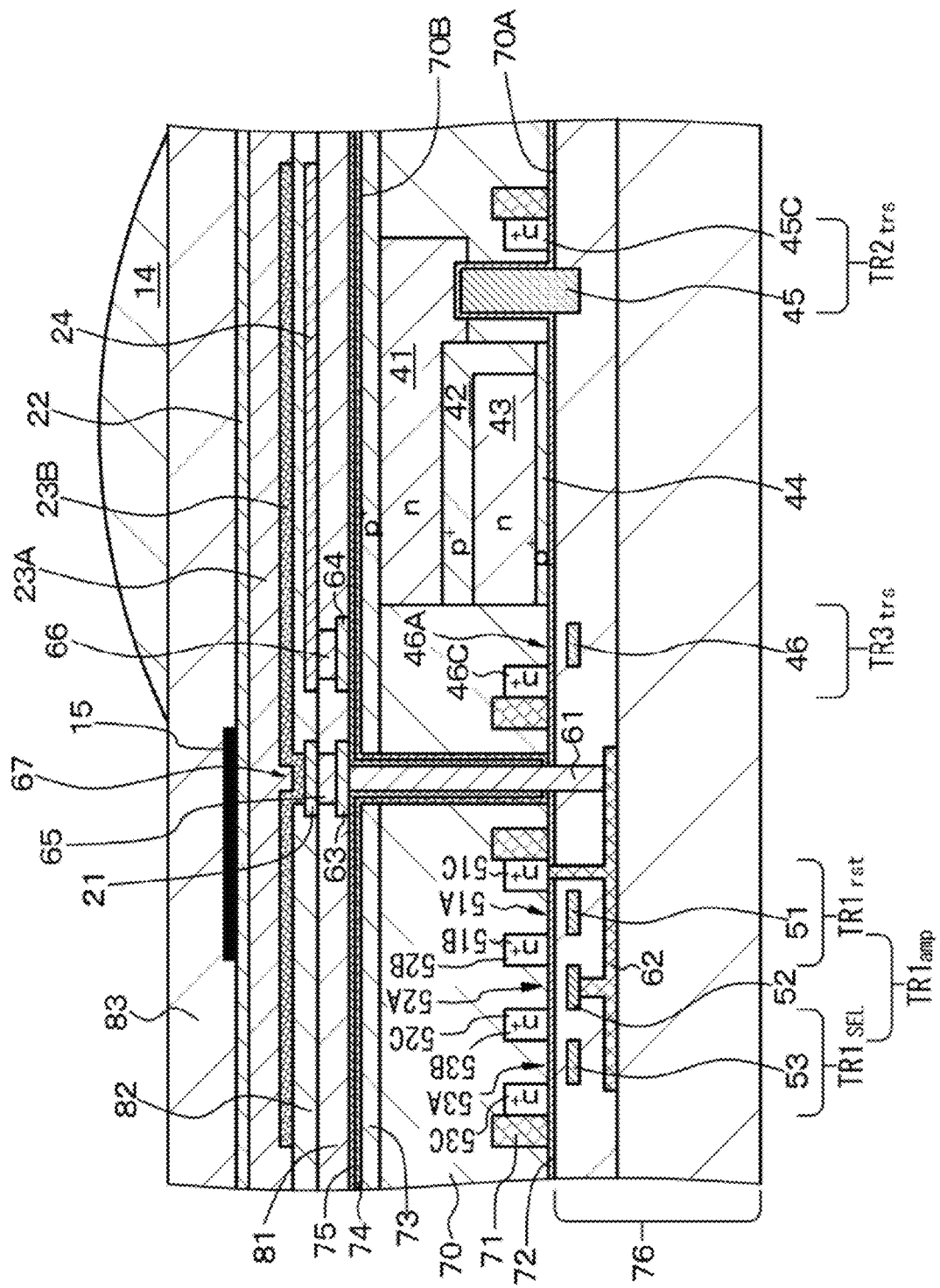
FIG. 69 is a schematic partial sectional view of a further modification of the imaging element of Embodiment 1.
Figure 70:
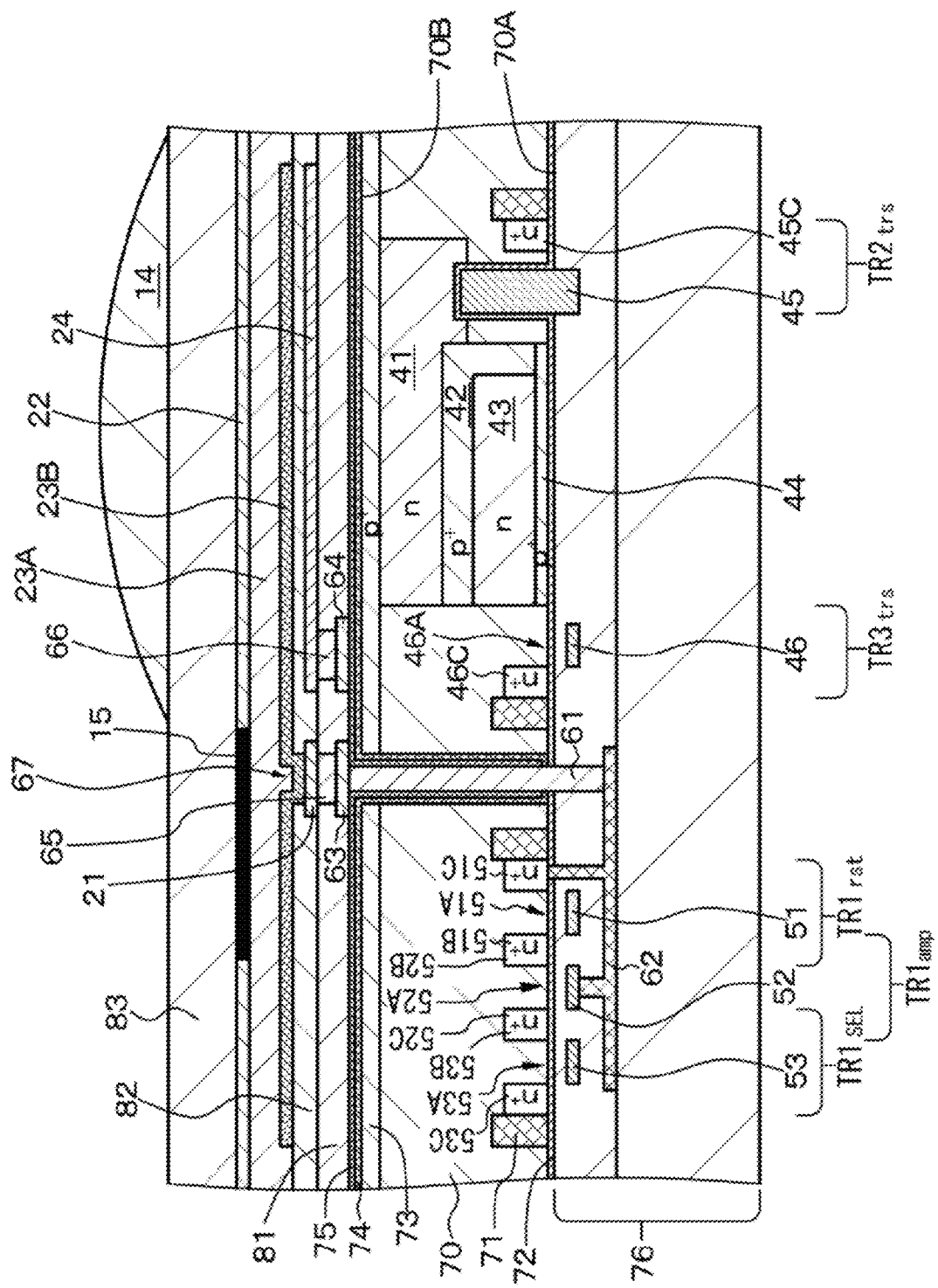
FIG. 70 is a schematic partial sectional view of a further modification of the imaging element of Embodiment 1.

Note that in an example depicted in FIG. 68, a light shielding layer 15 is formed on an upper side of the second electrode 22, that is, the light shielding layer 15 is formed on the light incidence side relative to the second electrode 22 and on an upper side of the first electrode 21. However, as depicted in FIG. 69, the light shielding layer 15 may be disposed on a surface on the light incidence side of the second electrode 22. Besides, in some cases, as depicted in FIG. 70, the second electrode 22 may be provided with the light shielding layer 15.

Figure 71:
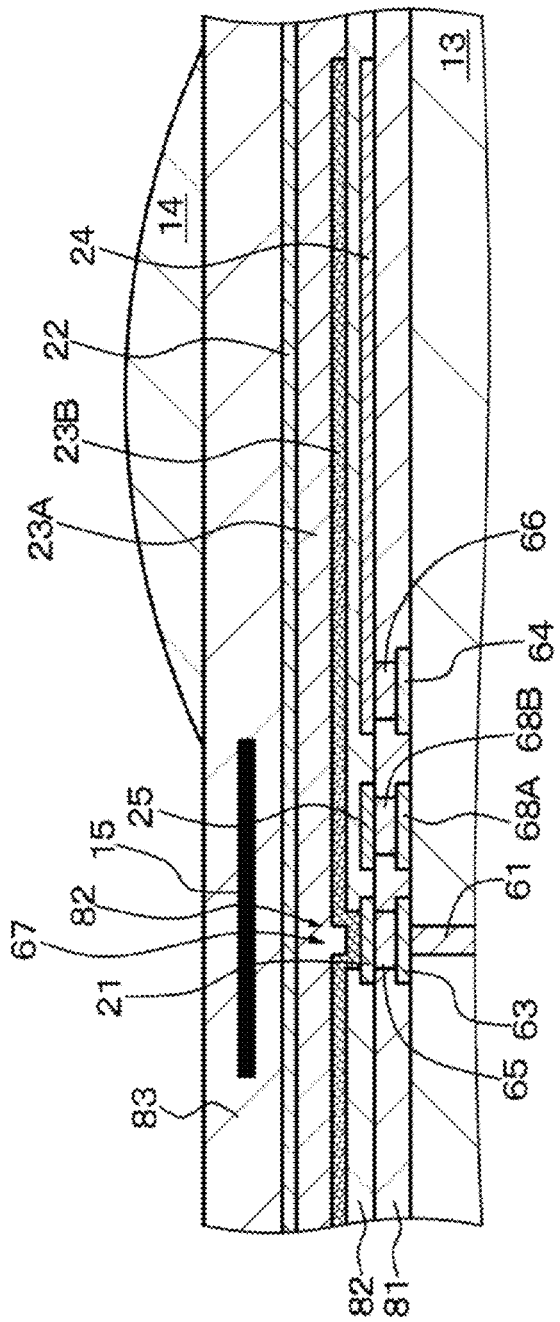
FIG. 71 is a schematic partial sectional view of a further modification of the imaging element of Embodiment 4.
Figure 72:
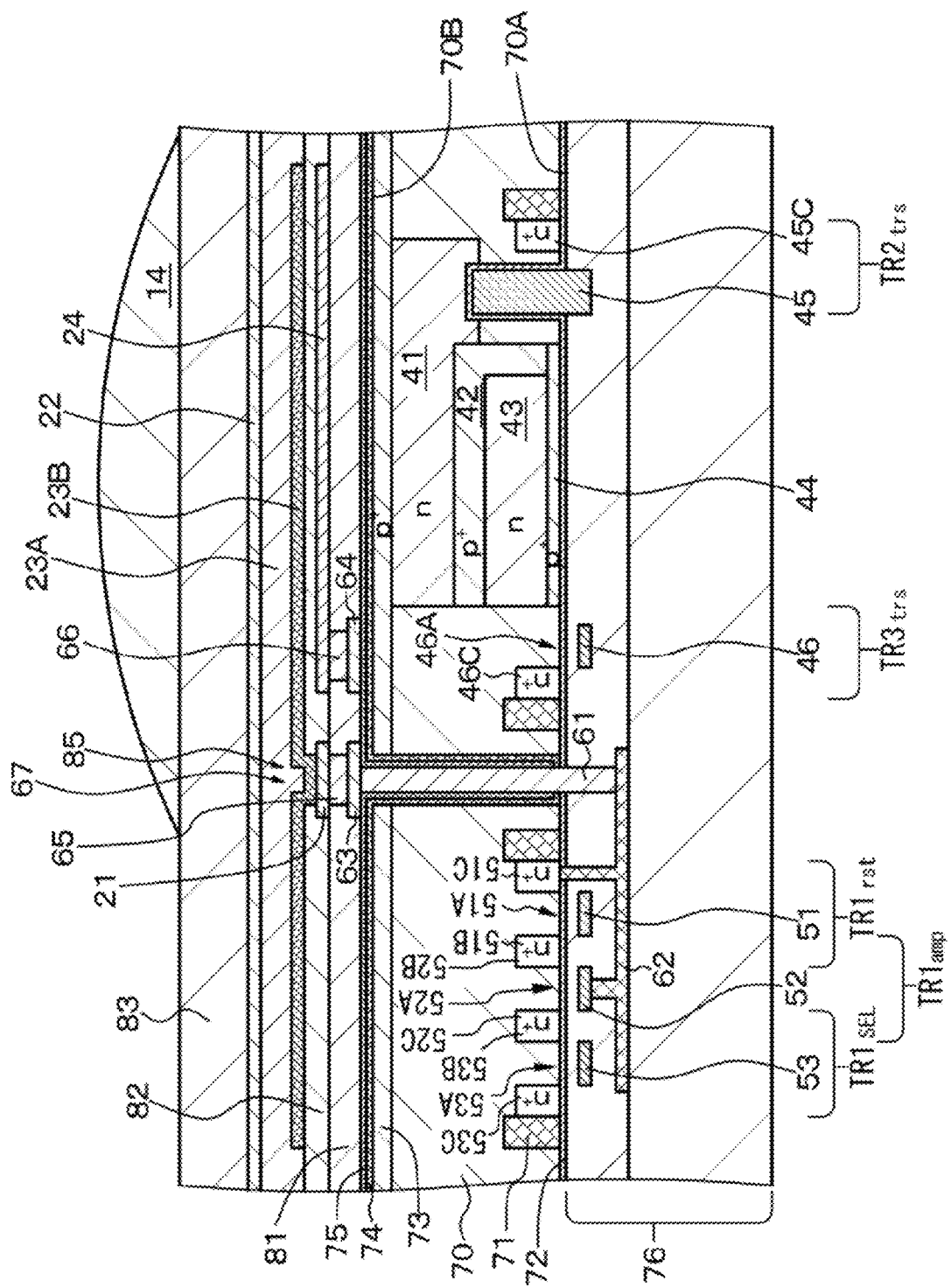
FIG. 72 is a schematic partial sectional view of a further modification of the imaging element of Embodiment 1.

Alternatively, a structure may be adopted in which light is incident from the second electrode 22 side, and the light is not incident on the first electrode 21. Specifically, as depicted in FIG. 68, the light shielding layer 15 is formed on the light incidence side near the second electrode 22 and on an upper side of the first electrode 21. Alternatively, a structure may be adopted in which, as depicted in FIG. 72, an on-chip microlens 14 is provided on an upper side of the charge storage electrode 24 and the second electrode 22, and light incident on the on-chip microlens 14 is concentrated onto the charge storage electrode 24 and does not reach the first electrode 21. Note that as described in Embodiment 4, in the case where the transfer control electrode 25 is provided, a mode may be adopted in which light is not incident on the first electrode 21 and the transfer control electrode 25. Specifically, a structure may be adopted in which as depicted in FIG. 71, the light shielding layer 15 is formed on an upper side of the first electrode 21 and the transfer control electrode 25. Alternatively, a structure may be adopted in which the light incident on the on-chip microlens 14 does not reach the first electrode 21 or the first electrode 21 and the transfer control electrode 25.

By adopting these configurations and structures, or by providing the light shielding layer 15 in such a manner that light is incident on only that part of the photoelectric conversion layer 23A which is located on an upper side of the charge storage electrode 24, or by designing the on-chip microlens 14, it is ensured that that part of the photoelectric conversion layer 23A which is located on an upper side of the first electrode 21 (or on an upper side of the first electrode 21 and the transfer control electrode 25) comes not to contribute to photoelectric conversion, and, therefore, all the pixels can be reset securely simultaneously, and a global shutter function can be realized more easily. In other words, in a driving method for a solid-state imaging apparatus including a plurality of imaging elements having these configurations and structures, the steps of in all the imaging elements, simultaneously discharging charges in the first electrode 21 to the exterior of the system while storing charges in the inorganic oxide semiconductor material layer 23B or the like, and thereafter in all the imaging elements, simultaneously transferring the charges stored in the inorganic oxide semiconductor material layer 23B or the like to the first electrode 21, and, after completion of the transfer, sequentially reading out the charges transferred to the first electrodes 21 in the imaging elements, are repeated.

In such a driving method for the solid-state imaging apparatus, each imaging element has a structure in which the light incident from the second electrode side is not incident on the first electrode, and, in all the imaging elements, charges in the first electrodes are simultaneously discharged to the exterior of the system while storing charges in the inorganic oxide semiconductor material layer or the like, so that the first electrodes can be securely reset simultaneously in all the imaging elements. Thereafter, in all the imaging elements, the charges stored in the inorganic oxide semiconductor material layer or the like are simultaneously transferred to the first electrodes, and, after completion of the transfer, the charges transferred to the first electrodes in the imaging elements are sequentially read out. Therefore, a so-called global shutter function can be easily realized.

Figure 73:
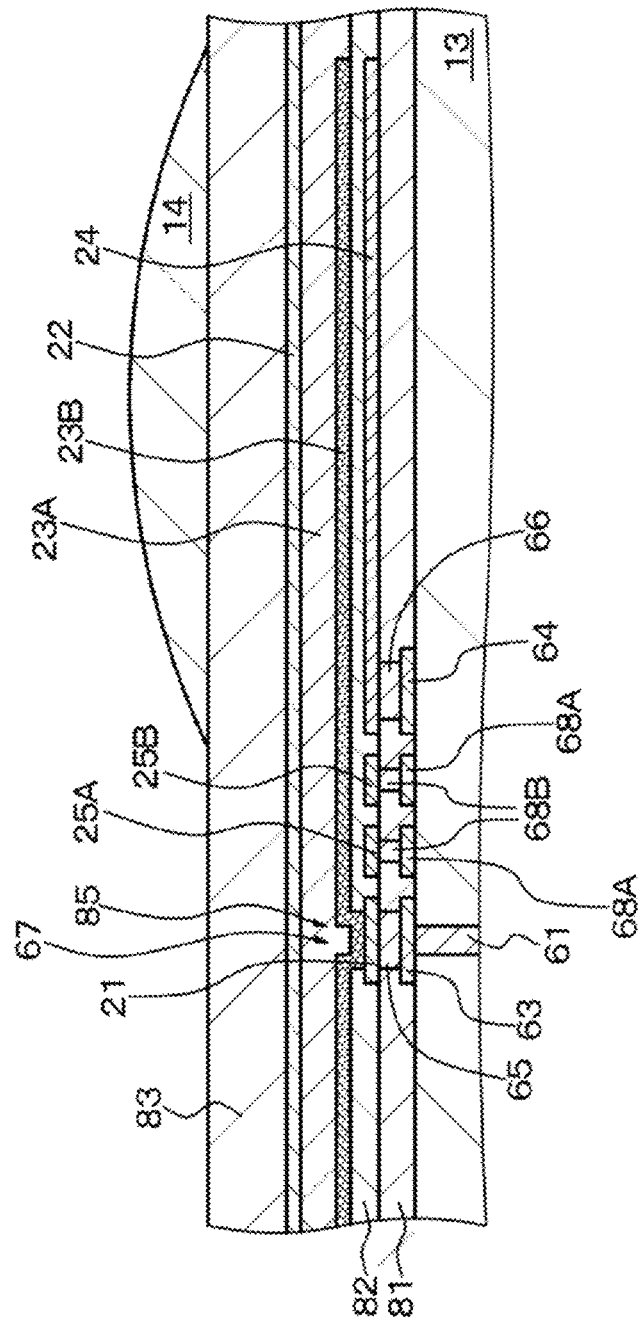
FIG. 73 is a schematic partial sectional view of a further modification of the imaging element of Embodiment 4.

In addition, as a modification of Embodiment 4, as depicted in FIG. 73, a plurality of transfer control electrodes may be provided from a position nearest to the first electrode 21 toward the charge storage electrode 24. Note that FIG. 73 depicts an example in which two transfer control electrodes 25A and 25B are provided. A structure may be adopted in which an on-chip microlens 14 is provided on an upper side of the charge storage electrode 24 and the second electrode 22, light incident on the on-chip microlens 14 is concentrated onto the charge storage electrode 24, and the light does not reach the first electrode 21 and the transfer control electrodes 25A and 25B.

Figure 74:
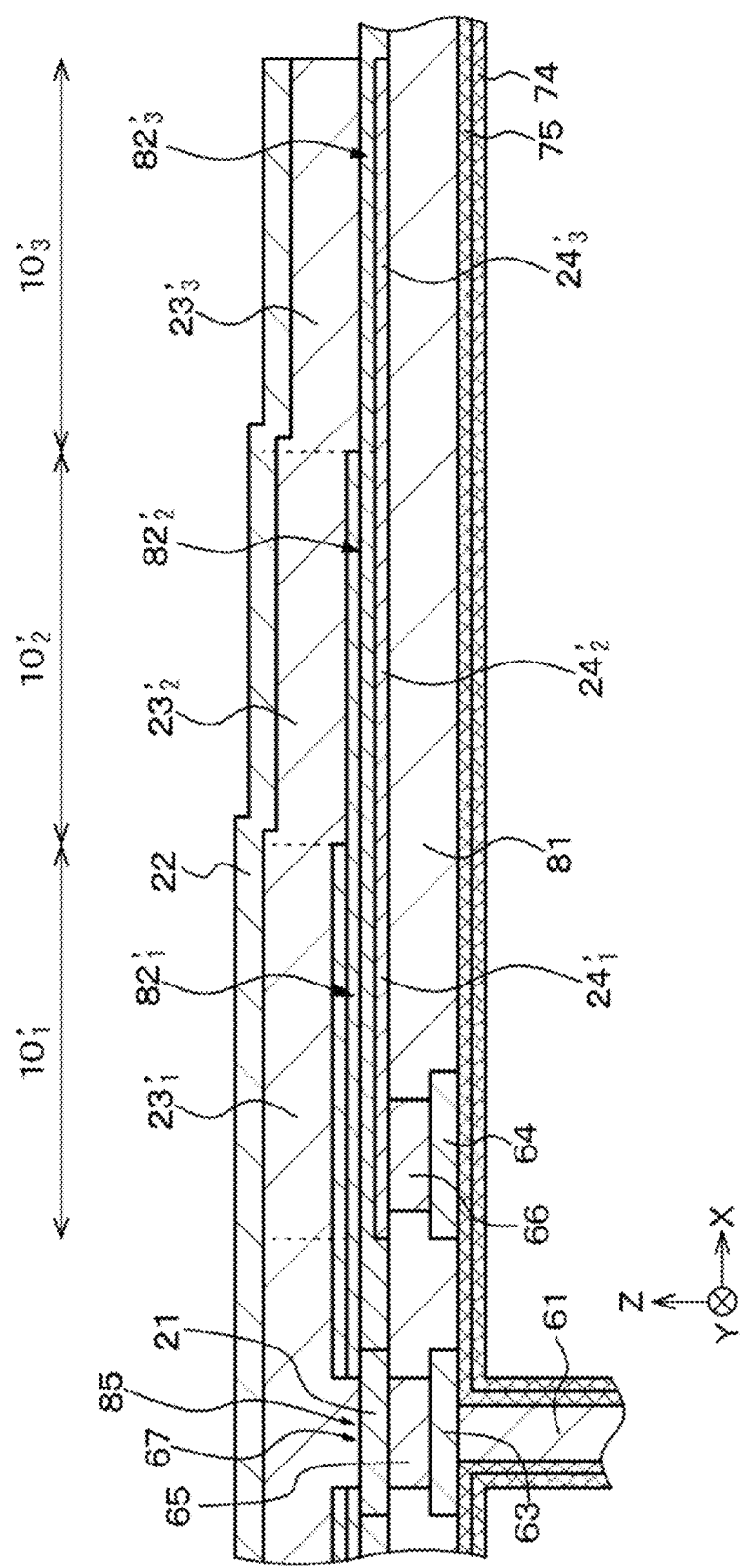
FIG. 74 is a schematic partial sectional view, in an enlarged form, of a part in which a charge storage electrode, a photoelectric conversion layer, and a second electrode are stacked in a modification of the imaging element of Embodiment 7.

In Embodiment 7 depicted in FIGS. 37 and 38, the thicknesses of the charge storage electrode segments $24'_1$, $24'_2$, and $24'_3$ are gradually decreased, so that the thicknesses of the insulating layer segments $82'_1$, $82'_2$, and $82'_3$ are gradually increased. On the other hand, as a schematic partial sectional view in an enlarged form of the part where the charge storage electrode, the inorganic oxide semiconductor material layer, the photoelectric conversion layer, and the second electrode are stacked in a modification of Embodiment 7 is depicted in FIG. 74, the thicknesses of the charge storage electrode segments $24'_1$, $24'_2$, and $24'_3$ may be constant, and the thicknesses of the insulating layer segments $82'_1$, $82'_2$, and $82'_3$ may be gradually increased. Note that the thicknesses of the photoelectric conversion layer segments $23'_1$, $23'_2$, and $23'_3$ are constant.

Figure 75:
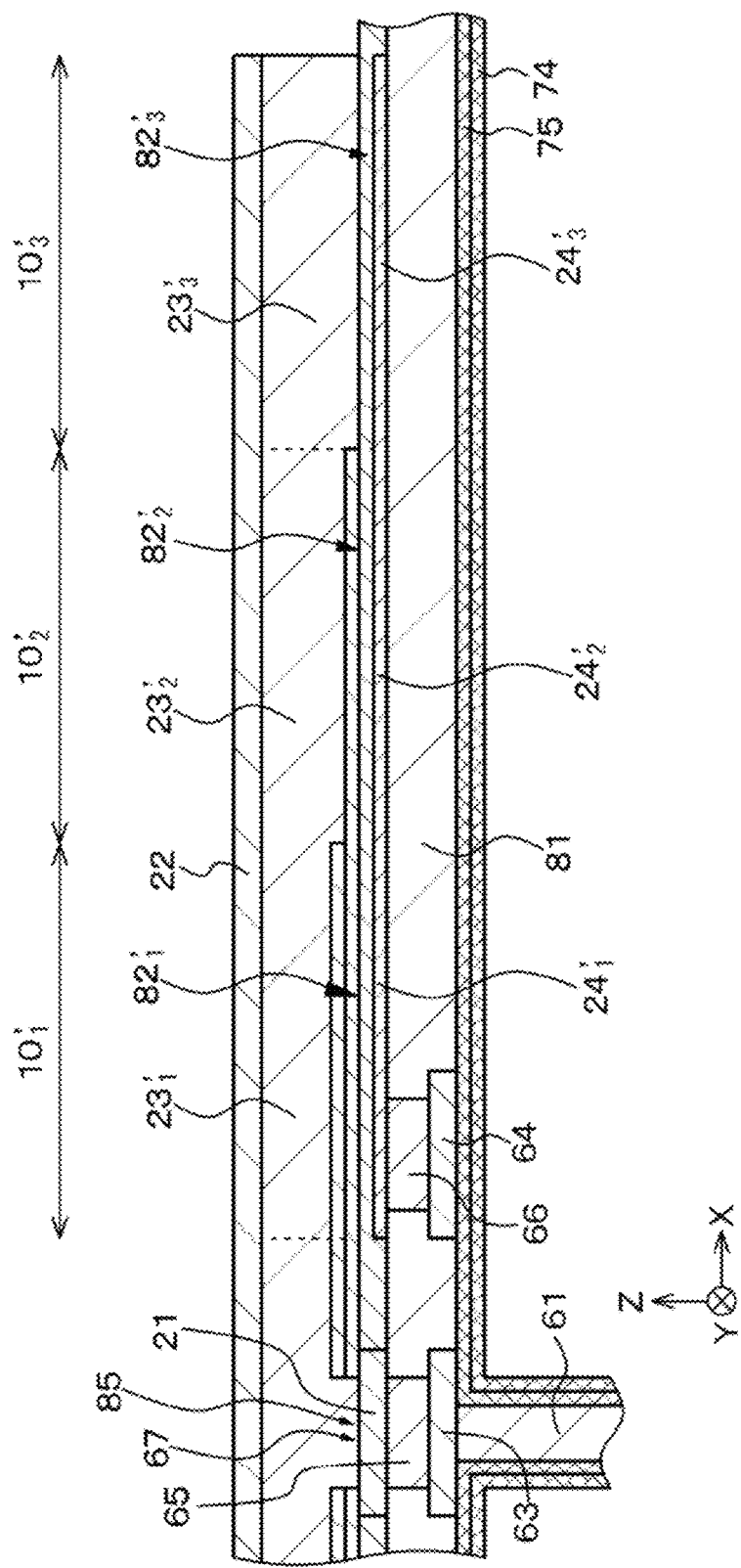
FIG. 75 is a schematic partial sectional view, in an enlarged form, of a part in which a charge storage electrode, a photoelectric conversion layer, and a second electrode are stacked in a modification of the imaging element of Embodiment 8.

In addition, in Embodiment 8 depicted in FIG. 40, the thicknesses of the charge storage electrode segments $24'_1$, $24'_2$, and $24'_3$ are gradually decreased, so that the thicknesses of the photoelectric conversion layer segments $23'_1$, $23'_2$, and $23'_3$ are gradually increased. On the other hand, as a schematic partial sectional view in an enlarged form of the part where the charge storage electrode, the photoelectric conversion layer, and the second electrode are stacked in a modification of Embodiment 8 is depicted in FIG. 75, the thicknesses of the charge storage electrode segments $24'_1$, $24'_2$, and $24'_3$ may be constant, and the thicknesses of the insulating layer segments $82'_1$, $82'_2$, and $82'_3$ may be gradually decreased, so that the thicknesses of the photoelectric conversion layer segments $23'_1$, $23'_2$, and $23'_3$ may be gradually increased.

It is natural that the various modifications described above are applicable also to Embodiments 2 to 14.

In Embodiments, description has been made by taking as an example a case where the imaging element of the present disclosure is applied to a CMOS type solid-state imaging apparatus in which unit pixels for detecting signal charges according to incident light amount as a physical quantity are arranged in a matrix pattern, but the application to the CMOS type solid-state imaging apparatus is not limitative, and the imaging element is also applicable to a CCD type solid-state imaging apparatus. In the latter case, the signal charges are transferred in the vertical direction by a vertical transfer register of a CCD type structure, are transferred in a horizontal direction by a horizontal transfer register, and are amplified, so that a pixel signal (image signal) is outputted. In addition, the application is not limited to general application to a column system solid-state imaging apparatus in which pixels are formed in a two-dimensional matrix pattern and column signal processing circuits are disposed on a pixel column basis. Further, in some cases, the select transistor may be omitted.

Further, the application of the imaging element of the present disclosure is not limited to the solid-state imaging apparatus that detects the distribution of incident light amounts of visible light to pick up an image, and the imaging element is also applicable to solid-state imaging apparatuses that pick up the distribution of incident amounts of infrared rays, X-rays or particles or the like as an image. In addition, in a broad sense, the imaging element of the present disclosure is generally applicable to solid-state imaging apparatuses (physical quantity distribution detectors), such as a fingerprint sensor, that detect the distribution of other physical quantities, such as pressure and capacitance, to pick up an image.

Furthermore, the application of the imaging element of the present disclosure is not limited to a solid-state imaging apparatus that sequentially scans unit pixels in an imaging region on a row basis and reads out pixel signals from the unit pixels. The imaging element of the present disclosure is also applicable to an X-Y address type solid-state imaging apparatus that select arbitrary pixels on a pixel basis and reads out pixel signals from the selected pixels on a pixel basis. The solid-state imaging apparatus may be in a mode of being formed as one chip, or in a modular mode having an imaging function in which an imaging region and a driving circuit or an optical system are collectively packaged.

Here, the imaging element of the present disclosure is applicable not only to the solid-state imaging apparatus but also to imaging devices. Here, the imaging devices refer to electronic apparatuses having an imaging function such as a mobile phones, as well as camera systems such as digital still cameras and video cameras. A modular mode mounted on an electronic apparatus, i.e., a camera module may be an imaging device in some cases.

Figure 79:
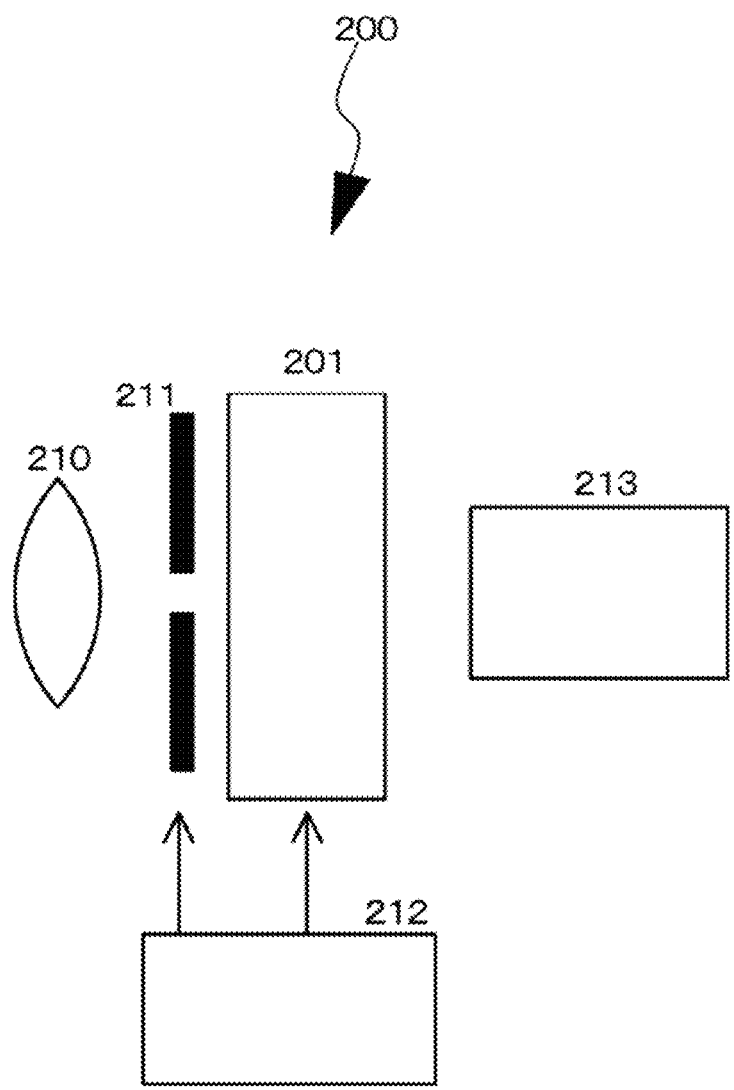
FIG. 79 is a conceptual diagram of an example in which a solid-state imaging apparatus including an imaging element of the present disclosure and the like is used in an electronic apparatus (camera).

An example in which a solid-state imaging apparatus 201 including the imaging elements of the present disclosure is used for an electronic apparatus (camera) 200 is depicted as a conceptual diagram in FIG. 79. The electronic apparatus 200 has the solid-state imaging apparatus 201, an optical lens 210, a shutter device 211, a driving circuit 212, and a signal processing circuit 213. The optical lens 210 focuses image light (incident light) from a subject, to form an image on an imaging surface of the solid-state imaging apparatus 201. As a result, signal charges are stored in the solid-state imaging apparatus 201 for a predetermined period of time. The shutter device 211 controls a light illumination period and a light shielding period for the solid-state imaging apparatus 201. The driving circuit 212 supplies driving signals for controlling a transfer operation and the like of the solid-state imaging apparatus 201 and a shutter operation of the shutter device 211. By the driving signal (timing signal) supplied from the driving circuit 212, signal transfer in the solid-state imaging apparatus 201 is performed. The signal processing circuit 213 performs various kinds of signal processing. A video signal having undergone the signal processing is stored in a storage medium such as a memory, or is outputted to a monitor. In such an electronic apparatus 200, refinement of pixel size in the solid-state imaging apparatus 201 and enhancement of transfer efficiency can be achieved, and, therefore, it is possible to obtain an electronic apparatus 200 enhanced in pixel characteristics. The electronic apparatus 200 to which the solid-state imaging apparatus 201 is applicable is not limited to a camera, but includes imaging devices such as a camera module for mobile apparatuses such as mobile phones as well as digital still cameras.

The technology according to the present disclosure (present technology) is applicable to various products. For example, the technology according to the present disclosure may be realized as a device to be mounted on any type of moving body such as an automobile, electric vehicle, hybrid electric vehicle, motorcycle, bicycle, personal mobility, airplane, drone, ship, and robot.

Figure 80:
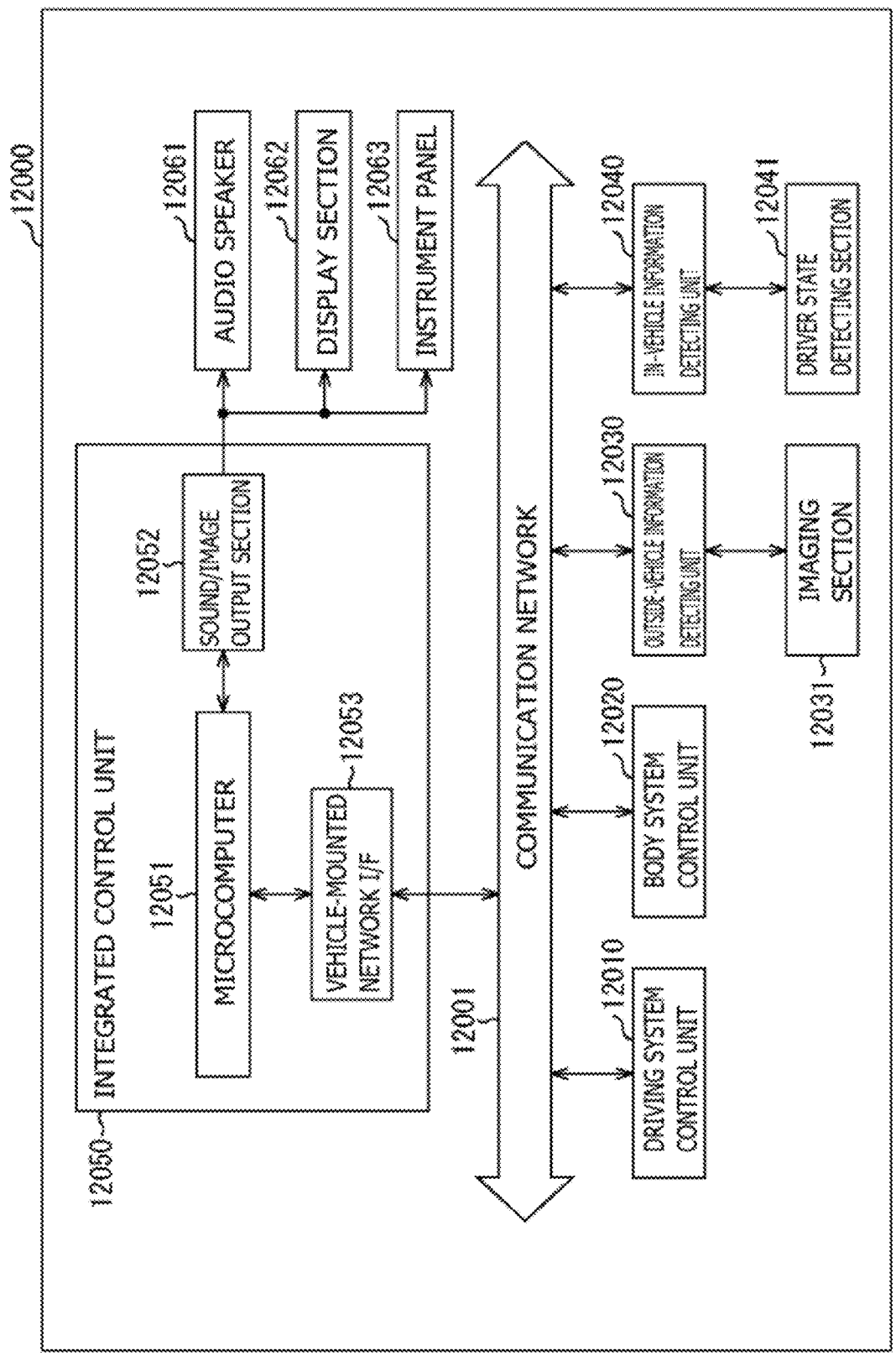
FIG. 80 is a block diagram depicting an example of schematic configuration of a vehicle control system.

FIG. 80 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 80, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 80, an audio speaker 12061, a display section 12062, and an instrument panel 12063 are illustrated as the output device. The display section 12062 may, for example, include at least one of an on-board display and a head-up display.

Figure 81:
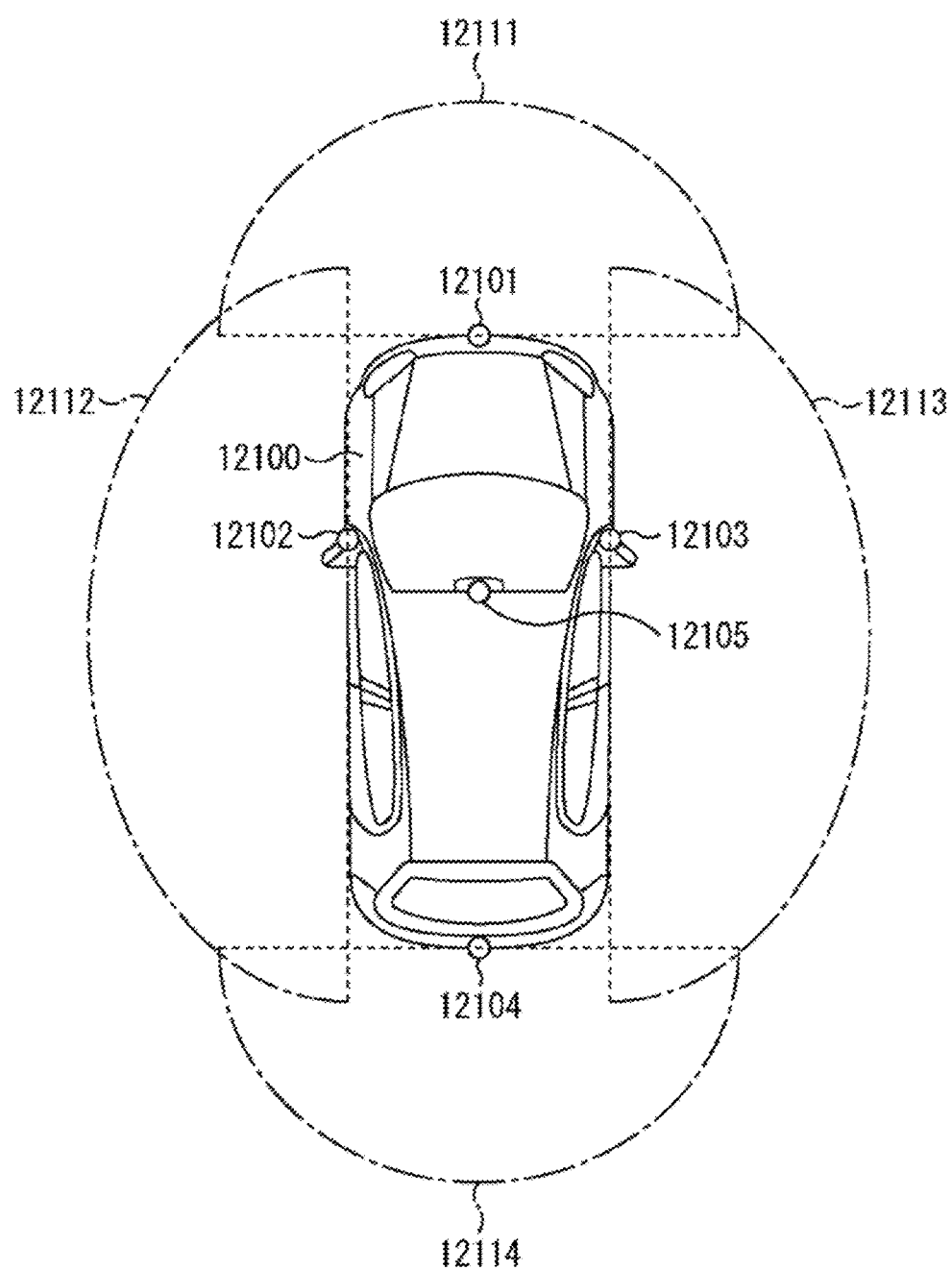
FIG. 81 is a diagram of assistance in explaining an example of installation positions of an outside-vehicle information detecting section and an imaging section.

FIG. 81 is a diagram depicting an example of the installation position of the imaging section 12031.

In FIG. 81, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 81 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In addition, for example, the technology of the present disclosure may be applied to an endoscopic surgery system.

Figure 82:
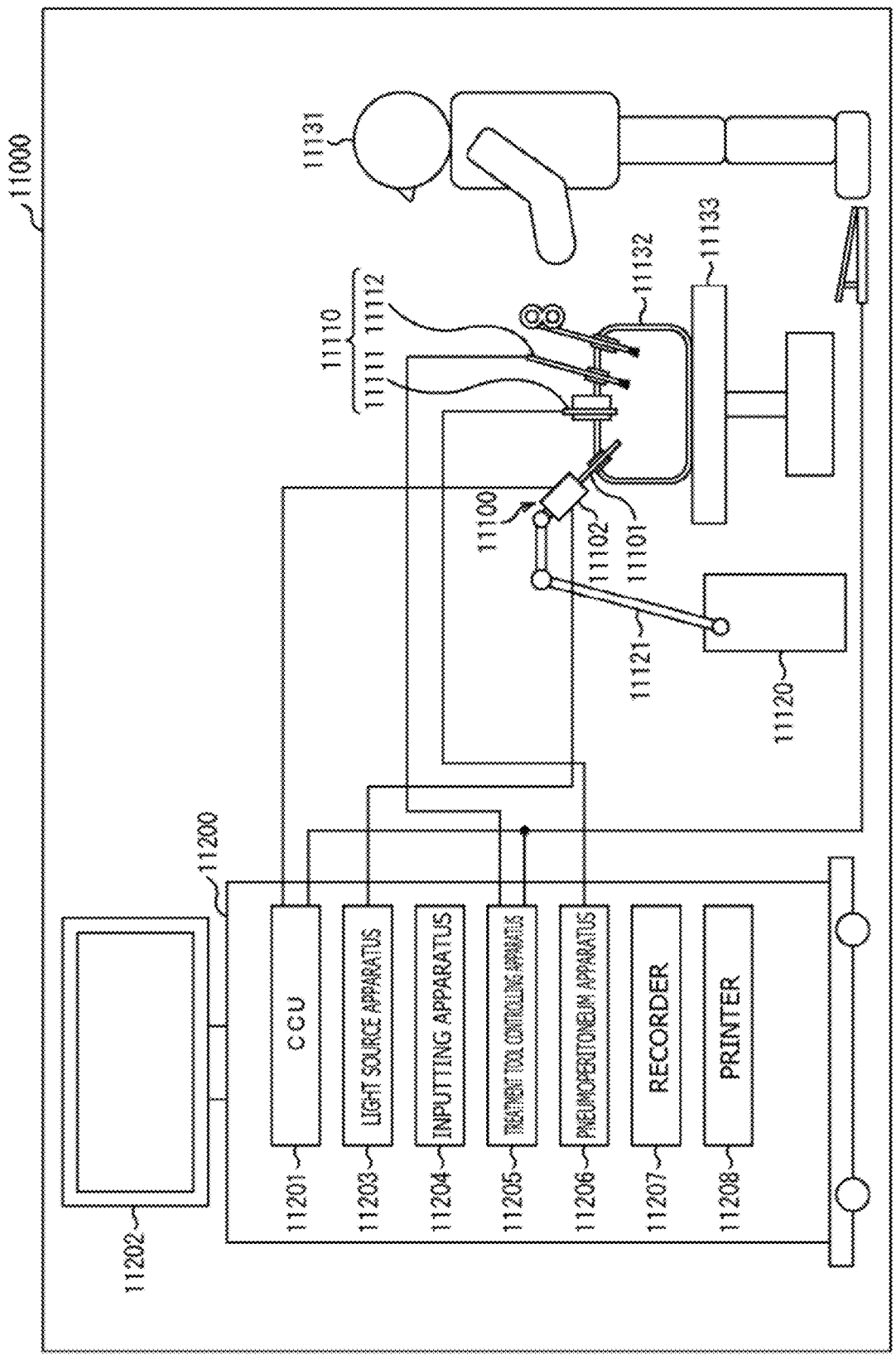
FIG. 82 is a view depicting an example of a schematic configuration of an endoscopic surgery system.

FIG. 82 is a view depicting an example of a schematic configuration of an endoscopic surgery system to which the technology according to an embodiment of the present disclosure (present technology) can be applied.

In FIG. 82, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 83:
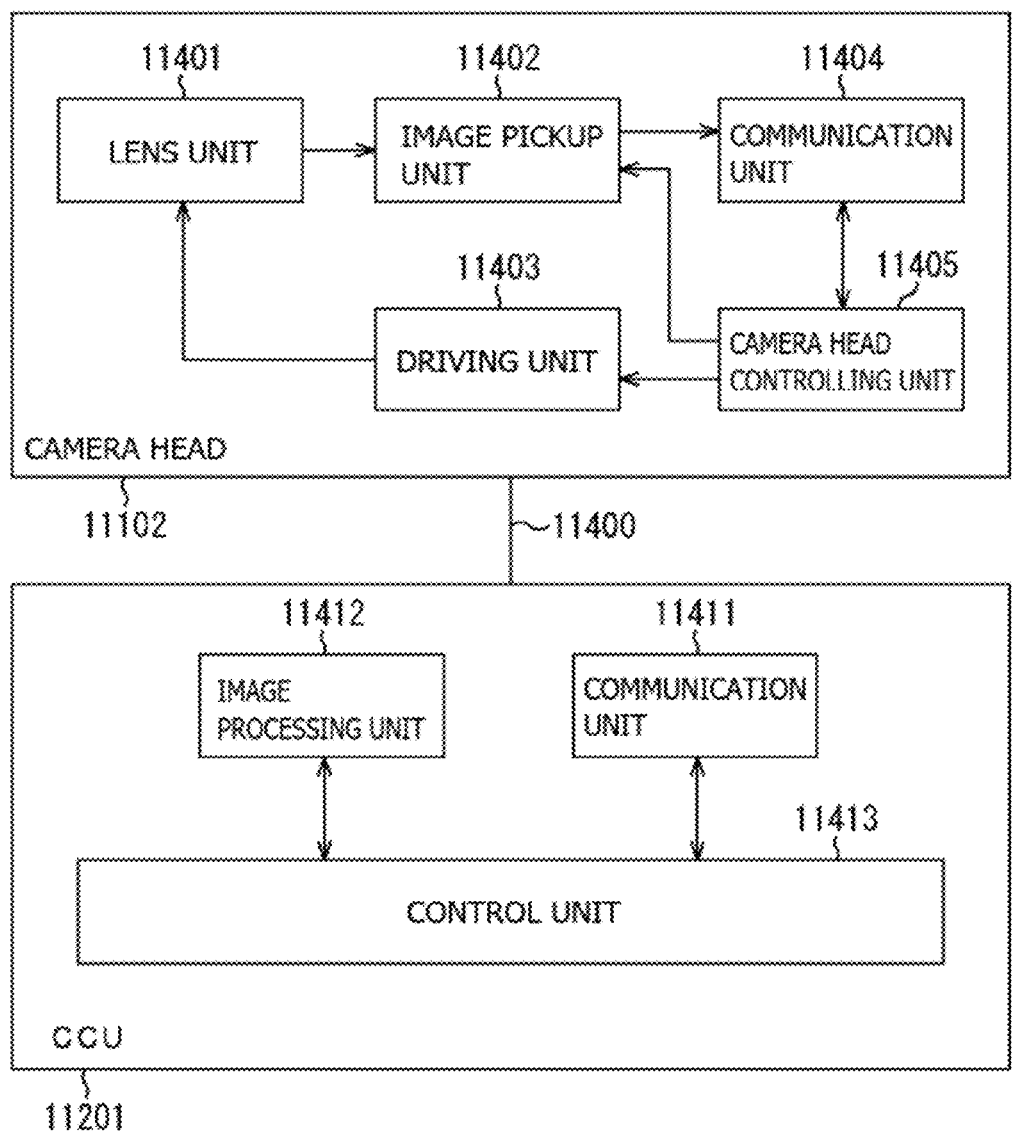
FIG. 83 is a block diagram depicting an example of a functional configuration of a camera head and a camera control unit (CCU).

FIG. 83 is a block diagram depicting an example of a functional configuration of the camera head 11102 and the CCU 11201 depicted in FIG. 82.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Note that while an endoscopic surgery system has been described here as an example, the technology of the present disclosure may be applied to other systems, for example, a microscopic surgery system.

Note that the present disclosure can take the following configurations.

[A01] «Imaging element»
An imaging element including:
a photoelectric conversion section that includes a first electrode, a photoelectric conversion layer, and a second electrode stacked on one another,
in which an inorganic oxide semiconductor material layer is formed between the first electrode and the photoelectric conversion layer, and the inorganic oxide semiconductor material layer includes indium atoms, gallium atoms, tin atoms, and zinc atoms.

[A02]
The imaging element according to [A01], in which when the inorganic oxide semiconductor material layer is represented by $In_aGa_bSn_cZn_dO_e$, $$1.8<(b+c)/a<2.3$$

and $$2.3<d/a<2.6$$

are satisfied.

[A03]
The imaging element according to [A02], in which $b>0$ is satisfied.

[A04]
The imaging element according to any one of [A01] to [A03], in which the photoelectric conversion section further includes an insulating layer, and a charge storage electrode that is disposed spaced from the first electrode and that is disposed to face the inorganic oxide semiconductor material layer, with the insulating layer interposed therebetween.

[A05]
The imaging element according to any one of [A01] to [A04], in which a LUMO value $E_1$ of a material constituting a part of the photoelectric conversion layer located in a vicinity of the inorganic oxide semiconductor material layer and a LUMO value $E_2$ of a material constituting the inorganic oxide semiconductor material layer satisfy the following expression:

$$E_2-E_1 \geq 0.1 \text{ eV}.$$

[A06]
The imaging element according to [A05], in which the following expression is satisfied:

$$E_2-E_1 > 0.1 \text{ eV}.$$

[A07]
The imaging element according to any one of [A01] to [A06], in which mobility of a material constituting the inorganic oxide semiconductor material layer is equal to or more than 10 $cm^2/V \cdot s$.

[A08]
The imaging element according to any one of [A01] to [A07], in which the inorganic oxide semiconductor material layer is amorphous.

[A09]
The imaging element according to any one of [A01] to [A08], in which a thickness of the inorganic oxide semiconductor material layer is $1 \times 10^{-8}$ to $1.5 \times 10^{-7}$ m.

[A10]
The imaging element according to any one of [A01] to [A09],
in which light is incident from the second electrode, and
a surface roughness Ra of the inorganic oxide semiconductor material layer at an interface between the photoelectric conversion layer and the inorganic oxide semiconductor material layer is equal to or less than 1.5 nm, and a value of root mean square roughness Rq of the inorganic oxide semiconductor material layer is equal to or less than 2.5 nm.

[B01]
The imaging element according any one of [A01] to [A10], in which the photoelectric conversion section further includes an insulating layer, and a charge storage electrode that is disposed spaced from the first electrode and that is disposed to face the inorganic oxide semiconductor material layer, with the insulating layer interposed therebetween.

[B02]

The imaging element according to [B01], further including:

a semiconductor substrate, in which the photoelectric conversion section is disposed on an upper side of the semiconductor substrate.

[B03]

The imaging element according to [B01] or [B02], in which the first electrode extends in an opening provided in the insulating layer, and is connected to the inorganic oxide semiconductor material layer.

[B04]

The imaging element according to [B01] or [B02], in which the inorganic oxide semiconductor material layer extends in an opening provided in the insulating layer, and is connected to the first electrode.

The imaging element according to [B04], in which an edge portion of a top surface of the first electrode is covered with the insulating layer, the first electrode is exposed at a bottom surface of the opening, and let a surface of the insulating layer making contact with the top surface of the first electrode be a first surface and let a surface of the insulating layer making contact with a part of the inorganic oxide semiconductor material layer facing the charge storage electrode be a second surface, then a side surface of the opening has an inclination such as to broaden from the first surface toward the second surface.

[B06]

The imaging element according to [B05], in which the side surface of the opening having the inclination such as to broaden from the first surface toward the second surface is located on the charge storage electrode side.

[B07] «Control of potentials of first electrode and charge storage electrode»

The imaging element according to any one of [B01] to [B06], further including:

a control section that is provided on the semiconductor substrate and that has a driving circuit, in which the first electrode and the charge storage electrode are connected to the driving circuit, in a charge storage period, a potential $V_{11}$ is impressed on the first electrode, and a potential $V_{12}$ is impressed on the charge storage electrode, from the driving circuit, and charges are stored in the inorganic oxide semiconductor material layer, and in a charge transfer period, a potential $V_{21}$ is impressed on the first electrode, and a potential $V_{22}$ is impressed on the charge storage electrode, from the driving circuit, and the charges stored in the inorganic oxide semiconductor material layer are read out to the control section via the first electrode, provided that the potential of the first electrode is higher than the potential of the second electrode, and $V_{12} \geq V_{11}$, and $V_{22} < V_{21}$ are satisfied.

[B08] «Transfer control electrode»

The imaging element according to [B01] to [B06], further including:

a transfer control electrode that is disposed between the first electrode and the charge storage electrode in a state of being spaced from the first electrode and the charge storage electrode and that is disposed to face the inorganic oxide semiconductor material layer, with the insulating layer interposed therebetween.

[B09] «Control of potentials of first electrode, charge storage electrode and transfer control electrode»

The imaging element according to [B08], further including:

a control section that is provided on the semiconductor substrate and that has a driving circuit, in which the first electrode, the charge storage electrode, and the transfer control electrode are connected to the driving circuit, in a charge storage period, a potential $V_{11}$ is impressed on the first electrode, a potential $V_{12}$ is impressed on the charge storage electrode, and a potential $V_{13}$ is impressed on the transfer control electrode, from the driving circuit, and charges are stored in the inorganic oxide semiconductor material layer, and in a charge transfer period, a potential $V_{21}$ is impressed on the first electrode, a potential $V_{22}$ is impressed on the charge storage electrode, and a potential $V_{23}$ is impressed on the transfer control electrode, from the driving circuit, and the charges stored in the inorganic oxide semiconductor material layer are read out to the control section via the first electrode, provided that the potential of the first electrode is higher than the potential of the second electrode, and $V_{12} > V_{13}$, and $V_{22} \leq V_{23} \leq V_{21}$ are satisfied.

[B10] «Charge discharge electrode»

The imaging element according to any one of [B01] to [B09], further including:

a charge discharge electrode that is connected to the inorganic oxide semiconductor material layer and that is disposed spaced from the first electrode and the charge storage electrode.

[B11]

The imaging element according to [B10], in which the charge discharge electrode is disposed such as to surround the first electrode and the charge storage electrode.

[B12]

The imaging element according to [B10] or [B11], in which the inorganic oxide semiconductor material layer extends in a second opening provided in the insulating layer and is connected to the charge discharge electrode, an edge portion of a top surface of the charge discharge electrode is covered with the insulating layer, the charge discharge electrode is exposed at a bottom surface of the second opening, and let a surface of the insulating layer making contact with the top surface of the charge discharge electrode be a third surface and let a surface of the insulating layer making contact with a part of the inorganic oxide semiconductor material layer facing the charge storage electrode be a second surface, then a side surface of the second opening has an inclination such as to broaden from the third surface toward the second surface.

[B13] «Control of potentials of first electrode, charge storage electrode, and charge discharge electrode»

The imaging element according to any one of [B10] to [B12], further including:

a control section that is provided on the semiconductor substrate and that has a driving circuit, in which the first electrode, the charge storage electrode, and the charge discharge electrode are connected to the driving circuit, in a charge storage period, a potential $V_{11}$ is impressed on the first electrode, a potential $V_{12}$ is impressed on the charge storage electrode, and a potential $V_{14}$ is impressed on the charge discharge electrode, from the driving circuit, and charges are stored in the inorganic oxide semiconductor material layer, and in a charge transfer period, a potential $V_{21}$ is impressed on the first electrode, a potential $V_{22}$ is impressed on the charge storage electrode, and a potential $V_{24}$ is impressed on the charge discharge electrode, from the driving circuit, and the charges stored in the inorganic oxide semiconductor material layer are read out to the control section via the first electrode, provided that the potential of the first electrode is higher than the potential of the second electrode, and $V_{14}>V_{11}$, and $V_{24}<V_{21}$ are satisfied.

[B14] «Charge storage electrode segment»

The imaging element according to any one of [B01] to [B13], in which the charge storage electrode includes a plurality of charge storage electrode segments.

[B15]

The imaging element according to [B14], in which in a case where the potential of the first electrode is higher than the potential of the second electrode, in a charge transfer period, a potential impressed on a charge storage electrode segment located at a place nearest to the first electrode is higher than a potential impressed on a charge storage electrode segment located at a place farthest from the first electrode, and in a case where the potential of the first electrode is lower than the potential of the second electrode, in the charge transfer period, the potential impressed on the charge storage electrode segment located at the place nearest to the first electrode is lower than the potential impressed on the charge storage electrode segment located at the place farthest from the first electrode.

[B16]

The imaging element according to any one of [B01] to [B15], in which the semiconductor substrate is provided with at least a floating diffusion layer and an amplification transistor that constitute the control section, and the first electrode is connected to the floating diffusion layer and a gate section of the amplification transistor.

[B17]

The imaging element according to [B16], in which the semiconductor substrate is provided further with a reset transistor and a select transistor that constitute the control section, the floating diffusion layer is connected to a source/drain region on one side of the reset transistor, a source/drain region on one side of the amplification transistor is connected to a source/drain region on one side of the select transistor, and a source/drain region on the other side of the select transistor is connected to a signal line.

[B18]

The imaging element according to any one of [B01] to [B17], in which a size of the charge storage electrode is greater than a size of the first electrode.

[B19]

The imaging element according to any one of [B01] to [B81], in which light is incident from the second electrode side, and a light shielding layer is formed on a light incidence side near the second electrode.

[B20]

The imaging element according to any one of [B01] to [B18], in which light is incident from the second electrode side, and light is not incident on the first electrode.

[B21]

The imaging element according to [B20], in which a light shielding layer is formed on a light incidence side near the second electrode and on an upper side of the first electrode.

[B22]

The imaging element according to [B20], in which an on-chip microlens is provided on an upper side of the charge storage electrode and the second electrode, and light incident on the on-chip microlens is concentrated on the charge storage electrode.

[B23] «Imaging element: first configuration»

The imaging element according to any one of [B01] to [B22], in which the photoelectric conversion section includes N (where N≥2) photoelectric conversion section segments, the inorganic oxide semiconductor material layer and the photoelectric conversion layer include N photoelectric conversion layer segments, the insulating layer includes N insulating layer segments, the charge storage electrode includes N charge storage electrode segments, an n-th (where n=1, 2, 3 ... N) photoelectric conversion section segment includes an n-th charge storage electrode segment, an n-th insulating layer segment, and an n-th photoelectric conversion layer segment, the photoelectric conversion section segment with a greater n value is located spaced more from the first electrode, and a thickness of the insulating layer segment varies gradually over a range from a first photoelectric conversion section segment to an N-th photoelectric conversion section segment.

[B24] «Imaging element: second configuration»

The imaging element according to any one of [B01] to [B22], in which the photoelectric conversion section includes N (where N≥2) photoelectric conversion section segments, the inorganic oxide semiconductor material layer and the photoelectric conversion layer include N photoelectric conversion layer segments, the insulating layer includes N insulating layer segments, the charge storage electrode includes N charge storage electrode segments, an n-th (where n=1, 2, 3 ... N) photoelectric conversion section segment includes an n-th charge storage electrode segment, an n-th insulating layer segment, and an n-th photoelectric conversion layer segment, the photoelectric conversion section segment with a greater n value is located spaced more from the first electrode, and a thickness of the photoelectric conversion layer segment varies gradually over a range from a first photoelectric conversion section segment to an N-th photoelectric conversion section segment.

[B25] «Imaging element: third configuration»

The imaging element according to any one of [B01] to [B22], in which the photoelectric conversion section includes N (where N≥2) photoelectric conversion section segments, the inorganic oxide semiconductor material layer and the photoelectric conversion layer include N photoelectric conversion layer segments, the insulating layer includes N insulating layer segments, the charge storage electrode includes N charge storage electrode segments, an n-th (where n=1, 2, 3 ... N) photoelectric conversion section segment includes an n-th charge storage electrode segment, an n-th insulating layer segment, and an n-th photoelectric conversion layer segment, the photoelectric conversion section segment with a greater n value is located spaced more from the first electrode, and a material constituting the insulating layer segment differs between adjacent ones of the photoelectric conversion section segments.

[B26]«Imaging element: fourth configuration»

The imaging element according to any one of [B01] to [B22], in which the photoelectric conversion section includes N (where N≥2) photoelectric conversion section segments, the inorganic oxide semiconductor material layer and the photoelectric conversion layer include N photoelectric conversion layer segments, the insulating layer includes N insulating layer segments, the charge storage electrode includes N charge storage electrode segments disposed spaced from one another, an n-th (where n=1, 2, 3 ... N) photoelectric conversion section segment includes an n-th charge storage electrode segment, an n-th insulating layer segment, and an n-th photoelectric conversion layer segment, the photoelectric conversion section segment with a greater n value is located spaced more from the first electrode, and a material constituting the charge storage electrode segment differs between adjacent ones of the photoelectric conversion section segments.

[B27] «Imaging element: fifth configuration»

The imaging element according to any one of [B01] to [B22], in which the photoelectric conversion section includes N (where N≥2) photoelectric conversion section segments, the inorganic oxide semiconductor material layer and the photoelectric conversion layer include N photoelectric conversion layer segments, the insulating layer includes N insulating layer segments, the charge storage electrode includes N charge storage electrode segments disposed spaced from one another, an n-th (where n=1, 2, 3 ... N) photoelectric conversion section segment includes an n-th charge storage electrode segment, an n-th insulating layer segment, and an n-th photoelectric conversion layer segment, the photoelectric conversion section segment with a greater n value is located spaced more from the first electrode, and an area of the charge storage electrode segment decreases gradually over a range from a first photoelectric conversion section segment to an N-th photoelectric conversion section segment.

[B28] «Imaging element: sixth configuration»

The imaging element according to any one of [B01] to [B22], in which let a stacking direction of the charge storage electrode, the insulating layer, the inorganic oxide semiconductor material layer, and the photoelectric conversion layer be a Z direction and let a direction for spacing away from the first electrode be an X direction, then a sectional area of a stacked part where the charge storage electrode, the insulating layer, the inorganic oxide semiconductor material layer, and the photoelectric conversion layer are stacked when the stacked part is cut along a YZ virtual plane varies depending on, distance from the first electrode.

[C01] «Stacked-type imaging element»

A stacked-type imaging element including:

at least one imaging element according to any one of [A01] to [A10].

[D01] «Solid-state imaging apparatus: first mode»

A solid-state imaging apparatus including:

a plurality of the imaging elements according to any one of [A01] to [A10].

[D02] «Solid-state imaging apparatus: second mode»

A solid-state imaging apparatus including:

a plurality of the stacked-type imaging elements according to [A11].

[E01] «Solid-state imaging apparatus: first configuration»

A solid-state imaging apparatus including:

a photoelectric conversion section including a first electrode, a photoelectric conversion layer, and a second electrode stacked on one another, in which the photoelectric conversion section has a plurality of the imaging elements according to any one of [A01] to [B28], a plurality of the imaging elements constitutes an imaging element block, and the first electrode is shared by the plurality of imaging elements constituting the imaging element block.

[E02] «Solid-state imaging apparatus: second configuration»

A solid-state imaging apparatus including:

a plurality of the imaging elements according to any one of [A01] to [B28], in which a plurality of the imaging elements constitutes an imaging element block, and the first electrode is shared by the plurality of imaging elements constituting the imaging element block.

[E03]

The solid-state imaging apparatus according to [E01] or [E02], in which one on-chip microlens is disposed on an upper side of one imaging element.

[E04]

The solid-state imaging apparatus according to [E01] or [E02], in which two imaging elements constitute an imaging element block, and one on-chip microlens is disposed on an upper side of the imaging element block.

[E05]

The solid-state imaging apparatus according to any one of [E01] to [E04], in which one floating diffusion layer is provided for a plurality of the imaging elements.

[E06]

The solid-state imaging apparatus according to any one of [E01] to [E05], in which the first electrode is disposed adjacently to the charge storage electrode of each imaging element.

[E07]

The solid-state imaging apparatus according to any one of [E01] to [E06], in which the first electrode is disposed adjacently to the charge storage electrodes of some of the plurality of imaging elements, and is not disposed adjacently to the charge storage electrodes of the rest of the plurality of imaging elements.

[E08]

The solid-state imaging apparatus according to [E07], in which a distance between the charge storage electrode constituting an imaging element and the charge storage electrode constituting another imaging element is longer than a distance between the first electrode and the charge storage electrode in the imaging element adjacent to the first electrode.

[F01] «Driving method for solid-state imaging apparatus»

A method of driving a solid-state imaging apparatus that includes a plurality of imaging elements, the imaging elements each including a photoelectric conversion section including a first electrode, a photoelectric conversion layer, and a second electrode stacked on each other, the photoelectric conversion section further including a charge storage electrode that is disposed spaced from the first electrode and that is disposed to face the photoelectric conversion layer, with an insulating layer interposed therebetween, light being incident from the second electrode side and light being not incident on the first electrode, the method repeating the steps of:

simultaneously discharging charges in the first electrodes to outside of a system while storing charges in inorganic oxide semiconductor material layers, in all the imaging elements; and, thereafter, simultaneously transferring the charges stored in the inorganic oxide semiconductor material layers to the first electrodes, in all the imaging elements, and, after completion of the transfer, sequentially reading out the charges transferred to the first electrode in each imaging element.

REFERENCE SIGN LIST $10'_1$, $10'_2$, $10'_3$ Photoelectric conversion section segment
13 Various imaging element constituent elements located on lower side of interlayer insulating layer
14 On-chip microlens (OCL)
15 Light shielding layer
21 First electrode
22 Second electrode
23A Photoelectric conversion layer
23B Inorganic oxide semiconductor material layer
$23'_1$, $23'_2$, $23'_3$ Photoelectric conversion layer segment
24, $24''_1$, $24_2$, $24''_3$ Charge storage electrode
24A, 24B, 24C, $24'_1$, $24'_2$, $24'_3$ Charge storage electrode segment
25, 25A, 25B Transfer control electrode (Charge transfer electrode)
26 Charge discharge electrode
27, $27A_1$, $27A_2$, $27A_3$, $27B_1$, $27B_2$, $27B_3$, 27C Charge movement control electrode
31, 33, 41, 43 n-Type semiconductor region
32, 34, 42, 44, 73 $p^+$ layer
35, 36, 45, 46 Gate section of transfer transistor
35C, 36C Region of semiconductor substrate
36A Transfer channel
51 Gate section of reset transistor $TR1_{rst}$
51A Channel forming region of reset transistor $TR1_{rst}$
51B, 51C Source/drain region of reset transistor $TR1_{rst}$
52 Gate section of amplification transistor $TR1_{amp}$
52A Channel forming region of amplification transistor $TR1_{amp}$
52B, 52C Source/drain region of amplification transistor $TR1_{amp}$
53 Gate section of select transistor $TR1_{sel}$
53A Channel forming region of select transistor $TR1_{sel}$
53B, 53C Source/drain region of select transistor $TR1_{sel}$
61 Contact hole section
62 Wiring layer
63, 64, 68A Pad section
65, 68B Connection hole
66, 67, 69 Connection section
70 Semiconductor substrate
70A First surface (front surface) of semiconductor substrate
70B Second surface (back surface) of semiconductor substrate
71 Element isolation region
72 Oxide film
74 $HfO_2$ film
75 Insulating material film
76, 81 Interlayer insulating layer
82 Insulating layer
$82'_1$, $82'_2$, $82'_3$ Insulating layer segment
82a First surface of insulating layer
82b Second surface of insulating layer
82c Third surface of insulating layer
83 Insulating layer
85, 85A, 85B, 85C Opening
86, 86A Second opening
100 Solid-state imaging apparatus
101 Stacked-type imaging element
111 Imaging region
112 Vertical driving circuit
113 Column signal processing circuit
114 Horizontal driving circuit
115 Output circuit
116 Drive control circuit
117 Signal line (data output line)
118 Horizontal signal line
200 Electronic apparatus (camera)
201 Solid-state imaging apparatus
210 Optical lens
211 Shutter device
212 Driving circuit
213 Signal processing circuit
$FD_1$, $FD_2$, $FD_3$, 45C, 46C Floating diffusion layer
$TR1_{trs}$, $TR2_{trs}$, $TR3_{trs}$ Transfer transistor
$TR1_{rst}$, $TR2_{rst}$, $TR3_{rst}$ Reset transistor
$TR1_{amp}$, $TR2_{amp}$, $TR3_{amp}$ Amplification transistor
$TR1_{sel}$, $TR3_{sel}$, $TR3_{sel}$ Select transistor
$V_{DD}$ Power source
$TG_1$, $TG_2$, $TG_3$ Transfer gate line
$RST_1$, $RST_2$, $RST_3$ Reset line
$SEL_1$, $SEL_2$, $SEL_3$ Select line
VSL, $VSL_1$, $VSL_2$, $VSL_3$ Signal line (data output line)
$V_{OA}$, $V_{OT}$, $V_{OU}$ Wiring

The invention claimed is:

1. An imaging element comprising:
  a photoelectric conversion section that includes a first electrode, a photoelectric conversion layer, and a second electrode stacked on one another,
  wherein an inorganic oxide semiconductor material layer is formed between the first electrode and the photoelectric conversion layer,
    wherein the inorganic oxide semiconductor material layer is embedded in the photoelectric conversion layer, and
  wherein the inorganic oxide semiconductor material layer includes indium atoms, gallium atoms, tin atoms, and zinc atoms.

2. The imaging element according to claim 1, wherein when the inorganic oxide semiconductor material layer is represented by $In_aGa_bSn_cZn_dO_e$,
wherein the relations $1.8<(b+c)/a<2.3$ and $2.3<d/a<2.6$ are satisfied.

3. The imaging element according to claim 1, wherein the photoelectric conversion section further includes an insulating layer, and a charge storage electrode that is disposed adjacent to the first electrode and that is disposed to below the inorganic oxide semiconductor material layer, with the insulating layer interposed therebetween in a cross-sectional view.

4. The imaging element according to claim 1, wherein a LUMO value $E_1$ of a material constituting a part of the photoelectric conversion layer located in a vicinity of the inorganic oxide semiconductor material layer and a LUMO value $E_2$ of a material constituting the inorganic oxide semiconductor material layer satisfy the following expression:

$E_2-E_1 \geq 0.1$ eV.

5. The imaging element according to claim 4, wherein the following expression is satisfied:

$E_2-E_1>0.1$ eV.

6. The imaging element according to claim 1, wherein a mobility of a material constituting the inorganic oxide semiconductor material layer is equal to or more than 10 $cm^2/V \cdot s$.

7. The imaging element according to claim 1, wherein the inorganic oxide semiconductor material layer is amorphous.

8. The imaging element according to claim 1, wherein a thickness of the inorganic oxide semiconductor material layer is $1 \times 10^{-8}$ to $1.5 \times 10^{-7}$ m.

9. The imaging element according to claim 1,
wherein light is incident from the second electrode, and
a surface roughness Ra of the inorganic oxide semiconductor material layer at an interface between the photoelectric conversion layer and the inorganic oxide semiconductor material layer is equal to or less than 1.5 nm, and a value of root mean square roughness Rq of the inorganic oxide semiconductor material layer is equal to or less than 2.5 nm.

10. A stacked-type imaging element comprising:
at least one imaging element according to claim 1.

11. A solid-state imaging apparatus comprising:
a plurality of imaging elements according to claim 1.

12. A solid-state imaging apparatus comprising:
a plurality of stacked-type imaging elements according to claim 10.

* * * * *